United States Patent
Taha et al.

(10) Patent No.: US 12,195,603 B2
(45) Date of Patent: Jan. 14, 2025

(54) POLYMERIC SURFACE HAVING REDUCED BIOMOLECULE ADHESION TO THERMOPLASTIC ARTICLES AND METHODS OF PLASMA TREATMENT

(71) Applicant: SIO2 MEDICAL PRODUCTS, INC., Auburn, AL (US)

(72) Inventors: Ahmad Taha, Auburn, AL (US); John T. Felts, Alameda, CA (US)

(73) Assignee: SIO2 MEDICAL PRODUCTS, LLC, Auburn, AL (US)

( * ) Notice: Subject to any disclaimer, the term of this patent is extended or adjusted under 35 U.S.C. 154(b) by 0 days.

(21) Appl. No.: 17/725,188

(22) Filed: Apr. 20, 2022

(65) Prior Publication Data

US 2022/0259394 A1    Aug. 18, 2022

Related U.S. Application Data

(63) Continuation-in-part of application No. 17/581,615, filed on Jan. 21, 2022, which is a continuation of
(Continued)

(51) Int. Cl.
*C23C 16/00*    (2006.01)
*B01L 3/00*    (2006.01)
(Continued)

(52) U.S. Cl.
CPC .............. *C08J 7/123* (2013.01); *B01L 3/5085* (2013.01); *B01L 3/50855* (2013.01);
(Continued)

(58) Field of Classification Search
CPC ..................................................... C23C 16/00
See application file for complete search history.

(56) References Cited

U.S. PATENT DOCUMENTS

| | | | |
|---|---|---|---|
| 4,261,806 A | 4/1981 | Asai et al. | |
| 4,948,628 A | 8/1990 | Montgomery et al. | |

(Continued)

FOREIGN PATENT DOCUMENTS

| | | |
|---|---|---|
| CN | 102459693 A | 5/2012 |
| CN | 103080197 A | 5/2013 |

(Continued)

OTHER PUBLICATIONS

Korean Office Action for Application No. 10-2017-7030749, issued Sep. 26, 2023, 13 pages.

(Continued)

*Primary Examiner* — Kelly M Gambetta
*Assistant Examiner* — Mohammad Mayy
(74) *Attorney, Agent, or Firm* — McAndrews, Held & Malloy, Ltd.

(57) ABSTRACT

A substrate is described having a treated contact surface comprising a carbon or silicon compound comprising from 1 to 30 atomic percent oxygen, from 0.1 to 30 atomic percent nitrogen, or both, each as measured by XPS. A method is also provided for treating a surface of a substrate. The method includes treating the surface with plasma comprising one or more non-polymerizing compounds. The treated contact surface has a biomolecule recovery percentage greater than the biomolecule recovery percentage of the surface prior to treatment according to the method.

20 Claims, 20 Drawing Sheets

Related U.S. Application Data application No. 15/776,728, filed as application No. PCT/US2016/037674 on Jun. 15, 2016, now Pat. No. 11,248,100, application No. 17/725,188 is a continuation-in-part of application No. 15/536,811, filed as application No. PCT/US2015/066169 on Dec. 16, 2015, now abandoned.

(60) Provisional application No. 62/257,269, filed on Nov. 19, 2015, provisional application No. 62/257,266, filed on Nov. 19, 2015, provisional application No. 62/255,555, filed on Nov. 16, 2015, provisional application No. 62/320,246, filed on Apr. 8, 2016, provisional application No. 62/093,194, filed on Dec. 17, 2014, provisional application No. 62/114,494, filed on Feb. 10, 2015, provisional application No. 62/155,090, filed on Apr. 30, 2015, provisional application No. 62/243,392, filed on Oct. 19, 2015.

(51) Int. Cl.

| | | |
|---|---|---|
| *C08J 7/04* | (2020.01) | |
| *C08J 7/048* | (2020.01) | |
| *C08J 7/056* | (2020.01) | |
| *C08J 7/06* | (2006.01) | |
| *C08J 7/12* | (2006.01) | |
| *C23C 16/50* | (2006.01) | |
| *C08J 7/18* | (2006.01) | |

(52) U.S. Cl.
CPC ............. *C08J 7/0427* (2020.01); *C08J 7/048* (2020.01); *C08J 7/056* (2020.01); *C08J 7/06* (2013.01); *C23C 16/50* (2013.01); *B01L 2300/0829* (2013.01); *B01L 2300/16* (2013.01); *C08J 7/18* (2013.01); *C08J 2300/22* (2013.01); *C08J 2323/12* (2013.01); *C08J 2325/02* (2013.01); *C08J 2471/02* (2013.01); *C08J 2483/04* (2013.01)

(56) References Cited

U.S. PATENT DOCUMENTS

| | | | |
|---|---|---|---|
| 5,147,678 A | 9/1992 | Foerch et al. | |
| 5,318,806 A * | 6/1994 | Montgomery | B29C 59/142 |
| | | | 427/491 |
| 5,344,462 A | 9/1994 | Paskalov et al. | |
| 5,376,413 A | 12/1994 | Callebert et al. | |
| 6,082,292 A | 7/2000 | Denes et al. | |
| 8,962,097 B1 * | 2/2015 | Yokley | C03C 23/006 |
| | | | 427/535 |
| 2004/0062882 A1 * | 4/2004 | Liebmann-Vinson | |
| | | | C12N 5/0068 |
| | | | 428/34.1 |
| 2006/0088666 A1 * | 4/2006 | Kobrin | B82Y 30/00 |
| | | | 427/255.6 |
| 2011/0110894 A1 | 5/2011 | Drahos et al. | |
| 2011/0116992 A1 | 5/2011 | North et al. | |
| 2012/0058635 A1 | 3/2012 | Tsuji | |
| 2013/0022752 A1 | 1/2013 | Antonakas | |
| 2013/0291632 A1 | 11/2013 | Felts et al. | |
| 2018/0334545 A1 | 11/2018 | Taha | |

FOREIGN PATENT DOCUMENTS

| | | |
|---|---|---|
| CN | 108463493 | 8/2018 |
| DE | 10066431 | 10/2013 |
| EP | 1859866 | 11/2007 |
| EP | 1892080 | 2/2008 |
| EP | 2251452 | 11/2010 |
| EP | 2572861 A1 | 3/2013 |
| JP | 59-215328 A | 12/1984 |
| JP | H05338309 | 12/1993 |
| JP | 2007231528 | 9/2007 |
| JP | 2013237812 A | 11/2013 |
| WO | 200069548 | 11/2000 |
| WO | 2010132591 | 11/2010 |
| WO | 2013041312 | 3/2013 |

OTHER PUBLICATIONS

China National Intellectual Property Administration, Notification of the First Office Action, Application No. 201680062146.6, dated Aug. 26, 2020 (19 pages).

Vandencasteele et al. "Plasma-modified Polymer Surfaces: Characterization using XPS", Journal of Electron Spectroscopy and Related Phenomena 2010, 178-179,394-408. (Year: 2010).

Steen et al. "Hydrophilic modification of polymeric membranes by low temperature H20 plasma treatment", Journal of Membrane Science 204, (2002), 341-357. (Year: 2002).

Yasuda, "Modification of Polymer Surfaces by Plasma Treatment and Plasma Polymerization"; Lee; Polymer Wear and Its Control; ACS Symposium Series; American Chemical Society; Washington, DC 1985, 89-102. (Year: 1985).

PCT, Notification of Transmittal of the International Search Report and the Written Opinion of the International Searching Authority, or the Declaration application No. PCTIUS2016/037674 dated Sep. 30, 2016 (14 pages).

Spierings et al: Water absorption and the effects of moisture on the dynamic properties of synthetic mountaineering ropes, International Journal of Impact Engineering, Pergamon, GB, vol. 34, No. 2, Nov. 17, 2006 (Nov. 17, 2006), pp. 205-215, XP005771420, ISSN: 0734-743X, DOI: 10.10161 J. IJIMPENG.2005.08.008 the whole document.

J.V. Da Maia et al: "Influence of gas and 1-12, treatment time on the surface modification of EPDM rubber treated a afterglow microwave plasmas", Applied Surface Science, vol. 285, Nov. 1, 2013 (Nov. 1, 2013), pp. 918-926, XP055300824, Amsterdam, NL ISSN: 0169-4332, DOI: 10.1016/j.apsusc.2013.09.013. the whole document.

Midwoud et al. "Comparison of Biocompatibility and Adsorption Properties of Different Plastics for Advanced Microfluidic Cell and Tissue Culture Models", Anal. Chem., 2012,84,3938-3944 (Year: 2012).

Ghasemi et al. "Ammonia Plasma Treated Polyethylene Films for Adsorption or Covalent Immobilization of Trypsin: Quantitative Correlation between X-ray Photoelectron Spectroscopy Data and Enzyme Activity", J. Phys. Chem. B, 2011,115,34,10228-10238 (Year: 2011).

Extended European Search Report for Application No. 20215505.7, dated Mar. 16, 2022, 13 pages.

Japanese Office Action for Application No. 2018-523497, dated Mar. 15, 2022, 19 pages.

* cited by examiner

POLYMERIC SURFACE HAVING REDUCED BIOMOLECULE ADHESION TO THERMOPLASTIC ARTICLES AND METHODS OF PLASMA TREATMENT

This application is a continuation-in-part of U.S. application Ser. No. 17/581,615, filed on Jan. 21, 2022, which is a continuation of U.S. application Ser. No. 15/776,728, filed on May 16, 2018 as a U.S. National Phase of International Application No. PCT/US2016/037674 filed Jun. 15, 2016, which claims priority to U.S. Provisional Patent Application Nos. 62/255,555, filed Nov. 16, 2015; 62/257,269, filed Nov. 19, 2015, 62/257,266, filed Nov. 19, 2015 and 62/320,246, filed Apr. 8, 2016, all of which are incorporated herein by reference in their entirety.

This application also claims priority to U.S. application Ser. No. 15/536,811, filed on Jun. 16, 2017 as a U.S. National Phase of International Application No. PCT/US2015/066169, filed Dec. 16, 2015, which claims priority to U.S. Provisional Patent Application Nos. 62/093,194, filed Dec. 17, 2014; 62/114,494, filed Feb. 10, 2015; 62/155,090, filed Apr. 30, 2015; and 62/243,392, filed Oct. 19, 2015, all of which are incorporated herein by reference in their entirety.

The invention relates generally to treating a surface, or surface modification of a plastic substrate, to reduce biomolecule adhesion to the surface. More particularly, the invention relates to plasma treatment or surface modification of a plastic substrate, e.g., a medical device or item of laboratory ware, using non-polymerizing compounds to reduce protein adhesion to the substrate surface. Further, the technology relates generally to a surface, or surface modification of a plastic substrate (sometimes referred to in this disclosure as a contact surface), having reduced biomolecule adhesion to the surface. More particularly, the technology relates to a plastic substrate, e.g., a medical device or item of laboratory ware, having reduced protein adhesion to the substrate surface.

BACKGROUND

In blood, biomolecule, and blood analyte testing, it is desirable to minimize biomolecule adsorption and binding to plastic ware used with these biological substances. Plastic microwell plates, chromatography vials, and other containers, as well as pipettes (sometimes spelled "pipets"), pipette tips, centrifuge tubes, microscope slides, and other types of laboratory ware (also known as labware) used to prepare and transfer samples commonly have hydrophobic surfaces and readily adsorb biomolecules such as proteins, DNA, and RNA. Surfaces of these and other types of laboratory ware components made of polymeric plastic can cause binding of the biomolecule samples. It is thus a desire to provide surfaces for plastic laboratory ware and other articles that contact biological substances, to reduce a wide range of biomolecules from adhering.

The present invention also relates to the technical field of fabrication of coated vessels for conducting chemical, biochemical, medical, and/or biological uses. These methods and systems are essential in a variety of applications including medical diagnostics, medical treatment, food and beverage testing, food and beverage packaging, environmental monitoring, manufacturing quality control, drug discovery, and scientific research.

Laboratory in vitro and analytical testing is commonly carried out on special-purpose laboratory glassware and plastic ware to contain and locate the test samples. Traditionally glassware was used, and continues to be used, but glassware is readily breakable, very expensive, prone to particulate problems, yields heavy metal extractables, and can cause aggregation of proteins and other biologics.

Some of these problems can be addressed by substituting injection molded plastic ware for glassware. In particular, plastic ware is preferred in the biologics area, such as areas of medicine, medical research, drug discovery, and scientific research, due to the large number of issues with glassware. Plastic ware addresses some of the problems with glassware, but plastic ware creates certain problems as well. It can cause non-specific binding of biomolecules to the plastic ware as well as non-specific adsorption of biomolecules to the plastic ware. Plastic ware also contains leachables, preventing the use of plastic ware or making it undesirable for many types of Laboratory in vitro and analytical testing.

In addition, pipettes, pipette tips and centrifuge tubes are other types of laboratory ware used to prepare and transfer samples and transfer reagent solutions, and again can be glassware or plastic ware. In blood, biomolecule, and blood analyte testing, it is desirable to minimize biomolecule adsorption and non-specific biomolecule binding to the plastic ware. Further, it is desirable to minimize biomolecule adsorption and non-specific binding of biomolecules to the plastic ware in in vitro and analytical testing. Plastic microwell plates, vials, and other containers, as well as pipettes, pipette tips, centrifuge tubes, and other types of laboratory ware used to prepare and transfer samples having hydrophobic surfaces readily adsorb biomolecules such as proteins, DNA, and RNA. Surfaces of these and other types of laboratory ware components made of polymeric plastic can cause non-specific binding of the samples. Surfaces of these and other types of labware components made of glass can cause particulate problems, have heavy metal extractables, and can cause aggregation of proteins and other biomolecules. Previous hydrophilic coatings, including polyethylene glycol (PEG) and zwitterion polymeric coatings have been found to provide excellent biomolecule adsorption performance. Many of these polymeric coatings are not covalently bound to the article surface and have potential to move (dissolve, disperse) into the fluid payload causing interference with assay testing and/or exposing the plastic surface to protein surface adsorption, limiting their utility. Polymeric coating that are covalently attached to the article surface would not have the potential to move (dissolve, disperse) into the fluid payload, eliminating this source of interference with assay testing. Further, covalently bound polymeric coating would prevent movement of the polymeric surface coating, thereby preventing undesired exposure of the article surface.

There is therefore a need for covalently bound polymeric coatings for the surface of plastic laboratory ware such as microwell plates, vials, other containers, pipettes, pipette tips, centrifuge tubes, and that will inhibit the adsorption of biomolecules to the surface of the plastic. Likewise, there is a need for bound polymeric coatings for the surface of plastic laboratory ware such as microwell plates, vials, other containers, pipettes, pipette tips, centrifuge tubes, and that will prevent movement of the polymeric surface coating thereby preventing undesired exposure of the plastic surface.

An important consideration in manufacturing packaging for regulated products, e.g., pharmaceuticals, is to ensure that the pharmaceutical product to be contained within a package is substantially free of contaminants. Therefore, processes for manufacturing and filling pharmaceutical packages with product, are typically performed under cleanroom conditions.

One cause of potential contamination is particulates. Particulate contamination may originate from various sources, which may be generally divided into two categories: (1) intrinsic contaminants; and (2) extrinsic contaminants. Intrinsic contaminants are product and process related particulates, for example, laser etching residues, filter media, cleanroom uniform fibers, rubber and plastic particles from filter housing, and needle shields. Extrinsic contamination comes from sources unrelated to product or process, for example, hair, skin cells, pollen, clothing fibers, salt and soil.

While filtration systems and good manufacturing practices can limit the surface and airborne particulate count in an area where containers are being manufactured or filled, these things do not always reduce particulate count on the container surfaces to acceptable levels. One particular challenge is presented by static charges of manufactured plastic containers, which tend to attract charged particles. Even if the airborne/surface particulate count is relatively low, a plastic container with a strong static charge can attract particulate contaminants and cause them to adhere to the container.

Attempted solutions to this problem include use of antistatic additives for polymers, such as ethoxylated alkylamines, ethoxylated alkyl amides, glycerol stearates, fatty acid esters, esters or ethers of polyols and sodium alkyl sulfonates. The amounts of such additives in polymers typically vary from 0.1% to 3% by weight. While these additives are somewhat effective in reducing the static charges of plastic articles that incorporate them, the additives are mobile in the polymer matrix and tend to bloom to the surface. Additives that bloom to the surface can contaminate the surface and the contents, especially liquid contents, of a container made from a polymer with such additives.

There is therefore a need for plastic articles that are treated to reduce their static charge without the use of typical antistatic additives, which may themselves be a source of contamination. Likewise, there is a need for methods of treating plastic articles to reduce their static charge without the use of typical antistatic additives. Additionally, many of these coatings require fluid phase chemistry, comprising reactants and solvents.

SUMMARY

Accordingly, in one aspect, the invention is directed to a method for treating a surface, optionally a surface of a substrate or a surface of a material. The method is carried out by treating the surface with conversion plasma of one or more non-polymerizing compounds, conditioning plasma of one or more non-polymerizing compounds, or both, to form a converted surface.

In a first more detailed embodiment, the invention is directed to a method for treating a surface of a substrate. The method includes at least two treatment steps. The first treatment step includes treating the surface with remote conditioning plasma of one or more non-polymerizing compounds. The second treatment step includes treating the surface with remote conversion plasma of water to form a converted surface. The converted surface has a biomolecule recovery percentage greater than the biomolecule recovery percentage of the surface prior to treatment according to the method.

In a second more detailed embodiment, the invention is directed to a method for treating a surface of a material. The method is carried out by treating the surface with conversion plasma of water; a volatile, polar, organic compound; a $C_1$-$C_{12}$ hydrocarbon and oxygen; a $C_1$-$C_{12}$ hydrocarbon and nitrogen; a silicon-containing gas; or a combination of two or more of these. The result is to form a converted surface.

A further aspect of the invention is a polymeric substrate consisting essentially of a contact surface and an interior portion. The contact surface includes from 1 to 30 atomic oxygen atoms, from 0 to 30 atomic % nitrogen atoms, and from 70 to 99 atomic % carbon atoms. The atomic % values are measured by x-ray photoelectron spectroscopy (XPS).

Another aspect of the invention is a method of forming the substrate of any preceding claim by providing a polymeric article having a contact surface comprising carbon and treating the contact surface. The contact surface is treated with a conversion plasma comprising water vapor and oxygen. The treatment is carried out under conditions effective to form a converted surface having a biomolecule recovery percentage greater than the biomolecule recovery percentage of the contact surface before treating the contact surface with the conversion plasma. The biomolecule recovery percentage is determined for an aqueous protein dispersion having a concentration from 0.01 nM to 1.4 nM, optionally 0.05 nM to 1.4 nM, optionally 0.1 nM to 1.4 nM, in contact with the converted surface.

Other aspects of the invention overcome the deficiencies of prior coatings and coated vessels by providing covalently bound polymeric zwitterionic monolayers or epoxy-modified zwitterion-containing copolymeric monolayers which can provide excellent inhibition of surface absorption of biomolecules and inhibition of non-specific binding of biomolecules with the surface without concern for polymer dissolution/dispersion into the fluid media. Embodiment (i) provides the reaction of a surface-bound hydroxyl group with a siloxane-functional polymer containing zwitterion functionality. Embodiment (ii) provides the reaction of a hydroxylated plastic or SiOx-coated glass surface with an epoxy-modified zwitterion-containing copolymers to assure covalent surface bonding.

The invention utilizes covalent bond formation between a hydroxylated plastic or SiOx-coated glass surface and, in Embodiment (i) a zwitterion-siloxane copolymer, resulting from condensation (water or volatile alcohol loss (e.g., surface SiOH+polymer (zwitterion-siloxane-Si(OR)x) →surface SiO→Si (polymer (zwitterion-siloxane)))+ROH or in Embodiment (ii) an epoxy-modified zwitterion-containing copolymer, resulting from functionalization of a hydroxylated plastic or SiOx-coated glass surface with a silyl amine coupling agent followed by further functionalization with a zwitterionic epoxy copolymer to form a epoxy-modified zwitterion-containing copolymeric monolayer.

The invention generally relates to a method for coating a surface of a vessel, such as laboratory ware and vessels used, e.g., for purposes of analytical chemistry, medical research, drug discovery, and scientific research (e.g., chromatography vials, microplates, pipettes, pipette tips, centrifuge test tubes, and the like), or other vessels and/or surfaces that come into contact with biomolecule containing substances such as beakers, round bottom flasks, Erlenmeyer flasks, graduated cylinders, and the like. Biomolecules may include, for example, simple biomolecules (e.g., nucleotides, amino acids, simple sugars and fatty acids), nucleic acid molecules, polynucleotides, polypeptides, polysaccharides, lipids, steroids, or a conjugate of these (e.g., a glycoprotein, a lipoprotein, a glycolipid, DNA-protein conjugate), antibodies, receptors, receptor fusion constructs, receptor fusion proteins, chimeric proteins, antibody fusion constructs, antibody fusion proteins, as well as cells, viruses, and bacteria. The preferred application of the present invention is with, for example, non-parenteral containers, although parenteral containers treated according to processes disclosed herein are also within the scope.

More particularly, the present invention relates to, for example, covalently bound (i) polymeric zwitterionic monolayers or (ii) epoxy-modified zwitterion-containing copolymeric monolayers, which have been known to show superior resistance to non-specific biomolecule, such as protein, adsorption and/or non-specific binding in the laboratory environment, where the zwitterionic deposition has been done using multiple step processes. Here, a commercially viable process offering both low cost and product performance has been developed based on the concept of the unique biomolecule, such as protein, adsorption resistance feature of covalently bound (i) polymeric zwitterionic monolayer coatings or (ii) epoxy-modified zwitterion-containing copolymeric monolayer. Covalently bound (i) polymeric zwitterionic monolayer coatings or (ii) epoxy-modified zwitterion-containing copolymeric monolayer coatings for these products improve their sample-contact characteristics, for example to adapt them for contact with biomolecule containing samples, such as protein or other peptide or polypeptide samples, to provide a surface which has, for example, non-binding or low-binding properties. For example, the present invention contemplates methods for coating surfaces of these products with a covalently bound (i) polymeric zwitterionic monolayer coatings or (ii) epoxy-modified zwitterion-containing copolymeric monolayer coating, to yield a non-specific biomolecule adsorption and/or non-specific binding resistant surface coating. These covalently bound (i) polymeric zwitterionic monolayer coatings or (ii) epoxy-modified zwitterion-containing copolymeric monolayer coatings have favorable properties when used as a coating for surfaces that come into contact with biomolecule containing samples.

Additionally, in one aspect, the invention is a method of reducing static charge of a plastic container. The invention utilizes the reaction of a (i) surface-bound hydroxyl group or (ii) hydroxylated plastic or SiOx-coated glass surface with a siloxane-functional polymer containing zwitterion functionality to provide covalently bound (i) polymeric zwitterionic monolayer coatings or (ii) epoxy-modified zwitterion-containing copolymeric monolayers which can provide excellent biomolecule adsorption inhibition and non-specific biomolecule surface binding inhibition without concern for polymer dissolution/dispersion into the fluid media. The coating reduces static charge of the container compared to a reference container that is essentially identical to the container except that the reference container is uncoated.

The invention utilizes sequential reactions.

In Embodiment (i), these sequential reactions involve (1) utilizing a hydroxy-modified or an SiOx plasma-modified surface followed by (2) forming a zwitterion-siloxane copolymer, resulting from condensation (water or volatile alcohol loss (e.g. surface SiOH+polymer (zwitterion-siloxane-Si (OR)x)→surface SiO—Si (polymer (zwitterion-siloxane)))+ROH. In certain embodiments, a hydroxyl-functional surface can be (A) formed, e.g., from O2/plasma reaction onto a carbon-based polymer surface (AC), forming C—OH moieties, or onto a silicon-based (SiO2 or silicone) surface (ASi), forming Si—OH moieties. Additionally, hydroxyl-functional surfaces can be (B) inherent to the nascent surface, e.g., polymers such as polyvinyl alcohol (PVOH) or silicon-based polymer surfaces (SiO2 or silicones). Thus the O2/plasma surface preparation method can be optional if inherent hydroxyl moieties are present on the surface.

In Embodiment (ii) these sequential reactions involve (1) forming a hydroxy-modified or an SiOx plasma-modified surface followed by (2) forming an amine modified surface by reacting the hydroxy-modified or an SiOx plasma-modified surface with a silyl amine coupling agent followed by (3) forming an amine linked by condensation of the amine modified surface with an epoxy-modified zwitterion-containing copolymer.

The coating may be both polymeric and hydrophilic (binds water to ionic moieties) providing a durable steric and bound-water barrier to biomolecule adsorption and non-specific biomolecule binding onto plastic surfaces.

While the zwitterionic layers may be thinner than preformed polymeric zwitterionic coatings, solvent coating methods, thru evaporation, can cause non-uniform coatings, resulting in (a) optically observable nonuniformities, (b) wasted coating (more coating thickness than required/desired), and the inventive materials should provide good biomolecule adsorption and/or binding inhibition.

A non-exhaustive list of patents of possible relevance includes U.S. Pat. Nos. 6,068,884 and 4,844,986 and U.S. Published Applications 20060046006, 20040267194, 20140004022, and 20130209766.

All references cited herein are incorporated herein by reference in their entireties.

The invention provides a method for providing a non-specific biomolecule adsorption and/or binding resistant coated surface which exhibits low- or non-binding of biomolecules and/or low or non-adsorption of biomolecules.

Embodiment (i) of the method comprises the steps of: (a) providing a substrate in a reaction chamber; (b) drawing a vacuum in the reaction chamber; (c) providing a gas comprising O2 in the vicinity of the substrate surface; (d) generating a plasma from the gas, thus forming a hydroxyl functional substrate surface, and optionally heating the substrate; (e) providing a copolymer solution comprising a solvent and at least one zwitterionic copolymer, wherein the at least one zwitterionic copolymer comprises at least one siloxane moiety and at least one zwitterion moiety; (f) reacting the hydroxyl functional surface with the at least one zwitterionic copolymer and optionally heating the substrate; (g) optionally waiting; (h) removing the copolymer solution, and optionally drying the non-specific biomolecule adsorption and/or non-specific binding resistant coated surface, optionally heating the surface, thus forming a non-specific biomolecule adsorption and/or non-specific binding resistant coated surface.

Embodiment (ii) of the method comprises the steps of (a) providing a substrate in a reaction chamber; (b) drawing a vacuum in the reaction chamber; (c) providing a gas comprising O2, optionally containing argon, optionally containing nitrogen in the vicinity of the substrate surface; (d) generating a plasma from the gas, thus forming a prepared substrate surface, and optionally heating the substrate; (e) providing a vapor comprising at least one silyl amine coupling agent to provide an amine modified substrate; (f) providing a copolymer solution comprising a solvent, wherein the copolymer comprises at least one copolymerizable zwitterionic monomer and at least one copolymerizable epoxy monomer, optionally in the presence of a polymerization initiator; (g) reacting the copolymer with the amine modified substrate and optionally heating the substrate; (h) optionally waiting; (i) removing the copolymer, and optionally drying the non-specific biomolecule adsorption and/or non-specific binding resistant coated surface, optionally heating the surface, thus forming a non-specific biomolecule adsorption and/or non-specific binding resistant coated surface.

Either embodiment (i) or (ii) provides a method for providing a non-specific biomolecule adsorption and/or non-specific binding resistant coated surface which exhibits low- or non-binding of biomolecules and/or low or non-adsorption of biomolecules.

Embodiment (i) comprises the steps of: (a) providing a substrate in a reaction chamber; (b) drawing a vacuum in the reaction chamber; (c) providing a gas comprising an organosilicon precursor and optionally O2 in the vicinity of the substrate surface; (d) generating a plasma from the gas, thus forming a thus forming a hydroxyl functional substrate surface; (e) providing a copolymer solution comprising a solvent and at least one zwitterionic copolymer, wherein the at least one zwitterionic copolymer comprises at least one siloxane moiety and at least one zwitterion moiety; (f) reacting the hydroxyl functional surface with the at least one zwitterionic copolymer and optionally heating the substrate; (g) optionally waiting; (h) removing the copolymer solution, and optionally drying the non-specific biomolecule adsorption and/or binding resistant coated surface, optionally heating the surface, thus forming a non-specific biomolecule adsorption and/or binding resistant coated surface.

Embodiment (ii) comprises the steps of: (a) providing a substrate that is a SiOx-coated glass surface reaction chamber; (b) drawing a vacuum in the reaction chamber; (c) providing a gas comprising O2, optionally containing argon, optionally containing nitrogen in the vicinity of the substrate surface; (d) generating a plasma from the gas, thus forming a prepared substrate surface, and optionally heating the substrate; (e) providing a vapor comprising at least one silyl amine coupling agent to provide an amine modified substrate; (f) providing a copolymer solution comprising a solvent, wherein the copolymer comprises at least one copolymerizable zwitterionic monomer and at least one copolymerizable epoxy monomer, optionally in the presence of a polymerization initiator; (g) reacting the copolymer with the amine modified substrate and optionally heating the substrate; (h) removing the copolymer solution, (i) optionally drying the non-specific biomolecule adsorption and/or non-specific binding resistant coated surface, and (j) optionally heating the surface, thus forming a non-specific biomolecule adsorption and/or binding resistant coated surface.

Embodiment (i) provides a method for providing a non-specific biomolecule adsorption and/or non-specific binding resistant coated surface which exhibits low- or non-binding of biomolecules and/or low or non-adsorption of biomolecules, the method comprising the steps: (a) providing a substrate with a hydroxyl functional surface; (b) providing a copolymer solution comprising a solvent and at least one zwitterionic copolymer, wherein the at least one zwitterionic copolymer comprises at least one siloxane moiety and at least one zwitterion moiety; (c) reacting the hydroxyl functional surface with the at least one zwitterionic copolymer and optionally heating the substrate; (d) optionally waiting; (e) removing the copolymer solution, and optionally drying the non-specific biomolecule adsorption and/or binding resistant coated surface, optionally heating the surface, thus forming a non-specific biomolecule adsorption and/or binding resistant coated surface.

Embodiment (i) provides a method wherein the zwitterionic copolymer binds covalently to the prepared substrate surface.

Embodiment (ii) provides a method wherein the at least one silyl amine coupling agent is selected from the group consisting of 3-Aminopropyltriethoxysilane, 3-Aminopropyltrimethoxysilane, 4-Aminobutyltriethoxysilane, M-Aminophenyltrimethoxysilane, P-Aminophenyltrimethoxysilane, O-Aminophenyltrimethoxysilane, 3-Aminopropyltris(Methoxyethoxyethoxy)Silane, 11-Aminoundecyltriethoxysilane, 3-(M-Aminophenoxy)Propyltrimethoxysilane, Aminopropylsilanetriol, 3-Aminopropylmethyldiethoxysilane, 3-Aminopropyldiisopropylethoxysilane, 3-Aminopropyldimethylethoxysilane, N-(2-Aminoethyl)-3-Aminopropyltrimethoxysilane, N-[3-(Trimethoxysilyl)Propyl]Ethylenediamine, N-(2-Aminoethyl)-3-Aminopropyltriethoxysilane, N-(6-Aminohexyl)Aminomethyltriethoxysilane, N-(6-Aminohexyl)Aminopropyltrimethoxysilane, N-(2-Aminoethyl)-11-Aminoundecyltrimethoxysilane, (Aminoethylaminomethyl)Phenethyltrimethoxysilane, N-3-[(Amino(Polypropylenoxy)], Aminopropyltrimethoxysilane, N-(2-Aminoethyl)-3-Aminopropylsilanetriol, N-(2-Aminoethyl)-3-Aminopropylmethyldimethoxysilane, N-(2-Aminoethyl)-3-Aminoisobutylmethyldimethoxysilane, (Aminoethylamino)-3-Isobutyldimethylmethoxysilane, (3-Trimethoxysilylpropyl)Diethylenetriamine, N-Butylaminopropyltrimethoxysilane, N-Ethylaminoisobutyltrimethoxysilane, N-Methylaminopropyltrimethoxysilane, N-Phenylaminopropyltrimethoxysilane, 3-(N-Allylamino)Propyltrimethoxysilane, (Cyclohexylaminomethyl)Triethoxysilane, N-Cyclohexylaminopropyltrimethoxysilane, N-Ethylaminoisobutylmethyldiethoxysilane, (Phenylaminomethyl)Methyldimethoxysilane, N-Phenylaminomethyltriethoxysilane, N-Methylaminopropylmethyldimethoxysilane, Bis(2-Hydroxyethyl)-3-Aminopropyltriethoxysilane, 3-(N-Styrylmethyl-2-Aminoethylamino)-Propyltrimethoxysilane Hydrochloride, (2-N-Benzylaminoethyl)-3-Aminopropyl-Trimethoxysilane, Bis(Triethoxysilylpropyl)Amine, Bis(Trimethoxysilylpropyl)Amine, Bis[(3-Trimethoxysilyl)Propyl]-Ethylenediamine, Bis[(3-Trimethoxysilyl)Propyl]-Ethylenediamine, Bis(Methyldiethoxysilylpropyl)Amine, N-Allyl-Aza-2,2-Dimethoxysila-Cyclopentane, N-Aminoethyl-Aza-2,2,4-Trimethyl-Silacyclopentane, N-(3-Aminopropyldimethylsila)Aza-2,2-Dimethyl-2-Silacyclopentane, N-N-Butyl-Aza-2,2-Dimethoxysila-Cyclopentane, 2,2-Dimethoxy-1,6-Diaza-2-Silacyclo-Octane, N-Methyl-Aza-2,2,4-Trimethylsila-Cylcopentane, 1-(N-(N',N'-dimethylaminoethyl))-1-aza-2,2,4-trimethyl-2-silacyclopentane and combinations thereof.

Embodiment (ii) provides a method wherein the at least one copolymerizable zwitterionic monomer is selected from the group consisting of 2-(meth)acryloyloxyethyl-2'-(trimethylammonio)ethyl phosphate (including MPC), 2-(methacryloxy)ethyl 2-(diimethylammonio)ethyl phosphate (aka=2-methacryloyloxyethyl phosphorylcholine; 2-(methacryloxy)ethyl-2-(dimethylammonio)ethylcarboxylate; 2-(methacryloxy)ethyl-2-(dimethylammonio)propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio)ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio)ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio)ethyl phosphate, 2-(allyloxycarbonylamino)ethyl-2'-(trimethylammonio) ethyl phosphate, 2-(butyroyloxy)ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl) fumarate, butyl-(2'-trimethylammonioethylphosphorylethyl) fumarate, hydroxyethyl-(2'-trimethylammonioethylphosphorylethyl) fumarate, 2-hydroxyethyl(meth)acrylate, 2-hydroxypropyl (meth)acrylate; polyalkylene glycol(meth)acrylate monomers diethylene glycol mono(meth)acrylate, polyethylene glycol mono(meth)acrylate, polypropylene glycol mono (meth)acrylate, methoxydiethylene glycol(meth)acrylate, methoxypolyethylene glycol(meth)acrylate, methoxypolypropylene glycol(meth)acrylate; ω-carboxy(meth)acrylates, phthalic acid monohydroxyethyl(meth)acrylate, hexahydrophthalic acid monohydroxyethyl(meth)acrylate, ω-carboxy-polycaprolactone (n=2 to 5) mono(meth)acrylate, (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl (meth)acrylate, diethylaminoethyl(meth)acrylate, maleic anhydride, and glyco-2-hydroxyethyl monomethacrylate (GEMA), D-carboxyethyl-3,3-dimethyammoniummethylmethacrylate and sulfopropyl-3,3-dimethyammoniumethylmethacrylate, and combinations thereof.

Embodiment (ii) provides a method wherein the at least one copolymerizable epoxy monomer is selected from the group consisting of glycidyl acrylate, glycidyl methacrylate (GMA), (E)-(oxiran-2-yl)methyl but-2-enoate, (3,3-dimethyloxiran-2-yl)methyl methacrylate, (E)-(oxiran-2-yl)methyl cinnamate, (oxiran-2-yl)methyl 2-methylenebutanoate, 1-(oxiran-2-yl)propyl acrylate, 1-(oxiran-2-yl)ethyl methacrylate, (oxiran-2-yl)methyl 3-methyl-2-methylenebutanoate, (oxiran-2-yl)methyl 2-methylenepentanoate, (3-methyloxiran-2-yl)methyl acrylate, 2-(oxiran-2-yl)propan-2-yl acrylate, (oxiran-2-yl)methyl 2-methylenehexanoate, (3-methyloxiran-2-yl)methyl methacrylate, and (3,3-dimethyloxiran-2-yl)methyl acrylate and combinations thereof.

Embodiment (ii) provides a method wherein the epoxy-modified zwitterionic copolymer binds covalently to the amine modified substrate.

In either embodiment (i) or (ii), the solvent is selected from the group consisting of water, methanol, ethanol, isopropanol, tetrahydrofuran, 1,4-dioxane, 1,2-dimethoxyethane, N,N-dimethylformamide, dimethylsulfoxide, methylene chloride, 1,2-dicholorethane and combinations thereof.

Either embodiment (i) or (ii) provides a method wherein the non-specific biomolecule adsorption and/or non-specific binding resistant coated surface has decreased binding of biomolecules compared to a non-treated substrate.

Either embodiment (i) or (ii) provides a method wherein the biomolecule is selected from the group consisting of nucleotides, amino acids, sugars, fatty acids, nucleic acid molecules, polypeptides, polynucleotides, polysaccharides, lipids, steroids, glycoproteins, lipoproteins, glycolipids, DNA, DNA-protein conjugates, RNA, RNA-conjugates, antibodies, and receptors, receptor fusion constructs, receptor fusion proteins, chimeric proteins, antibody fusion constructs, and antibody fusion proteins.

Either embodiment (i) or (ii) provides a method wherein the substrate is a surface of a vessel.

Either embodiment (i) or (ii) provides a method wherein the vessel is selected from the group consisting of a microplate; a centrifuge tube; a pipette tip; a cuvette, a microwell plate; an ELISA plate; a microtiter plate; a 96-well plate; a 384-well plate; a 1536-well plate; a round bottom flask; and an Erlenmeyer flask.

Embodiment (i) provides, as one alternative, a non-specific biomolecule adsorption and/or non-specific binding resistant coated substrate made by: (a) providing a substrate in a reaction chamber; (b) drawing a vacuum in the reaction chamber; (c) providing a gas comprising an organosilicon precursor and optionally O2 in the vicinity of the substrate surface; (d) generating a plasma from the gas, thus forming a hydroxyl functional substrate surface; (e) providing a copolymer solution comprising a solvent and at least one zwitterionic copolymer, wherein the at least one zwitterionic copolymer comprises at least one siloxane moiety and at least one zwitterion moiety; (f) reacting the hydroxyl functional surface with the at least one zwitterionic copolymer and optionally heating the substrate; (g), optionally waiting; (h) removing the copolymer solution, and optionally drying the non-specific biomolecule adsorption and/or binding resistant coated surface, optionally heating the surface, thus forming a non-specific biomolecule adsorption and/or binding resistant coated substrate.

Embodiment (i) further provides, as another alternative, a non-specific biomolecule adsorption and/or non-specific binding resistant coated substrate made by: (a) providing a substrate with a hydroxyl functional surface; (b) providing a copolymer solution comprising a solvent and at least one zwitterionic copolymer, wherein the at least one zwitterionic copolymer comprises two or more monomers, comprising at least one siloxane moiety and at least one zwitterion moiety; (c) reacting the hydroxyl functional surface with the at least one zwitterionic copolymer and optionally heating the substrate; (d) optionally waiting; (e) removing the copolymer solution, and optionally drying the non-specific biomolecule adsorption and/or binding resistant coated surface, optionally heating the surface, thus forming a non-specific biomolecule adsorption and/or binding resistant coated substrate.

Embodiment (ii) provides a non-specific biomolecule adsorption and/or non-specific binding resistant coated substrate made by: (a) providing a substrate in a reaction chamber; (b) drawing a vacuum in the reaction chamber; (c) providing a gas comprising O2 optionally containing argon, optionally containing nitrogen in the vicinity of the substrate surface; (d) generating a plasma from the gas, thus forming a prepared substrate surface, and optionally heating the substrate; (e) providing a vapor comprising at least one silyl amine coupling agent to provide an amine modified substrate; (f) providing a copolymer solution comprising a solvent, wherein the copolymer comprises at least one copolymerizable zwitterionic monomer and at least one copolymerizable epoxy monomer, optionally in the presence of a polymerization initiator; (g) reacting the copolymer with the amine modified substrate and optionally heating the substrate; removing the copolymer solution, and optionally drying the non-specific biomolecule adsorption and/or binding resistant coated surface, optionally heating the surface, thus forming a non-specific biomolecule adsorption and/or binding resistant coated substrate.

Embodiment (i) provides a non-specific biomolecule adsorption and/or binding resistant coated substrate wherein the non-specific biomolecule adsorption and/or binding resistant coating has decreased binding of biomolecules compared to a non-treated substrate. The biomolecule is selected from the group consisting of nucleotides, amino acids, sugars, fatty acids, nucleic acid molecules, polypeptides, polynucleotides, polysaccharides, lipids, steroids, glycoproteins, lipoproteins, glycolipids, DNA, DNA-protein conjugates, RNA, RNA-conjugates, antibodies, and receptors, receptor fusion constructs, receptor fusion proteins, chimeric proteins, antibody fusion constructs, and antibody fusion proteins.

Embodiment (ii) provides a non-specific biomolecule adsorption and/or non-specific binding resistant coated substrate made by: (a) providing a substrate that is a SiOx-coated glass surface reaction chamber; (b) drawing a vacuum in the reaction chamber; (c) providing a gas comprising O2, optionally containing argon, optionally containing nitrogen in the vicinity of the substrate surface; (d) generating a plasma from the gas, thus forming a prepared substrate surface, and optionally heating the substrate; (e) providing a vapor comprising at least one silyl amine coupling agent to provide an amine modified substrate; (f) providing a copolymer solution comprising a solvent, wherein the copolymer comprises at least one copolymerizable zwitterionic monomer and at least one copolymerizable epoxy monomer, optionally in the presence of a polymerization initiator; (g) reacting the copolymer with the amine modified substrate and optionally heating the substrate; (h) optionally waiting; (i) removing the copolymer solution, and optionally drying the non-specific biomolecule adsorption and/or non-specific binding resistant coated surface, optionally heating the surface, thus forming a non-specific biomolecule adsorption and/or binding resistant coated substrate.

In Embodiment (ii), the at least one silyl amine coupling agent is selected from the group consisting of 3-Aminopropyltriethoxysilane, 3-Aminopropyltrimethoxysilane, 4-Aminobutyltriethoxysilane, M-Aminophenyltrimethoxysilane, P-Aminophenyltrimethoxysilane, O-Aminophenyltrimethoxysilane, 3-Aminopropyltris(Methoxyethoxyethoxy)Silane, 11-Aminoundecyltriethoxysilane, 3-(M-Aminophenoxy)Propyltrimethoxysilane, Aminopropylsilanetriol, 3-Aminopropylmethyldiethoxysilane, 3-Aminopropyldiisopropylethoxysilane, 3-Aminopropyldimethylethoxysilane, N-(2-Aminoethyl)-3-Aminopropyltrimethoxysilane, N-[3-(Trimethoxysilyl)Propyl]Ethylenediamine, N-(2-Aminoethyl)-3-Aminopropyltriethoxysilane, N-(6-Aminohexyl) Aminomethyltriethoxysilane, N-(6-Aminohexyl) Aminopropyltrimethoxysilane, N-(2-Aminoethyl)-11-Aminoundecyltrimethoxysilane, (Aminoethylaminomethyl) Phenethyltrimethoxysilane, N-3-[(Amino(Polypropylenoxy)], Aminopropyltrimethoxysilane, N-(2-Aminoethyl)-3-Aminopropylsilanetriol, N-(2-Aminoethyl)-3-Aminopropylmethyldimethoxysilane, N-(2-Aminoethyl)-3-Aminoisobutylmethyldimethoxysilane, (Aminoethylamino)-3-Isobutyldimethylmethoxysilane, (3-Trimethoxysilylpropyl)Diethylenetriamine, N-Butylaminopropyltrimethoxysilane, N-Ethylaminoisobutyltrimethoxysilane, N-Methylaminopropyltrimethoxysilane, N-Phenylaminopropyltrimethoxysilane, 3-(N-Allylamino) Propyltrimethoxysilane, (Cyclohexylaminomethyl) Triethoxysilane, N-Cyclohexylaminopropyltrimethoxysilane, N-Ethylaminoisobutylmethyldiethoxysilane, (Phenylaminomethyl) Methyldimethoxysilane, N-Phenylaminomethyltriethoxysilane, N-Methylaminopropylmethyldimethoxysilane, Bis(2-Hydroxyethyl)-3-Aminopropyltriethoxysilane, 3-(N-Styrylmethyl-2-Aminoethylamino)-Propyltrimethoxysilane Hydrochloride, (2-N-Benzylaminoethyl)-3-Aminopropyl-Trimethoxysilane, Bis(Triethoxysilylpropyl)Amine, Bis(Trimethoxysilylpropyl)Amine, Bis[(3-Trimethoxysilyl)Propyl]-Ethylenediamine, Bis[(3-Trimethoxysilyl)Propyl]-Ethylenediamine, Bis(Methyldiethoxysilylpropyl)Amine, N-Allyl-Aza-2,2-Dimethoxysila-Cyclopentane, N-Aminoethyl-Aza-2,2,4-Trimethyl-Silacyclopentane, N-(3-Aminopropyldimethylsila)Aza-2,2-Dimethyl-2-Silacyclopentane, N-N-Butyl-Aza-2,2-Dimethoxysila-Cyclopentane, 2,2-Dimethoxy-1,6-Diaza-2-Silacyclo-Octane, N-Methyl-Aza-2,2,4-Trimethylsila-Cylcopentane, 1-(N-(N',N'-dimethylaminoethyl))-1-aza-2,2,4-trimethyl-2-silacyclopentane and combinations thereof.

Embodiment (ii) provides a non-specific biomolecule adsorption and/or non-specific binding resistant coated substrate wherein the at least one copolymerizable zwitterionic monomer is selected from the group consisting of 2-(meth)acryloyloxyethyl-2'-(trimethylammonio)ethyl phosphate (including MPC), 2-(methacryloxy)ethyl 2-(diimethylammonio)ethyl phosphate (aka=2-methacryloyloxyethyl phosphorylcholine; 2-(methacryloxy)ethyl-2-(dimethylammonio)ethylcarboxylate; 2-(methacryloxy)ethyl-2-(dimethylammonio)propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio) ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio)ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-

(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio)ethyl phosphate, 2-(allyloxycarbonylamino)ethyl-2'-(trimethylammonio) ethyl phosphate, 2-(butyroyloxy)ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl)fumarate, butyl-(2'-trimethylammonioethylphosphorylethyl) fumarate, hydroxyethyl-(2'-trimethylammonioethylphosphorylethyl) fumarate, 2-hydroxyethyl(meth)acrylate, 2-hydroxypropyl (meth)acrylate; polyalkylene glycol(meth)acrylate monomers diethylene glycol mono(meth)acrylate, polyethylene glycol mono(meth)acrylate, polypropylene glycol mono(meth)acrylate, methoxydiethylene glycol(meth)acrylate, methoxypolyethylene glycol(meth)acrylate, methoxypolypropylene glycol(meth)acrylate; ω-carboxy(meth)acrylates, phthalic acid monohydroxyethyl(meth)acrylate, hexahydrophthalic acid monohydroxyethyl(meth)acrylate, ω-carboxy-polycaprolactone (n=2 to 5) mono(meth)acrylate, (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl (meth)acrylate, diethylaminoethyl(meth)acrylate, maleic anhydride, and glyco-2-hydroxyethyl monomethacrylate (GEMA), b-carboxyethyl-3,3-dimethyammoniumethylmethacylate and sulfopropyl-3,3-dimethyammoniumethylmethacylate, and combinations thereof.

Embodiment (i) provides a non-specific biomolecule adsorption and/or non-specific binding resistant coated substrate made by: (a) providing a substrate with a hydroxyl functional surface; (b) providing a copolymer solution comprising a solvent and at least one zwitterionic copolymer, wherein the at least one zwitterionic copolymer comprises two or more monomers, comprising at least one siloxane moiety and at least one zwitterion moiety; (c) reacting the hydroxyl functional surface with the at least one zwitterionic copolymer and optionally heating the substrate; (d), optionally waiting; (e) removing the copolymer solution, and optionally drying the non-specific biomolecule adsorption and/or binding resistant coated surface, optionally heating the surface, thus forming a non-specific biomolecule adsorption and/or binding resistant coated substrate.

Embodiment (i) provides a non-specific biomolecule adsorption and/or non-specific binding resistant coated substrate wherein the zwitterionic copolymer binds covalently to the prepared substrate surface The at least one copolymerizable epoxy monomer of Embodiment (ii) is selected from the group consisting of glycidyl acrylate, glycidyl methacrylate (GMA), (E)-(oxiran-2-yl)methyl but-2-enoate, (3,3-dimethyloxiran-2-yl) methyl methacrylate, (E)-(oxiran-2-yl)methyl cinnamate, (oxiran-2-yl)methyl 2-methylenebutanoate, 1-(oxiran-2-yl) propyl acrylate, 1-(oxiran-2-yl)ethyl methacrylate, (oxiran-2-yl)methyl 3-methyl-2-methylenebutanoate, (oxiran-2-yl) methyl 2-methylenepentanoate, (3-methyloxiran-2-yl) methyl acrylate, 2-(oxiran-2-yl)propan-2-yl acrylate, (oxiran-2-yl)methyl 2-methylenehexanoate, (3-methyloxiran-2-yl)methyl methacrylate, and (3,3-dimethyloxiran-2-yl)methyl acrylate and combinations thereof.

Either embodiment (i) or (ii) provides a non-specific biomolecule adsorption and/or binding resistant coated substrate wherein the non-specific biomolecule adsorption and/or binding resistant coating has decreased binding of biomolecules compared to a non-treated substrate.

Either embodiment (i) or (ii) provides a non-specific biomolecule adsorption and/or binding resistant coated substrate wherein the biomolecule is selected from the group consisting of nucleotides, amino acids, sugars, fatty acids, nucleic acid molecules, polypeptides, polynucleotides, polysaccharides, lipids, steroids, glycoproteins, lipoproteins, glycolipids, DNA, DNA-protein conjugates, RNA, RNA-conjugates, antibodies, and receptors, receptor fusion constructs, receptor fusion proteins, chimeric proteins, antibody fusion constructs, and antibody fusion proteins.

The invention provides a non-specific biomolecule adsorption and/or non-specific binding resistant coated substrate wherein the substrate is a surface of a vessel.

The invention provides a non-specific biomolecule adsorption and/or non-specific binding resistant coated substrate wherein the vessels is selected from the group consisting of a microplate; a centrifuge tube; a pipette tip; a cuvette, a microwell plate; an ELISA plate; a microtiter plate; a 96-well plate; and a 384-well plate.

Embodiment (i) in one alternative provides a vessel having an interior surface coated at least in part with a non-specific biomolecule adsorption and/or binding resistant coating made by: (a) providing a substrate in a reaction chamber; (b) drawing a vacuum in the reaction chamber; (c) providing a gas comprising O2 in the vicinity of the substrate surface; (d) generating a plasma from the gas, thus forming a hydroxyl functional substrate surface, and optionally heating the substrate; (e) providing a copolymer solution comprising a solvent and at least one zwitterionic copolymer, wherein the at least one zwitterionic copolymer comprises two or more monomers, comprising at least one siloxane moiety and at least one zwitterion moiety; (f) reacting the hydroxyl functional surface with the at least one zwitterionic copolymer and optionally heating the substrate; (g) optionally waiting; (h) removing the copolymer solution, and optionally drying the non-specific biomolecule adsorption and/or binding resistant coated surface, optionally heating the surface, thus forming a non-specific biomolecule adsorption and/or binding resistant coated vessel.

Embodiment (i) in another alternative provides a vessel having an interior surface coated at least in part with a non-specific biomolecule adsorption and/or binding resistant coating made by: (a) providing a substrate a hydroxyl functional surface; (b) providing a copolymer solution comprising a solvent and at least one zwitterionic copolymer, wherein the at least one zwitterionic copolymer comprises two or more monomers, comprising at least one siloxane moiety and at least one zwitterion moiety; (c) reacting the hydroxyl functional surface with the at least one zwitterionic copolymer and optionally heating the substrate; (c) optionally waiting; (d) removing the copolymer solution, and optionally drying the non-specific biomolecule adsorption and/or binding resistant coated surface, optionally heating the surface, thus forming a non-specific biomolecule adsorption and/or binding resistant coated vessel.

Embodiment (ii) provides a vessel having an interior surface coated at least in part with a non-specific biomolecule adsorption and/or binding resistant coating made by: (a) providing a substrate in a reaction chamber; (b) drawing a vacuum in the reaction chamber; (c) providing a gas comprising O2, optionally containing argon, optionally containing nitrogen in the vicinity of the substrate surface; (d) generating a plasma from the gas, thus forming a prepared substrate surface, and optionally heating the substrate; (e) providing a vapor comprising at least one silyl amine coupling agent to provide an amine modified substrate; (f) providing a copolymer solution comprising a solvent, wherein the copolymer comprises at least one copolymerizable zwitterionic monomer and at least one copolymerizable epoxy monomer, optionally in the presence of a polymerization initiator; (g) reacting the copolymer with the amine modified substrate and optionally heating the substrate; (h) optionally waiting; (i) removing the copolymer solution, and optionally drying the non-specific biomolecule adsorption and/or non-specific binding resistant coated surface, optionally heating the surface, thus forming a non-specific biomolecule adsorption and/or binding resistant coated vessel.

Embodiment (i) provides a vessel having an interior surface coated at least in part with a non-specific biomolecule adsorption and/or binding resistant coating made by: (a) providing a substrate in a reaction chamber; (b) drawing a vacuum in the reaction chamber; (c) providing a gas comprising an organosilicon precursor and optionally O2 in the vicinity of the substrate surface; (d) generating a plasma from the gas, thus forming a hydroxyl functional surface on the substrate surface; (e) providing a copolymer solution comprising a solvent and at least one zwitterionic copolymer, wherein the at least one zwitterionic copolymer comprises two or more monomers, comprising at least one siloxane moiety and at least one zwitterion moiety; (f) reacting the hydroxyl functional surface with the at least one zwitterionic copolymer and optionally heating the substrate; (g) optionally waiting; (h) removing the copolymer solution, and optionally drying the non-specific biomolecule adsorption and/or binding resistant coated surface, optionally heating the surface, thus forming a non-specific biomolecule adsorption and/or binding resistant coated vessel.

Embodiment (ii) provides a vessel having an interior surface coated at least in part with a non-specific biomolecule adsorption and/or binding resistant coating made by: (a) providing a substrate in a that is a SiOx-coated glass surface reaction chamber; (b) drawing a vacuum in the reaction chamber; (c) providing a gas comprising O2, optionally containing argon, optionally containing nitrogen in the vicinity of the substrate surface; (d) generating a plasma from the gas, thus forming a prepared substrate surface, and optionally heating the substrate; (e) providing a vapor comprising at least one silyl amine coupling agent to provide an amine modified substrate; (f) providing a copolymer solution comprising a solvent, wherein the copolymer comprises at least one copolymerizable zwitterionic monomer and at least one copolymerizable epoxy monomer, optionally in the presence of a polymerization initiator; (g) reacting the copolymer with the amine modified substrate and optionally heating the substrate; (h) optionally waiting; (i) removing the copolymer solution, and optionally drying the non-specific biomolecule adsorption and/or non-specific binding resistant coated surface, optionally heating the surface, thus forming a non-specific biomolecule adsorption and/or binding resistant coated vessel.

Embodiment (i) provides a vessel having an interior surface coated at least in part with a non-specific biomolecule adsorption and/or binding resistant coating made by: (a) providing a substrate a hydroxyl functional surface; (b) providing a copolymer solution comprising a solvent and at least one zwitterionic copolymer, wherein the at least one zwitterionic copolymer comprises two or more monomers, comprising at least one siloxane moiety and at least one zwitterion moiety; (c) reacting the hydroxyl functional surface with the at least one zwitterionic copolymer and optionally heating the substrate; (c) optionally waiting; (d) removing the copolymer solution, and optionally drying the non-specific biomolecule adsorption and/or binding resistant coated surface, optionally heating the surface, thus forming a non-specific biomolecule adsorption and/or binding resistant coated vessel.

Embodiment (i) alternatively provides a vessel having an interior surface coated at least in part with a non-specific biomolecule adsorption and/or binding resistant coating made by: (a) providing a substrate a hydroxyl functional surface; (b) providing a copolymer solution comprising a solvent and at least one zwitterionic copolymer, wherein the at least one zwitterionic copolymer comprises two or more monomers, comprising at least one siloxane moiety and at least one zwitterion moiety; (c) reacting the hydroxyl functional surface with the at least one zwitterionic copolymer and optionally heating the substrate; (c) optionally waiting; (d) removing the copolymer solution, and optionally drying the non-specific biomolecule adsorption and/or binding resistant coated surface, optionally heating the surface, thus forming a non-specific biomolecule adsorption and/or binding resistant coated vessel.

The invention provides a non-specific biomolecule adsorption and/or non-specific binding resistant coated vessel wherein the zwitterionic copolymer binds covalently to the prepared substrate surface.

Embodiment (ii) provides a non-specific biomolecule adsorption and/or binding resistant coated vessel wherein the at least one silyl amine coupling agent is selected from the group consisting of 3-Aminopropyltriethoxysilane, 3-Aminopropyltrimethoxysilane, 4-Aminobutyltriethoxysilane, M-Aminophenyltrimethoxysilane, P-Aminophenyltrimethoxysilane, O-Aminophenyltrimethoxysilane, 3-Aminopropyltris(Methoxyethoxyethoxy)Silane, 11-Aminoundecyltriethoxysilane, 3-(M-Aminophenoxy) Propyltrimethoxysilane, Aminopropylsilanetriol, 3-Aminopropylmethyldiethoxysilane, 3-Aminopropyldiisopropylethoxysilane, 3-Aminopropyldimethylethoxysilane, N-(2-Aminoethyl)-3-Aminopropyltrimethoxysilane, N-[3-(Trimethoxysilyl)Propyl]Ethylenediamine, N-(2-Aminoethyl)-3-Aminopropyltriethoxysilane, N-(6-Aminohexyl)Aminomethyltriethoxysilane, N-(6-Aminohexyl)Aminopropyltrimethoxysilane, N-(2-Aminoethyl)-11-Aminoundecyltrimethoxysilane, (Aminoethylaminomethyl)Phenethyltrimethoxysilane, N-3-[(Amino(Polypropylenoxy)], Aminopropyltrimethoxysilane, N-(2-Aminoethyl)-3-Aminopropylsilanetriol, N-(2-Aminoethyl)-3-Aminopropylmethyldimethoxysilane, N-(2-Aminoethyl)-3-Aminoisobutylmethyldimethoxysilane, (Aminoethylamino)-3-Isobutyldimethylmethoxysilane, (3-Trimethoxysilylpropyl) Diethylenetriamine, N-Butylaminopropyltrimethoxysilane, N-Ethylaminoisobutyltrimethoxysilane, N-Methylaminopropyltrimethoxysilane, N-Phenylaminopropyltrimethoxysilane, 3-(N-Allylamino) Propyltrimethoxysilane, (Cyclohexylaminomethyl) Triethoxysilane, N-Cyclohexylaminopropyltrimethoxysilane, N-Ethylaminoisobutylmethyldiethoxysilane, (Phenylaminomethyl) Methyldimethoxysilane, N-Phenylaminomethyltriethoxysilane, N-Methylaminopropylmethyldimethoxysilane, Bis(2-Hydroxyethyl)-3-Aminopropyltriethoxysilane, 3-(N-Styrylmethyl-2-Aminoethylamino)-Propyltrimethoxysilane Hydrochloride, (2-N-Benzylaminoethyl)-3-Aminopropyl-Trimethoxysilane, Bis(Triethoxysilylpropyl)Amine, Bis(Trimethoxysilylpropyl)Amine, Bis[(3-Trimethoxysilyl)Propyl]-Ethylenediamine, Bis [(3-Trimethoxysilyl) Propyl]-Ethylenediamine, Bis(Methyldiethoxysilylpropyl)Amine, N-Allyl-Aza-2,2-Dimethoxysila-Cyclopentane, N-Aminoethyl-Aza-2,2,4-Trimethyl-Silacyclopentane, N-(3-Aminopropyldimethylsila)Aza-2,2-Dimethyl-2-Silacyclopentane, N-N-Butyl-Aza-2,2-Dimethoxysila-Cyclopentane, 2,2-Dimethoxy-1,6-Diaza-2-Silacyclo-Octane, N-Methyl-Aza-2,2,4-Trimethylsila-Cylcopentane, 1-(N-(N',N'-dimethylaminoethyl))-1-aza-2,2,4-trimethyl-2-silacyclopentane and combinations thereof.

Embodiment (ii) provides a non-specific biomolecule adsorption and/or non-specific binding resistant coated vessel wherein the at least one copolymerizable zwitterionic monomer is selected from the group consisting of 2-(meth)acryloyloxyethyl-2'-(trimethylammonio)ethyl phosphate (including MPC), 2-(methacryloxy)ethyl 2-(diimethylammonio)ethyl phosphate (aka=2-methacryloyloxyethyl phosphorylcholine; (methacryloxy)ethyl-2-(dimethylammonio) ethylcarboxylate; 2-(methacryloxy)ethyl-2-(dimethylammonio)propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio)ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio)ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio)ethyl phosphate, 2-(allyloxycarbonylamino)ethyl-2'-(trimethylammonio) ethyl phosphate, 2-(butyroyloxy)ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl) fumarate, butyl-(2'-trimethylammonioethylphosphorylethyl) fumarate, hydroxyethyl-(2'-trimethylammonioethylphosphorylethyl) fumarate, 2-hydroxyethyl(meth)acrylate, 2-hydroxypropyl(meth)acrylate; polyalkylene glycol(meth)acrylate monomers diethylene glycol mono(meth)acrylate, polyethylene glycol mono(meth)acrylate, polypropylene glycol mono(meth)acrylate, methoxydiethylene glycol(meth)acrylate, methoxypolyethylene glycol(meth)acrylate, methoxypolypropylene glycol(meth)acrylate; ω-carboxy(meth)acrylates, phthalic acid monohydroxyethyl(meth)acrylate, hexahydrophthalic acid monohydroxyethyl(meth)acrylate, ω-carboxy-polycaprolactone (n=2 to 5) mono(meth)acrylate, (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl(meth)acrylate, diethylaminoethyl(meth)acrylate, maleic anhydride, and glyco-2-hydroxyethyl monomethacrylate (GEMA), b-carboxyethyl-3,3-dimethyammoniumethylmethacylate and sulfopropyl-3,3-dimethyammoniumethylmethacylate, and combinations thereof.

Embodiment (ii) provides a non-specific biomolecule adsorption and/or binding resistant coated vessel wherein the at least one copolymerizable epoxy monomer is selected from the group consisting of glycidyl acrylate, glycidyl methacrylate (GMA), (E)-(oxiran-2-yl)methyl but-2-enoate, (3,3-dimethyloxiran-2-yl)methyl methacrylate, (E)-(oxiran-2-yl)methyl cinnamate, (oxiran-2-yl)methyl 2-methylenebutanoate, 1-(oxiran-2-yl)propyl acrylate, 1-(oxiran-2-yl)ethyl methacrylate, (oxiran-2-yl)methyl 3-methyl-2-methylenebutanoate, (oxiran-2-yl)methyl 2-methylenepentanoate, (3-methyloxiran-2-yl)methyl acrylate, 2-(oxiran-2-yl)propan-2-yl acrylate, (oxiran-2-yl)methyl 2-methylenehexanoate, (3-methyloxiran-2-yl)methyl methacrylate, and (3,3-dimethyloxiran-2-yl)methyl acrylate and combinations thereof.

Either embodiment (i) or (ii) provides a non-specific biomolecule adsorption and/or binding resistant coated vessel wherein the non-specific biomolecule adsorption and/or binding resistant coating has decreased binding of biomolecules compared to a non-treated substrate.

Either embodiment (i) or (ii) provides a non-specific biomolecule adsorption and/or binding resistant coated vessel wherein the biomolecule is selected from the group consisting of nucleotides, amino acids, sugars, fatty acids, nucleic acid molecules, polypeptides, polynucleotides, polysaccharides, lipids, steroids, glycoproteins, lipoproteins, glycolipids, DNA, DNA-protein conjugates, RNA, RNA-conjugates, antibodies, and receptors, receptor fusion constructs, receptor fusion proteins, chimeric proteins, antibody fusion constructs, and antibody fusion proteins.

Either embodiment (i) or (ii) provides a non-specific biomolecule adsorption and/or non-specific binding resistant coated vessel wherein the vessel is selected from the group consisting of a microplate; a centrifuge tube; a pipette tip; a cuvette, a microwell plate; an ELISA plate; a microtiter plate; a 96-well plate; and a 384-well plate; a 1536-well plate; a round bottom flask; and an Erlenmeyer flask.

Embodiment (i) provides that the zwitterionic copolymer comprises at least one siloxane moiety selected from the group consisting of (3-acryloxypropyl) trimethoxysilane; methacryloxypropyltrimethoxysilane; n-(3-acryloxy-2-hydroxypropyl)-3-aminopropyl triethoxysilane; o-(methacryloxyethyl)-n-(triethoxysilylpropyl) urethane; n-(3-methacryloxy-2-hydroxypropyl)-3-aminopropyltriethoxysilane;

methacryloxymethyltriethoxysilane; methacryloxymethyl trimethoxysilane; methacryloxypropyl triethoxysilane; (3-acryloxypropyl)methyl-dimethoxy silane; (methacryloxymethyl) methyl-diethoxysilane; (methacryloxymethyl) methyl-dimethoxysilane; Methacryloxypropylmethyl diethoxysilane; methacryloxypropylmethyl dimethoxysilane; Methacryloxypropyl dimethylethoxysilane; methacryloxypropyldimethyl methoxysilane, and combinations thereof; and at least one zwitterion moiety selected from the group consisting of 2-(meth)acryloyloxyethyl-2'-(trimethylammonio)ethyl phosphate (including MPC), 2-(methacryloxy)ethyl 2-(diimethylammonio)ethyl phosphate (aka=2-methacryloyloxyethyl phosphorylcholine; 2-(methacryloxy)ethyl-2-(dimethylammonio)ethylcarboxylate; 2-(methacryloxy)ethyl-2-(dimethylammonio)propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio)ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio)ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio)ethyl phosphate, 2-(allyloxycarbonylamino)ethyl-2'-(trimethylammonio) ethyl phosphate, 2-(butyroyloxy)ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl)fumarate, butyl-(2'-trimethylammonioethylphosphorylethyl)fumarate, hydroxyethyl-(2'-trimethylammonioethylphosphorylethyl)fumarate, 2-hydroxyethyl(meth)acrylate, 2-hydroxypropyl (meth)acrylate; polyalkylene glycol(meth)acrylate monomers diethylene glycol mono(meth)acrylate, polyethylene glycol mono(meth)acrylate, polypropylene glycol mono (meth)acrylate, methoxydiethylene glycol(meth)acrylate, methoxypolyethylene glycol(meth)acrylate, methoxypolypropylene glycol(meth)acrylate; ω-carboxy(meth)acrylates, phthalic acid monohydroxyethyl(meth)acrylate, hexahydrophthalic acid monohydroxyethyl(meth)acrylate, .omega.-carboxy-polycaprolactone (n=2 to 5) mono(meth) acrylate, (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl(meth)acrylate, diethylaminoethyl(meth)acrylate, maleic anhydride, and glyco-2-hydroxyethyl monomethacrylate (GEMA), □-carboxyethyl-3,3-dimethyammoniumethylmethacylate and sulfopropyl-3,3-dimethyammoniumethylmethacylate, and combinations thereof.

A method is described according to Embodiment (i) for providing a non-specific biomolecule adsorption and/or binding resistant coated surface which exhibits low- or non-binding of biomolecules and/or low or non-adsorption of biomolecules, the method comprising the steps:

(a) providing a substrate in a reaction chamber;

(b) drawing a vacuum in the reaction chamber;

(c) providing a gas comprising $O_2$ in the vicinity of the substrate surface;

(d) generating a plasma from the gas, thus forming a hydroxyl functional substrate surface, and optionally heating the substrate;

(e) providing a copolymer solution comprising a solvent and at least one zwitterionic copolymer, wherein the at least one zwitterionic copolymer comprises at least one siloxane moiety and at least one zwitterion moiety;

(f) reacting the hydroxyl functional surface with the at least one zwitterionic copolymer and optionally heating the substrate;

(g) optionally waiting;

(h) removing the copolymer solution, and optionally drying the non-specific biomolecule adsorption and/or non-specific binding resistant coated surface, optionally heating the surface, thus forming a non-specific biomolecule adsorption and/or non-specific binding resistant coated surface.

Optionally in Embodiment (i) the method comprising the steps:

(a) providing a substrate in a reaction chamber;

(b) drawing a vacuum in the reaction chamber;

(c) providing a gas comprising an organosilicon precursor and optionally $O_2$ in the vicinity of the substrate surface;

(d) generating a plasma from the gas, thus forming a thus forming a hydroxyl functional substrate surface;

(e) providing a copolymer solution comprising a solvent and at least one zwitterionic copolymer, wherein the at least one zwitterionic copolymer comprises at least one siloxane moiety and at least one zwitterion moiety;

(f) reacting the hydroxyl functional surface with the at least one zwitterionic copolymer and optionally heating the substrate;

(g) optionally waiting;

(h) removing the copolymer solution, and optionally drying the non-specific biomolecule adsorption and/or binding resistant coated surface, optionally heating the surface, thus forming a non-specific biomolecule adsorption and/ or binding resistant coated surface.

Optionally in Embodiment (i), the method comprising the steps:
(a) providing a substrate with a hydroxyl functional surface;
(b) providing a copolymer solution comprising a solvent and at least one zwitterionic copolymer, wherein the at least one zwitterionic copolymer comprises at least one siloxane moiety and at least one zwitterion moiety;
(c) reacting the hydroxyl functional surface with the at least one zwitterionic copolymer and optionally heating the substrate;
(d) optionally waiting;
(e) removing the copolymer solution, and optionally drying the non-specific biomolecule adsorption and/or non-specific binding resistant coated surface, optionally heating the surface,
thus forming a non-specific biomolecule adsorption and/or non-specific binding resistant coated surface.

Optionally in Embodiment (i), the method comprising the steps:
(a) providing a substrate with a hydroxyl functional surface;
(b) providing a copolymer solution comprising a solvent and at least one zwitterionic copolymer, wherein the at least one zwitterionic copolymer comprises at least one siloxane moiety and at least one zwitterion moiety;
(c) reacting the hydroxyl functional surface with the at least one zwitterionic copolymer and optionally heating the substrate;
(d) optionally waiting;
(e) removing the copolymer solution, and optionally drying the non-specific biomolecule adsorption and/or binding resistant coated surface, optionally heating the surface,
thus forming a non-specific biomolecule adsorption and/or binding resistant coated surface.

Optionally in Embodiment (i), the zwitterionic copolymer comprises at least one siloxane moiety selected from the group consisting of (3-acryloxypropyl) trimethoxysilane; methacryloxypropyltrimethoxysilane; n-(3-acryloxy-2-hydroxypropyl)-3-aminopropyl triethoxysilane; o-(methacryloxyethyl)-n-(triethoxysilylpropyl) urethane; n-(3-methacryloxy-2-hydroxypropyl)-3-aminopropyltriethoxysilane; methacryloxymethyltriethoxysilane; methacryloxymethyl trimethoxysilane; methacryloxypropyl triethoxysilane; (3-acryloxypropyl)methyl-dimethoxy silane; (methacryloxymethyl) methyl-diethoxysilane; (methacryloxymethyl) methyl-dimethoxysilane; Methacryloxypropylmethyl diethoxysilane; methacryloxypropylmethyl dimethoxysilane; Methacryloxypropyl dimethylethoxysilane; methacryloxypropyldimethyl methoxysilane, and combinations thereof; and
at least one zwitterion moiety selected from the group consisting of 2-(meth)acryloyloxyethyl-2'-(trimethylammonio)ethyl phosphate (including MPC), 2-(methacryloxy)ethyl 2-(diimethylammonio)ethyl phosphate (aka=2-methacryloyloxyethyl phosphorylcholine; 2-(methacryloxy)ethyl-2-(dimethylammonio)ethylcarboxylate; 2-(methacryloxy)ethyl-2-(dimethylammonio)propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio)ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio) ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio) ethyl phosphate, 2-(allyloxycarbonylamino)ethyl-2'-(trimethylammonio)ethyl phosphate, 2-(butyroyloxy)ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl)fumarate, butyl-(2'-trimethylammonioethylphosphorylethyl)fumarate, hydroxyethyl-(2'-trimethylammonioethylphosphorylethyl)fumarate, 2-hydroxyethyl(meth)acrylate, 2-hydroxypropyl(meth)acrylate; polyalkylene glycol(meth)acrylate monomers diethylene glycol mono(meth)acrylate, polyethylene glycol mono(meth)acrylate, polypropylene glycol mono(meth)acrylate, methoxydiethylene glycol(meth)acrylate, methoxypolyethylene glycol(meth)acrylate, methoxypolypropylene glycol(meth)acrylate; ω-carboxy(meth)acrylates, phthalic acid monohydroxyethyl (meth)acrylate, hexahydrophthalic acid monohydroxyethyl(meth)acrylate, .omega.-carboxypolycaprolactone (n=2 to 5) mono(meth)acrylate, (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl(meth)acrylate, diethylaminoethyl (meth)acrylate, maleic anhydride, and glyco-2-hydroxyethyl monomethacrylate (GEMA), β-carboxyethyl-3,3-dimethyammoniumethylmethacylate and sulfopropyl-3,3-dimethyammoniumethylmethacylate, and combinations thereof.

Optionally in Embodiment (i), the zwitterionic copolymer binds covalently to the prepared substrate surface.

Optionally in Embodiment (i), the solvent is selected from the group consisting of water, methanol, ethanol, isopropanol, tetrahydrofuran, 1,4-dioxane, 1,2-dimethoxyethane, N,N-dimethylformamide, dimethylsulfoxide, methylene chloride, 1,2-dicholorethane and combinations thereof.

Optionally in Embodiment (i), the non-specific biomolecule adsorption and/or non-specific binding resistant coated surface has decreased binding of biomolecules compared to a non-treated substrate.

Optionally in Embodiment (i), the biomolecule is selected from the group consisting of nucleotides, amino acids, sugars, fatty acids, nucleic acid molecules, polypeptides, polynucleotides, polysaccharides, lipids, steroids, glycoproteins, lipoproteins, glycolipids, DNA, DNA-protein conjugates, RNA, RNA-conjugates, antibodies, and receptors, receptor fusion constructs, receptor fusion proteins, chimeric proteins, antibody fusion constructs, and antibody fusion proteins.

Optionally in Embodiment (i), the substrate is a surface of a vessel.

Optionally in Embodiment (i), the vessel is selected from the group consisting of a microplate; a centrifuge tube; a pipette tip; a cuvette, a microwell plate; an ELISA plate; a microtiter plate; a 96-well plate; a 384-well plate; a 1536-well plate; a round bottom flask; and an Erlenmeyer flask.

Optionally in Embodiment (i), a non-specific biomolecule adsorption and/or non-specific binding resistant coated substrate made by:
(a) providing a substrate in a reaction chamber;
(b) drawing a vacuum in the reaction chamber;
(c) providing a gas comprising $O_2$ in the vicinity of the substrate surface;
(d) generating a plasma from the gas, thus forming a hydroxyl functional substrate surface, and optionally heating the substrate;
(e) providing a copolymer solution comprising a solvent and at least one zwitterionic copolymer, wherein the at least one zwitterionic copolymer comprises at least one siloxane moiety and at least one zwitterion moiety;
(f) reacting the hydroxyl functional surface with the at least one zwitterionic copolymer and optionally heating the substrate;
(g) optionally waiting;
(h) removing the copolymer solution, and optionally drying the non-specific biomolecule adsorption and/or binding resistant coated surface, optionally heating the surface,
thus forming a non-specific biomolecule adsorption and/or binding resistant coated substrate.

Optionally in Embodiment (i), the substrate made by:
(a) providing a substrate in a reaction chamber;
(b) drawing a vacuum in the reaction chamber;
(c) providing a gas comprising an organosilicon precursor and optionally $O_2$ in the vicinity of the substrate surface;
(d) generating a plasma from the gas, thus forming a hydroxyl functional substrate surface;
(e) providing a copolymer solution comprising a solvent and at least one zwitterionic copolymer, wherein the at least one zwitterionic copolymer comprises at least one siloxane moiety and at least one zwitterion moiety;
(f) reacting the hydroxyl functional surface with the at least one zwitterionic copolymer and optionally heating the substrate;
(g), optionally waiting;
(h) removing the copolymer solution, and optionally drying the non-specific biomolecule adsorption and/or binding resistant coated surface, optionally heating the surface,
thus forming a non-specific biomolecule adsorption and/or binding resistant coated substrate.

Optionally in Embodiment (i), the substrate made by:
(a) providing a substrate with a hydroxyl functional surface;
(b) providing a copolymer solution comprising a solvent and at least one zwitterionic copolymer, wherein the at least one zwitterionic copolymer comprises two or more monomers, comprising at least one siloxane moiety and at least one zwitterion moiety;
(c) reacting the hydroxyl functional surface with the at least one zwitterionic copolymer and optionally heating the substrate;
(d) optionally waiting;
(e) removing the copolymer solution, and optionally drying the non-specific biomolecule adsorption and/or binding resistant coated surface, optionally heating the surface,
thus forming a non-specific biomolecule adsorption and/or binding resistant coated substrate.

Optionally in Embodiment (i), the substrate made by:
(a) providing a substrate with a hydroxyl functional surface;
(b) providing a copolymer solution comprising a solvent and at least one zwitterionic copolymer, wherein the at least one zwitterionic copolymer comprises two or more monomers, comprising at least one siloxane moiety and at least one zwitterion moiety;
(c) reacting the hydroxyl functional surface with the at least one zwitterionic copolymer and optionally heating the substrate;
(d), optionally waiting;
(e) removing the copolymer solution, and optionally drying the non-specific biomolecule adsorption and/or binding resistant coated surface, optionally heating the surface,
thus forming a non-specific biomolecule adsorption and/or binding resistant coated substrate.

Optionally in Embodiment (i), the zwitterionic copolymer comprises at least one siloxane moiety selected from the group consisting of (3-acryloxypropyl) trimethoxysilane; methacryloxypropyltrimethoxysilane; n-(3-acryloxy-2-hydroxypropyl)-3-aminopropyl triethoxysilane; o-(methacryloxyethyl)-n-(triethoxysilylpropyl) urethane; n-(3-methacryloxy-2-hydroxypropyl)-3-aminopropyltriethoxysilane; methacryloxymethyltriethoxysilane; methacryloxymethyl trimethoxysilane; methacryloxypropyl triethoxysilane; (3-acryloxypropyl)methyl-dimethoxy silane; (methacryloxymethyl) methyl-diethoxysilane; (methacryloxymethyl) methyl-dimethoxysilane; Methacryloxypropylmethyl diethoxysilane; methacryloxypropylmethyl dimethoxysilane; Methacryloxypropyl dimethylethoxysilane; methacryloxypropyldimethyl methoxysilane, and combinations thereof; and
at least one zwitterion moiety selected from the group consisting of 2-(meth)acryloyloxyethyl-2'-(trimethylammonio)ethyl phosphate (including MPC), 2-(methacryloxy)ethyl 2-(diimethylammonio)ethyl phosphate (aka=2-methacryloyloxyethyl phosphorylcholine; 2-(methacryloxy)ethyl-2-(dimethylammonio)ethylcarboxylate; 2-(methacryloxy)ethyl-2-(dimethylammonio)propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio)ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio) ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio) ethyl phosphate, 2-(allyloxycarbonylamino)ethyl-2'-(trimethylammonio)ethyl phosphate, 2-(butyroyloxy) ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl)fumarate, butyl-(2'-trimethylammonioethylphosphorylethyl)fumarate, hydroxyethyl-(2'-trimethylammonioethylphosphorylethyl)fumarate, 2-hydroxyethyl(meth)acrylate, 2-hydroxypropyl(meth) acrylate; polyalkylene glycol(meth)acrylate monomers diethylene glycol mono(meth)acrylate, polyethylene glycol mono(meth)acrylate, polypropylene glycol mono(meth)acrylate, methoxydiethylene glycol(meth) acrylate, methoxypolyethylene glycol(meth)acrylate, methoxypolypropylene glycol(meth)acrylate; ω-carboxy(meth)acrylates, phthalic acid monohydroxyethyl (meth)acrylate, hexahydrophthalic acid monohydroxyethyl(meth)acrylate, .omega.-carboxypolycaprolactone (n=2 to 5) mono(meth)acrylate, (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl(meth)acrylate, diethylaminoethyl (meth)acrylate, maleic anhydride, and glyco-2-hydroxyethyl monomethacrylate (GEMA), β-carboxyethyl-3,3-dimethyammoniumethylmethacylate and sulfopropyl-3,3-dimethyammoniumethylmethacylate, and combinations thereof.

Optionally in Embodiment (i), the zwitterionic copolymer binds covalently to the prepared substrate surface.

Optionally in Embodiment (i), the non-specific biomolecule adsorption and/or binding resistant coating has decreased binding of biomolecules compared to a non-treated substrate.

Optionally in Embodiment (i), the biomolecule is selected from the group consisting of nucleotides, amino acids, sugars, fatty acids, nucleic acid molecules, polypeptides, polynucleotides, polysaccharides, lipids, steroids, glycoproteins, lipoproteins, glycolipids, DNA, DNA-protein conjugates, RNA, RNA-conjugates, antibodies, and receptors, receptor fusion constructs, receptor fusion proteins, chimeric proteins, antibody fusion constructs, and antibody fusion proteins.

Optionally in Embodiment (i), the substrate is a surface of a vessel.

Optionally in Embodiment (i), the vessel is selected from the group consisting of a microplate; a centrifuge tube; a pipette tip; a cuvette, a microwell plate; an ELISA plate; a microtiter plate; a 96-well plate; and a 384-well plate.

Optionally in Embodiment (i), a vessel having an interior surface coated at least in part with a non-specific biomolecule adsorption and/or binding resistant coating made by:
(a) providing a substrate in a reaction chamber;
(b) drawing a vacuum in the reaction chamber;
(c) providing a gas comprising O2 in the vicinity of the substrate surface;
(d) generating a plasma from the gas, thus forming a hydroxyl functional substrate surface, and optionally heating the substrate;
(e) providing a copolymer solution comprising a solvent and at least one zwitterionic copolymer, wherein the at least one zwitterionic copolymer comprises two or more monomers, comprising at least one siloxane moiety and at least one zwitterion moiety;
(f) reacting the hydroxyl functional surface with the at least one zwitterionic copolymer and optionally heating the substrate;
(g) optionally waiting;
(h) removing the copolymer solution, and optionally drying the non-specific biomolecule adsorption and/or binding resistant coated surface, optionally heating the surface,
thus forming a non-specific biomolecule adsorption and/or binding resistant coated vessel.

Optionally in Embodiment (i), the non-specific biomolecule adsorption and/or binding resistant coating made by:
(a) providing a substrate in a reaction chamber;
(b) drawing a vacuum in the reaction chamber;
(c) providing a gas comprising an organosilicon precursor and optionally $O_2$ in the vicinity of the substrate surface;
(d) generating a plasma from the gas, thus forming a hydroxyl functional surface on the substrate surface;
(e) providing a copolymer solution comprising a solvent and at least one zwitterionic copolymer, wherein the at least one zwitterionic copolymer comprises two or more monomers, comprising at least one siloxane moiety and at least one zwitterion moiety;
(f) reacting the hydroxyl functional surface with the at least one zwitterionic copolymer and optionally heating the substrate;
(g) optionally waiting;
(h) removing the copolymer solution, and optionally drying the non-specific biomolecule adsorption and/or binding resistant coated surface, optionally heating the surface,
thus forming a non-specific biomolecule adsorption and/or binding resistant coated vessel.

Optionally in Embodiment (i), a non-specific biomolecule adsorption and/or binding resistant coating made by:
(a) providing a substrate a hydroxyl functional surface;
(b) providing a copolymer solution comprising a solvent and at least one zwitterionic copolymer, wherein the at least one zwitterionic copolymer comprises two or more monomers, comprising at least one siloxane moiety and at least one zwitterion moiety;
(c) reacting the hydroxyl functional surface with the at least one zwitterionic copolymer and optionally heating the substrate;
(c) optionally waiting;
(d) removing the copolymer solution, and optionally drying the non-specific biomolecule adsorption and/or binding resistant coated surface, optionally heating the surface,
thus forming a non-specific biomolecule adsorption and/or binding resistant coated vessel.

Optionally in Embodiment (i), a non-specific biomolecule adsorption and/or binding resistant coating made by:
(a) providing a substrate a hydroxyl functional surface;
(b) providing a copolymer solution comprising a solvent and at least one zwitterionic copolymer, wherein the at least one zwitterionic copolymer comprises two or more monomers, comprising at least one siloxane moiety and at least one zwitterion moiety
(c) reacting the hydroxyl functional surface with the at least one zwitterionic copolymer and optionally heating the substrate;
(c) optionally waiting;
(d) removing the copolymer solution, and optionally drying the non-specific biomolecule adsorption and/or binding resistant coated surface, optionally heating the surface,
thus forming a non-specific biomolecule adsorption and/or binding resistant coated vessel.

Optionally in Embodiment (i), the zwitterionic copolymer comprises at least one siloxane moiety selected from the group consisting of (3-acryloxypropyl) trimethoxysilane; methacryloxypropyltrimethoxysilane; n-(3-acryloxy-2-hydroxypropyl)-3-aminopropyl triethoxysilane; o-(methacryloxyethyl)-n-(triethoxysilylpropyl) urethane; n-(3-methacryloxy-2-hydroxypropyl)-3-aminopropyltriethoxysilane; methacryloxymethyltriethoxysilane; methacryloxymethyl trimethoxysilane; methacryloxypropyl triethoxysilane; (3-acryloxypropyl)methyl-dimethoxy silane; (methacryloxymethyl) methyl-diethoxysilane; (methacryloxymethyl) methyl-dimethoxysilane; Methacryloxypropylmethyl diethoxysilane; methacryloxypropylmethyl dimethoxysilane; Methacryloxypropyl dimethylethoxysilane; methacryloxypropyldimethyl methoxysilane, and combinations thereof; and
at least one zwitterion moiety selected from the group consisting of 2-(meth)acryloyloxyethyl-2'-(trimethylammonio)ethyl phosphate (including MPC), 2-(methacryloxy)ethyl 2-(diimethylammonio)ethyl phosphate (aka=2-methacryloyloxyethyl phosphorylcholine; 2-(methacryloxy)ethyl-2-(dimethylammonio)ethylcarboxylate; 2-(methacryloxy)ethyl-2-(dimethylammonio)propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio)ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio) ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio) ethyl phosphate, 2-(allyloxycarbonylamino)ethyl-2'-(trimethylammonio)ethyl phosphate, 2-(butyroyloxy)ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl)fumarate, butyl-(2'-trimethylammonioethylphosphorylethyl)fumarate, hydroxyethyl-(2'-trimethylammonioethylphosphorylethyl)fumarate, 2-hydroxyethyl(meth)acrylate, 2-hydroxypropyl(meth)acrylate; polyalkylene glycol(meth)acrylate monomers diethylene glycol mono(meth)acrylate, polyethylene glycol mono(meth)acrylate, polypropylene glycol mono(meth)acrylate, methoxydiethylene glycol(meth)acrylate, methoxypolyethylene glycol(meth)acrylate, methoxypolypropylene glycol(meth)acrylate; ω-carboxy(meth)acrylates, phthalic acid monohydroxyethyl (meth)acrylate, hexahydrophthalic acid monohydroxyethyl(meth)acrylate, .omega.-carboxypolycaprolactone (n=2 to 5) mono(meth)acrylate, (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl(meth)acrylate, diethylaminoethyl (meth)acrylate, maleic anhydride, and glyco-2-hydroxyethyl monomethacrylate (GEMA), β-carboxyethyl-3,3-dimethyammoniumethylmethacylate and sulfopropyl-3,3-dimethyammoniumethylmethacylate, and combinations thereof.

Optionally in Embodiment (i), the zwitterionic copolymer binds covalently to the prepared substrate surface.

Optionally in Embodiment (i), the non-specific biomolecule adsorption and/or binding resistant coating has decreased binding of biomolecules compared to a non-treated substrate.

Optionally in Embodiment (i), the biomolecule is selected from the group consisting of nucleotides, amino acids, sugars, fatty acids, nucleic acid molecules, polypeptides, polynucleotides, polysaccharides, lipids, steroids, glycoproteins, lipoproteins, glycolipids, DNA, DNA-protein conjugates, RNA, RNA-conjugates, antibodies, and receptors, receptor fusion constructs, receptor fusion proteins, chimeric proteins, antibody fusion constructs, and antibody fusion proteins.

Optionally in Embodiment (i), the vessel is selected from the group consisting of a microplate; a centrifuge tube; a pipette tip; a cuvette, a microwell plate; an ELISA plate; a microtiter plate; a 96-well plate; and a 384-well plate; a 1536-well plate; a round bottom flask; and an Erlenmeyer flask.

Embodiment (ii)

A method is described according to Embodiment (ii) for providing a non-specific biomolecule adsorption and/or binding resistant coated surface which exhibits low- or non-binding of biomolecules and/or low or non-adsorption of biomolecules, the method comprising the steps:
(a) providing a substrate in a reaction chamber;
(b) drawing a vacuum in the reaction chamber;
(c) providing a gas comprising $O_2$, optionally containing argon, optionally containing nitrogen in the vicinity of the substrate surface;
(d) generating a plasma from the gas, thus forming a prepared substrate surface, and optionally heating the substrate;
(e) providing a vapor comprising at least one silyl amine coupling agent to provide an amine modified substrate;
(f) providing a copolymer solution comprising a solvent, wherein the copolymer comprises at least one copolymerizable zwitterionic monomer and at least one copolymerizable epoxy monomer, optionally in the presence of a polymerization initiator;
(g) reacting the copolymer with the amine modified substrate and optionally heating the substrate;
(h) optionally waiting;
(i) removing the copolymer, and optionally drying the non-specific biomolecule adsorption and/or non-specific binding resistant coated surface, optionally heating the surface,
thus forming a non-specific biomolecule adsorption and/or non-specific binding resistant coated surface.

The method of Embodiment (ii) comprising the steps:
(a) providing a substrate in a that is a SiOx-coated glass surface reaction chamber; (b) drawing a vacuum in the reaction chamber;
(c) providing a gas comprising $O_2$, optionally containing argon, optionally containing nitrogen in the vicinity of the substrate surface;
(d) generating a plasma from the gas, thus forming a prepared substrate surface, and optionally heating the substrate;
(e) providing a vapor comprising at least one silyl amine coupling agent to provide an amine modified substrate;
(f) providing a copolymer solution comprising a solvent, wherein the copolymer comprises at least one copolymerizable zwitterionic monomer and at least one copolymerizable epoxy monomer, optionally in the presence of a polymerization initiator;
(g) reacting the copolymer with the amine modified substrate and optionally heating the substrate;
(h) optionally waiting;
(i) removing the copolymer solution, and optionally drying the non-specific biomolecule adsorption and/or non-specific binding resistant coated surface, optionally heating the surface,
thus forming a non-specific biomolecule adsorption and/or binding resistant coated surface.

The method of Embodiment (ii) wherein the at least one silyl amine coupling agent is selected from the group consisting of 3-Aminopropyltriethoxysilane, 3-Aminopropyltrimethoxysilane, 4-Aminobutyltriethoxysilane, M-Aminophenyltrimethoxysilane, P-Aminophenyltrimethoxysilane, O-Aminophenyltrimethoxysilane, 3-Aminopropyltris(Methoxyethoxyethoxy)Silane, 11-Aminoundecyltriethoxysilane, 3-(M-Aminophenoxy)Propyltrimethoxysilane, Aminopropylsilanetriol, 3-Aminopropylmethyldiethoxysilane, 3-Aminopropyldiisopropylethoxysilane, 3-Aminopropyldimethylethoxysilane, N-(2-Aminoethyl)-3-Aminopropyltrimethoxysilane, N-[3-(Trimethoxysilyl)Propyl]Ethylenediamine, N-(2-Aminoethyl)-3-Aminopropyltriethoxysilane, N-(6-Aminohexyl)Aminomethyltriethoxysilane, N-(6-Aminohexyl)Aminopropyltrimethoxysilane, N-(2-Aminoethyl)-11-Aminoundecyltrimethoxysilane, (Aminoethylaminomethyl)Phenethyltrimethoxysilane, N-3-[(Amino(Polypropylenoxy)], Aminopropyltrimethoxysilane, N-(2-Aminoethyl)-3-Aminopropylsilanetriol, N-(2-Aminoethyl)-3-Aminopropylmethyldimethoxysilane, N-(2-Aminoethyl)-3-Aminoisobutylmethyldimethoxysilane, (Aminoethylamino)-3-Isobutyldimethylmethoxysilane, (3-Trimethoxysilylpropyl)Diethylenetriamine, N-Butylaminopropyltrimethoxysilane, N-Ethylaminoisobutyltrimethoxysilane, N-Methylaminopropyltrimethoxysilane, N-Phenylaminopropyltrimethoxysilane, 3-(N-Allylamino)Propyltrimethoxysilane, (Cyclohexylaminomethyl)Triethoxysilane, N-Cyclohexylaminopropyltrimethoxysilane, N-Ethylaminoisobutylmethyldiethoxysilane, (Phenylaminomethyl)Methyldimethoxysilane, N-Phenylaminomethyltriethoxysilane, N-Methylaminopropylmethyldimethoxysilane, Bis(2-Hydroxyethyl)-3-Aminopropyltriethoxysilane, 3-(N-Styrylmethyl-2-Aminoethylamino)-Propyltrimethoxysilane Hydrochloride, (2-N-Benzylaminoethyl)-3-Aminopropyl-Trimethoxysilane, Bis(Triethoxysilylpropyl)Amine, Bis(Trimethoxysilylpropyl)Amine, Bis[(3-Trimethoxysilyl)Propyl]-Ethylenediamine, Bis[(3-Trimethoxysilyl)Propyl]-Ethylenediamine, Bis(Methyldiethoxysilylpropyl)Amine, N-Allyl-Aza-2,2-Dimethoxysila-Cyclopentane, N-Aminoethyl-Aza-2,2,4-Trimethyl-Silacyclopentane, N-(3-Aminopropyldimethylsila)Aza-2,2-Dimethyl-2-Silacyclopentane, N-N-Butyl-Aza-2,2-Dimethoxysila-Cyclopentane, 2,2-Dimethoxy-1,6-Diaza-2-Silacyclo-Octane, N-Methyl-Aza-2,2,4-Trimethylsila-Cylcopentane, 1-(N-(N',N'-dimethylaminoethyl))-1-aza-2,2,4-trimethyl-2-silacyclopentane and combinations thereof.

The method of Embodiment (ii) wherein the at least one copolymerizable zwitterionic monomer is selected from the group consisting of 2-(meth)acryloyloxyethyl-2'-(trimethylammonio)ethyl phosphate (including MPC), 2-(methacryloxy)ethyl 2-(diimethylammonio)ethyl phosphate (aka=2-methacryloyloxyethyl phosphorylcholine; 2-(methacryloxy)ethyl-2-(dimethylammonio)ethylcarboxylate; 2-(methacryloxy)ethyl-2-(dimethylammonio)propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio)ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio)ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio)ethyl phosphate, 2-(allyloxycarbonylamino)ethyl-2'-(trimethylammonio) ethyl phosphate, 2-(butyroyloxy)ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl)fumarate, butyl-(2'-trimethylammonioethylphosphorylethyl)fumarate, hydroxyethyl-(2'-trimethylammonioethylphosphorylethyl) fumarate, 2-hydroxyethyl(meth)acrylate, 2-hydroxypropyl (meth)acrylate; polyalkylene glycol(meth)acrylate monomers diethylene glycol mono(meth)acrylate, polyethylene glycol mono(meth)acrylate, polypropylene glycol mono (meth)acrylate, methoxydiethylene glycol(meth)acrylate, methoxypolyethylene glycol(meth)acrylate, methoxypolypropylene glycol(meth)acrylate; ω-carboxy(meth)acrylates, phthalic acid monohydroxyethyl(meth)acrylate, hexahydrophthalic acid monohydroxyethyl(meth)acrylate, ω-carboxy-polycaprolactone (n=2 to 5) mono(meth)acrylate, (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl (meth)acrylate, diethylaminoethyl(meth)acrylate, maleic anhydride, and glyco-2-hydroxyethyl monomethacrylate (GEMA), β-carboxyethyl-3,3-dimethyammoniumethylmethacylate and sulfopropyl-3,3-dimethyammoniumethylmethacylate, and combinations thereof.

The method of Embodiment (ii) wherein the at least one copolymerizable epoxy monomer is selected from the group consisting of glycidyl acrylate, glycidyl methacrylate (GMA), (E)-(oxiran-2-yl)methyl but-2-enoate, (3,3-dimethyloxiran-2-yl)methyl methacrylate, (E)-(oxiran-2-yl)methyl cinnamate, (oxiran-2-yl)methyl 2-methylenebutanoate, 1-(oxiran-2-yl)propyl acrylate, 1-(oxiran-2-yl)ethyl methacrylate, (oxiran-2-yl)methyl 3-methyl-2-methylenebutanoate, (oxiran-2-yl)methyl 2-methylenepentanoate, (3-methyloxiran-2-yl)methyl acrylate, 2-(oxiran-2-yl)propan-2-yl acrylate, (oxiran-2-yl)methyl 2-methylenehexanoate, (3-methyloxiran-2-yl)methyl methacrylate, and (3,3-dimethyloxiran-2-yl)methyl acrylate and combinations thereof.

The method of Embodiment (ii) wherein the epoxy-modified zwitterionic copolymer binds covalently to the amine modified substrate.

The method of Embodiment (ii) wherein the solvent is selected from the group consisting of water, methanol, ethanol, isopropanol, tetrahydrofuran, 1,4-dioxane, 1,2-dimethoxyethane, N,N-dimethylformamide, dimethylsulfoxide, methylene chloride, 1,2-dicholorethane and combinations thereof.

The method of Embodiment (ii) wherein the non-specific biomolecule adsorption and/or non-specific binding resistant coated surface has decreased binding of biomolecules compared to a non-treated substrate.

The method of Embodiment (ii) wherein the biomolecule is selected from the group consisting of nucleotides, amino acids, sugars, fatty acids, nucleic acid molecules, polypeptides, polynucleotides, polysaccharides, lipids, steroids, glycoproteins, lipoproteins, glycolipids, DNA, DNA-protein conjugates, RNA, RNA-conjugates, antibodies, and receptors, receptor fusion constructs, receptor fusion proteins, chimeric proteins, antibody fusion constructs, and antibody fusion proteins.

The method of Embodiment (ii) wherein the substrate is a surface of a vessel.

The method of Embodiment (ii) wherein the vessel is selected from the group consisting of a microplate; a centrifuge tube; a pipette tip; a cuvette, a microwell plate; an ELISA plate; a microtiter plate; a 96-well plate; a 384-well plate; a 1536-well plate; a round bottom flask; and an Erlenmeyer flask.

A non-specific biomolecule adsorption and/or non-specific binding resistant coated substrate of Embodiment (ii) made by:
  (a) providing a substrate in a reaction chamber;
  (b) drawing a vacuum in the reaction chamber;
  (c) providing a gas comprising $O_2$ optionally containing argon, optionally containing nitrogen in the vicinity of the substrate surface;
  (d) generating a plasma from the gas, thus forming a prepared substrate surface, and optionally heating the substrate;
  (e) providing a vapor comprising at least one silyl amine coupling agent to provide an amine modified substrate;
  (f) providing a copolymer solution comprising a solvent, wherein the copolymer comprises at least one copolymerizable zwitterionic monomer and at least one copolymerizable epoxy monomer, optionally in the presence of a polymerization initiator;
  (g) reacting the copolymer with the amine modified substrate and optionally heating the substrate;
  (h) optionally waiting;
  (i) removing the copolymer solution, and optionally drying the non-specific biomolecule adsorption and/or binding resistant coated surface, optionally heating the surface, thus forming a non-specific biomolecule adsorption and/or binding resistant coated substrate.

The method of Embodiment (ii) in which the non-specific biomolecule adsorption and/or non-specific binding resistant coated substrate made by:
(a) providing a substrate in a that is a SiOx-coated glass surface reaction chamber; (b) drawing a vacuum in the reaction chamber;
(c) providing a gas comprising $O_2$, optionally containing argon, optionally containing nitrogen in the vicinity of the substrate surface;
(d) generating a plasma from the gas, thus forming a prepared substrate surface, and optionally heating the substrate;
(e) providing a vapor comprising at least one silyl amine coupling agent to provide an amine modified substrate;
(f) providing a copolymer solution comprising a solvent, wherein the copolymer comprises at least one copolymerizable zwitterionic monomer and at least one copolymerizable epoxy monomer, optionally in the presence of a polymerization initiator;
(g) reacting the copolymer with the amine modified substrate and optionally heating the substrate;
(h) optionally waiting;
(i) removing the copolymer solution, and optionally drying the non-specific biomolecule adsorption and/or non-specific binding resistant coated surface, optionally heating the surface,
thus forming a non-specific biomolecule adsorption and/or binding resistant coated substrate.

The method of Embodiment (ii) wherein the at least one silyl amine coupling agent is selected from the group consisting of 3-Aminopropyltriethoxysilane, 3-Aminopropyltrimethoxysilane, 4-Aminobutyltriethoxysilane, M-Aminophenyltrimethoxysilane, P-Aminophenyltrimethoxysilane, O-Aminophenyltrimethoxysilane, 3-Aminopropyltris(Methoxyethoxyethoxy)Silane, 11-Aminoundecyltriethoxysilane, 3-(M-Aminophenoxy)Propyltrimethoxysilane, Aminopropylsilanetriol, 3-Aminopropylmethyldiethoxysilane, 3-Aminopropyldiisopropylethoxysilane, 3-Aminopropyldimethylethoxysilane, N-(2-Aminoethyl)-3-Aminopropyltrimethoxysilane, N-[3-(Trimethoxysilyl)Propyl]Ethylenediamine, N-(2-Aminoethyl)-3-Aminopropyltriethoxysilane, N-(6-Aminohexyl)Aminomethyltriethoxysilane, N-(6-Aminohexyl)Aminopropyltrimethoxysilane, N-(2-Aminoethyl)-11-Aminoundecyltrimethoxysilane, (Aminoethylaminomethyl)Phenethyltrimethoxysilane, N-3-[(Amino(Polypropylenoxy)], Aminopropyltrimethoxysilane, N-(2-Aminoethyl)-3-Aminopropylsilanetriol, N-(2-Aminoethyl)-3-Aminopropylmethyldimethoxysilane, N-(2-Aminoethyl)-3-Aminoisobutylmethyldimethoxysilane, (Aminoethylamino)-3-Isobutyldimethylmethoxysilane, (3-Trimethoxysilylpropyl)Diethylenetriamine, N-Butylaminopropyltrimethoxysilane, N-Ethylaminoisobutyltrimethoxysilane, N-Methylaminopropyltrimethoxysilane, N-Phenylaminopropyltrimethoxysilane, 3-(N-Allylamino)Propyltrimethoxysilane, (Cyclohexylaminomethyl)Triethoxysilane, N-Cyclohexylaminopropyltrimethoxysilane, N-Ethylaminoisobutylmethyldiethoxysilane, (Phenylaminomethyl)Methyldimethoxysilane, N-Phenylaminomethyltriethoxysilane, N-Methylaminopropylmethyldimethoxysilane, Bis(2-Hydroxyethyl)-3-Aminopropyltriethoxysilane, 3-(N-Styrylmethyl-2-Aminoethylamino)-Propyltrimethoxysilane Hydrochloride, (2-N-Benzylaminoethyl)-3-Aminopropyl-Trimethoxysilane, Bis(Triethoxysilylpropyl)Amine, Bis(Trimethoxysilylpropyl)Amine, Bis[(3-Trimethoxysilyl)Propyl]-Ethylenediamine, Bis[(3-Trimethoxysilyl)Propyl]-Ethylenediamine, Bis(Methyldiethoxysilylpropyl)Amine, N-Allyl-Aza-2,2-Dimethoxysila-Cyclopentane, N-Aminoethyl-Aza-2,2,4-Trimethyl-Silacyclopentane, N-(3-Aminopropyldimethylsila)Aza-2,2-Dimethyl-2-Silacyclopentane, N-N-Butyl-Aza-2,2-Dimethoxysila-Cyclopentane, 2,2-Dimethoxy-1,6-Diaza-2-Silacyclo-Octane, N-Methyl-Aza-2,2,4-Trimethylsila-Cylcopentane, 1-(N-(N',N'-dimethylaminoethyl))-1-aza-2,2,4-trimethyl-2-silacyclopentane and combinations thereof.

The method of Embodiment (ii), wherein the at least one copolymerizable zwitterionic monomer is selected from the group consisting of 2-(meth)acryloyloxyethyl-2'-(trimethylammonio)ethyl phosphate (including MPC), 2-(methacryloxy)ethyl 2-(diimethylammonio)ethyl phosphate (aka=2-methacryloyloxyethyl phosphorylcholine; 2-(methacryloxy)ethyl-2-(dimethylammonio)ethylcarboxylate; 2-(methacryloxy)ethyl-2-(dimethylammonio)propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio)ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio)ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio)ethyl phosphate, 2-(allyloxycarbonylamino)ethyl-2'-(trimethylammonio)ethyl phosphate, 2-(butyroyloxy)ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl)fumarate, butyl-(2'-trimethylammonioethylphosphorylethyl) fumarate, hydroxyethyl-(2'-trimethylammonioethylphosphorylethyl) fumarate, 2-hydroxyethyl(meth)acrylate, 2-hydroxypropyl (meth)acrylate; polyalkylene glycol(meth)acrylate monomers diethylene glycol mono(meth)acrylate, polyethylene glycol mono(meth)acrylate, polypropylene glycol mono (meth)acrylate, methoxydiethylene glycol(meth)acrylate, methoxypolyethylene glycol(meth)acrylate, methoxypolypropylene glycol(meth)acrylate; ω-carboxy(meth)acrylates, phthalic acid monohydroxyethyl(meth)acrylate, hexahydrophthalic acid monohydroxyethyl(meth)acrylate, ω-carboxy-polycaprolactone (n=2 to 5) mono(meth)acrylate, (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl (meth)acrylate, diethylaminoethyl(meth)acrylate, maleic anhydride, and glyco-2-hydroxyethyl monomethacrylate (GEMA), β-carboxyethyl-3,3-dimethyammoniumethyl-methacylate and sulfopropyl-3,3-dimethyammoniumethyl-methacylate, and combinations thereof.

The method of Embodiment (ii), wherein the at least one copolymerizable epoxy monomer is selected from the group consisting of glycidyl acrylate, glycidyl methacrylate (GMA), (E)-(oxiran-2-yl)methyl but-2-enoate, (3,3-dimethyloxiran-2-yl)methyl methacrylate, (E)-(oxiran-2-yl)methyl cinnamate, (oxiran-2-yl)methyl 2-methylenebutanoate, 1-(oxiran-2-yl)propyl acrylate, 1-(oxiran-2-yl)ethyl methacrylate, (oxiran-2-yl)methyl 3-methyl-2-methylenebutanoate, (oxiran-2-yl)methyl 2-methylenepentanoate, (3-methyloxiran-2-yl)methyl acrylate, 2-(oxiran-2-yl)propan-2-yl acrylate, (oxiran-2-yl)methyl 2-methylenehexanoate, (3-methyloxiran-2-yl)methyl methacrylate, and (3,3-dimethyloxiran-2-yl)methyl acrylate and combinations thereof.

The method of Embodiment (ii) wherein the non-specific biomolecule adsorption and/or binding resistant coating has decreased binding of biomolecules compared to a non-treated substrate.

The method of Embodiment (ii), wherein the biomolecule is selected from the group consisting of nucleotides, amino acids, sugars, fatty acids, nucleic acid molecules, polypeptides, polynucleotides, polysaccharides, lipids, steroids, glycoproteins, lipoproteins, glycolipids, DNA, DNA-protein conjugates, RNA, RNA-conjugates, antibodies, and receptors, receptor fusion constructs, receptor fusion proteins, chimeric proteins, antibody fusion constructs, and antibody fusion proteins.

The method of Embodiment (ii), wherein the substrate is a surface of a vessel.

The method of Embodiment (ii) wherein the vessels is selected from the group consisting of a microplate; a centrifuge tube; a pipette tip; a cuvette, a microwell plate; an ELISA plate; a microtiter plate; a 96-well plate; and a 384-well plate.

A vessel of Embodiment (ii) having an interior surface coated at least in part with a non-specific biomolecule adsorption and/or binding resistant coating made by:
(a) providing a substrate in a reaction chamber;
(b) drawing a vacuum in the reaction chamber;
(c) providing a gas comprising $O_2$, optionally containing argon, optionally containing nitrogen in the vicinity of the substrate surface;
(d) generating a plasma from the gas, thus forming a prepared substrate surface, and optionally heating the substrate;
(e) providing a vapor comprising at least one silyl amine coupling agent to provide an amine modified substrate;
(f) providing a copolymer solution comprising a solvent, wherein the copolymer comprises at least one copolymerizable zwitterionic monomer and at least one copolymerizable epoxy monomer, optionally in the presence of a polymerization initiator;
(g) reacting the copolymer with the amine modified substrate and optionally heating the substrate;
(h) optionally waiting;
(i) removing the copolymer solution, and optionally drying the non-specific biomolecule adsorption and/or non-specific binding resistant coated surface, optionally heating the surface thus forming a non-specific biomolecule adsorption and/or binding resistant coated vessel.

The vessel of Embodiment (ii) having an interior surface coated at least in part with a non-specific biomolecule adsorption and/or binding resistant coating made by:
(a) providing a substrate in a that is a SiOx-coated glass surface reaction chamber;
(b) drawing a vacuum in the reaction chamber;
(c) providing a gas comprising $O_2$, optionally containing argon, optionally containing nitrogen in the vicinity of the substrate surface;
(d) generating a plasma from the gas, thus forming a prepared substrate surface, and optionally heating the substrate;
(e) providing a vapor comprising at least one silyl amine coupling agent to provide an amine modified substrate;
(f) providing a copolymer solution comprising a solvent, wherein the copolymer comprises at least one copolymerizable zwitterionic monomer and at least one copolymerizable epoxy monomer, optionally in the presence of a polymerization initiator;
(g) reacting the copolymer with the amine modified substrate and optionally heating the substrate;
(h) optionally waiting;
(i) removing the copolymer solution, and optionally drying the non-specific biomolecule adsorption and/or non-specific binding resistant coated surface, optionally heating the surface,
thus forming a non-specific biomolecule adsorption and/or binding resistant coated vessel.

The vessel of Embodiment (ii), wherein the at least one silyl amine coupling agent is selected from the group consisting of 3-Aminopropyltriethoxysilane, 3-Aminopropyltrimethoxysilane, 4-Aminobutyltriethoxysilane, M-Aminophenyltrimethoxysilane, P-Aminophenyltrimethoxysilane, O-Aminophenyltrimethoxysilane, 3-Aminopropyltris (Methoxyethoxyethoxy)Silane, 11-Aminoundecyltriethoxysilane, 3-(M-Aminophenoxy) Propyltrimethoxysilane, Aminopropylsilanetriol, 3-Aminopropylmethyldiethoxysilane, 3-Aminopropyldiisopropylethoxysilane, 3-Aminopropyldimethylethoxysilane, N-(2-Aminoethyl)-3-Aminopropyltrimethoxysilane, N-[3-(Trimethoxysilyl)Propyl]Ethylenediamine, N-(2-Aminoethyl)-3-Aminopropyltriethoxysilane, N-(6-Aminohexyl)Aminomethyltriethoxysilane, N-(6-Aminohexyl)Aminopropyltrimethoxysilane, N-(2-Aminoethyl)-11-Aminoundecyltrimethoxysilane, (Aminoethylaminomethyl)Phenethyltrimethoxysilane, N-3-[(Amino(Polypropylenoxy)], Aminopropyltrimethoxysilane, N-(2-Aminoethyl)-3-Aminopropylsilanetriol, N-(2-Aminoethyl)-3-Aminopropylmethyldimethoxysilane, N-(2-Aminoethyl)-3-Aminoisobutylmethyldimethoxysilane, (Aminoethylamino)-3-Isobutyldimethylmethoxysilane, (3-Trimethoxysilylpropyl) Diethylenetriamine, N-Butylaminopropyltrimethoxysilane, N-Ethylaminoisobutyltrimethoxysilane, N-Methylaminopropyltrimethoxysilane, N-Phenylaminopropyltrimethoxysilane, 3-(N-Allylamino) Propyltrimethoxysilane, (Cyclohexylaminomethyl)

Triethoxysilane, N-Cyclohexylaminopropyltrimethoxysilane, N-Ethylaminoisobutylmethyldiethoxysilane, (Phenylaminomethyl) Methyldimethoxysilane, N-Phenylaminomethyltriethoxysilane, N-Methylaminopropylmethyldimethoxysilane, Bis(2-Hydroxyethyl)-3-Aminopropyltriethoxysilane, 3-(N-Styrylmethyl-2-Aminoethylamino)-Propyltrimethoxysilane Hydrochloride, (2-N-Benzylaminoethyl)-3-Aminopropyl-Trimethoxysilane, Bis(Triethoxysilylpropyl)Amine, Bis(Trimethoxysilylpropyl)Amine, Bis[(3-Trimethoxysilyl)Propyl]-Ethylenediamine, Bis [(3-Trimethoxysilyl) Propyl]-Ethylenediamine, Bis(Methyldiethoxysilylpropyl)Amine, N-Allyl-Aza-2,2-Dimethoxysila-Cyclopentane, N-Aminoethyl-Aza-2,2,4-Trimethyl-Silacyclopentane, N-(3-Aminopropyldimethylsila)Aza-2,2-Dimethyl-2-Silacyclopentane, N-N-Butyl-Aza-2,2-Dimethoxysila-Cyclopentane, 2,2-Dimethoxy-1,6-Diaza-2-Silacyclo-Octane, N-Methyl-Aza-2,2,4-Trimethylsila-Cylcopentane, 1-(N-(N',N'-dimethylaminoethyl))-1-aza-2,2,4-trimethyl-2-silacyclopentane and combinations thereof.

The vessel of Embodiment (ii), wherein the at least one copolymerizable zwitterionic monomer is selected from the group consisting of 2-(meth)acryloyloxyethyl-2'-(trimethylammonio)ethyl phosphate (including MPC), 2-(methacryloxy)ethyl 2-(diimethylammonio)ethyl phosphate (aka=2-methacryloyloxyethyl phosphorylcholine; 2-(methacryloxy)ethyl-2-(dimethylammonio) ethylcarboxylate; 2-(methacryloxy)ethyl-2-(dimethylammonio)propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio)ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio) ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio)ethyl phosphate, 2-(allyloxycarbonylamino)ethyl-2'-(trimethylammonio) ethyl phosphate, 2-(butyroyloxy)ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl) fumarate, butyl-(2'-trimethylammonioethylphosphorylethyl) fumarate, hydroxyethyl-(2'-trimethylammonioethylphosphorylethyl) fumarate, 2-hydroxyethyl(meth)acrylate, 2-hydroxypropyl (meth)acrylate; polyalkylene glycol(meth)acrylate monomers diethylene glycol mono(meth)acrylate, polyethylene glycol mono(meth)acrylate, polypropylene glycol mono (meth)acrylate, methoxydiethylene glycol(meth)acrylate, methoxypolyethylene glycol(meth)acrylate, methoxypolypropylene glycol(meth)acrylate; ω-carboxy(meth)acrylates, phthalic acid monohydroxyethyl(meth)acrylate, hexahydrophthalic acid monohydroxyethyl(meth)acrylate, ω-carboxy-polycaprolactone (n=2 to 5) mono(meth)acrylate, (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl (meth)acrylate, diethylaminoethyl(meth)acrylate, maleic anhydride, and glyco-2-hydroxyethyl monomethacrylate (GEMA), β-carboxyethyl-3,3-dimethyammoniumethylmethacylate and sulfopropyl-3,3-dimethyammoniumethylmethacylate, and combinations thereof.

The vessel of Embodiment (ii), wherein the at least one copolymerizable epoxy monomer is selected from the group consisting of glycidyl acrylate, glycidyl methacrylate (GMA), (E)-(oxiran-2-yl)methyl but-2-enoate, (3,3-dimethyloxiran-2-yl)methyl methacrylate, (E)-(oxiran-2-yl)methyl cinnamate, (oxiran-2-yl)methyl 2-methylenebutanoate, 1-(oxiran-2-yl)propyl acrylate, 1-(oxiran-2-yl)ethyl methacrylate, (oxiran-2-yl)methyl 3-methyl-2-methylenebutanoate, (oxiran-2-yl)methyl 2-methylenepentanoate, (3-methyloxiran-2-yl)methyl acrylate, 2-(oxiran-2-yl)propan-2-yl acrylate, (oxiran-2-yl)methyl 2-methylenehexanoate, (3-methyloxiran-2-yl)methyl methacrylate, and (3,3-dimethyloxiran-2-yl)methyl acrylate and combinations thereof.

The vessel of Embodiment (ii), wherein the non-specific biomolecule adsorption and/or binding resistant coating has decreased binding of biomolecules compared to a non-treated substrate.

The vessel of Embodiment (ii), wherein the biomolecule is selected from the group consisting of nucleotides, amino acids, sugars, fatty acids, nucleic acid molecules, polypeptides, polynucleotides, polysaccharides, lipids, steroids, glycoproteins, lipoproteins, glycolipids, DNA, DNA-protein conjugates, RNA, RNA-conjugates, antibodies, and receptors, receptor fusion constructs, receptor fusion proteins, chimeric proteins, antibody fusion constructs, and antibody fusion proteins.

The vessel of Embodiment (ii), wherein the vessel is selected from the group consisting of a microplate; a centrifuge tube; a pipette tip; a cuvette, a microwell plate; an ELISA plate; a microtiter plate; a 96-well plate; and a 384-well plate; a 1536-well plate; a round bottom flask; and an Erlenmeyer flask.

BRIEF DESCRIPTION OF THE DRAWINGS

The technology will be described in conjunction with the following drawings in which like reference numerals designate like elements and in which.

Figure 1:
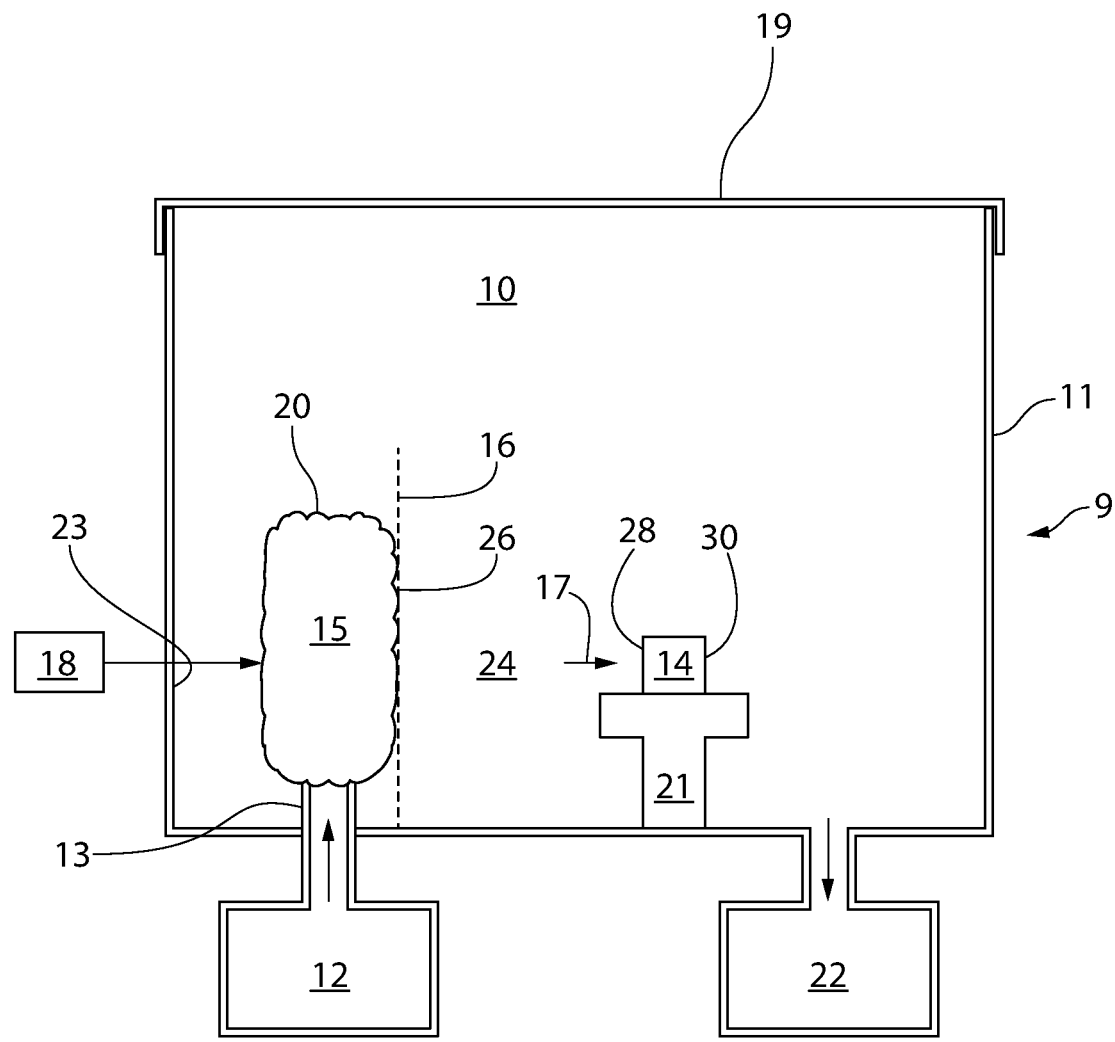
FIG. 1 illustrates generically described remote conversion plasma treatment apparatus useful in the first embodiment, certain features of which are optional.
Figure 14:
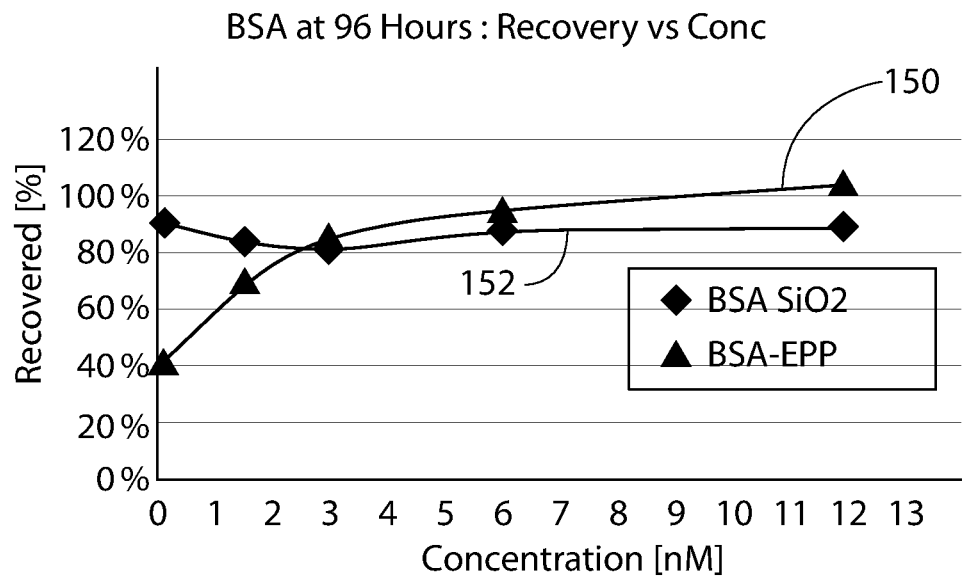
FIG. 14 is a plot of protein recovery versus concentration of protein (BSA) for Example 14.
Figure 15:
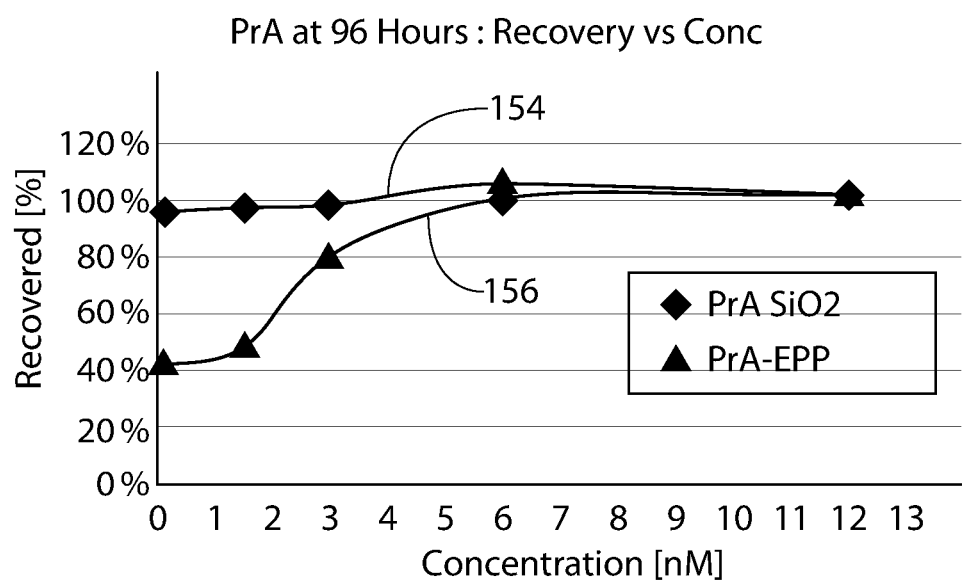
FIG. 15 is a plot of protein recovery versus concentration of protein (PrA) for Example 14.
Figure 16:
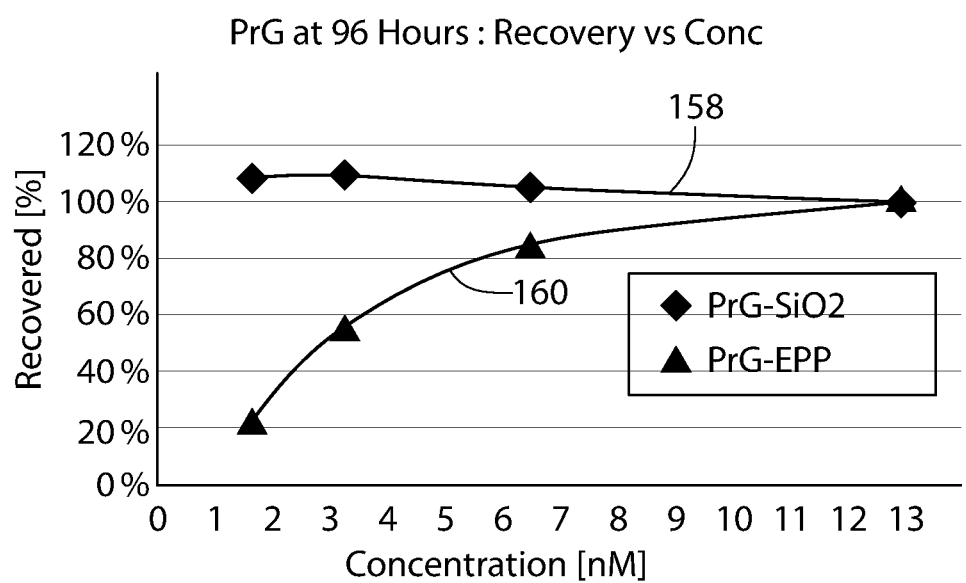
FIG. 16 is a plot of protein recovery versus concentration of protein (PrG) for Example 14.

The following reference characters are used in this description and the accompanying Figures:

| | |
|---|---|
| 9 | Apparatus of the first more detailed embodiment |
| 10 | Treatment volume |
| 11 | Reaction chamber wall (optional) |
| 12 | Fluid source |
| 13 | Fluid inlet |
| 14 | Substrate |
| 15 | Plasma zone |
| 16 | Shield (optional) |
| 17 | Treatment gas |
| 18 | Plasma energy source |
| 19 | Lid (optional) |
| 20 | Plasma (boundary) |
| 21 | Substrate support (optional) |
| 22 | Vacuum source (optional) |
| 23 | Applicator |
| 24 | Remote conversion plasma |
| 26 | Flat spot (of 20) (optional) |
| 28 | Front surface (of 14) |
| 30 | Back surface (of 14) |
| 32 | Well (of 14) (optional) |
| 34 | Unconditioned and unconverted polypropylene plot |
| 36 | Treated polypropylene plot |
| 38 | Glass plot |
| 110 | Chamber |
| 112 | Bottom (of 110) |
| 114 | Lid (of 110) |
| 116 | Vacuum conduit |
| 118 | Vacuum pump |
| 120 | Valve |
| 122 | Gas inlet |
| 124 | Processing area |
| 126 | Gas system |
| 128 | Mass flow controller |
| 130 | Compressed gas source |
| 132 | Capillary |
| 134 | Manifold |
| 136 | Shut-off valve |
| 138 | Electrode |
| 140 | Matching network |
| 142 | RF power supply |
| 144 | Coaxial cable |
| 150 | FIG. 14 - BSA-EPP Plot |
| 152 | FIG. 14 - BSA-SiO2 Plot |
| 154 | FIG. 15 - PrA-SiO2 Plot |
| 156 | FIG. 15 - PrA-EPP Plot |
| 158 | FIG. 16 - PrG-SiO2 Plot |
| 160 | FIG. 16 - PrG-EPP Plot |
| 162 | Substrate |
| 164 | Contact surface |
| 166 | Interior portion |

DETAILED DESCRIPTION OF THE PREFERRED EMBODIMENTS

In this specification, methods are disclosed for reducing biomolecule adhesion to a surface. A method for treating a surface, optionally an entire or partial surface of a substrate or a surface of a material, is provided, most generally comprising treating the surface with conversion plasma of one or more non-polymerizing compounds to form a treated contact surface.

The terms "contact surface" and "surface" mean the same thing unless otherwise expressly stated or indicated by the context in which it is used, and each term indicates a surface that is in a position to come in contact with a sample or other material, and has surface properties determining its interaction with the sample or other material with which it comes into contact. Some examples of contact surfaces are an interior surface of a vessel (for example, bounding a vessel lumen) or an exterior surface of a vessel, sheet, block, or other object.

The term "interior portion" indicates a portion of a bulk article or coating that is not a contact surface, but instead forms part of the interior of the bulk article or coating. In embodiments in which a contact surface of a substrate is treated to modify its properties, the interior portion of the substrate includes any portion that is not modified by the treatment.

The term "biomolecule" is used respecting any embodiment to include any nucleotides or peptides, or any combination of them. Nucleotides include oligonucleotides and polynucleotides, also known as nucleic acids, for example deoxyribonucleic acid (DNA) and ribonucleic acid (RNA). Peptides include amino acids, oligopeptides, polypeptides, and proteins. Nucleotides and peptides further include modified or derivatized nucleotides and peptides that adhere to a surface that is not treated according to the present technology.

The presently defined biomolecules include but are not limited to one or more of the following aqueous proteins: mammal serum albumin, for example Bovine Serum Albumin (BSA); Fibrinogen (FBG); Transferrin (TFN), for example blood serotransferrin (or siderophilin, also known as transferrin); lactotransferrin (lactoferrin); milk transferrin; egg white ovotransferrin (conalbumin); membrane-associated melanotransferrin; Protein A (PrA); Protein G (PrG); Protein A/G; Protein L; insulin, for example hexameric insulin, monomeric insulin, porcine insulin, human insulin, recombinant insulin and pharmaceutical grades of insulin; pharmaceutical protein; blood or blood component proteins; or any recombinant form, modification, full length precursor, signal peptide, pro-peptide, or mature variant of these proteins; and a combination of two or more of these.

Biomolecule adhesion to a surface is defined for any embodiment as a reduction of the aqueous concentration of a biomolecule dispersed in an aqueous medium stored in contact with the surface. It is not limited by the mechanism of reduction of concentration, whether literally "adhesion," adsorption, or another mechanism.

"Plasma," as referenced in any embodiment, has its conventional meaning in physics of one of the four fundamental states of matter, characterized by extensive ionization of its constituent particles, a generally gaseous form, and incandescence (i.e. it produces a glow discharge, meaning that it emits light).

"Conversion plasma treatment" refers to any plasma treatment that reduces the adhesion of one or more biomolecules to a treated contact surface.

"Conditioning plasma treatment" refers to any plasma treatment of a surface to prepare the surface for further conversion plasma treatment. "Conditioning plasma treatment" includes a plasma treatment that, in itself, reduces the adhesion of one or more biomolecules to a treated contact surface, but is followed by conversion plasma treatment that further reduces the adhesion of one or more biomolecules to a treated contact surface. "Conditioning plasma treatment" also includes a plasma treatment that, in itself, does not reduce the adhesion of one or more biomolecules to a treated contact surface.

A "remote" conversion plasma treatment, generally speaking, is conversion plasma treatment of a surface located at a "remote" point where the radiant energy density of the plasma, for example in Joules per cm3, is substantially less than the maximum radiant energy density at any point of the plasma glow discharge (referred to below as the "brightest point"), but the remote surface is close enough to some part of the glow discharge to reduce the adhesion of one or more biomolecules to the treated remote surface. "Remote" is defined in the same manner respecting a remote conditioning plasma treatment, except that the remote surface must be close enough to some part of the glow discharge to condition the surface.

The radiant energy density at the brightest point of the plasma is determined spectrophotometrically by measuring the radiant intensity of the most intense emission line of light in the visible spectrum (380 nanometer (nm) to 750 nm wavelength) at the brightest point. The radiant energy density at the remote point is determined spectrophotometrically by measuring the radiant energy density of the same emission line of light at the remote point. "Remoteness" of a point is quantified by measuring the ratio of the radiant energy density at the remote point to the radiant energy density at the brightest point. The present specification defines "remote" quantitatively as a specific range of that ratio. Broadly, the ratio is from 0 to 0.5, optionally from 0 to 0.25, optionally about 0, optionally exactly 0. Remote conversion plasma treatment can be carried out where the ratio is zero, even though that indicates no measurable visible light at the remote point, because the dark discharge region or afterglow region of plasma contains energetic species that, although not energetic enough to emit light, are energetic enough to modify the treated contact surface to reduce the adhesion of one or more biomolecules.

A "non-polymerizing compound" is defined operationally for all embodiments as a compound that does not polymerize on a treated contact surface or otherwise form an additive coating under the conditions used in a particular plasma treatment of the surface. Numerous, non-limiting examples of compounds that can be used under non-polymerizing conditions are the following: O2, N2, air, O3, N2O, H2, H2O2, NH3, Ar, He, Ne, and combinations of any of two or more of the foregoing. These may also include alcohols, organic acids, and polar organic solvents as well as materials that can be polymerized under different plasma conditions from those employed. "Non-polymerizing" includes compounds that react with and bond to a preexisting polymeric surface and locally modify its composition at the surface. The essential characterizing feature of a non-polymerizing coating is that it does not build up thickness (i.e. build up an additive coating) as the treatment time is increased.

A "substrate" is an article or other solid form (such as a granule, bead, or particle).

A "surface" is broadly defined as either an original surface (a "surface" also includes a portion of a surface wherever used in this specification) of a substrate, or a coated or treated contact surface prepared by any suitable coating or treating method, such as liquid application, condensation from a gas, or chemical vapor deposition, including plasma enhanced chemical vapor deposition carried out under conditions effective to form a coating on the substrate.

A treated contact surface is defined for all embodiments as a surface that has been plasma treated as described in this specification, and that exhibits reduced adhesion by biomolecules as a result of such treatment.

The terms "optionally" and "alternatively" are regarded as having the same meaning in the present specification and claims, and may be used interchangeably.

The "material" in any embodiment can be any material of which a substrate is formed, including but not limited to a thermoplastic material, optionally a thermoplastic injection moldable material. The substrate according to any embodiment may be made, for example, from material including, but not limited to: an olefin polymer; polypropylene (PP); polyethylene (PE); cyclic olefin copolymer (COC); cyclic olefin polymer (COP); polymethylpentene; polyester; polyethylene terephthalate; polyethylene naphthalate; polybutylene terephthalate (PBT); PVdC (polyvinylidene chloride); polyvinyl chloride (PVC); polycarbonate; polymethylmethacrylate; polylactic acid; polylactic acid; polystyrene; hydrogenated polystyrene; poly(cyclohexylethylene) (PCHE); epoxy resin; nylon; polyurethane polyacrylonitrile; polyacrylonitrile (PAN); an ionomeric resin; or Surlyn® ionomeric resin.

The term "vessel" as used throughout this specification may be any type of article that is adapted to contain or convey a liquid, a gas, a solid, or any two or more of these. One example of a vessel is an article with at least one opening (e.g., one, two or more, depending on the application) and a wall defining an interior contacting surface.

The present method for treating a surface, optionally a surface of a substrate, includes treating the surface with conversion plasma of one or more non-polymerizing compounds, in a chamber, to form a treated contact surface.

A wide variety of different surfaces can be treated according to any embodiment. One example of a surface is a vessel lumen surface, where the vessel is, for example, a vial, a bottle, a jar, a syringe, a cartridge, a blister package, or an ampoule. For more examples, the surface of the material can be a contact surface of an article of labware, for example a microplate, a centrifuge tube, a pipette tip, a well plate, a microwell plate, an ELISA plate, a microtiter plate, a 96-well plate, a 384-well plate, a centrifuge tube, a chromatography vial, an evacuated blood collection tube, or a specimen tube.

The treated contact surface of any embodiment optionally can be a coating or layer of PECVD deposited $SiO_xC_yH_z$ or $SiN_xC_yH_z$, in which x is from about 0.5 to about 2.4 as measured by X-ray photoelectron spectroscopy (XPS), y is from about 0.6 to about 3 as measured by XPS, and z is from about 2 to about 9 as measured by Rutherford backscattering spectrometry (RBS). Another example of the surface to be treated is a barrier coating or layer of SiOx, in which x is from about 1.5 to about 2.9 as measured by XPS, optionally an oxide or nitride of an organometallic precursor that is a compound of a metal element from Group III and/or Group IV of the Periodic Table, e.g. in Group III: Boron, Aluminum, Gallium, Indium, Thallium, Scandium, Yttrium, or Lanthanum, (Aluminum and Boron being preferred), and in Group IV: Silicon, Germanium, Tin, Lead, Titanium, Zirconium, Hafnium, or Thorium (Silicon and Tin being preferred).

The gas or gases employed to treat the surface in any embodiment can be an inert gas or a reactive gas, and can be any of the following: $O_2$, $N_2$, air, $O_3$, $N_2O$, $NO_2$, $N_2O_4$, $H_2$, $H_2O_2$, $H_2O$, $NH_3$, Ar, He, Ne, Xe, Kr, a nitrogen-containing gas, other non-polymerizing gases, gas combinations including an $Ar/O_2$ mix, an $N_2/O_2$ mix following a pre-treatment conditioning step with Ar, a volatile and polar organic compound, the combination of a $C_1$-$C_{12}$ hydrocarbon and oxygen; the combination of a $C_1$-$C_{12}$ hydrocarbon and nitrogen; a silicon-containing gas; or a combination of two or more of these. The treatment employs a non-polymerizing gas as defined in this specification.

The volatile and polar organic compound of any embodiment can be, for example water, for example tap water, distilled water, or deionized water; an alcohol, for example a $C_1$-$C_{12}$ alcohol, methanol, ethanol, n-propanol, isopropanol, n-butanol, isobutanol, s-butanol, t-butanol; a glycol, for example ethylene glycol, propylene glycol, butylene glycol, polyethylene glycol, and others; glycerine, a $C_1$-$C_{12}$ linear or cyclic ether, for example dimethyl ether, diethyl ether, dipropyl ether, dibutyl ether, glyme ($CH_3OCH_2CH_2OCH_3$); cyclic ethers of formula —$CH_2CH_2O_n$— such as diethylene oxide, triethylene oxide, and tetraethylene oxide; cyclic amines; cyclic esters (lactones), for example acetolactone, propiolactone, butyrolactone, valerolactone, and caprolactone; a $C_1$-$C_{12}$ aldehyde, for example formaldehyde, acetaldehyde, propionaldehyde, or butyraldehyde; a $C_1$-$C_{12}$ ketone, for example acetone, diethylketone, dipropylketone, or dibutylketone; a $C_1$-$C_{12}$ carboxylic acid, for example formic acid, acetic acid, propionic acid, or butyric acid; ammonia, a $C_1$-$C_{12}$ amine, for example methylamine, dimethylamine, ethylamine, diethylamine, propylamine, butylamine, pentylamine, hexylamine, heptylamine, octylamine, nonylamine, decylamine, undecylamine, or dodecylamine; hydrogen fluoride, hydrogen chloride, a $C_1$-$C_{12}$ epoxide, for example ethylene oxide or propylene oxide; or a combination of any two or more of these.

The $C_1$-$C_{12}$ hydrocarbon of any embodiment optionally can be methane, ethane, ethylene, acetylene, n-propane, i-propane, propene, propyne; n-butane, i-butane, t-butane, butane, 1-butyne, 2-butyne, or a combination of any two or more of these.

The silicon-containing gas of any embodiment can be a silane, an organosilicon precursor, or a combination of any two or more of these. The silicon-containing gas can be an acyclic or cyclic, substituted or unsubstituted silane, optionally comprising, consisting essentially of, or consisting of any one or more of: $Si_1$—$Si_4$ substituted or unsubstituted silanes, for example silane, disilane, trisilane, or tetrasilane; hydrocarbon or halogen substituted $Si_1$—$Si_4$ silanes, for example tetramethylsilane (TetraMS), tetraethyl silane, tetrapropylsilane, tetrabutylsilane, trimethylsilane (TriMS), triethyl silane, tripropylsilane, tributylsilane, trimethoxysilane, a fluorinated silane such as hexafluorodisilane, a cyclic silane such as octamethylcyclotetrasilane or tetramethylcyclotetrasilane, or a combination of any two or more of these. The silicon-containing gas can be a linear siloxane, a monocyclic siloxane, a polycyclic siloxane, a polysilsesquioxane, an alkyl trimethoxysilane, a linear silazane, a monocyclic silazane, a polycyclic silazane, a polysilsesquiazane, or a combination of any two or more of these, for example hexamethyldisiloxane (HMDSO), tetramethyldisiloxane (TMDSO), octamethylcyclotetrasiloxane (OMCTS), tetramethyldisilazane, hexamethyldisilazane, octamethyltrisilazane, octamethylcyclotetrasilazane, tetramethylcyclotetrasilazane, or a combination of any two or more of these.

The electrical power used to excite the plasma used in plasma treatment in any embodiment, can be, for example, from 1 to 1000 Watts, optionally from 100 to 900 Watts, optionally from 50 to 600 Watts, optionally 100 to 500 Watts, optionally from 500 to 700 Watts, optionally from 1 to 100 Watts, optionally from 1 to 30 Watts, optionally from 1 to 10 Watts, optionally from 1 to 5 Watts.

The frequency or type of energy of the electrical power used to excite the plasma used in plasma treatment, in any embodiment, can be any type of energy that will ignite plasma in the plasma zone. For example, it can be direct current (DC) or alternating current (electromagnetic energy) having a frequency from 3 Hz to 300 GHz. Electromagnetic energy in this range generally includes radio frequency (RF) energy and microwave energy, more particularly characterized as extremely low frequency (ELF) of 3 to 30 Hz, super low frequency (SLF) of 30 to 300 Hz, voice or ultra-low frequency (VF or ULF) of 300 Hz to 3 kHz, very low frequency (VLF) of 3 to 30 kHz, low frequency (LF) of 30 to 300 kHz, medium frequency (MF) of 300 kHz to 3 MHz, high frequency (HF) of 3 to 30 MHz, very high frequency (VHF) of 30 to 300 MHz, ultra-high frequency (UHF) of 300 MHz to 3 GHz, super high frequency (SHF) of 3 to 30 GHz, extremely high frequency (EHF) of 30 to 300 GHz, or any combination of two or more of these frequencies. For example, high frequency energy, commonly 13.56 MHz, is useful RF energy, and ultra-high frequency energy, commonly 2.54 GHz, is useful microwave energy, as two non-limiting examples of commonly used frequencies.

The plasma exciting energy, in any embodiment, can either be continuous during a treatment step or pulsed multiple times during the treatment step. If pulsed, it can alternately pulse on for times ranging from one millisecond to one second, and then off for times ranging from one millisecond to one second, in a regular or varying sequence during plasma treatment. One complete duty cycle (one "on" period plus one "off" period) can be 1 to 2000 milliseconds (ms), optionally 1 to 1000 milliseconds (ms), optionally 2 to 500 ms, optionally 5 to 100 ms, optionally 10 to 100 ms long.

Optionally in any embodiment, the relation between the power on and power off portions of the duty cycle can be, for example, power on 1-90 percent of the time, optionally on 1-80 percent of the time, optionally on 1-70 percent of the time, optionally on 1-60 percent of the time, optionally on 1-50 percent of the time, optionally on 1-45 percent of the time, optionally on 1-40 percent of the time, optionally on 1-35 percent of the time, optionally on 1-30 percent of the time, optionally on 1-25 percent of the time, optionally on 1-20 percent of the time, optionally on 1-15 percent of the time, optionally on 1-10 percent of the time, optionally on 1-5 percent of the time, and power off for the remaining time of each duty cycle.

The plasma pulsing described in Mark J. Kushner, *Pulsed Plasma-Pulsed Injection Sources For Remote Plasma Activated Chemical Vapor Deposition*, J. APPL. PHYS. 73, 4098 (1993), can optionally be used.

The flow rate of process gas during plasma treatment according to any embodiment can be from 1 to 300 sccm (standard cubic centimeters per minute), optionally 1 to 200 sccm, optionally from 1 to 100 sccm, optionally 1-50 sccm, optionally 5-50 sccm, optionally 1-10 sccm.

Optionally in any embodiment, the plasma chamber is reduced to a base pressure from 0.001 milliTorr (mTorr, 0.00013 Pascal) to 100 Torr (13,000 Pascal) before feeding gases. Optionally the feed gas pressure in any embodiment can range from 0.001 to 10,000 mTorr (0.00013 to 1300 Pascal), optionally from 1 mTorr to 10 Torr (0.13 to 1300 Pascal), optionally from 0.001 to 5000 mTorr (0.00013 to 670 Pascal), optionally from 1 to 1000 milliTorr (0.13 to 130 Pascal).

The treatment volume in which the plasma is generated in any embodiment can be, for example, from 100 mL to 50 liters, preferably 8 liters to 20 liters. Optionally, where the surface to be treated is an interior surface of a vessel having a lumen volume smaller than 100 mL, the treatment volume can be limited to the lumen volume or less. For example, vessels having a lumen volume of 0.1 to 100 mL, alternatively 0.5 to 10 mL, are contemplated, with treatment volumes accordingly.

The plasma treatment time in any embodiment can be, for example, from 1 to 300 seconds, optionally 3 to 300 sec., optionally 30 to 300 sec., optionally 150 to 250 sec., optionally 150 to 200 sec., optionally from 90 to 180 seconds.

The number of plasma treatment steps can vary, in any embodiment. For example one plasma treatment can be used; optionally two or more plasma treatments can be used, employing the same or different conditions.

In any embodiment, the plasma treatment apparatus employed can be any suitable apparatus, for example that of FIG. 1, FIG. 7, FIG. 8, or FIG. 10 described in this specification, as several examples. Plasma treatment apparatus of the type that employs the lumen of the vessel to be treated as a vacuum chamber, shown for example in U.S. Pat. No. 7,985,188, FIG. 2, can also be used in any embodiment.

The plasma treatment process of any embodiment optionally can be combined with treatment using an ionized gas. The ionized gas can be, as some examples, any of the gases identified as suitable for plasma treatment. The ionized gas can be delivered in any suitable manner. For example, it can be delivered from an ionizing blow-off gun or other ionized gas source. A convenient gas delivery pressure is from 1-120 psi (pounds per square inch) (6 to 830 kPa, kiloPascals) (gauge or, optionally, absolute pressure), optionally 50 psi (350 kPa). The water content of the ionized gas can be from 0 to 100%. The polar-treated contact surface with ionized gas can be carried out for any suitable treatment time, for example from 1-300 seconds, optionally for 10 seconds.

Polymeric Substrate Composition

Optionally in any embodiment, the result of the foregoing treatment is a polymeric substrate consisting essentially of a contact surface and an interior portion. Optionally in any embodiment, the contact surface includes from 1 to 30 atomic %, optionally from 5 to 20 atomic %, optionally from 5 to 10 atomic %, oxygen atoms; from 0 to 30 atomic %, optionally from 0 to 20 atomic %, optionally from 0 to 10 atomic %, nitrogen atoms; and from 80 to 99 atomic %, optionally from 80 to 95 atomic %, optionally from 90 to 95 atomic %, carbon atoms; in which the atomic % values are measured by x-ray photoelectron spectroscopy (XPS).

Optionally in any embodiment, oxygen and/or nitrogen atoms within the stated proportions are grafted to the carbon atoms. Alternatively, the carbon, oxygen, and nitrogen atoms can be deposited on a substrate to form a contact surface.

Optionally in any embodiment, the interior portion of the substrate comprises at least 80 atomic %, optionally at least 85 atomic %, optionally at least 90 atomic %, optionally at least 95 atomic %, optionally 100 atomic %, carbon atoms, and a larger atomic % of carbon atoms than the contact surface.

Optionally in any embodiment, the contact surface comprises from 0.1 to 10 atomic %, optionally from 0.1 to 5 atomic %, optionally from 1 to 5 atomic %, carbon atoms to which oxygen is grafted.

Optionally in any embodiment, the contact surface comprises from 0.1 to 10 atomic %, optionally from 0.1 to 5 atomic %, hydrogen bond acceptor groups. Examples of such hydrogen bond acceptor groups include, without limitation, moieties selected from —N+—N—, =O, —O—, —O2, —O3, C=O, O—C=O, C—O—C, or ≡N, bonded to carbon in each case, optionally selected from or any combination of two or more of these.

Optionally in any embodiment, the contact surface comprises a carbon or silicon compound modified with polar grafted species, optionally one or more of: C=O (carbonyl), C—O—C (ether), C—N—C (amine), C—N+—C (ammonium), CO2 (carboxyl), CO3, Si=O, Si—O—Si, Si—N—Si, Si—N+—Si, SiO2, SiO3,

C≡N,

Si≡N.

or a combination of two or more of these, as measured by x-ray photoelectron spectroscopy (XPS).

Optionally in any embodiment, the contact surface comprises thermoplastic material, for example a thermoplastic resin, for example an injection-molded thermoplastic resin. Some non-limiting examples of suitable resins include a hydrocarbon polymer, for example an olefin polymer, polypropylene (PP), polyethylene (PE), cyclic olefin copolymer (COC), cyclic olefin polymer (COP), polymethylpentene, polystyrene, hydrogenated polystyrene, polycyclohexylethylene (PCHE), or combinations of two or more of these, or a heteroatom-substituted hydrocarbon polymer, for example a polyester, polyethylene terephthalate, polyethylene naphthalate, polybutylene terephthalate (PBT), polyvinylidene chloride (PVdC), polyvinyl chloride (PVC), polycarbonate, polylactic acid, epoxy resin, nylon, polyurethane polyacrylonitrile, polyacrylonitrile (PAN), an ionomeric resin, Surlyn® ionomeric resin, or any combination, composite or blend of any two or more of the above materials.

Optionally in any embodiment, the contact surface has a biomolecule recovery percentage of at least 10%, optionally at least 20%, optionally at least 30%, optionally at least 40%, optionally at least 45%, optionally at least 50%, optionally at least 55%, optionally at least 60%, optionally at least 65%, optionally at least 70%, optionally at least 75%, optionally at least 80%, optionally at least 85%, optionally at least 90% optionally at least 95%. Optionally in any embodiment, the biomolecule recovery percentage is determined for at least one of: mammal serum albumin; Bovine Serum Albumin (BSA); Fibrinogen (FBG); Transferrin (TFN); egg white ovotransferrin (conalbumin); membrane-associated melanotransferrin; Protein A (PrA); Protein G (PrG); Protein A/G; Protein L; insulin; pharmaceutical protein; blood or blood component proteins; and any recombinant form, modification, full length precursor, signal peptide, propeptide, or mature variant of these proteins.

Optionally in any embodiment, for BSA having an atomic mass of 66,000 Daltons, the biomolecule recovery percentage is at least 20%, optionally at least 30%, optionally at least 40%, optionally at least 50%, optionally at least 60%, optionally at least 70%, optionally at least 80%, optionally at least 90%, optionally at least 95%, optionally at least 99%, optionally from 10% to 90%, optionally from 20% to 90%, optionally from 30% to 90%, optionally from 40% to 90%, optionally from 50% to 90%, optionally from 60% to 90%, optionally from 70% to 90%, optionally from 80% to 90%.

Optionally in any embodiment, for FBG having an atomic mass of 340,000 Daltons, the biomolecule recovery percentage is at least 10%, optionally at least 20%, optionally at least 30%, optionally at least 40%, optionally at least 50%, optionally at least 60%, optionally at least 70%, optionally at least 80%, optionally at least 90%, optionally at least 95%, optionally at least 99%, optionally from 10% to 90%, optionally from 20% to 90%, optionally from 30% to 90%, optionally from 40% to 90%, optionally from 50% to 90%, optionally from 60% to 90%, optionally from 70% to 90%, optionally from 80% to 90%, optionally from 15% to 20%.

Optionally in any embodiment, for TFN having an atomic mass of 80,000 Daltons, the biomolecule recovery percentage is at least 30%, optionally at least 20%, optionally at least 30%, optionally at least 40%, optionally at least 50%, optionally at least 60%, optionally at least 70%, optionally at least 80%, optionally at least 90%, optionally at least 95%, optionally at least 99%, optionally from 10% to 90%, optionally from 20% to 90%, optionally from 30% to 90%, optionally from 40% to 90%, optionally from 50% to 90%, optionally from 60% to 90%, optionally from 70% to 90%, optionally from 80% to 90%, optionally from 30% to 50%.

Optionally in any embodiment, for PrA having an atomic mass of 45,000 Daltons, the biomolecule recovery percentage is at least 10%, optionally at least 20%, optionally at least 30%, optionally at least 40%, optionally at least 50%, optionally at least 60%, optionally at least 70%, optionally at least 80%, optionally at least 90%, optionally at least 95%, optionally at least 99%, optionally from 10% to 90%, optionally from 20% to 90%, optionally from 30% to 90%, optionally from 40% to 90%, optionally from 50% to 90%, optionally from 60% to 90%, optionally from 70% to 90%, optionally from 80% to 90%, optionally from 10% to 90%.

Optionally in any embodiment, for PrG having an atomic mass of 20,000 Daltons, the biomolecule recovery percentage is at least 10%, optionally at least 20%, optionally at least 30%, optionally at least 40%, optionally at least 50%, optionally at least 60%, optionally at least 70%, optionally at least 80%, optionally at least 90%, optionally at least 95%, optionally at least 99%, optionally from 10% to 90%, optionally from 20% to 90%, optionally from 30% to 90%, optionally from 40% to 90%, optionally from 50% to 90%, optionally from 60% to 90%, optionally from 70% to 90%, optionally from 80% to 90%, optionally from 5% to 90%.

Optionally in any embodiment, the contact surface is a vessel lumen surface, for example a fluid contact surface of an article of labware. Examples of suitable articles of labware include a microplate, a centrifuge tube, a pipette tip, a well plate, a microwell plate, an ELISA plate, a microtiter plate, a 96-well plate, a 384-well plate, a vial, a bottle, a jar, a syringe, a cartridge, a blister package, an ampoule, an evacuated blood collection tube, a specimen tube, a centrifuge tube, or a chromatography vial.

Optionally in any embodiment, the contact surface is in contact with an aqueous protein.

Optionally in any embodiment, the contact surface has a contact angle with distilled water of from 0° to 90°, optionally from 20° to 80°, optionally from 40° to 80°, optionally from 50° to 70°, optionally from 55° to 65°.

Optionally in any embodiment, the contact surface has an electrostatic charge build-up on the converted and optionally conditioned contact surface of less than 5 kilovolts per cm (5 kV/cm), optionally less than 3 kV/cm, optionally less than 2 kV/cm, optionally less than 1 kV/cm.

Optionally in any embodiment, the contact surface is treated with conditioning plasma, conversion plasma, or both of one or more non-polymerizing compounds to form the surface. Optionally in any embodiment, the non-polymerizing compound comprises, consists essentially of or consists of one or more members selected from the group consisting of: $O_2$, $N_2$, air, $O_3$, $N_2O$, $H_2$, $H_2O$, $H_2O_2$, $NH_3$, Ar, He and Ne.

Optionally in any embodiment, the contact surface is a PECVD deposited coating from 5 to 1000 nm thick. Optionally in any embodiment, the PECVD deposited coating is applied using any one or combination of gas precursors including siloxane, organosiloxane, polyethylene glycol (PEG); or monomer gas precursors including acetylene, methane, propane, butane, ethane, and/or co-monomer gases including air, oxygen or water vapor. Optionally in any embodiment, the PECVD deposited coating is an amorphous carbon coating further comprising oxygen and optionally nitrogen heteroatoms. For example, the amorphous carbon coating can be applied using carbon-containing monomer gas precursors, for example acetylene, ethylene methane, ethane, propane, butane, or a combination of two or more of these, and a reactive gas including air, oxygen, water vapor, or a combination of two or more of these.

Biomolecule Contact and Recovery

After the plasma treatment(s) of any embodiment, the treated contact surface, for example a vessel lumen surface, can be contacted with an aqueous protein or other biomolecule. Some non-limiting examples of suitable proteins are the aqueous protein comprises: mammal serum albumin, for example Bovine Serum Albumin (BSA); Fibrinogen (FBG); Transferrin (TFN), for example blood serotransferrin (or siderophilin, also known as transferrin); lactotransferrin (lactoferrin); milk transferrin; egg white ovotransferrin (conalbumin); and membrane-associated melanotransferrin; Protein A (PrA); Protein G (PrG); Protein A/G; Protein L; Insulin, for example hexameric insulin, monomeric insulin, porcine insulin, human insulin, recombinant insulin and pharmaceutical grades of insulin; Pharmaceutical protein; blood or blood component proteins; or any recombinant form, modification, full length precursor, signal peptide, propeptide, or mature variant of these proteins; or a combination of two or more of these.

Optionally, the treated contact surface has a protein recovery percentage greater than the protein recovery percentage of the unconditioned and unconverted surface for at least one of Bovine Serum Albumin (BSA); Fibrinogen (FBG); Transferrin (TFN), for example blood serotransferrin (or siderophilin, also known as transferrin); lactotransferrin (lactoferrin); milk transferrin; egg white ovotransferrin (conalbumin); and membrane-associated melanotransferrin; Protein A (PrA); Protein G (PrG); Protein A/G; Protein L; Insulin, for example hexameric insulin, monomeric insulin, porcine insulin, human insulin, recombinant insulin and pharmaceutical grades of insulin; pharmaceutical protein; blood or blood component proteins; or any recombinant form, modification, full length precursor, signal peptide, propeptide, or mature variant of these proteins or peptides.

First More Detailed Embodiment

A vessel having a substrate according to the first more detailed embodiment may be made, for example, from any of the materials defined above. For applications in which clear and glass-like polymers are desired (e.g., for syringes and vials), a cyclic olefin polymer (COP), cyclic olefin copolymer (COC), polymethylmethacrylate, polyethylene terephthalate or polycarbonate may be preferred. Also contemplated are linear polyolefins such as polypropylene and aromatic polyolefins such as polystyrene. Such substrates may be manufactured, e.g., by injection molding or injection stretch blow molding (which is also classified as injection molding in any embodiment of this disclosure), to very tight and precise tolerances (generally much tighter than achievable with glass). Plasma treated glass substrates, for example borosilicate glass substrates, are also contemplated.

A vessel according to the first more detailed embodiment can be a container, for example a sample tube or a cuvette for holding fluids, e.g., for holding biological materials or biologically active compounds or compositions e.g. for collecting or storing biological fluids like blood or urine, a syringe (or a part thereof, for example a syringe barrel) for storing or delivering a biologically active compound or composition, e.g., a medicament or pharmaceutical composition, a vial for storing biological materials or biologically active compounds or compositions, a pipe or other conduit for transporting biological materials or biologically active compounds or compositions, for example a catheter. Other non-limiting examples of contemplated vessels include well or non-well slides or plates, for example titer plates or microtiter plates (also known as microplates). Other examples of vessels include measuring and delivery devices such as pipettes, pipette tips, Erlenmeyer flasks, beakers, and graduated cylinders. The specific vessels described herein with respect to an actual reduction to practice of a non-limiting embodiment are polypropylene 96-well microplates and beakers. However, a skilled artisan would understand that the methods and equipment set-up described herein can be modified and adapted, consistent with the present technology, to accommodate and treat any type of surface or a vessel or other type of object.

The surface of the vessel of the first more detailed embodiment may be made from the substrate material itself, e.g., any of the thermoplastic resins listed above. Optionally, the substrate may be a bulk material or may be a pH protective coating or layer of PECVD deposited $SiO_xC_yH_z$ or $SiN_xC_yH_z$, in which x is from about 0.5 to about 2.4 as measured by X-ray photoelectron spectroscopy (XPS), y is from about 0.6 to about 3 as measured by XPS, and z is from about 2 to about 9 as measured by Rutherford backscattering spectrometry (RBS). Another example of a substrate is a barrier coating or layer of PECVD deposited $SiO_x$, in which x is from about 1.5 to about 2.9 as measured by XPS, optionally an oxide or nitride of an organometallic precursor that is a compound of a metal element from Group III and/or Group IV of the Periodic Table, e.g. in Group III: Boron, Aluminum, Gallium, Indium, Thallium, Scandium, Yttrium, or Lanthanum, (Aluminum and Boron being preferred), and in Group IV: Silicon, Germanium, Tin, Lead, Titanium, Zirconium, Hafnium, or Thorium (Silicon and Tin being preferred). Methods and equipment for depositing these coatings or layers are described in detail in WO2013/071138, published May 16, 2013, which is incorporated herein by reference in its entirety.

Methods according to the first more detailed embodiment employ the use of remote conversion plasma treatment. Unlike direct plasma processing, in the case of remote conversion plasma, neither ions nor electrons of plasma contact the article surface in substantial amounts. Neutral species, typically having lower energy, are present in the plasma afterglow, which are sufficiently energetic to react with the article surface, without sputtering or other higher energy chemical reactions induced by ions and electrons. The result of remote conversion plasma is a gentle surface modification without the high energy effects of "direct" plasmas.

Methods according to the first more detailed embodiment employ non-polymerizing gases, such as $O_2$, $N_2$, air, $O_3$, $N_2O$, $H_2$, $H_2O_2$, $NH_3$, Ar, He, Ne, other non-polymerizing gases, and combinations of any of two or more of the foregoing. These may also include non-polymerizing alcohols, non-polymerizing organic acids and non-polymerizing polar organic solvents. Experiments have been carried out in which the conditioning step (non-polymerizing compound step) used Ar, N2, Ar/O2 mix, or N2/O2 mix and a pretreatment conditioning step with Ar. These and other non-polymerizing gases do not necessarily deposit a coating. Rather, they react with the surface to modify the surface, e.g., to form a treated contact surface, in which the treated contact surface has a biomolecule recovery percentage greater than the biomolecule recovery percentage of the unconditioned and unconverted surface. For example, the surface reactions may result in new chemical functional groups on the surface, including, but not limited to carbonyl, carboxyl, hydroxyl, nitrile, amide, amine. It is contemplated that these polar chemical groups increase the surface energy and hydrophilicity of otherwise hydrophobic polymers that an unconditioned and unconverted surface may typically comprise. While hydrophobic surfaces are generally good binding surfaces for biomolecules, hydrophilic surfaces, which attract water molecules, facilitate the blocking of biomolecules binding to that surface. While the invention is not limited according to this theory of operation, it is contemplated that this mechanism prevents biomolecule binding to surfaces.

Optionally, methods according to the first more detailed embodiment may be used to reduce the propensity of a substrate surface to cause biomolecules to adhere thereto. Preferably, the methods will reduce biomolecule adhesion across a wide spectrum of biomolecules, including but not limited to one or more of the following aqueous proteins: mammal serum albumin, for example Bovine Serum Albumin (BSA); Fibrinogen (FBG); Transferrin (TFN), for example blood serotransferrin (or siderophilin, also known as transferrin); lactotransferrin (lactoferrin); milk transferrin; egg white ovotransferrin (conalbumin); and membrane-associated melanotransferrin; Protein A (PrA); Protein G (PrG); Protein A/G; Protein L; Insulin, for example hexameric insulin, monomeric insulin, porcine insulin, human insulin, recombinant insulin and pharmaceutical grades of insulin; Pharmaceutical protein; blood or blood component proteins; or any recombinant form, modification, full length precursor, signal peptide, pro-peptide, or mature variant of these proteins; and a combination of two or more of these.

FIG. 1 is a schematic generic view of remote conversion plasma treatment apparatus of the first more detailed embodiment having common features with each more particular embodiment of FIGS. 2, 6, 7, and 8 for carrying out remote conversion plasma treatment in this specification. Plasma gas from a fluid source 12 capable of supporting the generation of plasma in the plasma zone 15 having a boundary 20 (plasma is defined here as a visible glow discharge) is introduced via a fluid inlet 13 to a plasma zone 15, and plasma energy from a plasma energy source 18 is provided to the plasma zone 15 to generate plasma having a boundary 20 in the plasma zone 15.

The plasma energy of the first more detailed embodiment broadly can be any type of energy that will ignite plasma in the plasma zone 15. For example, it can be direct current (DC) or alternating current (electromagnetic energy) having a frequency from 3 Hz to 300 GHz. Electromagnetic energy in this range generally includes radio frequency (RF) energy and microwave energy, more particularly characterized as extremely low frequency (ELF) of 3 to 30 Hz, super low frequency (SLF) of 30 to 300 Hz, voice or ultra-low frequency (VF or ULF) of 300 Hz to 3 kHz, very low frequency (VLF) of 3 to 30 kHz, low frequency (LF) of 30 to 300 kHz, medium frequency (MF) of 300 kHz to 3 MHz, high frequency (HF) of 3 to 30 MHz, very high frequency (VHF) of 30 to 300 MHz, ultra-high frequency (UHF) of 300 MHz to 3 GHz, super high frequency (SHF) of 3 to 30 GHz, extremely high frequency (EHF) of 30 to 300 GHz, or any combination of two or more of these frequencies. For example, high frequency energy, commonly 13.56 MHz, is useful RF energy, and ultra-high frequency energy, commonly 2.54 GHz, is useful microwave energy, as two non-limiting examples of commonly used frequencies.

The nature of the optimal applicator 23 of the first more detailed embodiment is determined by the frequency and power level of the energy, as is well known. If the plasma is excited by radio waves, for example, the applicator 23 can be an electrode, while if the plasma is excited by microwave energy, for example, the applicator 23 can be a waveguide.

An afterglow region 24 of the first more detailed embodiment is located outside but near the plasma boundary 20, and contains treatment gas 17. The afterglow region 24 can be the entire treatment volume 10 outside the plasma boundary 20 and within the reaction chamber wall 1 and lid 19, or the afterglow region 24 can be a subset of the treatment volume 10, depending on the dimensions of and conditions maintained in the treatment volume. The treatment gas 17 in the afterglow region 24 is not ionized sufficiently to form plasma, but it is sufficiently energetic to be capable of modifying a surface that it contacts, more so than the same gas composition at the same temperature and pressure in the absence of the plasma.

It will be understood by a skilled person that some gas compositions are sufficiently chemically reactive that they will modify a substrate in the apparatus 9 of the first more detailed embodiment when plasma is absent. The test for whether a region of, or adjacent to, remote conversion plasma treatment apparatus is within the afterglow, for given equipment, plasma, gas feed, and pressure or vacuum conditions producing a visible glow discharge outside the region, is whether a substrate located in the region under the given equipment, plasma, gas feed, and pressure is modified compared to a substrate exposed to the same equipment, gas feed and pressure or vacuum conditions, when no plasma is present in the region normally defining the plasma zone as the result of the absence of or insufficiency of the plasma energy 18 of the first more detailed embodiment.

Remote conversion plasma treatment of the first more detailed embodiment is carried out by providing plasma in the plasma zone 15, which generates an afterglow in the afterglow region or remote conversion plasma (two terms for the same region) 24, which contacts and modifies a substrate surface placed at least partially in the afterglow region 24.

As one option of the first more detailed embodiment in the remote conversion plasma treatment apparatus, the plasma gas enters the plasma zone, is excited to form plasma, then continues downstream to the afterglow region 24 where it has less energy, is then defined as treatment gas 17, and contacts the substrate. In other words, at least a portion of the gas flows through the plasma zone 15, is energized to form plasma, and continues to the afterglow region 24, becoming more energetic in the plasma zone 15 and less energetic by the time it enters the afterglow region 24 (but still energized compared to the gas before entering the plasma zone 15). Where this option is adopted, the plasma and the afterglow region 24 are in gas communication and at least some of the same gas is fed through both zones. Optionally, as where plasma is not generated in the entire cross-section of flowing gas, some of the gas may bypass the plasma by staying outside the boundary 20 of the plasma zone 15 and still flow through the afterglow region 24, while other gas flows through both the plasma zone 15 and the afterglow region 24.

As another option in the remote conversion plasma treatment apparatus of the first more detailed embodiment, the plasma gas can be different molecules from the treatment gas 17 (though the plasma gas and treatment gas may either have identical compositions or different compositions), and the plasma gas remains in or is fed through only the plasma zone 15 and not the afterglow region 24, while the treatment gas is energized by the plasma gas but is separate from the plasma gas and while in the afterglow region 24 is not energized sufficiently to form plasma.

The nature of the applicator 23 of the first more detailed embodiment can vary depending on the application conditions, for example the power level and frequency of the plasma energy 18. For example, the applicator can be configured as an electrode, antenna, or waveguide.

Optionally, a shield 16 may be placed between the plasma and at least a portion of the substrate 14 in the treatment area of the first more detailed embodiment to prevent the plasma from contacting or coming undesirably close to the substrate 14 or unevenly affecting the substrate 14. For one example, the optional shield 16 in FIG. 1 can be perforated to allow gas flow through it, particularly flow of the neutral species forming the afterglow, but the shield 16 is configured or equipped, suitably for the choice of plasma-forming energy, to prevent the plasma from penetrating the shield of the first more detailed embodiment. For example, the perforations may be sized or the shield can be electrically biased or grounded such that the plasma-forming energy or the plasma cannot pass through it. This arrangement has the advantage that, if the plasma zone has a substantial area intersecting with the shield, the substantial area optionally is flattened so the plasma boundary 20 has a "flat spot" 26, illustrated in FIG. 1 of the first more detailed embodiment, which can be placed parallel to the surface of the substrate to be treated so they are equidistant over a substantial area, instead of the plasma terminating in a tapered tail that extends much closer to one portion of the substrate 14 than to other parts of the substrate 14 not aligned with the tail, illustrated in FIG. 8 of the first more detailed embodiment.

Another shield option of the first more detailed embodiment is that the shield can be made such that it passes neither gas nor plasma, serving as an obstruction of the direct path between some or all of the plasma and some or all of the treatment area. The obstruction can fill less than all of the gas cross-section flowing from the plasma zone 15 to the afterglow region 24, so non-ionized gas can flow around the shield and reach the afterglow region 24 by a circuitous path, while plasma cannot either circumvent or pass through it.

Yet another shield option of the first more detailed embodiment is that the substrate 14 to be treated can be positioned in the apparatus during treatment such that one portion of a substrate 14 that can withstand contact with plasma is exposed to the plasma, shielding from the plasma another portion of the substrate 14 or another substrate receiving remote conversion plasma treatment.

Still another shield option of the first more detailed embodiment is that the gas flow path through the plasma and treatment area can be sharply bent, for example turning a 90 degree corner between the plasma and treatment area, so the wall of the apparatus itself shields the treatment area from line-of-sight relation to the plasma under certain treatment conditions.

The substrate orientation in the treatment volume of the first more detailed embodiment can vary, and the substrate, applicator, gas and vacuum sources can optionally be arranged to provide either substantially even or uneven exposure to remote conversion plasma across a substrate.

Another option in the first more detailed embodiment is that the substrate itself can serve as the reactor wall or a portion of the reactor wall, so treatment gas 17 introduced into reactor treats the portion of the substrate serving as the reactor wall.

Another option in the first more detailed embodiment is the introduction of a second non-polymerizing gas, functioning as diluent gas, into the reactor, in addition to the non-polymerizing compound or water vapor which is the active agent of the treatment gas 17. Diluent gases are defined as gases introduced at the fluid inlet 13 that do not materially interact with the substrate 14 to the extent they find their way into the treatment gas 17, given the treatment apparatus and conditions applied. Diluent gases can either participate or not participate in formation of the plasma. The diluent gas can be introduced through the inlet 13 or elsewhere in the reactor. Diluent gases can be added at a rate from 1% to 10,000% by volume, optionally 10% to 1000% by volume, optionally 100% to 1000% by volume, of the rate of addition of the non-polymerizing compound or water vapor.

As another option in the first more detailed embodiment, some or all of the non-polymerizing compound or water vapor can be added to the treatment volume 10 in such a manner as to bypass the plasma zone 15 en route to the treatment gas 17.

Figure 2:
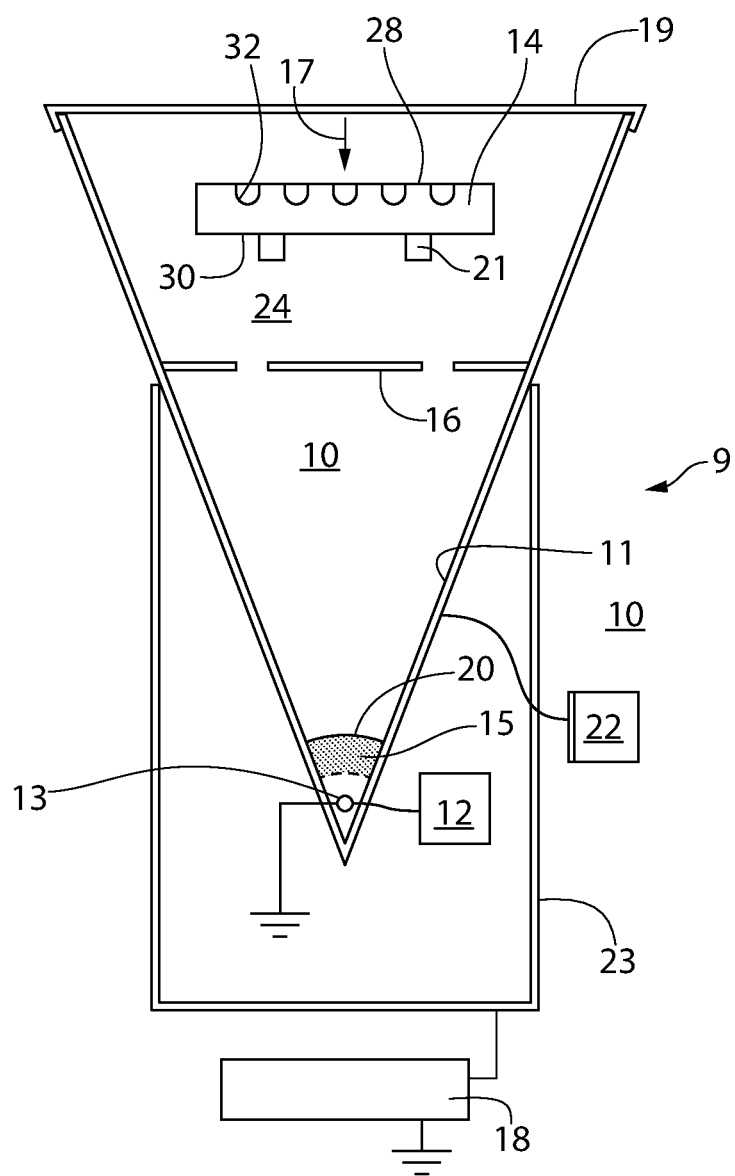
FIG. 2 illustrates an exemplary plasma reactor configuration for carrying out remote conversion plasma treatment of microplates according to the first more detailed embodiment.

FIG. 2 of the first more detailed embodiment shows another embodiment of the apparatus of FIG. 1. The apparatus again can be used for carrying out the remote conversion plasma treatment according to the first more detailed embodiment. The chamber of this embodiment comprises a treatment volume 10 defined and enclosed by a reaction chamber wall 11, which optionally is not electrically conductive. The treatment volume 10 is supplied with a fluid source 12 (in this instance, a tubular fluid inlet 13 projecting axially into the treatment volume 10, however other fluid sources are contemplated, e.g., "shower head" type fluid sources). Optionally, the treatment volume 10 can be defined by a treatment chamber wall 11 or by the lumen within a vessel or other article to be treated. Feed gases are fed into the treatment volume 10. The plasma reaction chamber comprises as an optional feature a vacuum source 22 for at least partially evacuating the treatment volume 10 compared to ambient pressure, for use when plasma treating at reduced pressure, although plasma treating under suitable conditions at ambient atmospheric pressure or at a pressure higher than ambient atmospheric pressure is also contemplated.

The plasma reaction chamber also comprises an optional outer applicator 23, here in the form of an electrode surrounding at least a portion of the plasma reaction chamber. A radio frequency (RF) plasma energy source 18 is coupled to the reaction chamber by an applicator 23 and provides power that excites the gases to form plasma. The plasma forms a visible glow discharge 20 that optionally is limited to a close proximity to the fluid source 12.

Microplates 14 optionally can be oriented such that the surfaces of the microplates 14 on which treatment is desired (the surface that is configured and intended to contact/hold a biomolecule-containing solution) face the fluid source 12. However, the surfaces to be treated can also or instead face away from the fluid source 12, as shown in FIG. 2. In addition, in the illustrated embodiment the microplate 14 is shielded with a shield 16 to block the microplate 14 from being in the direct "line of sight" of (i.e. having an unobstructed path to) the fluid source 12. As a non-limiting example, the respective surfaces of the microplates 14 can be positioned a horizontal distance of approximately 2.75 inches (7 cm) from the fluid source, although operation is contemplated with placement of the microplate 14 surfaces at a horizontal distance of from ½ to 10 inches (1 to 25 cm), optionally 2.5 to 5.5 inches (6 to 14 cm) from the fluid source. In this manner, the process relies on remote conversion plasma (as opposed to direct plasma) to treat the microplates' 14 surfaces. In this non-limiting example, the system has a capacity of 20 parts (microplates) per batch at a total process time of eight minutes per batch.

Figure 6:
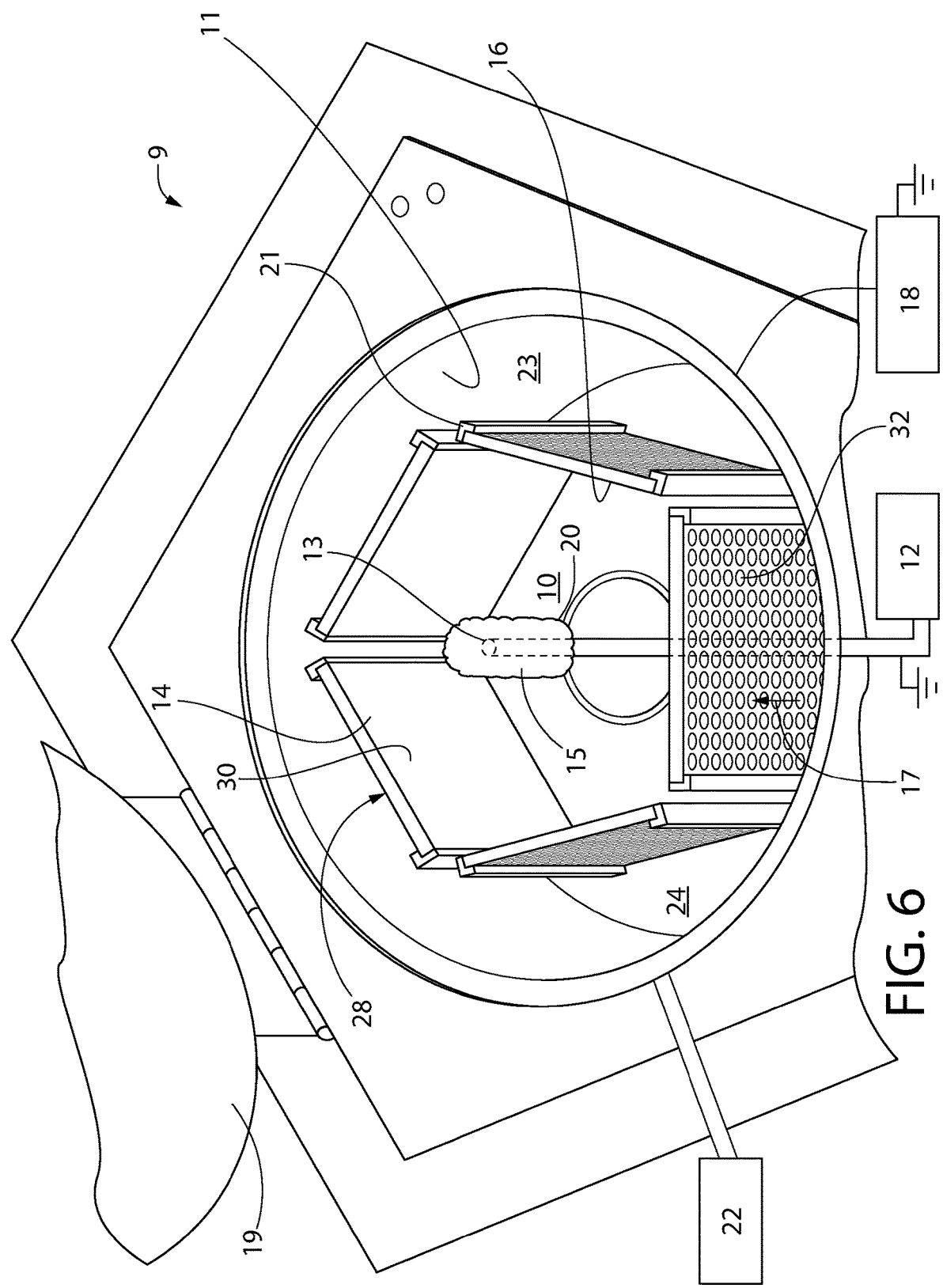
FIG. 6 illustrates an exemplary radio-frequency-excited plasma reactor configuration according to FIG. 1 for carrying out remote conversion plasma treatment of microplates according to the first more detailed embodiment.

FIG. 6 of the first more detailed embodiment shows another embodiment of the apparatus of FIG. 1. The process used to treat the microplates in FIG. 6 uses a radio-frequency (RF) plasma system. The system has a gas delivery input, a vacuum pump and RF power supply with matching network. The microplates are shown oriented with the front surfaces containing the wells 32 facing away from and shielded from the plasma along the perimeter of the chamber.

These details are illustrated in FIG. 6 of the first more detailed embodiment, where there is shown another exemplary setup having all the elements of the apparatus of FIG. 2 of the first more detailed embodiment for use in a plasma reaction chamber for carrying out remote conversion plasma treatment according to the first more detailed embodiment. The chamber of the first more detailed embodiment comprised a treatment volume 10 defined and enclosed by a reaction chamber wall 11 having a fluid source 12 (in this instance, a tubular fluid inlet 13 projecting axially into the treatment volume 10, however other fluid sources are contemplated, e.g., "shower head" type fluid sources). The reaction chamber wall 11 in this embodiment was provided with a removable lid 13 that is openable to allow substrates to be inserted or removed and sealable to contain the process and, optionally, evacuate the treatment volume. In the first more detailed embodiment, the fluid source 12 was made of metallic material, electrically grounded, and also functioned as an applicator, in the form of an inner electrode. As is well known, the plasma of the first more detailed embodiment optionally can be generated without an inner electrode.

Feed gases were fed into the treatment volume 10. The plasma reaction chamber comprised an optional feature of a vacuum source 22 for at least partially evacuating the treatment volume 10. The plasma reaction chamber wall 11 also functioned as an applicator 23 in the form of an outer applicator or electrode surrounding at least a portion of the plasma reaction chamber. A plasma energy source 18, in this instance a radio frequency (RF) source, was coupled to applicators 23 defined by the reaction chamber wall 24 and the fluid source 12 to provide power that excited the gases to form plasma. The plasma zone 15 formed a visible glow discharge that was limited by the plasma boundary 20 in close proximity to the fluid source 12. The afterglow region also known as a remote conversion plasma region 24 is the region radially or axially outside the boundary 20 of the visible glow discharge and extending beyond the substrates treated.

Microplates 14 having front surfaces 28 and back surfaces 30 were oriented such that the wells 32 on the front surfaces of the microplates 14 on which treatment was desired (the front surface that is configured and intended to contact/hold a biomolecule-containing solution) faced away from the fluid source 12 and the back surfaces 30 faced toward the fluid source 12. The front surfaces 28 of the microplates 14 were shielded by their own back surfaces 30 to block the microplate front surfaces 28 from being in the direct "line of sight" of the fluid source 12. In this manner, the process relied on remote conversion plasma (as opposed to direct plasma) to treat the surfaces of the wells 32.

Figure 7:
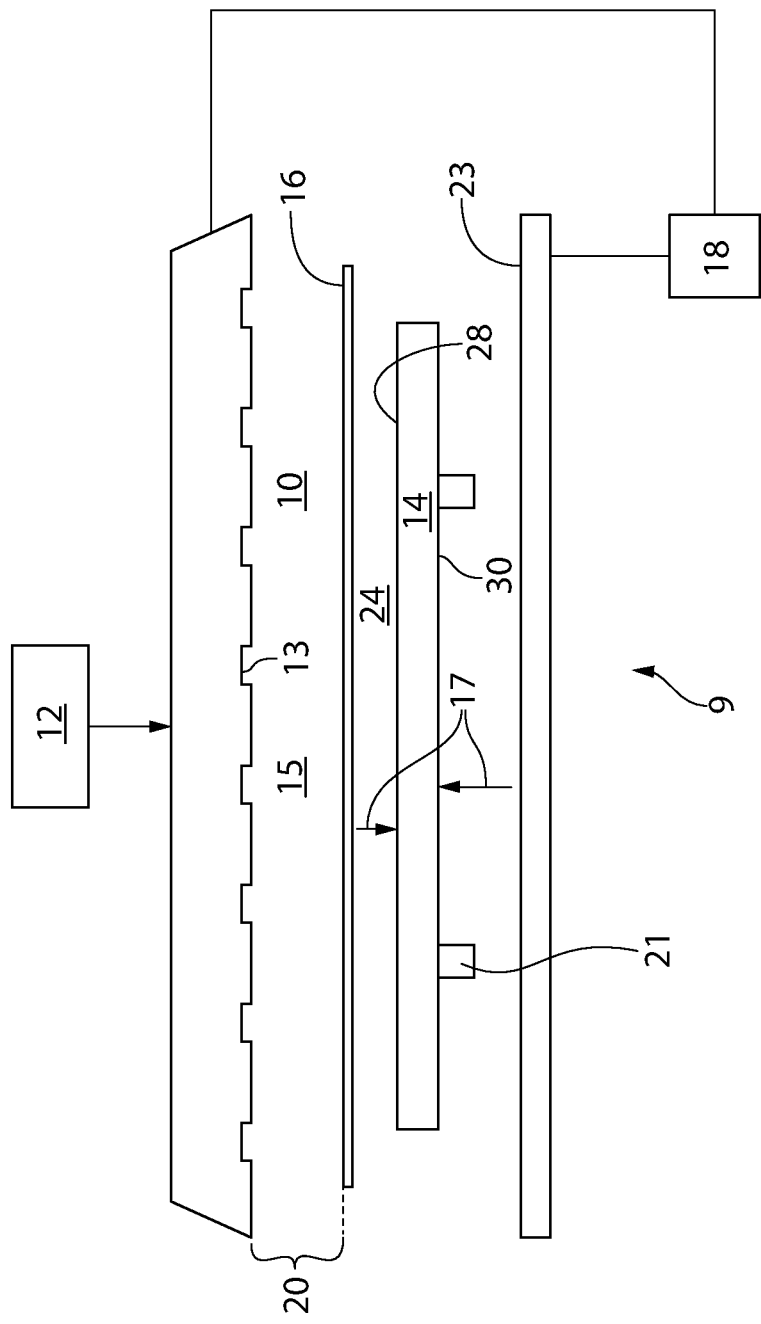
FIG. 7 illustrates another exemplary plasma reactor configuration according to FIG. 1 for carrying out remote conversion plasma treatment of microplates according to the first more detailed embodiment.

FIG. 7 of the first more detailed embodiment shows another embodiment of the apparatus of FIG. 1, having corresponding features. The embodiment of FIG. 7 provides a "shower head" fluid inlet 13 and a plate electrode as the applicator 23 that provide more uniform generation and application of treatment gas 17 over a wider area of the substrate 14.

Figure 8:
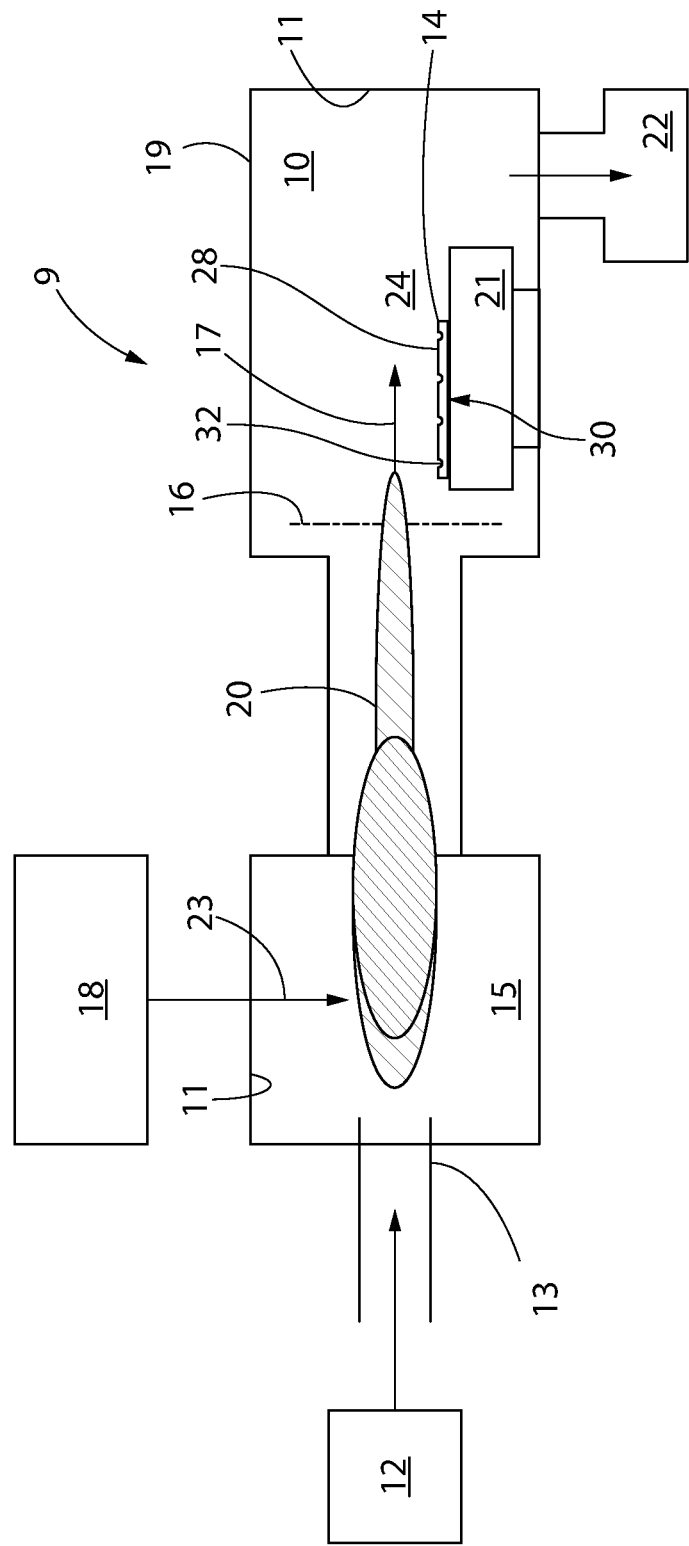
FIG. 8 is an exemplary microwave-excited plasma reactor configuration according to FIG. 1 for carrying out remote conversion plasma treatment of microplates according to the first more detailed embodiment.

FIG. 8 of the first more detailed embodiment shows another embodiment of the apparatus of FIG. 1, having corresponding features. The embodiment of FIG. 8 provides microwave plasma energy 18 delivered through an applicator 23 configured as a waveguide. In this embodiment the plasma zone 15 and substrate support 21 are provided in separate vessels connected by a conduit.

Optionally in the first more detailed embodiment, the treated contact surface has a biomolecule recovery percentage greater than the biomolecule recovery percentage of the unconditioned and unconverted surface for at least one of Bovine Serum Albumin (BSA); Fibrinogen (FBG); Transferrin (TFN), for example blood serotransferrin (or siderophilin, also known as transferrin); lactotransferrin (lactoferrin); milk transferrin; egg white ovotransferrin (conalbumin); and membrane-associated melanotransferrin; Protein A (PrA); Protein G (PrG); Protein A/G; Protein L; Insulin, for example hexameric insulin, monomeric insulin, porcine insulin, human insulin, recombinant insulin and pharmaceutical grades of insulin; pharmaceutical protein; blood or blood component proteins; or any recombinant form, modification, full length precursor, signal peptide, propeptide, mature variant of these proteins and a combination of two or more of these.

In one optional embodiment of the first more detailed embodiment, a plasma treatment process comprises, consists essentially of, or consists of the following two steps using remote conversion plasma: (1) an oxygen plasma step (or more generically, a non-polymerizing compound plasma step) followed by (2) a water vapor plasma step. It should be understood that additional steps before, between, or after the aforementioned steps may be added and remain within the scope of the first more detailed embodiment. Further, it should also be understood that the oxygen plasma step may utilize optional gases to oxygen, including but not limited to nitrogen or any non-polymerizing gases listed in this specification. As another optional embodiment of the first more detailed embodiment, a plasma treatment process comprises, consists essentially of, or consists of using remote conversion plasma of oxygen and water vapor combined in one plasma step. This optional embodiment is characterized as a conversion step without a preliminary conditioning step in the present specification.

Optional process parameter ranges for the conditioning step (non-polymerizing compound plasma step) and second treatment step (water vapor plasma step) of the first more detailed embodiment are set forth in Table 1 of the first more detailed embodiment

TABLE 1

Process parameter ranges for plasma treatment

| Non-Polymerizing Compound Plasma Step | | Water Vapor Plasma Step | |
|---|---|---|---|
| Power (W) | 50-600 | Power (W) | 50-600 |
| Gas Flow rate (sccm) | 5-50 | $H_2O$ Flow rate (sccm) | 1-10 |

TABLE 1-continued

Process parameter ranges for plasma treatment

| Non-Polymerizing Compound Plasma Step | | Water Vapor Plasma Step | |
|---|---|---|---|
| Time (minutes) | 0.5-5 | Time (minutes) | 0.05-5 |
| Pressure (mTorr) | 0-1,000 | Pressure (mTorr) | 0-5,000 |

Optionally, no pretreatment step is required before the non-polymerizing gas plasma step.

Optionally, in the first more detailed embodiment, the remote conversion plasma used to treat a substrate surface may be RF generated plasma. Optionally, plasma enhanced chemical vapor deposition (PECVD) or other plasma processes may be used consistent with the first more detailed embodiment.

Optionally, the treatment volume in a plasma reaction chamber may be from 100 mL to 50 liters, preferably 8 liters to 20 liters for certain applications. Optionally, the treatment volume may be generally cylindrical, although other shapes and configurations are also contemplated.

Treated Substrate Disclosure

Treated substrates, and in particular treated contact surfaces, obtained by these and other methods are contemplated.

In an aspect of the substrate in any embodiment a converted and optionally conditioned contact surface comprises a carbon or silicon compound comprising from 1 to 30 atomic percent grafted oxygen, optionally from 2 to 20 atomic percent grafted oxygen, optionally from 4 to 12 atomic percent grafted oxygen, optionally from 1 to 2 atomic percent grafted oxygen, optionally from 2 to 3 atomic percent grafted oxygen, optionally from 3 to 4 atomic percent grafted oxygen, optionally from 4 to 5 atomic percent grafted oxygen, optionally from 5 to 6 atomic percent grafted oxygen, optionally from 6 to 7 atomic percent grafted oxygen, optionally from 7 to 8 atomic percent grafted oxygen, optionally from 8 to 9 atomic percent grafted oxygen, optionally from 9 to 10 atomic percent grafted oxygen, optionally from 10 to 11 atomic percent grafted oxygen, optionally from 11 to 12 atomic percent grafted oxygen, optionally from 12 to 13 atomic percent grafted oxygen, optionally from 13 to 14 atomic percent grafted oxygen, optionally from 14 to 15 atomic percent grafted oxygen, optionally from 15 to 16 atomic percent grafted oxygen, optionally from 16 to 17 atomic percent grafted oxygen, optionally from 17 to 18 atomic percent grafted oxygen, optionally from 18 to 19 atomic percent grafted oxygen, optionally from 19 to 20 atomic percent grafted oxygen, optionally from 20 to 21 atomic percent grafted oxygen, optionally from 21 to 22 atomic percent grafted oxygen, optionally from 22 to 23 atomic percent grafted oxygen, optionally from 23 to 24 atomic percent grafted oxygen, optionally from 24 to 25 atomic percent grafted oxygen, optionally from 25 to 26 atomic percent grafted oxygen, optionally from 26 to 27 atomic percent grafted oxygen, optionally from 27 to 28 atomic percent grafted oxygen, optionally from 28 to 29 atomic percent grafted oxygen, optionally from 29 to 30 atomic percent grafted oxygen, as measured by x-ray photoelectron spectroscopy (XPS).

It will be understood that an "atomic percent" or "at. %" of a particular species, typically a chemical element, on a converted and optionally conditioned contact surface is the number of atoms, molecules, or moieties of the particular species detected by XPS, divided by the number of all of the atoms, molecules, or moieties of all the species detected by XPS, multiplied by 100%. Thus, if 89 carbon atoms, 5 nitrogen atoms, and 11 oxygen atoms are all of the atoms detected on the substrate, the atomic percent of carbon is $$100\% \times 89/(89+5+11) = 84.8 \text{ at. } \% \text{ C}$$

"Grafted oxygen" or another grafted species as used here refers to oxygen or another grafted species that is chemically (more specifically, covalently) bonded to an atom or atoms on the substrate surface, as detected by XPS analysis. A species grafted on a molecule of a polymer at the substrate surface typically is grafted between the ends of the polymer molecule, either inserted into the polymer backbone or attached as a pendant group.

In an aspect of the substrate in any embodiment a converted and optionally conditioned contact surface comprises a carbon or silicon compound comprising from 0 to 30, optionally from 0.1 to 30 atomic percent grafted nitrogen, optionally from 0.1 to 20 atomic percent grafted nitrogen, optionally from 0.1 to 10 atomic percent grafted nitrogen, optionally from 0.1 to 1 atomic percent grafted nitrogen, optionally from 1 to 2 atomic percent grafted nitrogen, optionally from 2 to 3 atomic percent grafted nitrogen, optionally from 3 to 4 atomic percent grafted nitrogen, optionally from 4 to 5 atomic percent grafted nitrogen, optionally from 5 to 6 atomic percent grafted nitrogen, optionally from 6 to 7 atomic percent grafted nitrogen, optionally from 7 to 8 atomic percent grafted nitrogen, optionally from 8 to 9 atomic percent grafted nitrogen, optionally from 9 to 10 atomic percent grafted nitrogen, optionally from 10 to 11 atomic percent grafted nitrogen, optionally from 11 to 12 atomic percent grafted nitrogen, optionally from 12 to 13 atomic percent grafted nitrogen, optionally from 13 to 14 atomic percent grafted nitrogen, optionally from 14 to 15 atomic percent grafted nitrogen, optionally from 15 to 16 atomic percent grafted nitrogen, optionally from 16 to 17 atomic percent grafted nitrogen, optionally from 17 to 18 atomic percent grafted nitrogen, optionally from 18 to 19 atomic percent grafted nitrogen, optionally from 19 to 20 atomic percent grafted nitrogen, optionally from 20 to 21 atomic percent grafted nitrogen, optionally from 21 to 22 atomic percent grafted nitrogen, optionally from 22 to 23 atomic percent grafted nitrogen, optionally from 23 to 24 atomic percent grafted nitrogen, optionally from 24 to 25 atomic percent grafted nitrogen, optionally from 25 to 26 atomic percent grafted nitrogen, optionally from 26 to 27 atomic percent grafted nitrogen, optionally from 27 to 28 atomic percent grafted nitrogen, optionally from 28 to 29 atomic percent grafted nitrogen, optionally from 29 to 30 atomic percent grafted nitrogen, as measured by x-ray photoelectron spectroscopy (XPS).

In an aspect of the substrate in any embodiment the converted and optionally conditioned contact surface is further comprising from 0 to 30 atomic percent grafted nitrogen, optionally from 0 to 20 atomic percent grafted nitrogen, optionally from 0.1 to 30 atomic percent grafted nitrogen, optionally from 0.1 to 20 atomic percent grafted nitrogen, optionally from 0.1 to 10 atomic percent grafted nitrogen, optionally from 0.1 to 1 atomic percent grafted nitrogen, optionally from 1 to 2 atomic percent grafted nitrogen, optionally from 2 to 3 atomic percent grafted nitrogen, optionally from 3 to 4 atomic percent grafted nitrogen, optionally from 4 to 5 atomic percent grafted nitrogen, optionally from 5 to 6 atomic percent grafted nitrogen, optionally from 6 to 7 atomic percent grafted nitrogen, optionally from 7 to 8 atomic percent grafted nitrogen, optionally from 8 to 9 atomic percent grafted nitrogen, optionally from 9 to 10 atomic percent grafted nitrogen, optionally from 10 to 11 atomic percent grafted nitrogen, optionally from 11 to 12 atomic percent grafted nitrogen, optionally from 12 to 13 atomic percent grafted nitrogen, optionally from 13 to 14 atomic percent grafted nitrogen, optionally from 14 to 15 atomic percent grafted nitrogen, optionally from 15 to 16 atomic percent grafted nitrogen, optionally from 16 to 17 atomic percent grafted nitrogen, optionally from 17 to 18 atomic percent grafted nitrogen, optionally from 18 to 19 atomic percent grafted nitrogen, optionally from 19 to 20 atomic percent grafted nitrogen, optionally from 20 to 21 atomic percent grafted nitrogen, optionally from 21 to 22 atomic percent grafted nitrogen, optionally from 22 to 23 atomic percent grafted nitrogen, optionally from 23 to 24 atomic percent grafted nitrogen, optionally from 24 to 25 atomic percent grafted nitrogen, optionally from 25 to 26 atomic percent grafted nitrogen, optionally from 26 to 27 atomic percent grafted nitrogen, optionally from 27 to 28 atomic percent grafted nitrogen, optionally from 28 to 29 atomic percent grafted nitrogen, optionally from 29 to 30 atomic percent grafted nitrogen, as measured by x-ray photoelectron spectroscopy (XPS).

In an aspect of the substrate in any embodiment the converted and optionally conditioned contact surface comprises grafted hydrogen bond acceptor functional groups, for example one or more of —$N^+$—, —N—, =O, —O—, —$O_2$, —$O_3$, or $\equiv$N, bonded to carbon or silicon in each case, as measured by x-ray photoelectron spectroscopy (XPS).

In an aspect of the substrate in any embodiment the converted and optionally conditioned contact surface comprises a carbon or silicon compound modified with polar grafted species, optionally one or more of: C=O (carbonyl), C—O—C (ether), C—N—C (amine), C—$N^+$—C (ammonium), $CO_2$ (carboxyl), $CO_3$, Si=O, Si—O—Si, Si—N—Si, Si—$N^+$—Si, $SiO_2$, $SiO_3$, C$\equiv$N, Si$\equiv$N, or a combination of two or more of these, as measured by x-ray photoelectron spectroscopy (XPS).
Grafted Species In an aspect of the substrate in any embodiment the converted and optionally conditioned contact surface comprises a hydrocarbon modified with polar grafted species, and the total atomic proportion of carbon forming C=O (carbonyl), C—O—C (ether), C—N—C (amine), $CO_2$ (carboxyl), $CO_3$, N—$C_3$, $N^+C_4$, C$\equiv$N, or a combination of two or more of these grafted species is from 1 to 40%, optionally 5 to 30%, optionally 10 to 20%, of the total atomic proportion of carbon bonded with carbon or hydrogen in the substrate.

In an aspect of the substrate in any embodiment the converted and optionally conditioned contact surface comprises a silicon compound modified with polar grafted species, and the total atomic proportion of silicon forming Si=O, Si—O—Si, Si—N—Si, $SiO_2$, $SiO_3$, N—$Si_3$, $N^+Si_4$, Si$\equiv$N, or a combination of two or more of these is from 1 to 40%, optionally 5 to 30%, optionally 10 to 20%, of the total atomic proportion of silicon bonded with oxygen in the substrate.

In an aspect of the substrate in any embodiment the total atomic proportion of carbon forming C=O (carbonyl), C—O—C (ether), C—N—C (amine), $CO_2$ (carboxyl), or $CO_3$, or a combination of two or more of these is from 1 to 40%, optionally 5 to 30%, optionally 10 to 20%, of the total atomic proportion of carbon bonded with carbon or hydrogen in the substrate.

In an aspect of the substrate in any embodiment the total atomic proportion of carbon forming C—O—C (ether) or C—N—C (amine) or a combination of the two is from 1 to 40%, optionally 5 to 30%, optionally 10 to 20%, of the total atomic proportion of carbon bonded with carbon or hydrogen in the substrate.

In an aspect of the substrate in any embodiment the converted and optionally conditioned converted and optionally conditioned contact surface has a contact angle with distilled water of from 0° to 90°, optionally from 20° to 80°, optionally from 40° to 80°, optionally from 50° to 70°, optionally from 55° to 65°.

In an aspect of the substrate in any embodiment the converted and optionally conditioned contact surface has a biomolecule recovery percentage of at least 40%, optionally at least 45%, optionally at least 50%, optionally at least 55%, optionally at least 60%, optionally at least 65%, optionally at least 70%, optionally at least 75%, optionally at least 80%, optionally at least 85%, optionally at least 90% optionally at least 95%.

In an aspect of the substrate in any embodiment the converted and optionally conditioned contact surface is a vessel lumen surface.

In an aspect of the substrate in any embodiment the biomolecule recovery percentage is determined for at least one of: mammal serum albumin; Bovine Serum Albumin (BSA); Fibrinogen (FBG); Transferrin (TFN); egg white ovotransferrin (conalbumin); membrane-associated melanotransferrin; Protein A (PrA); Protein G (PrG); Protein A/G; Protein L; Insulin; Pharmaceutical protein; blood or blood component proteins; and any recombinant form, modification, full length precursor, signal peptide, propeptide, or mature variant of these proteins.

In an aspect of the substrate in any embodiment the converted and optionally conditioned contact surface comprises thermoplastic material, for example a thermoplastic resin, for example an injection-molded thermoplastic resin.

In an aspect of the substrate in any embodiment the converted and optionally conditioned contact surface comprises a hydrocarbon, for example an olefin polymer, polypropylene (PP), polyethylene (PE), cyclic olefin copolymer (COC), cyclic olefin polymer (COP), polymethylpentene, polystyrene, hydrogenated polystyrene, polycyclohexylethylene (PCHE), or combinations of two or more of these. The converted and optionally conditioned contact surface optionally comprises a heteroatom-substituted hydrocarbon polymer, for example a polyester, polyethylene terephthalate, polyethylene naphthalate, polybutylene terephthalate (PBT), polyvinylidene chloride (PVdC), polyvinyl chloride (PVC), polycarbonate, polylactic acid, epoxy resin, nylon, polyurethane polyacrylonitrile, polyacrylonitrile (PAN), an ionomeric resin, Surlyn® ionomeric resin, or any combination, composite or blend of any two or more of the above materials.

In an aspect of the substrate in any embodiment the converted and optionally conditioned contact surface is a coating or layer of PECVD deposited $SiO_xC_yH_z$ or $SiN_xC_yH_z$, in which x is from about 0.5 to about 2.4 as measured by X-ray photoelectron spectroscopy (XPS), y is from about 0.6 to about 3 as measured by XPS, and z is from about 2 to about 9 as measured by Rutherford backscattering spectrometry (RBS).

In an aspect of the substrate in any embodiment the converted and optionally conditioned contact surface is a barrier coating or layer of SiOx, in which x is from about 1.5 to about 2.9 as measured by XPS, optionally an oxide or nitride of an organometallic precursor that is a compound of a metal element from Group III and/or Group IV of the Periodic Table, e.g. in Group III: Boron, Aluminum, Gallium, Indium, Thallium, Scandium, Yttrium, or Lanthanum, (Aluminum and Boron being preferred), and in Group IV: Silicon, Germanium, Tin, Lead, Titanium, Zirconium, Hafnium, or Thorium (Silicon and Tin being preferred).

In an aspect of the substrate in any embodiment the converted and optionally conditioned contact surface is a contact surface of an article of labware. For example, the converted and optionally conditioned contact surface can be, without limitation, a contact surface of a microplate, a centrifuge tube, a pipette tip, a well plate, a microwell plate, an ELISA plate, a microtiter plate, a 96-well plate, a 384-well plate, a vial, a bottle, a jar, a syringe, a cartridge, a blister package, an ampoule, an evacuated blood collection tube, a specimen tube, a centrifuge tube, or a chromatography vial.

In an aspect of the substrate in any embodiment the converted and optionally conditioned contact surface is a vessel lumen surface.

In an aspect of the substrate in any embodiment the converted and optionally conditioned contact surface is in contact with an aqueous protein. In an aspect of the substrate in any embodiment the aqueous protein comprises: mammal serum albumin, for example Bovine Serum Albumin (BSA); Fibrinogen (FBG); Transferrin (TFN), for example blood serotransferrin (or siderophilin, also known as transferrin); lactotransferrin (lactoferrin); milk transferrin; egg white ovotransferrin (conalbumin); and membrane-associated melanotransferrin; Protein A (PrA); Protein G (PrG); Protein A/G; Protein L; Insulin, for example hexameric insulin, monomeric insulin, porcine insulin, human insulin, recombinant insulin and pharmaceutical grades of insulin; Pharmaceutical protein; blood or blood component proteins; or any recombinant form, modification, full length precursor, signal peptide, propeptide, or mature variant of these proteins; or a combination of two or more of these.

In an aspect of the substrate in any embodiment the converted and optionally conditioned contact surface has a protein recovery percentage greater than the protein recovery percentage of the unconditioned and unconverted surface for at least one of Bovine Serum Albumin (BSA); Fibrinogen (FBG); Transferrin (TFN), for example blood serotransferrin (or siderophilin, also known as transferrin); lactotransferrin (lactoferrin); milk transferrin; egg white ovotransferrin (conalbumin); and membrane-associated melanotransferrin; Protein A (PrA); Protein G (PrG); Protein A/G; Protein L; Insulin, for example hexameric insulin, monomeric insulin, porcine insulin, human insulin, recombinant insulin and pharmaceutical grades of insulin; Pharmaceutical protein; blood or blood component proteins; or any recombinant form, modification, full length precursor, signal peptide, propeptide, or mature variant of these proteins.

In an aspect of the substrate in any embodiment the converted and optionally conditioned contact surface has a protein recovery percentage greater than the protein recovery percentage of the unconditioned and unconverted surface for Bovine Serum Albumin having an atomic mass of 66,000 Daltons (BSA) on NUNC® 96-well round bottom plates, following the protocol in the present specification.

In an aspect of the substrate in any embodiment the converted and optionally conditioned contact surface has a protein recovery percentage at 24 hours on NUNC® 96-well round bottom plates greater than 70%, optionally greater than 80%, optionally greater than 90%, optionally up to 100% for BSA, following the protocol in the present specification.

In an aspect of the substrate in any embodiment the converted and optionally conditioned contact surface has a protein recovery percentage at 24 hours greater than the protein recovery percentage of the unconditioned and unconverted surface for Fibrinogen having an atomic mass of 340,000 Daltons (FBG) on NUNC® 96-well round bottom plates, following the protocol in the present specification.

In an aspect of the substrate in any embodiment the converted and optionally conditioned contact surface has a protein recovery percentage at 24 hours on NUNC® 96-well round bottom plates greater than 20%, optionally greater than 40%, optionally greater than 60%, optionally greater than 80%, optionally up to 84% for FBG, following the protocol in the present specification.

In an aspect of the substrate in any embodiment the converted and optionally conditioned contact surface has a protein recovery percentage at 24 hours on NUNC® 96-well round bottom plates greater than the protein recovery percentage of the unconditioned and unconverted surface for Transferrin having an atomic mass of 80,000 Daltons (TFN), following the protocol in the present specification.

In an aspect of the substrate in any embodiment the converted and optionally conditioned contact surface has a protein recovery percentage at 24 hours on NUNC® 96-well round bottom plates greater than 60%, optionally greater than 65%, optionally greater than 69%, optionally up to 70% for TFN, following the protocol in the present specification.

In an aspect of the substrate in any embodiment the converted and optionally conditioned contact surface has a protein recovery percentage at 24 hours on NUNC® 96-well round bottom plates greater than the protein recovery percentage of the unconditioned and unconverted surface for Protein A having an atomic mass of 45,000 Daltons (PrA), following the protocol in the present specification.

In an aspect of the substrate in any embodiment the converted and optionally conditioned contact surface has a protein recovery percentage at 24 hours on NUNC® 96-well round bottom plates greater than 9%, optionally greater than 20%, optionally greater than 40%, optionally greater than 60%, optionally up to 67% for PrA, following the protocol in the present specification.

In an aspect of the substrate in any embodiment the converted and optionally conditioned contact surface has a protein recovery percentage at 24 hours on NUNC® 96-well round bottom plates greater than the protein recovery percentage of the unconditioned and unconverted surface for Protein G having an atomic mass of 20,000 Daltons (PrG), following the protocol in the present specification.

In an aspect of the substrate in any embodiment the converted and optionally conditioned contact surface has a protein recovery percentage at 24 hours on NUNC® 96-well round bottom plates greater than 12%, optionally greater than 20%, optionally greater than 40%, optionally greater than 60%, optionally greater than 80%, optionally up to 90% for PrG, following the protocol in the present specification.

In an aspect of the substrate in any embodiment the converted and optionally conditioned contact surface has a protein recovery percentage at 24 hours greater than the protein recovery percentage of the unconditioned and unconverted surface for Bovine Serum Albumin having an atomic mass of 66,000 Daltons (BSA) on Eppendorf LoBind® low-protein-binding 96-well round bottom plates, following the protocol in the present specification. LoBind® is a trademark of Eppendorf AG, Hamburg, Germany.

In an aspect of the substrate in any embodiment the converted and optionally conditioned contact surface has a protein recovery percentage at 24 hours on Eppendorf LoBind® 96-well round bottom plates greater than 95% for BSA, following the protocol in the present specification.

In an aspect of the substrate in any embodiment the converted and optionally conditioned contact surface has a protein recovery percentage at 24 hours greater than the protein recovery percentage of the unconditioned and unconverted surface for Fibrinogen having an atomic mass of 340,000 Daltons (FBG) on Eppendorf LoBind® 96-well round bottom plates, following the protocol in the present specification.

In an aspect of the substrate in any embodiment the treated contact surface has a protein recovery percentage at 24 hours on Eppendorf LoBind® 96-well round bottom plates greater than 72% for FBG, following the protocol in the present specification.

In an aspect of the substrate in any embodiment the treated contact surface has a protein recovery percentage at 24 hours on Eppendorf LoBind® 96-well round bottom plates greater than the protein recovery percentage of the unconditioned and unconverted surface for Transferrin having an atomic mass of 80,000 Daltons (TFN), following the protocol in the present specification.

In an aspect of the substrate in any embodiment the treated contact surface has a protein recovery percentage at 24 hours on Eppendorf LoBind® 96-well round bottom plates greater than 69% for TFN, following the protocol in the present specification.

In an aspect of the substrate in any embodiment the treated contact surface has a protein recovery percentage at 24 hours on Eppendorf LoBind® 96-well round bottom plates greater than the protein recovery percentage of the unconditioned and unconverted surface for Protein A having an atomic mass of 45,000 Daltons (PrA), following the protocol in the present specification.

In an aspect of the substrate in any embodiment the treated contact surface has a protein recovery percentage at 24 hours on Eppendorf LoBind® 96-well round bottom plates greater than the protein recovery percentage of the unconditioned and unconverted surface for Protein G having an atomic mass of 20,000 Daltons (PrG), following the protocol in the present specification.

In an aspect of the substrate in any embodiment the treated contact surface has a protein recovery percentage at 24 hours on Eppendorf LoBind® 96-well round bottom plates greater than 96% for PrG, following the protocol in the present specification.

In an aspect of the substrate in any embodiment the treated contact surface has a protein recovery percentage at 24 hours greater than the protein recovery percentage of the unconditioned and unconverted surface for Bovine Serum Albumin having an atomic mass of 66,000 Daltons (BSA) on GRIENER® 96-well round bottom plates, following the protocol in the present specification.

In an aspect of the substrate in any embodiment the treated contact surface has a protein recovery percentage at 24 hours on GRIENER® 96-well round bottom plates greater than 60%, optionally up to 86%, for BSA, following the protocol in the present specification.

In an aspect of the substrate in any embodiment the treated contact surface has a protein recovery percentage at 24 hours greater than the protein recovery percentage of the unconditioned and unconverted surface for Fibrinogen having an atomic mass of 340,000 Daltons (FBG) on GRIENER® 96-well round bottom plates, following the protocol in the present specification.

In an aspect of the substrate in any embodiment the treated contact surface has a protein recovery percentage at 24 hours on GRIENER® 96-well round bottom plates greater than 50%, optionally up to 65%, for FBG, following the protocol in the present specification.

In an aspect of the substrate in any embodiment the treated contact surface has a protein recovery percentage at 24 hours on GRIENER® 96-well round bottom plates greater than the protein recovery percentage of the unconditioned and unconverted surface for Transferrin having an atomic mass of 80,000 Daltons (TFN), following the protocol in the present specification.

In an aspect of the substrate in any embodiment the treated contact surface has a protein recovery percentage at 24 hours on GRIENER® 96-well round bottom plates greater than 50%, optionally up to 60%, for TFN, following the protocol in the present specification.

In an aspect of the substrate in any embodiment the treated contact surface has a protein recovery percentage at 24 hours on GRIENER® 96-well round bottom plates greater than the protein recovery percentage of the unconditioned and unconverted surface for Protein A having an atomic mass of 45,000 Daltons (PrA), following the protocol in the present specification.

In an aspect of the substrate in any embodiment the treated contact surface has a protein recovery percentage at 24 hours on GRIENER® 96-well round bottom plates greater than 25%, optionally up to 56%, for PrA, following the protocol in the present specification.

In an aspect of the substrate in any embodiment the treated contact surface has a protein recovery percentage at 24 hours on GRIENER® 96-well round bottom plates greater than the protein recovery percentage of the unconditioned and unconverted surface for Protein G having an atomic mass of 20,000 Daltons (PrG), following the protocol in the present specification.

In an aspect of the substrate in any embodiment the treated contact surface has a protein recovery percentage at 24 hours on GRIENER® 96-well round bottom plates greater than 60%, optionally up to 75%, for PrG, following the protocol in the present specification.

In an aspect of the substrate in any embodiment the carbon or silicon compound consists essentially of polypropylene, optionally polypropylene homopolymer.

In an aspect of the substrate in any embodiment the treated polypropylene contact surface has a protein recovery percentage greater than the protein recovery percentage of the unconditioned and unconverted polypropylene contact surface for Bovine Serum Albumin having an atomic mass of 66,000 Daltons (BSA), following the protocol in the present specification.

In an aspect of the substrate in any embodiment the treated polypropylene contact surface has a protein recovery percentage greater than the protein recovery percentage of the unconditioned and unconverted polypropylene contact surface for Fibrinogen having an atomic mass of 340,000 Daltons (FBG), following the protocol in the present specification.

In an aspect of the substrate in any embodiment the treated polypropylene contact surface has a protein recovery percentage greater than the protein recovery percentage of the unconditioned and unconverted polypropylene contact surface for Transferrin having an atomic mass of 80,000 Daltons (TFN), following the protocol in the present specification.

In an aspect of the substrate in any embodiment the treated polypropylene contact surface has a protein recovery percentage greater than the protein recovery percentage of the unconditioned and unconverted polypropylene contact surface for Protein A having an atomic mass of 45,000 Daltons (PrA), following the protocol in the present specification.

In an aspect of the substrate in any embodiment the treated polypropylene contact surface has a protein recovery percentage greater than the protein recovery percentage of the unconditioned and unconverted polypropylene contact surface for Protein G having an atomic mass of 20,000 Daltons (PrG), following the protocol in the present specification.

In an aspect of the substrate in any embodiment the carbon or silicon compound consists essentially of polypropylene and the converted and optionally conditioned contact surface has any one or more of the following attributes:
  a water contact angle between 0 and 90 degrees;
  fewer hydrogen bond donor functional groups, for example —OH, —N—H, —N—H$_2$, —N$^+$H$_3$, or combinations of two or more of these, of the total atomic proportion of carbon bonded with carbon or hydrogen in the substrate as quantified by XPS, than the carbon or silicon compound before treatment;
  more hydrogen bond acceptor functional groups, for example C=O (carbonyl), C—O—C (ether), C—N—C (amine), C—N$^+$—C (ammonium), CO$_2$ (carboxyl), or CO$_3$, or a combination of two or more of these, of the total atomic proportion of carbon bonded with carbon or hydrogen in the substrate as quantified by XPS, than the carbon or silicon compound before treatment; and
  charge neutrality or near charge neutrality, for example an electrostatic charge build-up on the converted and optionally conditioned contact surface of less than 2 kilovolts per inch (2 kV/in, 5 kV/cm), optionally less than 3 kV/cm, optionally less than 2 kV/cm, optionally less than 1 kV/cm as quantified using a Static Sensor—3M Static Sensor 718.

In an aspect of the substrate in any embodiment the converted and optionally conditioned contact surface has fewer hydrogen bond donor functional groups, for example —OH, —N—H, —N—H$_2$, —N$^+$H$_3$, or combinations of two or more of these, of the total atomic proportion of carbon bonded with carbon or hydrogen in the substrate as quantified by XPS, than the carbon or silicon compound before treatment.

In an aspect of the substrate in any embodiment the converted and optionally conditioned contact surface has more hydrogen bond acceptor functional groups, for example C=O (carbonyl), C—O—C (ether), C—N—C (amine), C—N$^+$—C (ammonium), CO$_2$ (carboxyl), or CO$_3$, or a combination of two or more of these, of the total atomic proportion of carbon bonded with carbon or hydrogen in the substrate as quantified by XPS, than the carbon or silicon compound before treatment.

In an aspect of the substrate in any embodiment the converted and optionally conditioned contact surface has charge neutrality or near charge neutrality for example, an electrostatic charge build-up on the converted and optionally conditioned contact surface of less than 2 kilovolts per inch (2 kV/in, 5 kV/cm), optionally less than 3 kV/cm, optionally less than 2 kV/cm, optionally less than 1 kV/cm, quantified as before.

PECVD Coatings and Layers

Another approach for reducing biomolecule adhesion is to provide as the contact surface: (i) a barrier coating or layer having the atomic proportions: SiO$_x$, in which x is from about 0.5 to about 2.4, or a pH protective coating or layer having the atomic proportions SiO$_x$C$_y$H$_z$, in which x is from about 0.5 to about 2.4 and y is from about 0.6 to about 3, each as measured by XPS. Such coatings and methods for producing them on a substrate are described in WO2014US23813, which incorporated here by reference.

WORKING EXAMPLES

Various aspects will be illustrated in more detail with reference to the following Examples, but it should be understood that the first more detailed embodiment is not deemed to be limited thereto.

Testing of all Embodiments

The following protocol was used to test the plates in all embodiments, except as otherwise indicated in the examples:

Purpose: The purpose of this experiment was to determine the amount of protein binding over time to a surface coated microtiter plate (a microtiter plate is also referred to in this disclosure as a "microplate" or occasionally as a "plate" of the type having wells: all three terms have identical meaning in this disclosure).

Materials: BIOTEK® Synergy H1 Microplate Reader and BIOTEK Gen5© Software, MILLIPORE® MILLI-Q® Water System (sold by Merck KGAA, Darmstadt, Germany), MILLIPORE® Direct Detect Spectrometer, ALEXA FLUOR® 488 Labeled Proteins (Bovine Serum Albumin (BSA), Fibrinogen (FBG), Transferrin (TFN), Protein A (PrA) and Protein G (PrG), sold by Molecular Probes, Inc., Eugene, Oregon USA), 10× Phosphate Buffered Saline (PBS), NUNC® Black 96-well Optical Bottom Plates, 1 L Plastic Bottle, 25-100 mL Glass Beakers, Aluminum Foil, 1-10 mL Pipette, 100-1000 µL Pipette, 0.1-5 µL Pipette, 50-300 µL Multichannel Pipette.

The selected proteins, one or more of those listed above, were tested on a single surface coated microplate. Each protein was received as a fluorescently labeled powder, labeled with ALEXA FLUOR® 488:
  5 mg of BSA: 66,000 Da
  5 mg of FBG: 340,000 Da
  5 mg of TFN: 80,000 Da
  1 mg of PrA: 45,000 Da
  1 mg of PrG: 20,000 Da Once received, each vial of protein was wrapped in aluminum foil for extra protection from light and labeled accordingly, then placed into the freezer for storage.

A solution of 1×PBS (phosphate buffer solution) was made from a stock solution of 10×PBS: 100 mL of 10×PBS was added to a plastic 1 L bottle, followed by 900 mL of distilled water from the MILLIPORE® Q-pod, forming 1×PBS. Using a 100-1000 µL pipette, 1000 µL of 1×PBS was pipetted into each vial of protein separately, to create protein solutions. Each vial was then inverted and vortexed to thoroughly mix the solution.

Each protein was then tested on the MILLIPORE® Direct Detect to get an accurate protein concentration. Using a 0.1-5 μL pipette, a 2 μL sample of PBS was placed on the first spot of the Direct Detect reading card and marked as a blank in the software. A 2 μL sample of the first protein was then placed onto the remaining 3 spots and marked as samples. After the card was read, an average of the 3 protein concentrations was recorded in mg/mL. This was repeated for the remaining four proteins. The protein solutions were then placed into the refrigerator for storage.

A standard curve was prepared with 1×PBS for each protein. The standard curve started at 25 nM and a serial 2× dilution was performed to obtain the other tested concentrations, for example one or more of 12.5 nM, 6.25 nM, 3.125 nM and 1.5625 nM. Further dilutions to 0.5 nM were also prepared in some instances. The 12.5 nM solution prepared from the standard curve was used for testing.

Once the dilutions for all tested proteins were done, the standard curve for each protein was prepared and tested as follows. 25 100-mL glass beakers were set into rows of 5. Each beaker was wrapped in aluminum foil and labeled with the name of the protein the curve corresponded to and the concentration of the solution in the beaker. Row 1 was the standard curve for BSA; row 2, FBG; row 3, TFN; row 4, PrA; row 5, PrG. Therefore the first row was labeled as follows: BSA 25 nM, BSA 12.5 nM, BSA 6.25 nM, BSA 3.125 nM, BSA 1.56 nM.

After a standard curve was made, it was tested using the microplate reader, then the next standard curve was made and tested, and so on.

The BIOTEK® Synergy H1 microplate reader and BIOTEK Gen5® software were used for analysis.

After the first standard curve was prepared, it was ready to be tested on the Synergy H1. Using a 50-300 μL multichannel pipette, 200 μL of 1×PBS was pipetted into wells A1-A4 of a black optical bottom microplate. Then, 200 μL of the 25 nM solution was pipetted into wells B1-B4, 200 μL of 12.5 nM solution was pipetted into wells C1-C4, 200 μL of 12.5 nM solution was pipetted into wells D1-D4, 200 μL of 12.5 nM solution was pipetted into wells E1-E4, 200 μL of 12.5 nM solution was pipetted into wells F1-F4, and 200 μL of 12.5 nM solution was pipetted into wells G1-G4. A similar procedure was used to fill the wells with other dilutions of the protein solution.

Once the microplate was filled with solution, it was wrapped in aluminum foil and the sections and time points were labeled.

After 1.5 hours, using a 50-300 μL multichannel pipette and poking through the aluminum foil, 200 μL of BSA solution was pipetted from the wells in the 1.5 hr column (column 1) and placed into a black optical bottom microplate. The black microplate was placed into the microplate tray. The other four proteins were then read the same way by opening their corresponding experiments. The same thing was done after 2.5 hours, 4.5 hours and 24 hours. After the 24 hr read, "Plate→Export" was then selected from the menu bar. An excel spreadsheet will appear and can then be saved in the desired location with the desired name.

Using the data produced by the BIOTEK Gen5® software, the 12.5 nM solution concentrations from both the standard curve and SPL1 were averaged. The concentrations in the 4 wells at 1.5 hr were averaged. This was then done for 2.5 hr, 4.5 hr and 24 hr also. The average concentration at each time point was then divided by the average concentration of The 12.5 nM solution from the beginning and multiplied by 100 to get a percent recovery at each time point:

% Recovery @1.5 hr=[AVG. BSA 1.5 hr]/[AVG 12.5 nM solution]*100

In another aspect, either embodiment (i) or (ii) is directed to methods of applying non-specific biomolecule adsorption and/or binding resistant surface coatings characterized by e.g., non-binding properties with regard to biomolecules, to substrates using, for example, Chemical Vapor Deposition (CVD). In any embodiment, the substrate can comprise glass or thermoplastic resins such as a polymer, for example a polycarbonate polymer, an olefin polymer, a cyclic olefin copolymer, a polypropylene polymer, a polyester polymer, a polyethylene terephthalatepolymer or a combination of any two or more of these.

Non-Specific Biomolecule Adsorption and/or Binding Resistant Coating

In its main aspect, either embodiment (i) or (ii) provides a non-specific biomolecule adsorption and/or binding resistant surface coating of a vessel. This non-specific biomolecule adsorption and/or binding resistant surface coating is advantageously made by carrying out the methods as follows.

Surface modification may be done on, for example, the commercial products such as a polypropylene microplate (NUNC, 96 well, 0.5 ml, round bottom) with varying conditions. For example, either embodiment (i) or (ii) may comprise two stages, i) substrate conditioning stage to provide, for example, a hydroxylated plastic or SiOx-coated glass surfaces, ii) a copolymerization stage, to yield the non-specific biomolecule adsorption and/or binding resistant surface coating.

The processes of either embodiment (i) or (ii) yield the non-specific biomolecule adsorption and/or non-specific binding resistant surface coating. For example, the present invention provides a method for providing a non-specific biomolecule adsorption and/or binding resistant surface coating surface which exhibits the property of low- or non-binding of biomolecules. The present invention also provides a method for providing a non-specific biomolecule adsorption and/or non-specific binding resistant surface coating surface which inhibits adsorption of biomolecules. In preferred embodiments, the non-specific biomolecule adsorption and/or binding resistant coating binds covalently to the prepared substrate, but may associate with the prepared substrate in other ways.

Copolymerizable Siloxane Monomers

Embodiment (i) utilizes copolymerizable siloxane monomers such as, for example, (3-acryloxypropyl) trimethoxysilane; methacryloxypropyltrimethoxysilane; n-(3-acryloxy-2-hydroxypropyl)-3-aminopropyl triethoxysilane; o-(methacryloxyethyl)-n-(triethoxysilylpropyl) urethane; n-(3-methacryloxy-2-hydroxypropyl)-3-aminopropyltriethoxysilane; methacryloxymethyltriethoxysilane; methacryloxymethyl trimethoxysilane; methacryloxypropyl triethoxysilane; (3-acryloxypropyl)methyl-dimethoxy silane; (methacryloxymethyl) methyl-diethoxysilane; (methacryloxymethyl)methyl-dimethoxysilane; Methacryloxypropylmethyl diethoxysilane; methacryloxypropylmethyl dimethoxysilane; Methacryloxypropyl dimethylethoxysilane; methacryloxypropyldimethyl methoxysilane.

Copolymerizable Epoxy Monomers

Embodiment (ii) may utilize, for example, copolymerizable epoxy monomers. Non-limiting examples of polymerizable epoxy monomers include glycidyl acrylate, glycidyl methacrylate (GMA), (E)-(oxiran-2-yl)methyl but-2-enoate, (3,3-dimethyloxiran-2-yl)methyl methacrylate, (E)-(oxiran-2-yl)methyl cinnamate, (oxiran-2-yl)methyl 2-methylenebutanoate, 1-(oxiran-2-yl)propyl acrylate, 1-(oxiran-2-yl)ethyl methacrylate, (oxiran-2-yl)methyl 3-methyl-2-methylenebutanoate, (oxiran-2-yl)methyl 2-methylenepentanoate, (3-methyloxiran-2-yl)methyl acrylate, 2-(oxiran-2-yl)propan-2-yl acrylate, (oxiran-2-yl)methyl 2-methylenehexanoate, (3-methyloxiran-2-yl)methyl methacrylate, and (3,3-dimethyloxiran-2-yl)methyl acrylate. These monomers may be used singly or as a mixture thereof.

Silyl Amine Coupling Agents

Embodiment (ii) may utilize, silyl amine coupling agents. Non-limiting examples include 3-Aminopropyltriethoxysilane, 3-Aminopropyltrimethoxysilane, 4-Aminobutyltriethoxysilane, M-Aminophenyltrimethoxysilane, P-Aminophenyltrimethoxysilane, O-Aminophenyltrimethoxysilane, 3-Aminopropyltris(Methoxyethoxyethoxy)Silane, 11-Aminoundecyltriethoxysilane, 3-(M-Aminophenoxy)Propyltrimethoxysilane, Aminopropylsilanetriol, 3-Aminopropylmethyldiethoxysilane, 3-Aminopropyldiisopropylethoxysilane, 3-Aminopropyldimethylethoxysilane, N-(2-Aminoethyl)-3-Aminopropyltrimethoxysilane, N-[3-(Trimethoxysilyl)Propyl]Ethylenediamine, N-(2-Aminoethyl)-3-Aminopropyltriethoxysilane, N-(6-Aminohexyl)Aminomethyltriethoxysilane, N-(6-Aminohexyl)Aminopropyltrimethoxysilane, N-(2-Aminoethyl)-11-Aminoundecyltrimethoxysilane, (Aminoethylaminomethyl)Phenethyltrimethoxysilane, N-3-[(Amino(Polypropylenoxy)]Aminopropyltrimethoxysilane, N-(2-Aminoethyl)-3-Aminopropylsilanetriol, N-(2-Aminoethyl)-3-Aminopropylmethyldimethoxysilane, N-(2-Aminoethyl)-3-Aminoisobutylmethyldimethoxysilane, (Aminoethylamino)-3-Isobutyldimethylmethoxysilane, (3-Trimethoxysilylpropyl)Diethylenetriamine, N-Butylaminopropyltrimethoxysilane, N-Ethylaminoisobutyltrimethoxysilane, N-Methylaminopropyltrimethoxysilane, N-Phenylaminopropyltrimethoxysilane, 3-(N-Allylamino)Propyltrimethoxysilane, (Cyclohexylaminomethyl)Triethoxysilane, N-Cyclohexylaminopropyltrimethoxysilane, N-Ethylaminoisobutylmethyldiethoxysilane, (Phenylaminomethyl)Methyldimethoxysilane, N-Phenylaminomethyltriethoxysilane, N-Methylaminopropylmethyldimethoxysilane, Bis(2-Hydroxyethyl)-3-Aminopropyltriethoxysilane, 3-(N-Styrylmethyl-2-Aminoethylamino)-Propyltrimethoxysilane Hydrochloride, (2-N-Benzylaminoethyl)-3-Aminopropyl-Trimethoxysilane, Bis(Triethoxysilylpropyl)Amine, Bis(Trimethoxysilylpropyl)Amine, Bis[(3-Trimethoxysilyl)Propyl]-Ethylenediamine, Bis[(3-Trimethoxysilyl)Propyl]-Ethylenediamine, Bis(Methyldiethoxysilylpropyl)Amine, N-Allyl-Aza-2,2-Dimethoxysila-Cyclopentane, N-Aminoethyl-Aza-2,2,4-Trimethyl-Silacyclopentane, N-(3-Aminopropyldimethylsila)Aza-2,2-Dimethyl-2-Silacyclopentane, N-N-Butyl-Aza-2,2-Dimethoxysila-Cyclopentane, 2,2-Dimethoxy-1,6-Diaza-2-Silacyclo-Octane, N-Methyl-Aza-2,2,4-Trimethylsila-Cylcopentane, and 1-(N-(N',N'-dimethylaminoethyl))-1-aza-2,2,4-trimethyl-2-silacyclopentane. These reagents may be used singly or as a mixture thereof.

Copolymerizable Zwitterionic Monomers

Either embodiment (i) or (ii) can utilize, for example, copolymerizable zwitterionic monomers. Non-limiting examples of copolymerizable monomers include for example, 2-(meth)acryloyloxyethyl-2'-(trimethylammonio)ethyl phosphate (MPC), 2-(methacryloxy)ethyl 2-(trimethylammonio)ethyl phosphate (aka=2-methacryloyloxyethyl phosphorylcholine; 2-(methacryloxy)ethyl-2-(dimethylammonio) ethylcarboxylate; 2-(methacryloxy) ethyl-2-(dimethylammonio) propylsulfonate; 2-(methyacrylamido)ethyl-2-(dimethylammonio)propylsulfonate; phosphoric acid 2-(methacryloyloxy)ethyl 2-(trimethylammonio) ethyl ester); 3-(meth)acryloyloxypropyl-2'-(trimethylammonio) ethyl phosphate, 4-(meth)acryloyloxybutyl-2'-(trimethylammonio)ethyl phosphate 5-(meth)acryloyloxypentyl-2'-(trimethylammonio)ethyl phosphate, 6-(meth)acryloyloxyhexyl-2'-(trimethylammonio)ethyl phosphate, 2-(meth)acryloyloxyethyl-2'-(trimethylammonio)ethyl phosphate, 2-(meth)acryloyloxyethyl-2'-(tripropylammonio)ethyl phosphate, 2-(meth)acryloyloxyethyl-2'-(tributylammonio)ethyl phosphate, 2-(meth)acryloyloxypropyl-2'-(trimethylammonio)ethyl phosphate, 2-(meth)acryloyloxybutyl-2'-(trimethylammonio)ethyl phosphate, 2-(meth)acryloyloxypentyl-2'-(trimethylammonio)ethyl phosphate, 2-(meth)acryloyloxyhexyl-2'-(trimethylammonio)ethyl phosphate, 2-(meth)acryloyloxyethyl-3'-(trimethylammonio)propyl phosphate, 3-(meth)acryloyloxypropyl-3'-(trimethylammonio)propyl phosphate, 4-(meth)acryloyloxybutyl-3'-(trimethylammonio)propyl phosphate, 5-(meth)acryloyloxypentyl-3'-(trimethylammonio)propyl phosphate, 6-(meth)acryloyloxyhexyl-3'-(trimethylammonio)propyl phosphate, 2-(meth)acryloyloxyethyl-4'-(trimethylammonio)butyl phosphate, 3-(meth)acryloyloxypropyl-4'-(trimethylammonio)butyl phosphate, 4-(meth)acryloyloxybutyl-4'-(trimethylammonio)butyl phosphate, 5-(meth)acryloyloxypentyl-4'-(trimethylammonio)butyl phosphate, 6-(meth)acryloyloxyhexyl-4'-(trimethylammonio)butyl phosphate, 2-(vinyloxy)ethyl-2'-(trimethylammonio)ethyl phosphate, 2-(allyloxy)ethyl-2'-(trimethylammonio)ethyl phosphate, 2-(p-vinylbenzyloxy)ethyl-2'-(trimethylammonio)ethyl phosphate, 2-(p-vinylbenzoyloxy)ethyl-2'-(trimethylammonio)ethyl phosphate, 2-(styryloxy)ethyl-2'-(trimethylammonio)ethyl phosphate, 2-(p-vinylbenzyl)ethyl-2'-(trimethylammonio)ethyl phosphate, 2-(vinyloxycarbonyl)ethyl-2'-(trimethylammonio)ethyl phosphate, 2-(allyloxycarbonyl)ethyl-2'-(trimethylammonio)ethyl phosphate, 2-(acryloylamino)ethyl-2'-(trimethylammonio)ethyl phosphate, 2-(vinylcarbonylamino)ethyl-2'-(trimethylammonio)ethyl phosphate, 2-(allyloxycarbonylamino)ethyl-2'-(trimethylammonio) ethyl phosphate, 2-(butyroyloxy)ethyl-2'-(trimethylammonio)ethyl phosphate, 2-(crotonoyloxy)ethyl-2'-(trimethylammonio)ethyl phosphate, ethyl-(2'-trimethylammonioethylphosphorylethyl)fumarate, butyl-(2'-trimethylammonioethylphosphorylethyl)fumarate, hydroxyethyl-(2'-trimethylammonioethylphosphorylethyl) fumarate, beta-carboxyethyl-3,3-dimethyammoniumethylmethacylate, and sulfopropyl-3,3-dimethyammoniumethylmethacylate. These monomers may be used singly or as a mixture thereof.

Examples of radical polymerizable monomers useful in Embodiment (i) may also include, for example, hydroxyalkyl(meth)acrylate monomers such as 2-hydroxyethyl(meth)acrylate and 2-hydroxypropyl(meth)acrylate; polyalkylene glycol(meth)acrylate monomers such as diethylene glycol mono(meth)acrylate, polyethylene glycol mono(meth)acrylate, polypropylene glycol mono(meth)acrylate, methoxydiethylene glycol(meth)acrylate, methoxypolyethylene glycol (meth)acrylate, and methoxypolypropylene glycol(meth) acrylate; .omega.-carboxy(meth)acrylates such as phthalic acid monohydroxyethyl(meth)acrylate, hexahydrophthalic acid monohydroxyethyl(meth)acrylate, .omega.-carboxy-polycaprolactone (n=2 to 5) mono(meth)acrylate, and (meth)acryloyloxyethyl succinate; N-vinyl-2-pyrrolidone, vinylpyridine, (meth)acrylamide, (meth)acrylic acid, 2-acrylamide-2-methylpropanesulfonic acid, dimethylaminoethyl (meth)acrylate, diethylaminoethyl(meth)acrylate, maleic anhydride, and glyco-2-hydroxyethyl monomethacrylate (GEMA).

For Embodiment (i), the copolymer may be obtained, for example, by radical polymerization of a monomer composition containing at least one monomer, and optionally one or more monomers, in a solvent, optionally in the presence of a polymerization initiator. The radical polymerization may be performed in a system replacing the atmosphere with an inert gas such as nitrogen, argon, carbon dioxide, or helium.

For Embodiment (ii), the copolymer may be obtained, for example, by radical polymerization of a monomer composition containing at least one copolymerizable zwitterionic monomer, optionally one or more copolymerizable zwitterionic monomers, and at least one copolymerizable epoxy monomer, optionally one or more copolymerizable epoxy monomers in a solvent, optionally in the presence of a polymerization initiator. The polymerization may be performed in a system replacing the atmosphere with an inert gas such as nitrogen, argon, carbon dioxide, or helium.

For either Embodiment (i) or (ii), there is no limitation as to the polymerization initiator. A conventional polymerization initiator for radical polymerization may be used. Examples of the initiators may include organic peroxides such as t-butyl peroxypivalate, t-butyl peroxyneodecanoate, t-butyl peroxy-2-ethyl hexanoate, t-butyl peroxyacetate, 1,1,3,3-tetramethylbutyl peroxy-2-ethylhexanoate, succinic acid peroxide, benzoyl peroxide, 3,5,5-trimethyl hexanoyl peroxide, lauroyl peroxide, tert-Butyl hydroperoxide, tert-Butyl peracetate, Cumene hydroperoxide, 2,5-Di(tert-butylperoxy)-2,5-dimethyl-3-hexyne, Dicumyl peroxide, 2,5-Bis (tert-butylperoxy)-2,5-dimethylhexane, 2,4-Pentanedione peroxide, 1,1-Bis(tert-butylperoxy)-3,3,5-trimethylcyclohexane, 1,1-Bis(tert-butylperoxy)cyclohexane, Benzoyl peroxide, 2-Butanone peroxide, Di-tert-Butyl peroxide, Lauroyl peroxide, tert-Butyl peroxybenzoate, tert-Butylperoxy and 2-ethylhexyl carbonate; azo compounds such as 2,2'-azobisisobutyronitrile, 2,2'-azobis(2-amidinopropane)dihydrochloride, dimethyl 2,2'-azobisisobutyrate, 2,2'-azobis(2,4-dimethylvaleronitrile), 1,1'-azobis(cyclohexane-1-carbonitrile), 2,2'-azobis(2-methyl-N-(2-hydroxyethyl)-propionamide, 4,4'-Azobis(4-cyanovaleric acid), 2,2'-Azobis(2-methylpropionamidine) and 2,2'-Azobis(2-methylpropionitrile); inorganic radical initiators such as potassium persulfate, sodium persulfate, ammonium persulfate, persulfate-hydrogen sulfite system and Hydroxymethanesulfinic acid. These polymerization initiators may be used singly or as a mixture thereof.

For either Embodiment (i) or (ii), the amount of the polymerization initiator to be used is desirably from 0.001 parts by weight to 10 parts by weight, and more preferably from 0.01 parts by weight to 5 parts by weight per 100 parts by weight of the total amount of the monomers.

For either Embodiment (i) or (ii) there is no particular limitation as to the solvent for producing the copolymer so long as it is a solvent which dissolves the monomers serving as structural units of the copolymer, and does not react with the copolymer. The solvent may be a mixed solvent. The solvent may be for example, water, methanol, ethanol, ethanol, isopropanol, tetrahydrofuran, 1,4-dioxane, 1,2-dimethoxyethane, N,N-dimethylformamide, dimethylsulfoxide, methylene chloride, 1,2-dicholorethane, and the like, or a combination thereof.

Substrate Surface Preparation

Either Embodiment (i) or (ii) provides for preparation of a substrate surface to yield a prepared substrate surface. The prepared substrate surface may be prepared by, for example, oxygen plasma treatment on the plain surface of a vessel to provide an hydroxylated plastic surface, such as, for example, a polypropylene microplate. For Embodiment (i), alternatively, in certain embodiments, a hydroxyl-functional surface can be (A) formed, e.g., from O2/plasma reaction onto a carbon-based polymer surface (AC), forming C—OH moieties, or onto a silicon-based (SiO2 or silicone) surface (ASi), forming Si—OH moieties. Additionally, hydroxyl-functional surfaces can be (B) inherent to the nascent surface, e.g., polymers such as polyvinyl alcohol (PVOH) or silicon-based polymer surfaces (SiO2 or silicones). Thus the O2/plasma surface preparation method can be optional if inherent hydroxyl moieties are present on the surface.

Either Embodiment (i) or (ii) provides for preparation of a substrate surface by, for example, SiOx deposition to form a SiOx-coated glass surface. The SiOx coated surface may be prepared by, for example, plasma enhanced chemical vapor deposition (PECVD). PECVD apparatus and methods for depositing any of the coatings defined in this specification, for example the coatings comprising silicon, oxygen, and optionally carbon, are disclosed, for example, in WO2013/071138, published May 16, 2013, which is incorporated here by reference.

Another example of a chemical vapor deposition process useful in any embodiment, which is a type of PECVD, is plasma impulse chemical vapor deposition (PICVD). Suitable equipment and processing conditions for PICVD can be found, for example, in U.S. Pat. No. 7,399,500.

Another example of a chemical vapor deposition process useful in any embodiment is pulsed plasma enhanced chemical vapor deposition (PPECVD). Suitable equipment and processing conditions for PPECVD can be found, for example, in S. J. Limb, K. K. S. Lau, D. J. Edell, E. F. Gleason, K. K. Gleason, Molecular Design Of Fluorocarbon Film Architecture By Pulsed Plasma Enhanced And Pyrolytic Chemical Vapor Deposition, PLASMA POLYMERIZATION 4 1999 21-32, which is incorporated here by reference.

Another example of a chemical vapor deposition process useful in either Embodiment (i) or (ii) is pyrolytic chemical vapor deposition (PCVD). Suitable equipment and processing conditions for PCVD can be found, for example, in S. J. Limb, K. K. S. Lau, D. J. Edell, E. F. Gleason, K. K. Gleason, Molecular Design Of Fluorocarbon Film Architecture By Pulsed Plasma Enhanced And Pyrolytic Chemical Vapor Deposition, PLASMA POLYMERIZATION 4 1999 21-32, which is incorporated here by reference.

Another example of a chemical vapor deposition process useful in Embodiment (i) is pyrolysis of a precursor, for example of hexafluoropropylene oxide. Suitable equipment and processing conditions for pyrolysis can be found, for example, in J. Wang, X. Song, R. lia, J. Shen, G. Yang, H. Huang, Fluorocarbon Thin Film With Superhydrophobic Property Prepared By Pyrolysis Of Hexafluoropropylene Oxide, APPLIED SURFACE SCIENCE 258 2012 9782-9785, which is incorporated here by reference.

Preferably in either Embodiment (i) or (ii), PECVD is used to generate a barrier layer on a substrate to result in a coated surface having low- or non-binding properties and/or biomolecule adsorption resistance. Methods of applying coatings using PECVD are taught in U.S. Pat. No. 7,985,188, which is herein incorporated by reference in its entirety.

In the context of either Embodiment (i) or (ii), the following PECVD method is generally applied to provide the initial barrier layer, which comprises the following steps: (a) providing a gaseous reactant comprising a precursor, in the case of Embodiment (i), or silyl amine coupling agent, in the case of Embodiment (ii), each as defined herein, and optionally O2 in the vicinity of the substrate surface; and (b) generating a plasma from the gaseous reactant, thus forming a coating on the substrate surface by plasma enhanced chemical vapor deposition (PECVD). In one aspect of Embodiment (i), the barrier coating may be either silazane or siloxane. In one aspect of Embodiment (ii), the barrier coating will be silyl amine.

In PECVD methods of either Embodiment (i) or (ii), the coating characteristics are advantageously set by one or more of the following conditions: the plasma properties, the pressure under which the plasma is applied, the power applied to generate the plasma, the presence and relative amount of O2 in the gaseous reactant, the plasma volume, and the precursor, in the case of Embodiment (i), or silyl amine coupling agent, in the case of Embodiment (ii). Optionally, the coating characteristics are set by the presence and relative amount of O2 in the gaseous reactant and/or the power applied to generate the plasma.

In a further preferred aspect of either Embodiment (i) or (ii), the plasma is generated at reduced pressure (as compared to the ambient or atmospheric pressure). Optionally, the reduced pressure is less than 300 mTorr, optionally less than 200 mTorr, even optionally less than 100 mTorr.

The PECVD of either Embodiment (i) or (ii) optionally is performed by energizing the gaseous reactant containing the precursor with electrodes powered at a frequency at microwave or radio frequency, and optionally at a radio frequency. The radio frequency preferred to perform an embodiment will also be addressed as "RF frequency". A typical radio frequency range for performing the present invention is a frequency of from 10 kHz to less than 300 MHz, optionally from 1 to 50 MHz, even optionally from 10 to 15 MHz. A frequency of, for example, 13.56 MHz, is preferred, this being a government sanctioned frequency for conducting PECVD work. The present invention may be practiced at other frequencies, such as, for example, 27.12 MHz, or 40.68 MHz.

For either Embodiment (i) or (ii), there are several advantages for using a RF power source versus a microwave source: Since RF operates at a lower power, there is less heating of the substrate/vessel. Because the focus of the present invention is putting a plasma coating on plastic substrates, lower processing temperatures are desired to prevent melting/distortion of the substrate. To prevent substrate overheating when using microwave PECVD, the microwave PECVD is applied in short bursts, by pulsing the power. The power pulsing extends the cycle time for the coating, which is undesired in the present invention. The higher frequency microwave can also cause off-gassing of volatile substances like residual water, oligomers and other materials in the plastic substrate. This off-gassing can interfere with the PECVD coating. A major concern with using microwave for PECVD is delamination of the coating from the substrate. Delamination occurs because the microwaves change the surface of the substrate prior to depositing the coating layer. To mitigate the possibility of delamination, interface coating layers have been developed for microwave PECVD to achieve good bonding between the coating and the substrate. No such interface coating layer is needed with RF PECVD as there is no risk of delamination. Finally, the barrier layer according to the present invention are advantageously applied using lower power. RF power operates at lower power and provides more control over the PECVD process than microwave power. Nonetheless, microwave power, though less preferred, is usable under suitable process conditions, such as for example from between 300 MHz and 300 GHz.

Furthermore, for all PECVD methods described herein of either Embodiment (i) or (ii), there is a specific correlation between the power (in Watts) used to generate the plasma and the volume of the lumen wherein the plasma is generated. Typically, the lumen is the lumen of a vessel coated according to the present invention. The RF power should scale with the volume of the vessel if the same electrode system is employed. Once the composition of a gaseous reactant, for example the ratio of the precursor to O2, and all other parameters of the PECVD coating method but the power have been set, they will typically not change when the geometry of a vessel is maintained and only its volume is varied. In this case, the power will be directly proportional to the volume. Thus, starting from the power to volume ratios provided by present description, the power which has to be applied in order to achieve the same or a similar coating in a vessel of same geometry, but different size, can easily be found.

A precursor is provided for Embodiment (i). Preferably, said precursor is an organosilicon compound (in the following also designated as "organosilicon precursor"), more preferably an organosilicon compound selected from the group consisting of, for example, a linear siloxane, a monocyclic siloxane, a polycyclic siloxane, a polysilsesquioxane, an alkyl trimethoxysilane, a trialkoxy silane, a silazane analogue of any of these precursors (i.e., a linear silazane, a monocyclic silazane, a polycyclic silazane, a polysilsesquioxazane), a silazane, a trimethylsilazane, a trialkylsilazane, a tetramethylsilazane, and a combination of any two or more of these precursors. The precursor is applied to a substrate under conditions effective to form a barrier coating by, for example, PECVD. The precursor is thus polymerized, crosslinked, partially or fully oxidized, or any combination of these.

In a further aspect of either Embodiment (i) or (ii), the coating is a barrier coating, for example an SiOx coating. Typically, the barrier coating is a barrier against a gas or liquid, preferably against water vapor, oxygen and/or air. The barrier may also be used for establishing and/or maintaining a vacuum inside a vessel coated with the barrier coating, e.g. inside a blood collection tube.

The method of Embodiment (i) may comprise the application of one or more coatings made by PECVD from the same or different organosilicon precursors under the same or different reaction conditions. E.g. a vessel may first be coated with an SiOx barrier coating using hexamethyldisiloxane (HMDSO) as organosilicon precursor.

The method of Embodiment (ii) may comprise the application of one or more coatings made by PECVD from the same or different silyl amine coupling agents under the same or different reaction conditions. E.g. a vessel may first be coated with an SiOx barrier coating using hexamethyldisiloxane (HMDSO) followed by coating with a silyl amine coupling agent.

Substrate Surface

For either Embodiment (i) or (ii), the non-specific biomolecule adsorption and/or binding resistant coating may be applied to a substrate surface, e.g. a vessel wall or a part thereof, which may be glass, or which is a thermoplastic material, which comprises, for example: an olefin polymer; polypropylene (PP); polyethylene (PE); cyclic olefin copolymer (COC); cyclic olefin polymer (COP); polymethylpentene; polyester; polyethylene terephthalate; polyethylene naphthalate; polybutylene terephthalate (PBT); PVdC (polyvinylidene chloride); polyvinyl chloride (PVC); polycarbonate; polymethylmethacrylate; polylactic acid; polylactic acid; polystyrene; hydrogenated polystyrene; poly(cyclohexylethylene) (PCHE); epoxy resin; nylon; polyurethane polyacrylonitrile; polyacrylonitrile (PAN); an ionomeric resin; Surlyn® ionomeric resin; glass; borosilicate glass; or a combination of any two or more of these.

Coated Vessels

The article coated with the non-specific biomolecule adsorption and/or binding resistant surface coating for either Embodiment (i) or (ii) may be a vessel having the non-specific biomolecule adsorption and/or binding resistant surface coating on a wall, preferably on the interior wall, e.g. a syringe barrel, or a vessel part or vessel cap having said coating on the vessel contacting surface, e.g. a syringe plunger or a vessel cap. The present invention further provides the coating resulting from the method as described above, a surface coated with said coating, and a vessel coated with said coating.

A "vessel" in the context of either Embodiment (i) or (ii) is a subset exemplary of the broader set of e.g., laboratory ware and medical devices. A vessel per se can be any type of article that is adapted to contain or convey a material. The material can be a liquid, a gas, a solid, or any two or more of these. One example of a vessel is an article with at least one opening and a wall defining an interior contact surface. Optionally, at least a portion of the interior contact surface defines a "contact surface" which is treated according to the present disclosure. The term "at least" in the context of the present invention means "equal or more" than the integer following the term. Thus, a vessel in the context of the present invention has one or more openings.

One or two openings, like the openings of a sample tube (one opening) or a syringe barrel (two openings) are preferred for either Embodiment (i) or (ii). If the vessel has two or more openings, they can be of same or different size. If there is more than one opening, one opening can be used for the gas inlet for a functionalized barrier coating method according to the present invention, while the other openings are either capped or open.

A vessel according to either Embodiment (i) or (ii) can be a sample tube, e.g. for collecting or storing biological fluids like blood or urine, a syringe (or a part thereof, for example a syringe barrel) for storing or delivering a biologically active compound or composition, e.g., a medicament or pharmaceutical composition, a vial for storing biological materials or biologically active compounds or compositions, a pipe, e.g., a catheter for transporting biological materials or biologically active compounds or compositions, or a cuvette for holding fluids, e.g., for holding biological materials or biologically active compounds or compositions.

A vessel of either Embodiment (i) or (ii) can be of any shape. One example of a vessel has a substantially cylindrical wall adjacent to at least one of its open ends. Generally, the interior wall of a vessel of this type is cylindrically shaped, like, e.g. in a sample tube or a syringe barrel. Sample tubes and syringes or their parts (for example syringe barrels), vials, and petri dishes, which commonly are generally cylindrical, are contemplated.

Some other non-limiting examples of contemplated vessels for either Embodiment (i) or (ii) include well or non-well slides or plates, for example titer plates or microtiter plates. Still other non-limiting examples of contemplated vessels include pump contact surfaces in contact with the pumped material, including impeller contact surfaces, pump chamber contact surfaces and the like. Even other non-limiting examples of contemplated vessels include parts of an fluid containment, pumping, processing, filtering, and delivery system, such as an intravenous fluid delivery system, a blood processing system (such as a heart-lung machine or a blood component separator) a dialysis system, or an insulin delivery system, as several examples. Examples of such vessel parts are tubing, pump interior contact surfaces, drug or saline containing bags or bottles, adapters and tubing connectors for connecting parts of the system together, intravenous needles and needle assemblies, membranes and filters, etc. Other examples of vessels include measuring and delivery devices such as pipettes, pipette tips, Erlenmeyer flasks, beakers, and graduated cylinders.

Either Embodiment (i) or (ii) further has application to any contact surfaces of devices used or usable in contact with pharmaceutical preparations or other materials, such as ampoules, vials, syringes, bottles, bags, or other containment vessels, stirring rods, impellers, stirring pellets, etc., also within the definition of "contact surfaces."

Either Embodiment (i) or (ii) further has application to any contact surfaces of devices used or usable in contact with biomolecules or solutions of biomolecules, such as ampoules, vials, syringes, bottles, bags, or other containment vessels, stirring rods, impellers, stirring pellets, etc., also within the definition of "contact surfaces."

Some specific medical devices and laboratory ware having fluid or tissue contacting surfaces that can be treated according to either Embodiment (i) or (ii) follow: agar petri dishes; blood culture devices; blood sample cassettes; blood sampling systems; bottles; capillary blood collection devices; catheters; cell lifters; cell scrapers; cell spreaders; centrifuge components; collection and transport devices; containers; cover glasses; cryo/freezer boxes; depression microscopic slides; direct testing and serology devices; flat microscopic slides; microbiology equipment and supplies; microbiology testing devices; microscopic slides; molecular diagnostics devices; petri dishes; pipettes; pipette tips; sample collection containers; sample collection tubes; sample collection/storage devices; shaker flasks; Erlenmeyer flasks; beakers; graduated cylinders; and syringes.

Either Embodiment (i) or (ii) provides vessels treated with the functionalized barrier coating of the instant invention in which the article comprises, for example, at least one of the following: a microplate; a centrifuge tube; a pipette tip; a pipette, a microwell plate; an ELISA plate; a microtiter plate; a 96-well plate; a 384-well plate; a 1536-well plate; a round bottom flask; a beaker; a graduated cylinder; and an Erlenmeyer flask A "vessel" in the context of either Embodiment (i) or (ii) can be any type of vessel with at least one opening and a wall defining an interior surface. The substrate can be the inside wall of a vessel having a lumen. Though the invention is not necessarily limited to vessels of a particular volume, vessels are contemplated in which the lumen has a void volume of, for example, from 0.5 to 50 mL, optionally from 1 to 10 mL, optionally from 0.5 to 5 mL, optionally from 1 to 3 mL. The substrate surface can be part or all of the inner surface of a vessel having at least one opening and an inner surface.

Coating of a Vessel

When a vessel is coated by the above coating method of either Embodiment (i) or (ii), the coating method comprises several steps. A vessel is provided having an open end, a closed end, and an interior surface. Surface modification may be done on, for example, the commercial products such as a polypropylene microplate (NUNC, 96 well, 0.5 ml, round bottom) with varying conditions. For example, the process may comprise, for example, two stages, i) substrate conditioning stage to provide, for example, a hydroxylated plastic or SiOx-coated glass surfaces, ii) an copolymerization reagent stage, to yield the non-specific biomolecule adsorption and/or non-specific binding resistant surface coating.

Preferably, the method either Embodiment (i) or (ii) is performed by seating the open end of the vessel on a vessel holder, establishing a sealed communication between the vessel holder and the interior of the vessel. In this preferred aspect, the gaseous reactant is introduced into the vessel through the vessel holder. In a particularly preferred aspect, a plasma enhanced chemical vapor deposition (PECVD) apparatus comprising a vessel holder, an inner electrode, an outer electrode, and a power supply is used for the coating method according to the present invention.

The vessel holder of either Embodiment (i) or (ii) has a port to receive a vessel in a seated position for processing. The inner electrode is positioned to be received within a vessel seated on a vessel holder. The outer electrode has an interior portion positioned to receive a vessel seated on the vessel holder. The power supply feeds alternating current to the inner and/or outer electrodes to form a plasma within the vessel seated on the vessel holder. Typically, the power supply feeds alternating current to the outer electrode while the inner electrode is grounded. In this embodiment, the vessel defines the plasma reaction chamber.

In some embodiments of either Embodiment (i) or (ii), the vessel is immersed in a copolymer solution prepared as described in U.S. Pat. No. 6,828,028.

In either Embodiment (i) or (ii), a substrate can optionally be placed in a reaction chamber, a vacuum is drawn on the reaction chamber, and a gas comprising oxygen is added to the reaction chamber. A plasma is generated from the gas, optionally with heating to form the prepared substrate surface.

In Embodiment (i), the prepared surface is then treated with a copolymer solution comprising a solvent and at least one zwitterionic copolymer. In Embodiment (ii), the prepared surface is then reacted with a vapor comprising at least one silyl amine coupling agent, optionally in the presence of oxygen, optionally with heating to form an amine functionalized substrate surface. In Embodiment (ii), the amine functionalized substrate surface is then treated with a copolymer solution comprising a solvent and at least one copolymerizable zwitterionic monomer and at least one copolymerizable epoxy monomer, optionally in the presence of a polymerization initiator. In either Embodiment (i) or (ii), an optional next step is heating, removing the copolymer solution, and optionally drying the non-specific biomolecule adsorption and/or non-specific binding resistant coated surface, optionally heating the substrate surface, thus forming a non-specific biomolecule adsorption and/or non-specific binding resistant coated surface.

Optionally in Embodiment (i), a substrate is placed in a reaction chambers, a vacuum is drawn on the reaction chamber, and a gas comprising an organosilicon precursor and optionally containing oxygen is added to the reaction chamber. A plasma is generated from the gas by plasma enhanced chemical vapor deposition (PECVD), optionally with radiofrequency irradiation, optionally with microwave irradiation, optionally with heating to form the prepared substrate surface. The prepared surface is then treated with a copolymer solution comprising a solvent and at least one zwitterionic copolymer, optionally with heating, optionally waiting, removing the copolymer solution, and optionally drying the non-specific biomolecule adsorption and/or non-specific binding resistant coated surface, optionally heating the substrate surface, thus forming a non-specific biomolecule adsorption and/or non-specific binding resistant coated surface.

Optionally in Embodiment (ii), a substrate that is a SiOx-coated glass surface is placed in a reaction chambers, a vacuum is drawn on the reaction chamber, and a gas comprising oxygen is added to the reaction chamber. A plasma is generated from the gas by plasma enhanced chemical vapor deposition (PECVD), optionally with radiofrequency irradiation, optionally with microwave irradiation, optionally with heating to form the prepared substrate surface. The prepared surface is then reacted with a vapor comprising at least one silyl amine coupling agent, optionally in the presence of oxygen, optionally with heating to form an amine functionalized substrate surface. The amine functionalized substrate surface is then treated with a copolymer solution comprising a solvent and at least one copolymerizable zwitterionic monomer and at least one copolymerizable epoxy monomer, optionally in the presence of a polymerization initiator, optionally with heating, optionally waiting, removing the copolymer solution, and optionally drying the non-specific biomolecule adsorption and/or non-specific binding resistant coated surface, optionally heating the substrate surface, thus forming a non-specific biomolecule adsorption and/or non-specific binding resistant coated surface.

In some embodiments, a substrate is placed in a reaction chambers, a vacuum is drawn on the reaction chamber, and a gas comprising an organosilicon precursor and optionally containing oxygen, in the case of Embodiment (i) or a gas comprising oxygen, in the case of Embodiment (ii), is added to the reaction chamber. In either Embodiment (i) or (ii), a plasma is generated from the gas by pulsed plasma enhanced chemical vapor deposition (PPECVD), optionally with radiofrequency irradiation, optionally with microwave irradiation, optionally with heating to form the prepared substrate surface. In Embodiment (ii), the prepared substrate surface is then reacted with a vapor comprising at least one silyl amine coupling agent, optionally in the presence of oxygen, optionally with heating to form an amine functionalized substrate surface. The amine functionalized substrate surface is then treated with a copolymer solution comprising a solvent and at least one copolymerizable zwitterionic monomer and at least one copolymerizable epoxy monomer, optionally in the presence of a polymerization initiator, optionally with heating, optionally waiting, removing the copolymer solution, and optionally drying the non-specific biomolecule adsorption and/or non-specific binding resistant coated surface, optionally heating the substrate surface, thus forming a non-specific biomolecule adsorption and/or non-specific binding resistant coated surface.

Optionally in Embodiment (i) or (ii), a substrate is placed in a reaction chambers, a vacuum is drawn on the reaction chamber, and a gas comprising oxygen is added to the reaction chamber. A plasma is generated from the gas by pyrolytic chemical vapor deposition (PCVD), optionally with radiofrequency irradiation, optionally with microwave irradiation, optionally with heating to form the prepared substrate surface. In Embodiment (i), the prepared surface is then treated with a copolymer solution comprising a solvent and at least one zwitterionic copolymer. In Embodiment (ii), the prepared substrate surface is then reacted with a vapor comprising at least one silyl amine coupling agent, optionally in the presence of oxygen, optionally with heating to form an amine functionalized substrate surface. The amine functionalized substrate surface is then treated with a copolymer solution comprising a solvent and at least one copolymerizable zwitterionic monomer and at least one copolymerizable epoxy monomer, optionally in the presence of a polymerization initiator, optionally with heating, optionally waiting, removing the copolymer solution, and optionally drying the non-specific biomolecule adsorption and/or non-specific binding resistant coated surface, optionally heating the substrate surface, thus forming a non-specific biomolecule adsorption and/or non-specific binding resistant coated surface.

Optionally in Embodiment (ii), a substrate is placed in a vacuum plasma reactor, the vacuum plasma reactor is evacuated, and then gas comprising oxygen, optionally containing argon, optionally containing nitrogen is added. The gas is then irradiated with RF frequency energy. The irradiation is terminated and the substrate is exposed to a vapor comprising at least one silyl amine coupling agent to provide an amine modified substrate. The amine modified substrate surface is then treated with a copolymer solution comprising a solvent and at least one copolymerizable zwitterionic monomer and at least one copolymerizable epoxy monomer, optionally in the presence of a polymerization initiator, optionally with heating, optionally waiting, removing the copolymer solution, and optionally drying the non-specific biomolecule adsorption and/or non-specific binding resistant coated surface, optionally heating the substrate surface, thus forming a non-specific biomolecule adsorption and/or non-specific binding resistant coated surface.

Optionally in Embodiment (ii), a substrate that is a SiOx-coated glass surface is placed in a vacuum plasma reactor, the vacuum plasma reactor is evacuated, and then gas comprising oxygen, optionally containing argon, optionally containing nitrogen is added. The gas is then irradiated with RF frequency energy. The irradiation is terminated and the substrate is exposed to a vapor comprising at least one silyl amine coupling agent to provide an amine modified substrate.

The amine modified substrate surface is then treated with a copolymer solution comprising a solvent and at least one copolymerizable zwitterionic monomer and at least one copolymerizable epoxy monomer, optionally in the presence of a polymerization initiator. In either Embodiment (i) or (ii), the process optionally continues with heating, removing the copolymer solution, and optionally drying the non-specific biomolecule adsorption and/or non-specific binding resistant coated surface, optionally heating the substrate surface, thus forming a non-specific biomolecule adsorption and/or non-specific binding resistant coated surface.

Optionally in Embodiment (i), a substrate is placed in a reaction chambers, a vacuum is drawn on the reaction chamber, and a gas comprising an organosilicon precursor and optionally containing oxygen is added to the reaction chamber. The prepared surface is then treated with a copolymer solution comprising a solvent and at least one zwitterionic copolymer, optionally with heating, optionally waiting, removing the copolymer solution, and optionally drying the non-specific biomolecule adsorption and/or non-specific binding resistant coated surface, optionally heating the substrate surface, thus forming a non-specific biomolecule adsorption and/or non-specific binding resistant coated surface.

The invention will be illustrated in more detail with reference to the following Examples, but it should be understood that the present invention is not deemed to be limited thereto.

EXAMPLES

Example 1 of the First More Detailed Embodiment

Polypropylene 96-well microplates were plasma treated according to an optional aspect of the first more detailed embodiment. The process used to treat the microplates used a radio-frequency (RF) plasma system. The system had a gas delivery input, a vacuum pump and RF power supply with matching network. The microplates were oriented facing away from and shielded from the plasma along the perimeter of the chamber. These details are illustrated in FIG. 2. The shielding resulted in remote plasma treatment in which the ratio between the radiant density at the remote points on the surfaces of the microplates and the brightest point of the plasma discharge was less than 0.25.

The two step remote conversion plasma process used according to this non-limiting example is summarized in Table 2 of the first more detailed embodiment:

TABLE 2

Process parameters for plasma treatment per Example 1 of the first more detailed embodiment

| Process Step 1- Conditioning Plasma | | Process Step 2- conversion plasma | |
|---|---|---|---|
| Power (W) | 500 | Power (W) | 500 |
| $O_2$ Flow rate (sccm) | 50 | $H_2O$ Flow rate (sccm) | 5 |
| Time (minutes) | 5 | Time (minutes) | 3 |
| Pressure (mTorr) | 50 | Pressure (mTorr) | 80-120 |

The biomolecule binding resistance resulting from this remote conversion plasma process of the first more detailed embodiment on the surface of the treated microplates was analyzed by carrying out the Testing of All Embodiments. The percent recovery is the percentage of the original concentration of the protein remaining in solution, i.e., which did not bind to the surface of a microplate.

Figure 3:
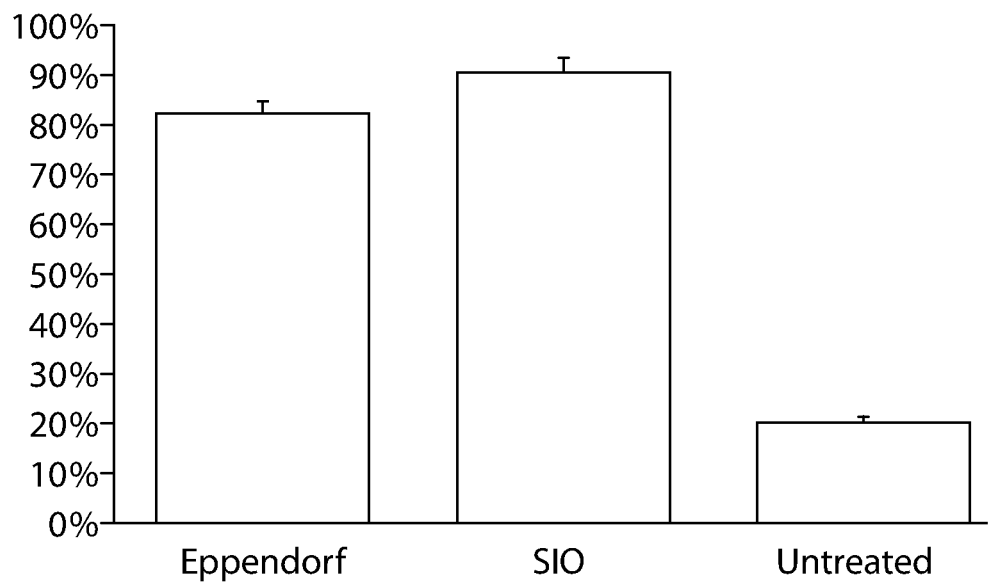
FIG. 3 is a bar graph illustrating comparative biomolecule recovery results between unconditioned and unconverted polypropylene microplates, Eppendorf LoBind® brand microplates and microplates treated with an exemplary remote conversion plasma treatment process according to the first more detailed embodiment.

In this testing, samples of three different types of microplates were tested for percent recovery. The samples included: (1) unconditioned and unconverted polypropylene microplates ("Unconditioned and unconverted" samples); (2) polypropylene microplates molded by SiO2 Medical Products and converted according to the first more detailed embodiment described in Example 1 of this specification ("SIO" samples); and (3) Eppendorf LoBind brand microplates ("Eppendorf LoBind" samples). The bar chart in FIG. 3 shows the results of this comparative testing. As FIG. 3 of the first more detailed embodiment illustrates, the converted SiO2 plates had a 60% increase in biomolecule recovery compared to the Unconditioned and unconverted Samples and an 8-10% increase in biomolecule recovery compared to the Eppendorf LoBind samples.

Accordingly, remote conversion plasma treatment according to the first more detailed embodiment has been demonstrated to result in lower biomolecule adhesion (or the inverse, higher biomolecule recovery) than other known methods. In fact, the comparative data of the SiO2 samples and the Eppendorf LoBind samples were particularly surprising, since Eppendorf LoBind has been considered the industry standard in protein resistant labware. The SiO2 plates' 8-10% increase in efficacy compared to the Eppendorf LoBind samples represents a marked improvement compared to the state of the art.

Example 2 of the First More Detailed Embodiment

Figure 4:
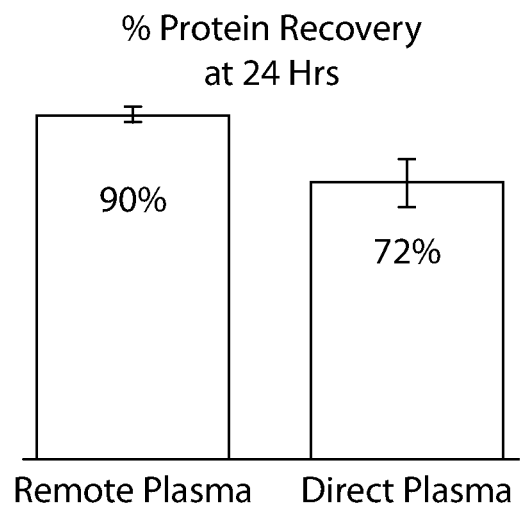
FIG. 4 is a bar graph illustrating comparative biomolecule recovery results between microplates treated with an exemplary remote conversion plasma treatment process according to the first more detailed embodiment and microplates treated with the same process steps and conditions except using direct conversion plasma treatment instead of remote conversion plasma treatment.

In this example of the first more detailed embodiment, the SiO2 plates of Example 1 were compared to the same microplates that were converted with same process steps and conditions as the SIO, except (and this is an important exception), the second samples were treated with direct plasma instead of remote conversion plasma (the "Direct Plasma" samples). Surprisingly, as shown in FIG. 4, the Direct Plasma samples had a biomolecule recovery percentage after 24 hours of 72%, while the SiO2 plates (which were treated under the same conditions/process steps except by remote conversion plasma) had a biomolecule recovery percentage after 24 hours of 90%. This remarkable step change demonstrates the unexpected improvement resulting solely from use of remote conversion plasma of the first more detailed embodiment in place of direct plasma.

Example 3 of the First More Detailed Embodiment

Figure 5:
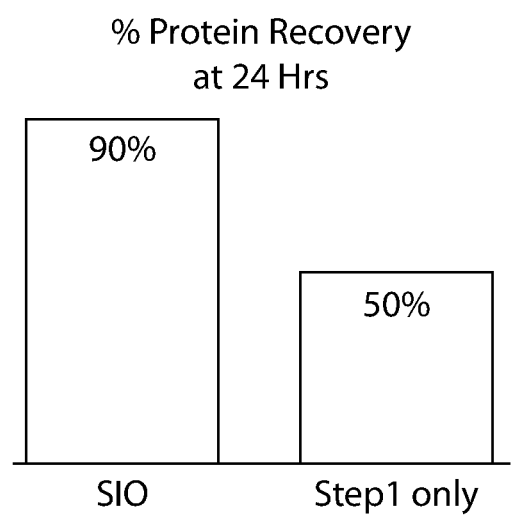
FIG. 5 is a bar graph illustrating comparative biomolecule recovery results between microplates treated with an exemplary remote conversion plasma treatment process according to the first more detailed embodiment and microplates treated with only the non-polymerizing compound step and without the second step.

In this example of the first more detailed embodiment, the SIO samples of Example 1 were compared to the same microplates that were treated with only the conditioning step of the method of the first more detailed embodiment (i.e., the non-polymerizing compound plasma step or conditioning plasma treatment) without the second treatment step (water vapor plasma step or conversion plasma treatment) ("Step 1 Only" samples). As shown in FIG. 5, Step 1 Only samples had a biomolecule recovery percentage after 24 hours at about 25° C. (the aging of all protein samples in this specification is at 25° C. unless otherwise indicated) of 50%, while the SiO2 plates (which were treated under the same conditions/process steps except also by remote conversion plasma) had a biomolecule recovery percentage after 24 hours of 90%. Accordingly, using both steps of the method according to embodiments of the first more detailed embodiment results in significantly improved biomolecule recovery percentage than using only the conditioning step alone.

Example 4 (Prophetic) of the First More Detailed Embodiment

A further contemplated optional advantage of the first more detailed embodiment is that it provides high levels of resistance to biomolecule adhesion without a countervailing high extractables profile. For example, Eppendorf LoBind® labware is resistant to biomolecule adhesion by virtue of a chemical additive, which has a propensity to extract from the substrate and into a solution in contact with the substrate. By contrast, the first more detailed embodiment does not rely on chemical additives mixed into a polymer substrate to give the substrate its biomolecule adhesion resistant properties. Moreover, processes according to the first more detailed embodiment do not result in or otherwise cause compounds or particles to extract from a treated substrate. It has further been determined that the pH protective process described in this disclosure does not result in or otherwise cause compounds or particles to extract from a converted surface.

Accordingly, in one optional aspect, the disclosed technology (in the first more detailed embodiment described herein) relates to a method for treating a surface, also referred to as a material or workpiece, to form a converted having a biomolecule recovery percentage of the surface before conversion treatment, and in which any conditioning or conversion treatment does not materially increase the extractables profile of the substrate. Applicants contemplate that this would bear out in actual comparative tests between the unconditioned and unconverted surface and the converted surface.

Example 5 of the First More Detailed Embodiment

A test similar to Example 1 of the first more detailed embodiment was carried out to compare the biomolecule recovery from unconditioned and unconverted polypropylene (UTPP) laboratory beakers, remote conversion plasma treated polypropylene (TPP) laboratory beakers according to the first more detailed embodiment, and unconditioned and unconverted glass laboratory beakers. The biomolecules used were 12 nM dispersions of lyophilized BSA, FBG, TFN, PrA, and PrG.

In a first trial of the first more detailed embodiment, the biomolecule dispersion was made up in the beaker and aspirated several times to mix it. The biomolecule recovery was measured in relative fluorescence units (RFU). The initial RFU reading (0 min) was taken to establish a 100% recovery baseline, then the biomolecule dispersion in the beaker was stirred for 1 min with a pipet tip, after which it was allowed to remain on the laboratory bench undisturbed for the remainder of the test. The biomolecule recovery was measured initially, and then a sample was drawn and measured for percentage biomolecule recovery at each 5-minute interval. The results are shown in Table 3.

TABLE 3

Polypropylene beaker trial of the first more detailed embodiment

| UTPP BSA | | UTPP FBG | | UTPP TFN | | UTPP PrA | | UTPP PrG | |
|---|---|---|---|---|---|---|---|---|---|
| Time (min) | % R | Time (min) | % R | Time (min) | % R | Time (min) | % R | Time (min) | % R |
| 0 | 100% | 0 | 100% | 0 | 100% | 0 | 100% | 0 | 100% |
| 1 | 99% | 1 | 99% | 1 | 98% | 1 | 100% | 1 | 101% |
| 5 | 98% | 5 | 97% | 5 | 94% | 5 | 98% | 5 | 99% |
| 10 | 99% | 10 | 99% | 10 | 93% | 10 | 99% | 10 | 100% |
| 15 | 98% | 15 | 92% | 15 | 90% | 15 | 97% | 15 | 99% |
| 20 | 99% | 20 | 98% | 20 | 88% | 20 | 98% | 20 | 101% |
| 25 | 99% | 25 | 97% | 25 | 85% | 25 | 96% | 25 | 98% |
| 30 | 98% | 30 | 96% | 30 | 85% | 30 | 96% | 30 | 99% |

| TPP BSA | | TPP FBG | | TPP TFN | | TPP PrA | | TPP PrG | |
|---|---|---|---|---|---|---|---|---|---|
| Time (min) | % R | Time (min) | % R | Time (min) | % R | Time (min) | % R | Time (min) | % R |
| 0 | 100% | 0 | 100% | 0 | 100% | 0 | 100% | 0 | 100% |
| 1 | 104% | 1 | 101% | 1 | 100% | 1 | 104% | 1 | 104% |
| 5 | 104% | 5 | 100% | 5 | 96% | 5 | 104% | 5 | 104% |
| 10 | 106% | 10 | 101% | 10 | 96% | 10 | 104% | 10 | 104% |
| 15 | 104% | 15 | 99% | 15 | 94% | 15 | 102% | 15 | 104% |
| 20 | 106% | 20 | 100% | 20 | 94% | 20 | 104% | 20 | 104% |

TABLE 3-continued

| | | | | | | | | | |
|---|---|---|---|---|---|---|---|---|---|
| 25 | 103% | 25 | 98% | 25 | 91% | 25 | 102% | 25 | 101% |
| 30 | 105% | 30 | 98% | 30 | 90% | 30 | 103% | 30 | 103% |

A second trial of the first more detailed embodiment, with results shown in Table 4, was carried out in the same manner as the first trial except that glass beakers, not treated according to the first more detailed embodiment, were used as the substrate.

TABLE 4

Glass beaker trial of the first more detailed embodiment

| Glass BSA | | Glass FBG | | Glass TFN | | Glass PrA | | Glass PrG | |
|---|---|---|---|---|---|---|---|---|---|
| Time (min) | % R | Time (min) | % R | Time (min) | % R | Time (min) | % R | Time (min) | % R |
| 0 | 100% | 0 | 100% | 0 | 100% | 0 | 100% | 0 | 100% |
| 1 | 100% | 1 | 100% | 1 | 100% | 1 | 105% | 1 | 99% |
| 4 | 99% | 4 | 88% | 4 | 98% | 4 | 103% | 4 | 97% |
| 7 | 100% | 7 | 99% | 7 | 97% | 7 | 104% | 7 | 98% |
| 8 | 98% | 8 | 98% | 8 | 96% | 8 | 102% | 8 | 96% |
| 10 | 98% | 10 | 98% | 10 | 95% | 10 | 100% | 10 | 97% |
| 15 | 96% | 15 | 95% | 15 | 92% | 15 | 100% | 15 | 94% |
| 20 | 97% | 20 | 96% | 20 | 92% | 20 | 101% | 20 | 93% |
| 25 | 96% | 25 | 93% | 25 | 88% | 25 | 95% | 25 | 91% |
| 30 | 94% | 30 | 93% | 30 | 87% | 30 | 98% | 30 | 92% |

Figure 9:
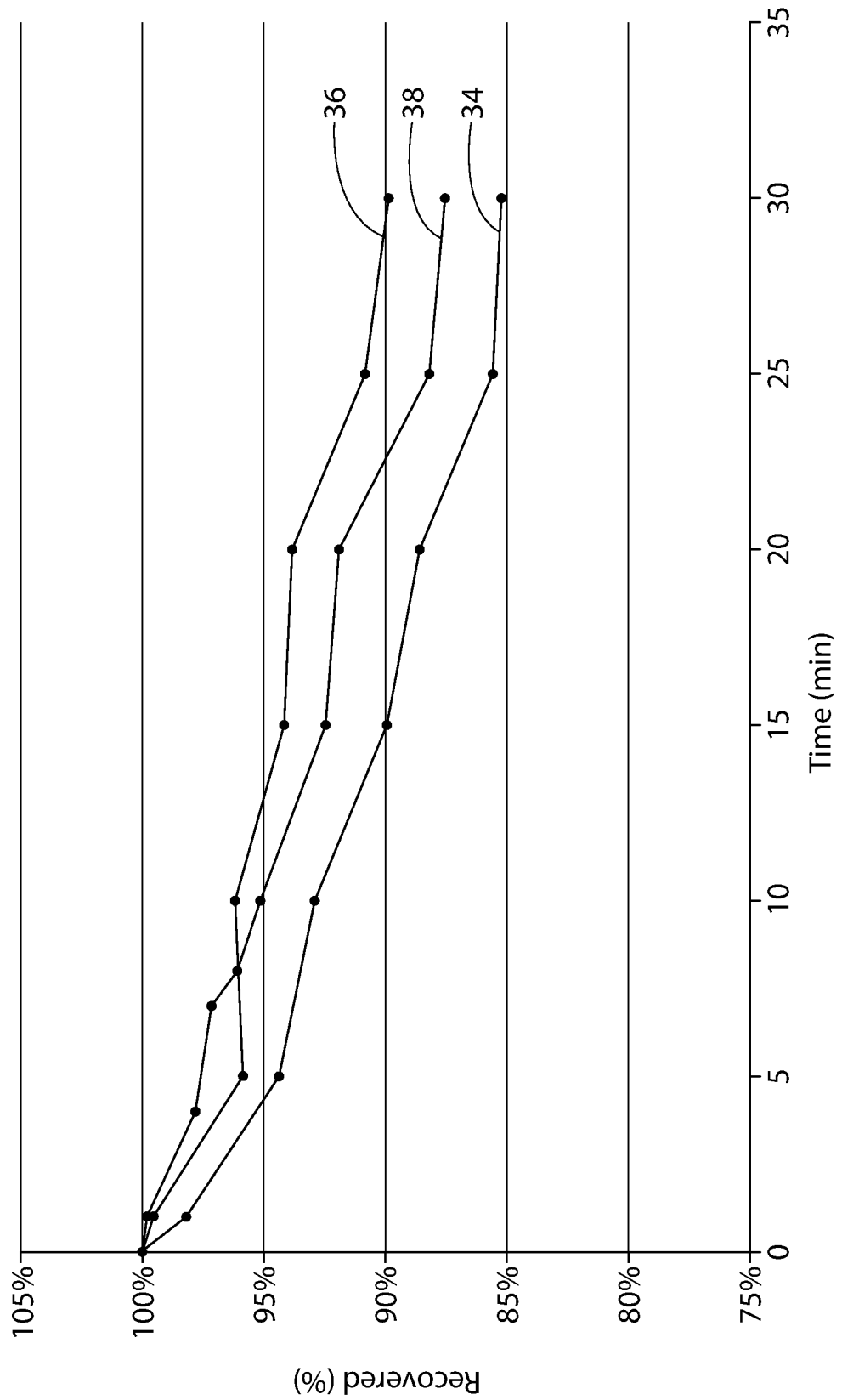
FIG. 9 is a plot of biomolecule (TFN) recovery from unconditioned and unconverted polypropylene beakers, treated polypropylene beakers according to the first more detailed embodiment, and glass beakers.

FIG. 9 of the first more detailed embodiment plots the TFN results in Tables above, showing plots 34 for the unconditioned and unconverted polypropylene beaker, 36 for the treated polypropylene beaker, and 38 for glass. As FIG. 9 shows, the treated polypropylene beaker provided the highest biomolecule recovery after 10 to 30 minutes, glass produced a lower biomolecule recovery after 10 to 30 minutes, and the unconditioned and unconverted polypropylene beaker provided the lowest biomolecule recovery at all times after the initial measurement.

Example 6 of the First More Detailed Embodiment

A test similar to Example 1 of the first more detailed embodiment was carried out to compare the biomolecule recovery from multiwell polypropylene plates of two types, versus protein concentration, after 24 hours of contact between the protein and the plate. "SiO2" plates were molded from polypropylene and plasma treated according to Example 1. "CA" (Competitor A) plates were commercial competitive polypropylene plates provided with a coating to provide reduced non-specific protein binding.

Figure 11:
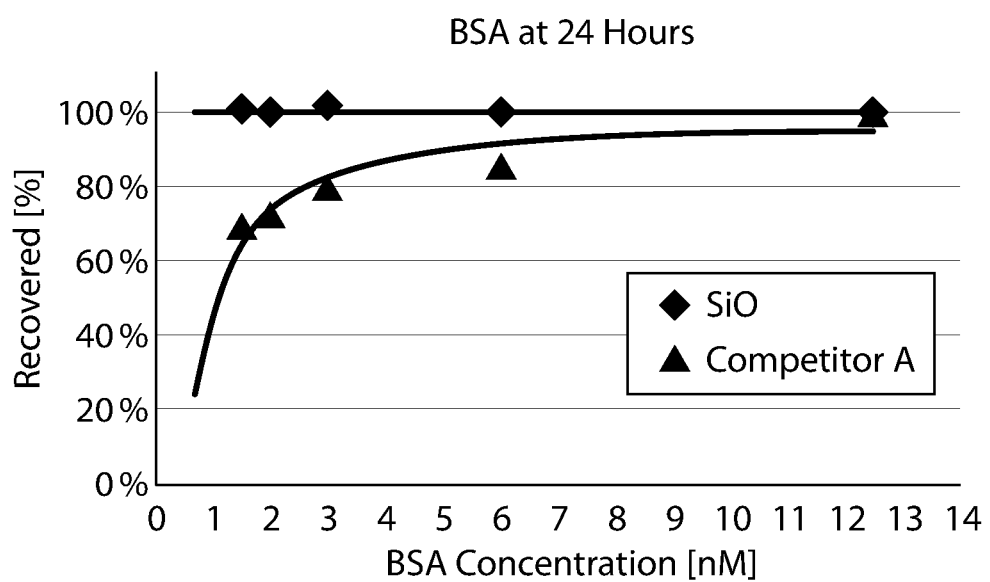
FIG. 11 is a plot of protein recovery versus concentration of protein (BSA) for Example 6.
Figure 12:
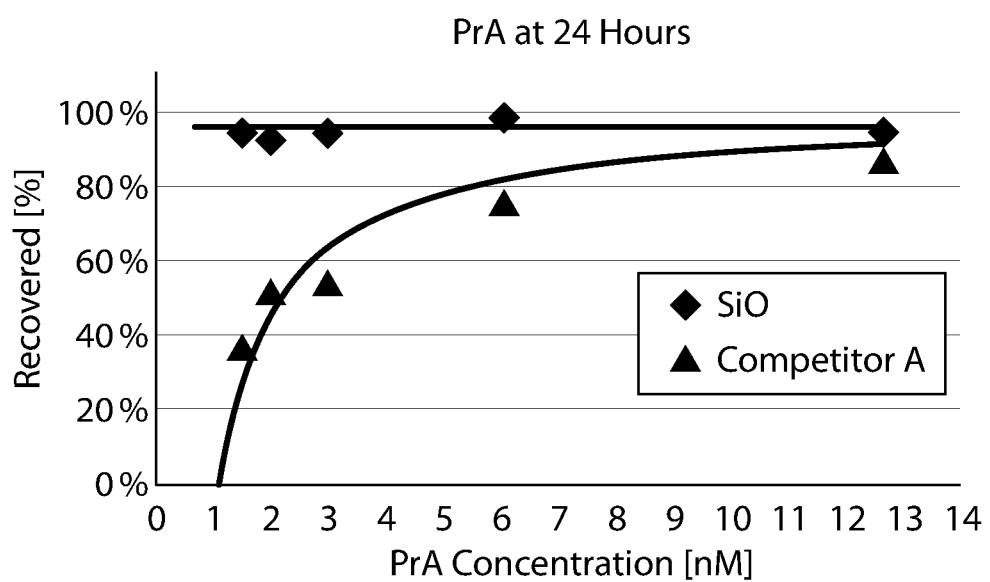
FIG. 12 is a plot of protein recovery versus concentration of protein (PrA) for Example 6.
Figure 13:
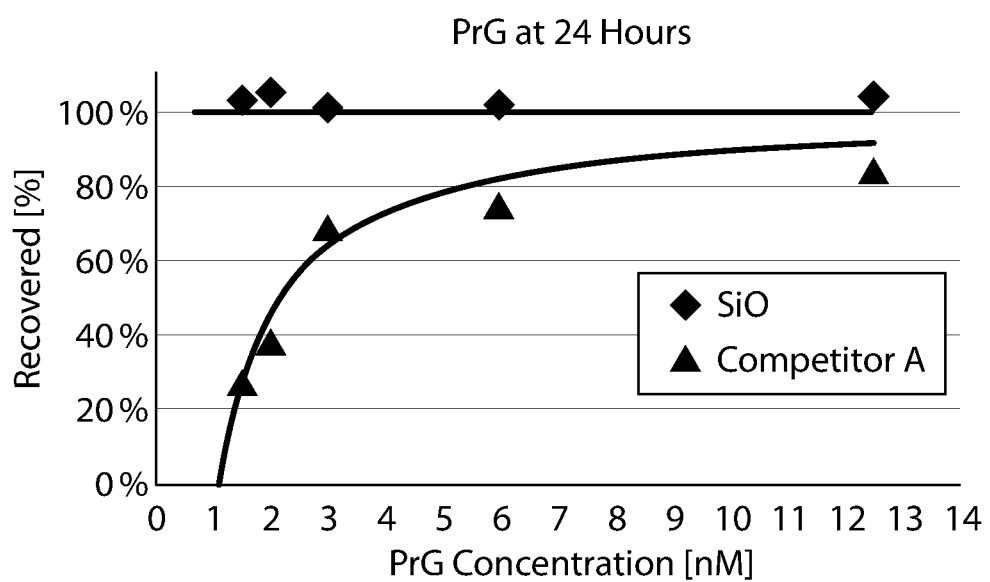
FIG. 13 is a plot of protein recovery versus concentration of protein (PrG) for Example 6.

The results are provided in Table 5 and FIGS. 11-13 showing that essentially all the protein of each type was recovered from the converted SiO2 plates at all tested concentrations, so the recovery was independent of concentration. In contrast, the protein recovery from the CA plates depended strongly on the concentration, particularly at lower concentrations

TABLE 5

RECOVERY @ 24 hrs. in %
(96-Well 1000 µL Deep Well Plate)

| Concentration (nM) | Plate | BSA | PrA | PrG |
|---|---|---|---|---|
| 1.5 | SiO2 | 101 | 94 | 103 |
| 2 | SiO2 | 100 | 92 | 105 |

TABLE 5-continued

RECOVERY @ 24 hrs. in %
(96-Well 1000 µL Deep Well Plate)

| Concentration (nM) | Plate | BSA | PrA | PrG |
|---|---|---|---|---|
| 3 | SiO2 | 102 | 94 | 101 |
| 6 | SiO2 | 100 | 98 | 102 |
| 12.5 | SiO2 | 100 | 94 | 104 |
| 1.5 | CA | 70 | 37 | 27 |
| 2 | CA | 73 | 52 | 38 |
| 3 | CA | 80 | 54 | 69 |
| 6 | CA | 86 | 76 | 75 |
| 12.5 | CA | 100 | 87 | 84 |

Example 7 of the First More Detailed Embodiment

A test similar to Example 1 of the first more detailed embodiment was carried out to compare the biomolecule recovery from converted "SiO2" plates and "CA" plates of the types described in Example 6. The biomolecules used were 1.5 or 3 nM dispersions of lyophilized BSA, FBG, TFN, PrA, and PrG.

The conditions and results are shown in Table 6. For the BSA, PrA, PrG, and TFN proteins, the converted SiO2 plates provided substantially superior protein recovery, compared to the CA plates. For the FBG protein, the converted SiO2 plates provided better protein recovery than the CA plates.

TABLE 6

RECOVERY @ 72 hrs. in %
(96 Well 350 μL (SiO2) or 500 μL (CA) Shallow Plate)

| Concentration (nM) | Plate | BSA | FBG | TFN | PrA | PrG |
|---|---|---|---|---|---|---|
| 1.5 | SiO2 | 104 | 85 | 79 | 99 | 101 |
| 3 | SiO2 | 100 | 85 | 71 | 93 | 98 |
| 1.5 | CA | 69 | 77 | 45 | 44 | 39 |
| 3 | CA | 74 | 83 | 38 | 60 | 66 |

Example 8 of the First More Detailed Embodiment

A test similar to Example 7 of the first more detailed embodiment was carried out to compare 96-well, 500 μL SiO2 and CA plates. The conditions and results are shown in Table 7. For the BSA, PrA, PrG, and TFN proteins, as well as the 1.5 nM concentration of FBG, the converted SiO2 plates provided substantially superior protein recovery, compared to the CA plates. The 3 nM concentration of FBG was anomalous.

TABLE 7

RECOVERY @ 72 hrs. in %
(96 Well 500 μL Deep Well Plate)

| Concentration (nM) | Plate | BSA | FBG | TFN | PrA | PrG |
|---|---|---|---|---|---|---|
| 1.5 | SiO2 | 101 | 85 | 68 | 93 | 104 |
| 3 | SiO2 | 96 | 74 | 71 | 91 | 104 |
| 1.5 | CA | 69 | 77 | 45 | 44 | 39 |
| 3 | CA | 74 | 83 | 38 | 60 | 66 |

Example 9 of the First More Detailed Embodiment

A test similar to Example 7 of the first more detailed embodiment was carried out to compare 96-well, 1000 μL converted SiO2 and CA plates. The conditions and results are shown in Table 8. For the BSA, PrA, and PrG proteins, the converted SiO2 plates provided substantially superior protein recovery, compared to the CA plates. The FBG proteins did not demonstrate substantially superior protein recovery.

TABLE 8

RECOVERY @ 72 hrs. in %
(96 Well 1000 μL Deep Well Plate)

| Concentration (nM) | Plate | BSA | FBG | TFN | PrA | PrG |
|---|---|---|---|---|---|---|
| 1.5 | SiO2 | 101 | 51 | 64 | 99 | 100 |
| 3 | SiO2 | 99 | 63 | 62 | 99 | 102 |
| 1.5 | CA | 84 | 76 | 44 | 38 | 44 |
| 3 | CA | 81 | 83 | 46 | 63 | 52 |

Example 10 of the First More Detailed Embodiment

A test similar to Example 7 of the first more detailed embodiment was carried out to compare 384 Well 55 μL (converted SiO2) vs 200 μL (CA) shallow plates. The conditions and results are shown in Table 8. For the BSA, PrA, and PrG proteins, the converted SiO2 plates provided substantially superior protein recovery, compared to the CA plates. The FBG proteins did not demonstrate substantially superior protein recovery.

TABLE 9

RECOVERY @ 72 hrs. in %
(384 Well 55 μL (SiO2) or 200 μL (CA) Shallow Plate)

| Concentration (nM) | Plate | BSA | FBG | TFN | PrA | PrG |
|---|---|---|---|---|---|---|
| 1.5 | SiO2 | 97 | 38 | 92 | 71 | 102 |
| 3 | SiO2 | 102 | 57 | 87 | 92 | 104 |
| 1.5 | CA | 34 | 58 | 32 | 27 | 14 |
| 3 | CA | 63 | 62 | 39 | 37 | 28 |

Example 11 of the First More Detailed Embodiment

A test similar to Example 1 of the first more detailed embodiment was carried out to compare the SiO2 converted plates of the first more detailed embodiment to polypropylene plates treated with StabilBlot® BSA Blocker, a commercial treatment used to reduce BSA protein adhesion, sold by SurModics, Inc., Eden Prairie, MN, USA. The conditions and results are shown in Table 10, where converted SiO2 is the plate according to Example 1, Plate A is a polypropylene plate treated with 5% BSA blocker for one hour and Plate B is a polypropylene plate treated with 1% BSA blocker for one hour. Except for FBG protein, the present technology again provided superior results compared to the BSA blocker plates.

TABLE 10

RECOVERY @ 24 hrs. in %
(3 nM in buffer)

| Concentration (nM) | Plate | BSA | FBG | TFN | PrA | PrG |
|---|---|---|---|---|---|---|
| 3 | SiO2 | 102 | 69 | 79 | 96 | 104 |
| 3 | A | 97 | 85 | 71 | 93 | 102 |
| 3 | B | 94 | 84 | 66 | 70 | 75 |

A: 5% BSA blocker passivation of 1000 μL, treated 1 hr;
B: 1% BSA blocker passivation of 1000 μL, treated 1 hr;

Example 12 of the First More Detailed Embodiment

A test similar to Example 7 of the first more detailed embodiment was carried out to compare the protein recovery rates of SiO2 converted plates in accordance with Example 1 over longer periods of time—from 1 to 4 months. The conditions and results are shown in Table 11, which illustrates that roughly uniform resistance to protein adhesion was observed for all of the proteins over a substantial period.

TABLE 11

RECOVERY in %

| Time (month) | BSA | FBG | TFN | PrA | PrG |
|---|---|---|---|---|---|
| Initial | 97 | 80 | 63 | 98 | 101 |
| 1 | 95 | — | 66 | 81 | 100 |
| 2 | 94 | 85 | 61 | 87 | 96 |

TABLE 11-continued

| | | RECOVERY in % | | | |
|---|---|---|---|---|---|
| Time (month) | BSA | FBG | TFN | PrA | PrG |
| 3 | 92 | 77 | 79 | 87 | 94 |
| 4 | 97 | 74 | 77 | 85 | 94 |

Example 13 of the First More Detailed Embodiment

The uniformity of binding among the different wells of a single plate was tested using two 96-well plates with deep (500 µL) wells, converted SiO2 plate prepared according to Example 1 except testing 2 nM PrA protein after two hours in all 96 wells, and the other a Competitor A plate, again testing 2 nM PrA protein after two hours in all 96 wells. The protein recovery from each well on one plate was measured, then averaged, ranged (determining the highest and lowest recovery rates among the 96 wells), and a standard deviation was calculated. For the converted SiO2 plate, the mean recovery was 95%, the range of recoveries was 11%, and the standard deviation was 2%. For the CA plate, the mean recovery was 64%, the range of recoveries was 14%, and the standard deviation was 3%.

The same test as in the preceding paragraph was also carried out using 96-well plates with 1000 µL wells. For the converted SiO2 plate, the mean recovery was 100%, the range of recoveries was 13%, and the standard deviation was 3%. For the CA plate, the mean recovery was 62%, the range of recoveries was 25%, and the standard deviation was 3%.

This testing indicated that the conversion treatment of Example 1 allows at least as uniform a recovery rate among the different wells as the protein resisting coating of the CA plate. This suggests that the SiO2 plasma treatment is very uniform across the plate.

Example 14 of the First More Detailed Embodiment

This example was carried out to compare the protein recovery from multiwell polypropylene plates of two types versus protein concentration, after 96 hours of contact between the protein and the plate. SiO2 plates were molded from polypropylene and plasma converted according to Example 6. "EPP" plates were commercial competitive polypropylene Eppendorf LoBind® plates. The testing protocol is the same as in Example 6, except that the smallest protein concentrations—0.1 nM—were much lower than those in Example 6.

The results are shown in Table 12 and FIGS. 14-16. In fact, the comparative data of the converted SiO2 plates (plots 152, 154, and 158) and the Eppendorf LoBind® plates (i.e. "EPP" plates, plots 150, 156, and 160) were particularly surprising, since Eppendorf LoBind® has been considered the industry standard in protein resistant labware. For all three types of proteins tested in the example (i.e. BSA, PrA and PrG), the protein recovery was substantially constantly high regardless of the concentration for converted SiO2 plates. However, for "EPP" plates, the protein recovery was dramatically lowered at low concentration. Especially at ultra-low concentration (e.g. from 0.1 nM to less than 1.5 nM), the protein recoveries for the SiO2 converted plates were far superior to the "EPP" plate.

For the PrG protein as shown by data marked with asterisks in Table 12, the 0.1 nM SiO2 converted plate data point was regarded as anomalous, since the true protein recovery of the SiO2 converted plate cannot exceed 100% plus the error limit assigned to the data point. The 0.1 nM EPP Plate PrG data point also was regarded as anomalous, since it deviates substantially from the trend of the other data points. These anomalous data points are not shown in FIG. 16.

TABLE 12

| | RECOVERY @ 96 hrs in % (96-Well 500 µL Deep Well Plate) | | | |
|---|---|---|---|---|
| Concentration (nM) | Plate | BSA | PrA | PrG |
| 0.1 | SiO2 | 91 | 95 | 216* |
| 1.5 | SiO2 | 84 | 97 | 109 |
| 3 | SiO2 | 81 | 98 | 109 |
| 6 | SiO2 | 87 | 106 | 105 |
| 12 | SiO2 | 89 | 101 | 100 |
| 0.1 | EPP | 42 | 42 | 85* |
| 1.5 | EPP | 68 | 48 | 23 |
| 3 | EPP | 85 | 80 | 56 |
| 6 | EPP | 95 | 100 | 85 |
| 12 | EPP | 104 | 102 | 100 |

Example 15 of the First More Detailed Embodiment

Characterization of Extracted Organic Species from the Present Low Protein Binding Converted Microplates Using GC-MS Method This testing was carried out on a 96-well microplate to evaluate if the present conversion treatment adds extractables to the solution in contact with the substrate. The microplate was molded from polypropylene and converted with plasma according to Example 6.

Extraction Procedures

300 µL isopropanol (IPA) was added to a total of 16 wells in the 96-well microplate. After the addition, the plate was covered firmly with a glass plate and stored at room temperature for 72 hours. Following extraction, the contents of the 16 wells were combined in one individual vial, capped, and inverted to mix. Individual aliquots were transferred to autosampler vials for GC-MS analyses.

GC-MS Analysis Conditions and Results

Figure 17:
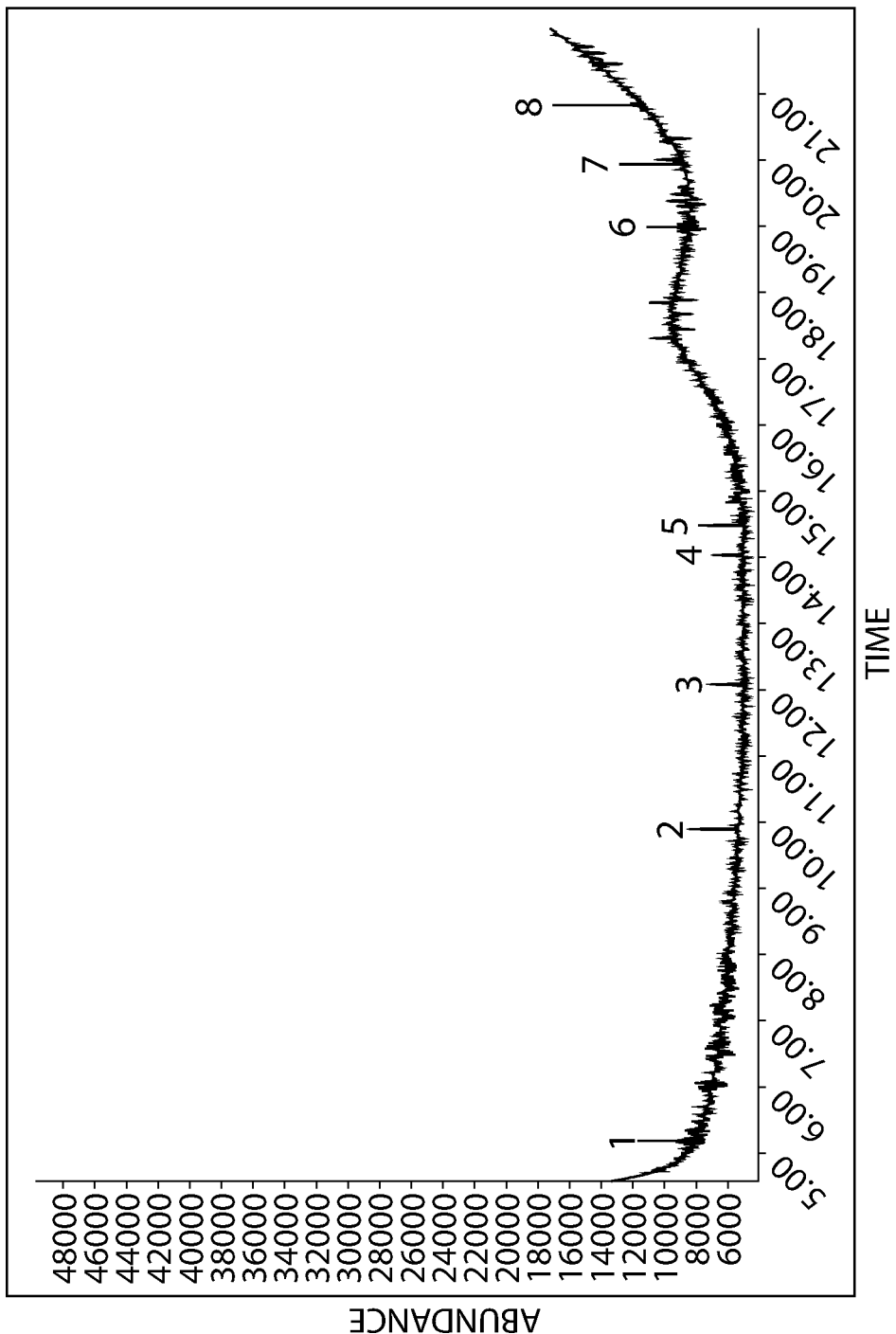
FIG. 17 is a GC-MS (gas chromatography–mass spectroscopy) plot characterizing extracted organic species from low protein binding treated microplates according to Example 15, showing peak assignments.

The GC-MS (gas chromatography—mass spectrometry) analysis conditions are shown in Table 13 and a resulting plot, annotated with the eight peak assignments made, is shown in FIG. 17 and the peak assignments are described in Table 14.

TABLE 13

| GC-MS Conditions | |
|---|---|
| Capillary Column | DB - 5 MS, 30 m × 0.25 mm I.D. × 0.25 µm |
| Inlet | 300° C. |
| Carrier Gas (He) Flow | 1.0 mL/minute constant flow |
| Injection | 1 µL splitless injection |
| Temperature Program | 50° C. increased at 10° C./min to 300° C. (10 min hold) |

TABLE 13-continued

GC-MS Conditions

| | |
|---|---|
| Transfer Line | 300° C. |
| Detector | Agilent 5973 MSD, Scan Mode m/z 33-700 |

TABLE 14

Extract Peaks For SiO2 Plates

| Peak #, FIG. 17 | Compound Identification |
|---|---|
| 1 | Siloxane (seen in blank) |
| 2 | Siloxane (seen in blank) |
| 3 | Siloxane (seen in blank) |
| 4 | Siloxane (seen in blank) |
| 5 | Unknown (seen in blank) |
| 6 | Aliphatic hydrocarbon (seen in blank) |
| 7 | Aliphatic hydrocarbon (seen in blank) |
| 8 | Aliphatic hydrocarbon (seen in blank) |

Figure 18:
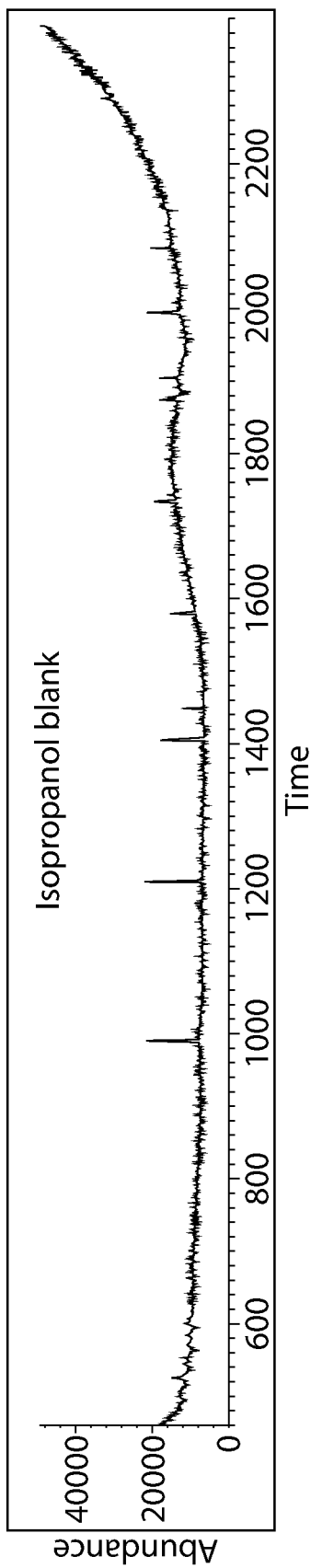
FIG. 18 is a plot similar to FIG. 17 for an isopropanol blank according to Example 15.
Figure 19:
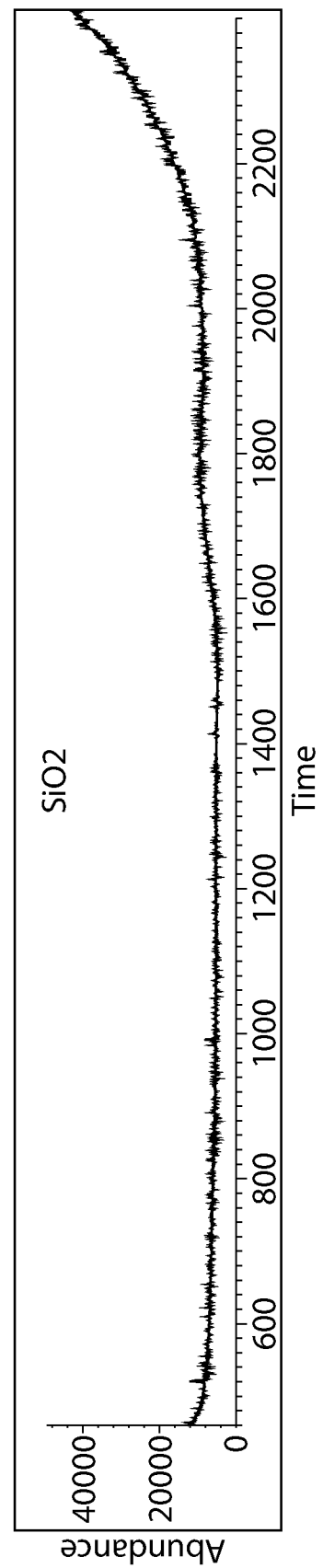
FIG. 19 is a plot similar to FIG. 17 from Example 15 without peak assignments, for comparison with FIG. 18.

FIGS. 18 and 19 show the GC-MS plots, measured in the same way as FIG. 17, characterizing extracted organic species for an isopropanol blank (FIG. 18) vs. the converted SiO2 low protein binding treated microplates according to Example 15 (FIG. 19).

Example 16 of the First More Detailed Embodiment

Characterization of Extracted Organic Species from SiO2 Low Protein Binding Converted Microplates Using LC-MS Method An LC-MS (liquid chromatography—mass spectroscopy) method was used to analyze the organic extractables and evaluate if the present conversion treatment adds organic extractables to the solution in contact with the substrate. Extraction procedures are the same as in Example 15.

LC-MS Analysis Conditions and Results

Analyses were conducted with an Agilent G6530A Q-TOF mass spectrometer and extracts were run in both positive and negative APCI modes. The LC-MS conditions for positive APCI are shown in Table 15 and the LC-MS conditions for negative APCI are shown in Table 16.

Figure 20:
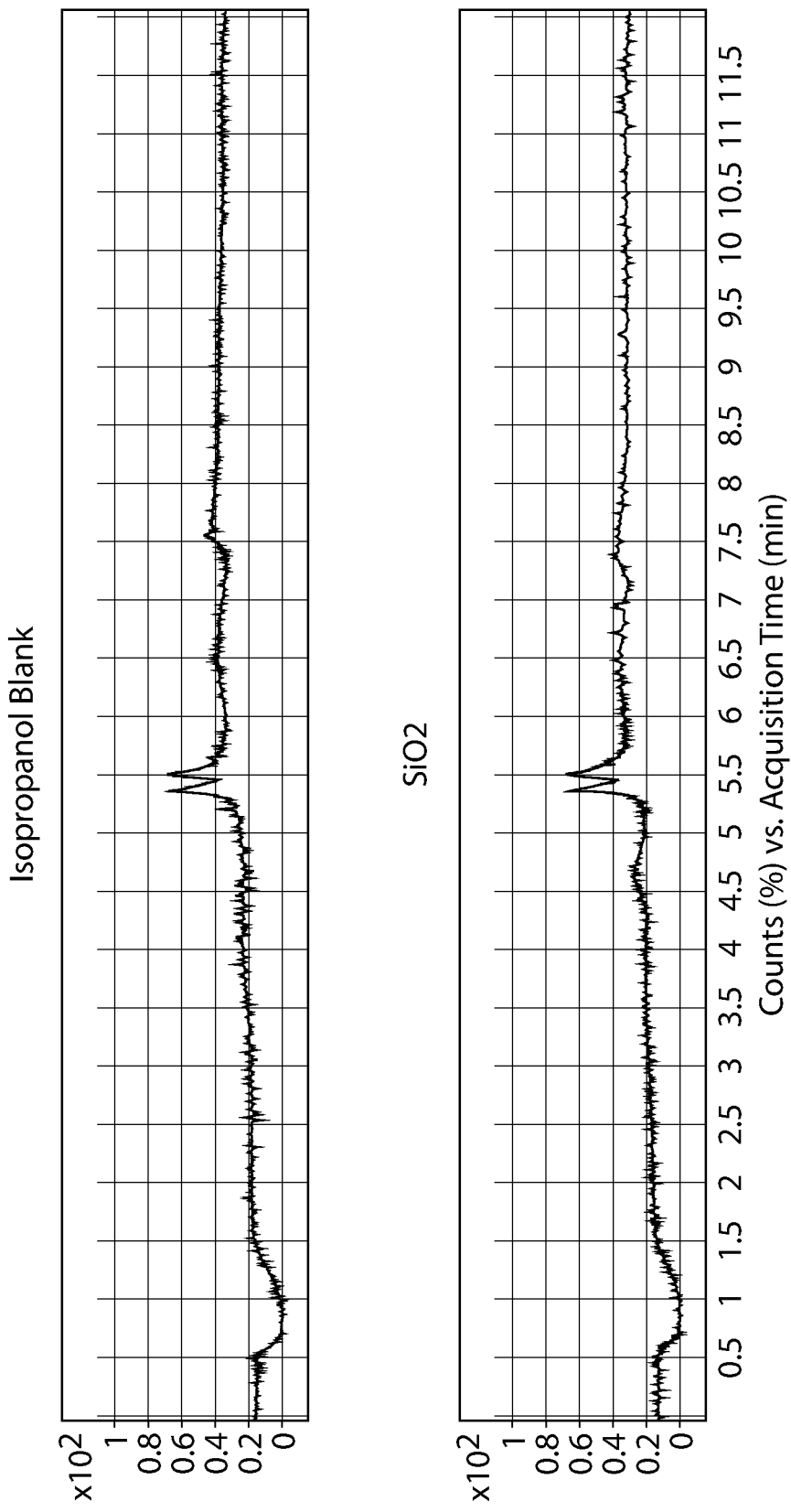
FIG. 20 is a comparison from Example 16 of the LC-MS isopropanol extracted ion chromatogram (positive APCI mode) of the SiO2 low protein binding treated plates (lower plot) vs that of the isopropanol blank (upper plot).

FIG. 20 shows the comparison of the LC-MS isopropanol extracted ion chromatogram (positive APCI mode) of the SiO2 low protein binding converted plates (lower plot) vs that of the isopropanol blank (upper plot).

Figure 22:
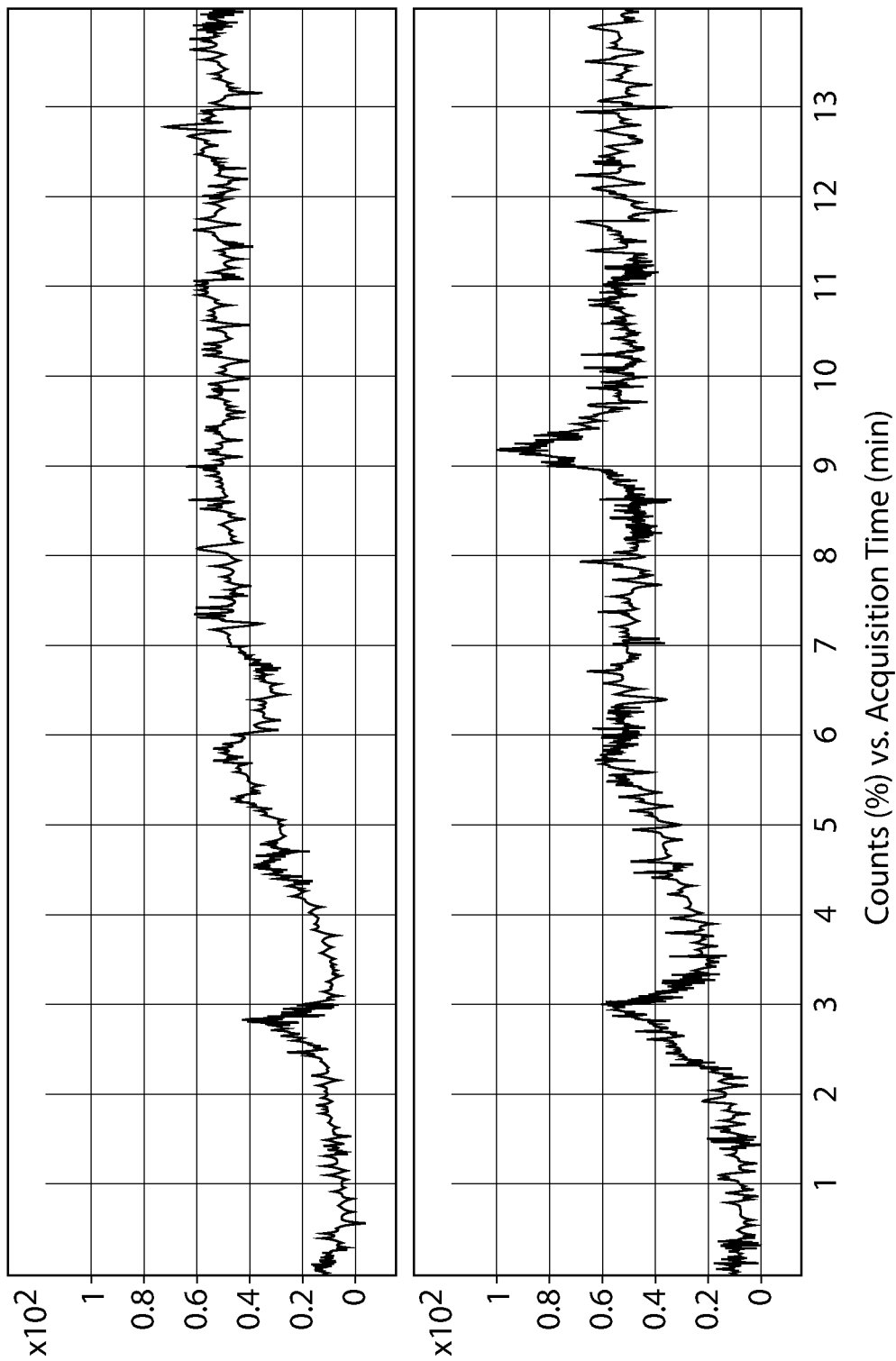
FIG. 22 is a comparison from Example 16 of the LC-MS isopropanol extracted ion chromatogram (negative APCI mode) of the SiO2 low protein binding treated plates (lower plot) vs that of the isopropanol blank (upper plot).
Figure 23:
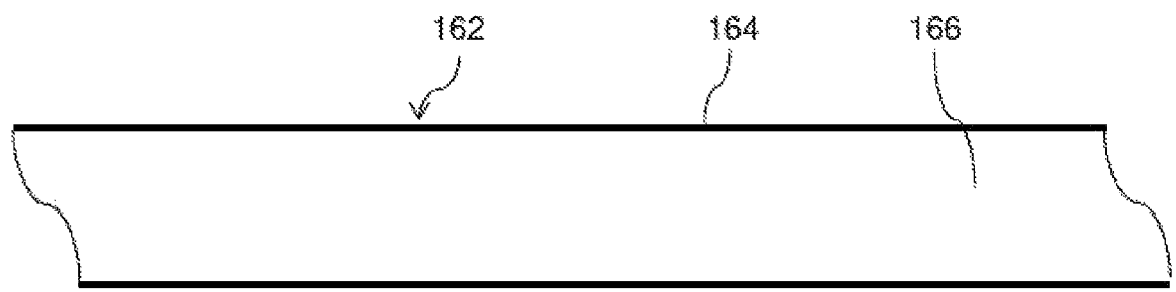
FIG. 23 is an illustration, with reference to all embodiments, of a substrate 162 having a contact surface 164 and an interior portion 166.

FIG. 22 shows the comparison of the LC-MS isopropanol extracted ion chromatogram (negative APCI mode) of the SiO2 low protein binding converted plates (lower plot) vs that of the isopropanol blank (upper plot).

Figure 21:
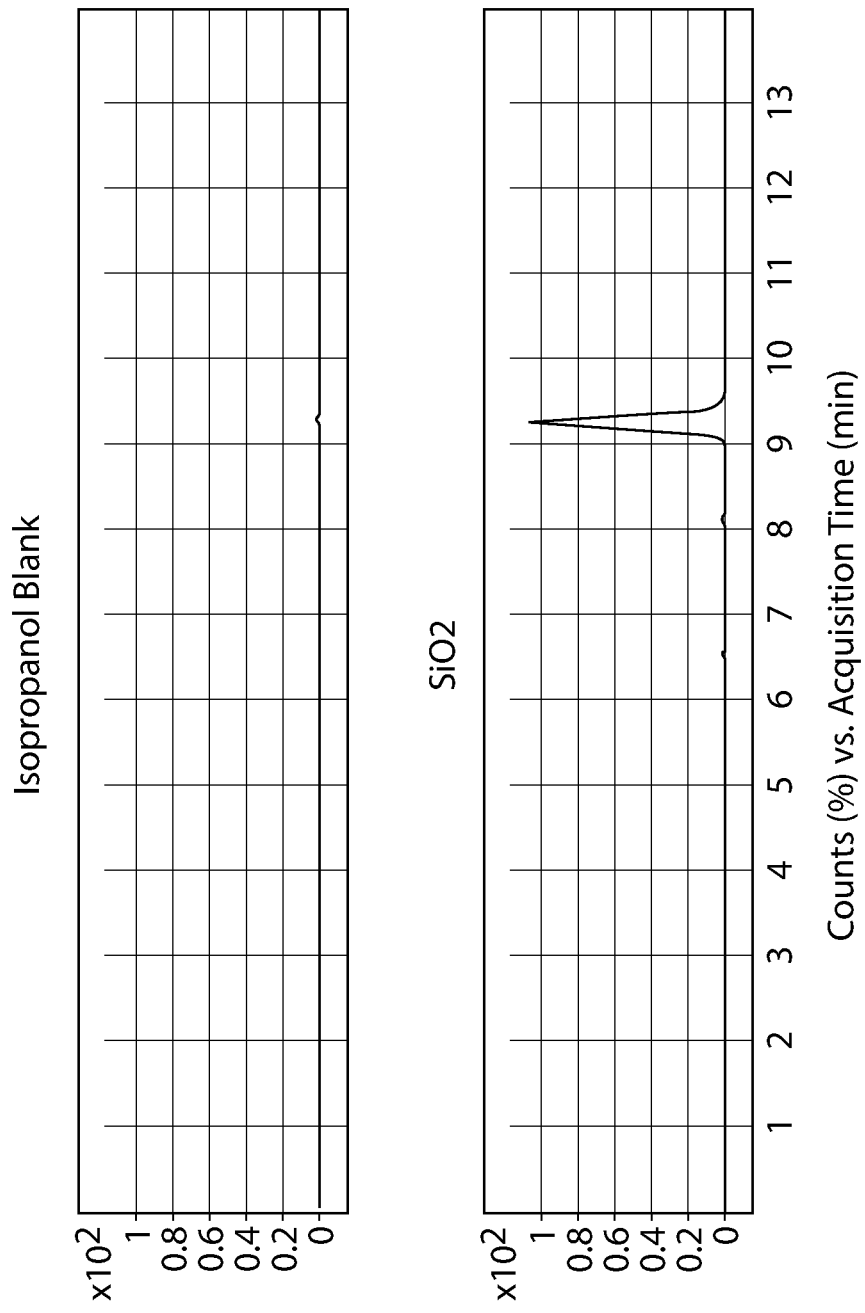
FIG. 21 is a comparison from Example 16 of the LC-MS isopropanol extracted ion chromatogram (positive APCI mode) of the SiO2 unconditioned and unconverted plates (lower plot) vs that of the isopropanol blank (upper plot), showing the presence of a polypropylene component in the unconditioned and unconverted plate extract.

The only unmatched peak for SiO2 converted plates is at m/z 529 which is consistent with Irganox® 1076 in the unconditioned and unconverted SiO2 plates' isopropanol extract (FIG. 21, lower plot), vs. an isopropanol blank (upper plot). Therefore, this extracted compound was not added by the present low protein binding treatment. It came from the resin, as it also was extracted from unconditioned and unconverted SiO2 plates.

TABLE 15

LC-MS Conditions For Positive APCI

| | | | |
|---|---|---|---|
| Mobile Phase A | HPLC Grade Water | | |
| Mobile Phase B | HPLC Grade Methanol | | |
| Column | Zorbax Exlipse $C_8$ columns, 2.1 mm × 50 mm, 1.8 μm | | |
| Column Temperature | 40° C. | | |
| Injection Volume | 3 μL | | |
| Flow Rate | 0.3 mL/min | | |
| Gradient | Time (min) | % A | % B |
| | 0.0 | 90.0 | 10.0 |
| | 5.0 | 0.0 | 100.0 |
| | 12.0 | 0.0 | 100.0 |
| Equilibration time | 4 minutes between runs | | |

TABLE 16

LC-MS Conditions For Negative APCI

| | | | |
|---|---|---|---|
| Mobile Phase A | HPLC Grade Water | | |
| Mobile Phase B | HPLC Grade Methanol | | |
| Column | Imtakt Cadenza CD-C18 column, 4.6 mm × 30 mm, 3 μm | | |
| Column Temperature | 40° C. | | |
| Injection Volume | 5 μL | | |
| Flow Rate | 0.7 mL/min | | |
| Gradient | Time (min) | % A | % B |
| | 0.0 | 40.0 | 60.0 |
| | 6.0 | 0.0 | 100.0 |
| | 14.0 | 0.0 | 100.0 |
| Equilibration time | 4 minutes between runs | | |

Example 17 of the First More Detailed Embodiment

Characterization of Extracted Inorganic Species from SiO2 Microplates Using ICP-MS Method An ICP-MS method was used to compare the inorganic extractable level of three types of 96-well microplates. The three types of microplates are unconditioned and unconverted commercial Labcyte polypropylene microplates (Labcyte), unconditioned and unconverted commercial Porvair polypropylene microplates (Porvair) and SiO2 low binding plasma converted microplates, molded by SiO2 Medical Products, Inc. from polypropylene and converted with plasma according to Example 6.

Extraction Procedures

The wells in the microplates were filled with a 2% v/v nitric acid (HNO3) solution in de-ionized (DI) water, covered with a glass plate, and allowed to extract at room temperature for 72 hours. Then approximately 3 mL of the solution were transferred into autosampler tubes and analyzed by ICP-MS using an Agilent 7700× spectrometer and the conditions are shown in Table 17.

ICP-MS Analysis Conditions and Results

The results are shown in Table 18. The results show that nitric acid extracts of converted SiO2 plates have low levels of inorganics, near equivalent to that of unconditioned and unconverted Labcyte and Porvair plates. Therefore SiO2

Medical Products low protein binding conversion treatment does not add inorganic extractables.

TABLE 17

ICP-MS Conditions

| RF Power | 1550 W |
|---|---|
| Plasma Mode | General Purpose |
| He Flow | 4.3 mL/min |
| Number of Replicates | 3 |
| Sweeps/Replicates | 100 |

*The results were not corrected for the procedural blank reported in the first column

TABLE 18

Summary of the ICP-MS Elemental Analysis of the Extraction Residues, Including Detection Limit (DL) and Quantitation Limit (QL) Results

| Element | Blank* µg/L | Labcyte (S152365) µg/L | SiO2 (S152367) µg/L | Porvair (S152368) µg/L | DL µg/L | QL µg/L |
|---|---|---|---|---|---|---|
| Aluminum | <DL | 17.0 | 14.3 | 11.4 | 0.023 | 0.077 |
| Antimony | <DL | 0.016 | <DL | 0.015 | 0.003 | 0.009 |
| Arsenic | <DL | <QL | <DL | <DL | 0.024 | 0.081 |
| Barium | <DL | 0.22 | 0.36 | 1.45 | 0.004 | 0.013 |
| Cadmium | <DL | <QL | <QL | <DL | 0.002 | 0.007 |
| Calcium | <DL | 17.9 | 28.5 | 74.0 | 1.743 | 5.809 |
| Chromium | <DL | 0.22 | 0.16 | 2.52 | 0.025 | 0.084 |
| Cobalt | <DL | 0.014 | 0.017 | 0.027 | 0.002 | 0.006 |
| Copper | <DL | 1.67 | 1.67 | 1.01 | 0.257 | 0.856 |
| Gold | 0.013 | 0.011 | 0.011 | 0.015 | 0.001 | 0.003 |
| Iridium | 0.003 | <QL | 0.161 | 0.102 | 0.001 | 0.003 |
| Iron | <DL | 2.39 | 4.52 | 47.5 | 0.040 | 0.134 |
| Lead | <DL | 0.118 | 0.111 | 0.075 | 0.001 | 0.003 |
| Lithium | <DL | 0.03 | 0.03 | 0.05 | 0.008 | 0.026 |
| Magnesium | <DL | 15.8 | 28.5 | 88.0 | 0.007 | 0.023 |
| Mercury | <DL | <DL | <DL | <DL | 1.775 | 5.917 |
| Manganese | <DL | 0.06 | 0.16 | 0.71 | 0.010 | 0.035 |
| Molybdenum | <DL | <QL | 0.03 | 0.21 | 0.004 | 0.013 |
| Nickel | <DL | 0.13 | 0.25 | 0.22 | 0.019 | 0.064 |
| Osmium | 0.018 | 0.014 | 0.014 | 0.014 | 0.002 | 0.008 |
| Palladium | <QL | <QL | 0.010 | 0.009 | 0.002 | 0.007 |
| Platinum | <DL | <DL | <DL | <QL | 0.001 | 0.004 |
| Potassium | <DL | 15.1 | 21.3 | 33.5 | 0.931 | 3.103 |
| Rhodium | 0.002 | <QL | 0.041 | 0.032 | 0.0004 | 0.001 |
| Ruthenium | <DL | <DL | <DL | <DL | 0.002 | 0.006 |
| Selenium | <DL | <DL | <DL | <DL | 0.128 | 0.426 |
| Silver | 0.002 | 0.001 | 0.003 | 0.003 | 0.0003 | 0.001 |
| Sodium | <QL | 264 | 469 | 433 | 0.063 | 0.210 |
| Thallium | <DL | <QL | <QL | <DL | 0.0002 | 0.001 |
| Tin | <DL | <QL | <DL | <QL | 0.025 | 0.082 |
| Vanadium | <DL | 0.008 | 0.010 | 0.050 | 0.002 | 0.005 |
| Zinc | <DL | 3.24 | 10.5 | 6.10 | 0.030 | 0.099 |

*The results were not corrected for the procedural blank reported in the first column

Example 18 of the First More Detailed Embodiment

The treated 96-well microplates of Example 1 were subjected to x-ray photoelectron spectroscopy (XPS) analysis to determine the properties of the treated contact surface, in particular to demonstrate qualitatively and quantitatively the introduction of grafted moieties to the polymer.

The term "grafting" as used in this disclosure refers to a modification of the original surface of the microplate or other substrate, as by plasma treatment or other means, to chemically bond certain moieties into the original material to modify its composition and properties, leaving many or all of the grafted moieties at the surface, modifying its surface properties, but without introducing a coating over the surface.

XPS was carried out on the treated contact surface in two locations: on the top surface of the microplate between two wells and about half way down the sidewall of a well. The measurements on the sidewall are most pertinent, as the lands should remain free of the samples to avoid contamination of any adjacent well.

The analytical parameters used in for XPS were as follows:

| | |
|---|---|
| Instrument | PHI Quantum 2000 |
| X-ray source | Monochromated Alk$_a$1486.6 eV |
| Acceptance Angle | ±23° |
| Take-off angle | 45° |
| Analysis area | 600 µm (micrometers) |
| Charge Correction | C1s 284.8 eV |
| Ion Gun Conditions | Ar+, 1 keV, 2 × 2 mm raster |
| Sputter Rate | 15.6 /min (SiO2 Equivalent) |

XPS does not detect hydrogen, but does detect carbon, nitrogen and oxygen. XPS of a hydrocarbon such as the untreated polypropylene surface would detect only carbon, plus trace amounts of several other elements. The XPS of the treated contact surface of Example 1, however, provided the atomic proportions (normalized to 100%) of Table 19:

TABLE 19

| Element | Top Face, Atomic % | Sidewall, Atomic % |
|---|---|---|
| C | 89.8 | 91.2 |
| N | 0.6 | 0.3 |
| O | 9.2 | 8.3 |
| S | 0.1 | <0.1 |
| Cl | 0.1 | 0.1 |
| Ca | 0.1 | Not detected |
| Sn | 0.1 | 0.1 |
| Total | 100.0 | 100.0 |

This result shows the grafting of a substantial atomic proportion of oxygen—about 8 to 9 atomic percent—into the polypropylene at the top face and sidewall of the polypropylene microplate, but without forming a coating blanketing the original surface or a change in the bulk composition, as the predominant constituent remains carbon.

Example 19 of the First More Detailed Embodiment

Another XPS analysis was carried out, focusing on the chemical constituents at the surface of a treated polypropylene microplate according to Example 1. The chemical constituents shown in Table 20 were detected. The right column normalizes the sidewall data, normalized as the ratio to 100 atomic percent C bonded to C and H:

TABLE 20

| Moiety | Top Face, Moiety % | Sidewall, Moiety % | Sidewall Data Normalized |
|---|---|---|---|
| C—(C, H) | 76.5 | 78.7 | 100.0% |
| C—(O, N) | 8.4 | 8.4 | 10.7% |
| C=O | 2.6 | 2.5 | 3.2% |
| O—C=O | 1.4 | 1 | 1.3% |
| $CO_3$ | 0.8 | 0.6 | 0.8% |
| N—(C, H)$_3$ | 0.2 | 0.1 | 0.1% |
| N—(C, H)$_4$+ | 0.3 | 0.2 | 0.3% |
| non C—(C, H) total | | | 16.3% |

These moieties change the properties of the surface, but again without forming a coating blanketing the original surface or a change in the bulk composition.

Example 20 of the First More Detailed Embodiment

The contact angle of distilled water on the 96-well microplates treated according to Example 1 of the first more detailed embodiment was measured. The analysis instrument for the contact angle tests was the Contact Angle Meter model DM-701, made by Kyowa Interface Science Co., Ltd. (Tokyo, Japan). To obtain the contact angle, five water droplets were deposited on the inside surface of small pieces obtained from each specimen. The testing conditions and parameters are summarized below. The plates were broken to expose treated contact surfaces. The best representative pieces for each specimen were selected for testing. A drop size of 1 µL (one microliter) was used for all samples. Due to the curvature of the specimens, a curvature correction routine was used to accurately measure the contact angle.

Contact Angle Testing Conditions and Parameters of the First More Detailed Embodiment Test instrument—DM-701 Contact Angle Meter
Liquid Dispenser—22 gauge stainless steel needle
Drop Size—µL (one microliter)
Test liquid—Distilled water
Environment—Ambient air, room temperature (about 25° C.)
Radius of Curvature for each Specimen (micrometers, µm)—as measured.

As a control, the contact angle of an untreated polypropylene microplate surface was measured in the same manner. The contact angle of the untreated polypropylene was 82°, while the contact angle of the treated contact surface according to the first more detailed embodiment was 600 This test illustrates that the plasma treatment provided a much more hydrophilic surface with a lower contact angle, without adding a coating or changing the bulk material.

Second More Detailed Embodiment

A process according to a second more detailed embodiment has been developed that can be applied to polyolefins and a wide range of other polymers that optionally provides over 50% reduction in protein adhesion. The process is based on one to four steps or more that can take place at atmospheric and at reduced pressures via plasma processing. The process can be applied to a wide range of polymeric materials (polyolefins, polyesters, polystyrenes in addition to many other materials) and products including labware, diagnostic devices, contact lenses, medical devices, or implants in addition to many other products.

A first, optional step of the second more detailed embodiment is treating a surface with a polar liquid treatment agent comprising: water, a volatile, polar, organic compound, or a combination of any two or more of these, forming a polar-treated contact surface.

A second, optional step of the second more detailed embodiment is treating the surface with ionized gas.

A third, optional step of the second more detailed embodiment is treating the surface with conditioning plasma comprising: a nitrogen-containing gas, an inert gas, an oxidizing gas, or a combination of two or more of these, forming a conditioned contact surface.

A fourth step of the second more detailed embodiment is treating the surface with conversion plasma of water; a volatile, polar, organic compound; a $C_1$-$C_{12}$ hydrocarbon and oxygen; a $C_1$-$C_{12}$ hydrocarbon and nitrogen; a silicon-containing gas; or a combination of two or more of these, forming a treated contact surface.

The surface to be treated of the second more detailed embodiment can be made of a wide variety of different materials. Several useful types of materials are thermoplastic material, for example a thermoplastic resin, for example a polymer, optionally injection-molded thermoplastic resin. For example, the material can be, or include, an olefin polymer, polypropylene (PP), polyethylene (PE), cyclic olefin copolymer (COC), cyclic olefin polymer (COP), polymethylpentene, polyester, polyethylene terephthalate, polyethylene naphthalate, polybutylene terephthalate (PBT), polyvinylidene chloride (PVdC), polyvinyl chloride (PVC), polycarbonate, polylactic acid, polystyrene, hydrogenated polystyrene, polycyclohexylethylene (PCHE), epoxy resin, nylon, polyurethane polyacrylonitrile, polyacrylonitrile (PAN), an ionomeric resin, Surlyn® ionomeric resin, or any combination, composite or blend of any two or more of the above materials.

A wide variety of different surfaces can be treated according to the second more detailed embodiment. One example of a surface is a vessel lumen surface, where the vessel is, for example, a vial, a bottle, a jar, a syringe, a cartridge, a blister package, or an ampoule. For more examples, the surface of the material can be a contact surface of an article of labware, for example a microplate, a centrifuge tube, a pipette tip, a well plate, a microwell plate, an ELISA plate, a microtiter plate, a 96-well plate, a 384-well plate, a centrifuge tube, a chromatography vial, an evacuated blood collection tube, or a specimen tube.

Yet another example of the second more detailed embodiment is that the surface can be a coating or layer of PECVD deposited $SiO_xC_yH_z$ or $SiN_xC_yH_z$, in which x is from about 0.5 to about 2.4 as measured by X-ray photoelectron spectroscopy (XPS), y is from about 0.6 to about 3 as measured by XPS, and z is from about 2 to about 9 as measured by Rutherford backscattering spectrometry (RBS). Another example is the surface is a barrier coating or layer of SiOx, in which x is from about 1.5 to about 2.9 as measured by XPS, optionally an oxide or nitride of an organometallic precursor that is a compound of a metal element from Group III and/or Group IV of the Periodic Table, e.g. in Group III: Boron, Aluminum, Gallium, Indium, Thallium, Scandium, Yttrium, or Lanthanum, (Aluminum and Boron being preferred), and in Group IV: Silicon, Germanium, Tin, Lead, Titanium, Zirconium, Hafnium, or Thorium (Silicon and Tin being preferred).

The polar liquid treatment agent of the second more detailed embodiment can be, for example, water, for example tap water, distilled water, or deionized water; an alcohol, for example a $C_1$-$C_{12}$ alcohol, methanol, ethanol, n-propanol, isopropanol, n-butanol, isobutanol, s-butanol, t-butanol; a glycol, for example ethylene glycol, propylene glycol, butylene glycol, polyethylene glycol, and others; glycerine, a $C_1$-$C_{12}$ linear or cyclic ether, for example dimethyl ether, diethyl ether, dipropyl ether, dibutyl ether, glyme ($CH_3OCH_2CH_2OCH_3$); cyclic ethers of formula —$CH_2CH_2O_n$— such as diethylene oxide, triethylene oxide, and tetraethylene oxide; cyclic amines; cyclic esters (lactones), for example acetolactone, propiolactone, butyrolactone, valerolactone, and caprolactone; a $C_1$-$C_{12}$ aldehyde, for example formaldehyde, acetaldehyde, propionaldehyde, or butyraldehyde; a $C_1$-$C_{12}$ ketone, for example acetone, diethylketone, dipropylketone, or dibutylketone; a $C_1$-$C_{12}$ carboxylic acid, for example formic acid, acetic acid, propionic acid, or butyric acid; ammonia, a $C_1$-$C_{12}$ amine, for example methylamine, dimethylamine, ethylamine, diethylamine, propylamine, butylamine, pentylamine, hexylamine, heptylamine, octylamine, nonylamine, decylamine, undecylamine, or dodecylamine; hydrogen fluoride, hydrogen chloride, a $C_1$-$C_{12}$ epoxide, for example ethylene oxide or propylene oxide; or a combination of any two or more of these. In this context, "liquid" means liquid under the temperature, pressure, or other conditions of treatment.

Contacting the surface with a polar liquid treatment agent of the second more detailed embodiment can be carried out in any useful manner, such as spraying, dipping, flooding, soaking, flowing, transferring with an applicator, condensing from vapor, or otherwise applying the polar liquid treatment agent. After contacting the surface with a polar liquid treatment agent of the second more detailed embodiment, the surface can be allowed to stand for 1 second to 30 minutes, for example.

In the ionized gas treatment of the second more detailed embodiment, the ionized gas can be, as some examples, air; nitrogen; oxygen; an inert gas, for example argon, helium, neon, xenon, or krypton; or a combination of any two or more of these. The ionized gas can be delivered in any suitable manner. For example, it can be delivered from an ionizing blow-off gun or other ionized gas source. A convenient gas delivery pressure is from 1-120 psi (6 to 830 kPa) (gauge or, optionally, absolute pressure), optionally 50 psi (350 kPa). The water content of the ionized gas can be from 0 to 100%. The polar-treated contact surface with ionized gas can be carried out for any suitable treatment time, for example from 1-300 seconds, optionally for 10 seconds.

In the conditioning plasma treatment of the second more detailed embodiment, a nitrogen-containing gas, an inert gas, an oxidizing gas, or a combination of two or more of these can be used in the plasma treatment apparatus. The nitrogen-containing gas can be nitrogen, nitrous oxide, nitrogen dioxide, nitrogen tetroxide, ammonia, or a combination of any two or more of these. The inert gas can be argon, helium, neon, xenon, krypton, or a combination of any two or more of these. The oxidizing gas can be oxygen, ozone, or a combination of any two or more of these.

In the conversion plasma treatment of the second more detailed embodiment, water; a volatile, polar, organic compound; a $C_1$-$C_{12}$ hydrocarbon and oxygen; a $C_1$-$C_{12}$ hydrocarbon and nitrogen; a silicon-containing gas; or a combination of two or more of these can be used in the plasma treatment apparatus. The polar liquid treatment agent can be, for example, any of the polar liquid treatment agents mentioned in this specification. The $C_1$-$C_{12}$ hydrocarbon optionally can be methane, ethane, ethylene, acetylene, n-propane, i-propane, propene, propyne; n-butane, i-butane, t-butane, butane, 1-butyne, 2-butyne, or a combination of any two or more of these.

The silicon-containing gas of the second more detailed embodiment can be a silane, an organosilicon precursor, or a combination of any two or more of these. The silicon-containing gas can be an acyclic or cyclic, substituted or unsubstituted silane, optionally comprising, consisting essentially of, or consisting of any one or more of: $Si_1$—$Si_4$ substituted or unsubstituted silanes, for example silane, disilane, trisilane, or tetrasilane; hydrocarbon or halogen substituted $Si_1$—$Si_4$ silanes, for example tetramethylsilane (TetraMS), tetraethyl silane, tetrapropylsilane, tetrabutylsilane, trimethylsilane (TriMS), triethyl silane, tripropylsilane, tributylsilane, trimethoxysilane, a fluorinated silane such as hexafluorodisilane, a cyclic silane such as octamethylcyclotetrasilane or tetramethylcyclotetrasilane, or a combination of any two or more of these. The silicon-containing gas can be a linear siloxane, a monocyclic siloxane, a polycyclic siloxane, a polysilsesquioxane, an alkyl trimethoxysilane, a linear silazane, a monocyclic silazane, a polycyclic silazane, a polysilsesquiazane, or a combination of any two or more of these. The silicon-containing gas can be tetramethyldisilazane, hexamethyldisilazane, octamethyltrisilazane, octamethylcyclotetrasilazane, tetramethylcyclotetrasilazane, or a combination of any two or more of these.

The conditioning plasma treatment, the treating plasma treatment, or both of the second more detailed embodiment can be carried out in a plasma chamber. The plasma chamber can have a treatment volume between two metallic plates. The treatment volume can be, for example, from 100 mL to 50 liters, for example about 14 liters. Optionally, the treatment volume can be generally cylindrical.

The plasma chamber of the second more detailed embodiment can have a generally cylindrical outer electrode surrounding at least a portion of the treatment chamber.

To provide a gas feed to the plasma chamber of the second more detailed embodiment, a tubular gas inlet can project into the treatment volume, through which the feed gases are fed into the plasma chamber. The plasma chamber optionally can include a vacuum source for at least partially evacuating the treatment volume.

Optionally in the second more detailed embodiment, the exciting energy for the conditioning plasma or conversion plasma can be from 1 to 1000 Watts, optionally from 100 to 900 Watts, optionally from 500 to 700 Watts, optionally from 1 to 100 Watts, optionally from 1 to 30 Watts, optionally from 1 to 10 Watts, optionally from 1 to 5 Watts.

Optionally in the second more detailed embodiment, the plasma chamber is reduced to a base pressure from 0.001 milliTorr (mTorr) to 100 Torr before feeding gases in the conditioning plasma or conversion plasma treatment.

Optionally in the second more detailed embodiment, the gases are fed for conditioning plasma or conversion plasma treatment at a total pressure for all gases from 1 mTorr to 10 Torr, and at a feed rate of from 1 to 300 sccm, optionally 1 to 100 sccm.

Optionally in the second more detailed embodiment, the gases are fed for conditioning plasma or conversion plasma treatment for from 1 to 300 seconds, optionally from 90 to 180 seconds.

After the treatment(s) of the second more detailed embodiment, the treated contact surface, for example a vessel lumen surface, can be contacted with an aqueous protein. Some non-limiting examples of suitable proteins are the aqueous protein comprises: mammal serum albumin, for example Bovine Serum Albumin (BSA); Fibrinogen (FBG); Transferrin (TFN), for example blood serotransferrin (or siderophilin, also known as transferrin); lactotransferrin (lactoferrin); milk transferrin; egg white ovotransferrin (conalbumin); and membrane-associated melanotransferrin; Protein A (PrA); Protein G (PrG); Protein A/G; Protein L; Insulin, for example hexameric insulin, monomeric insulin, porcine insulin, human insulin, recombinant insulin and pharmaceutical grades of insulin; Pharmaceutical protein; blood or blood component proteins; or any recombinant form, modification, full length precursor, signal peptide, propeptide, or mature variant of these proteins; or a combination of two or more of these.

Optionally in the second more detailed embodiment, the treated contact surface has a protein recovery percentage greater than the protein recovery percentage of the unconditioned and unconverted surface for at least one of Bovine Serum Albumin (BSA); Fibrinogen (FBG); Transferrin (TFN), for example blood serotransferrin (or siderophilin, also known as transferrin); lactotransferrin (lactoferrin); milk transferrin; egg white ovotransferrin (conalbumin); and membrane-associated melanotransferrin; Protein A (PrA); Protein G (PrG); Protein A/G; Protein L; Insulin, for example hexameric insulin, monomeric insulin, porcine insulin, human insulin, recombinant insulin and pharmaceutical grades of insulin; pharmaceutical protein; blood or blood component proteins; or any recombinant form, modification, full length precursor, signal peptide, propeptide, or mature variant of these proteins.

Optionally in the second more detailed embodiment, the treated contact surface has a protein recovery percentage at 24 hours greater than the protein recovery percentage of the unconditioned and unconverted surface for Bovine Serum Albumin having an atomic mass of 66,000 Daltons (BSA) on NUNC® 96-well round bottom plates sold by Nunc A/S Corporation, Denmark, following the protocol in the present specification.

Optionally in the second more detailed embodiment, the treated contact surface has a protein recovery percentage at 24 hours on NUNC® 96-well round bottom plates greater than 70%, optionally greater than 80%, optionally greater than 90%, optionally up to 100% for BSA, following the protocol in the present specification.

Optionally in the second more detailed embodiment, the treated contact surface has a protein recovery percentage at 24 hours greater than the protein recovery percentage of the unconditioned and unconverted surface for Fibrinogen having an atomic mass of 340,000 Daltons (FBG) on NUNC® 96-well round bottom plates, following the protocol in the present specification.

Optionally in the second more detailed embodiment, the treated contact surface has a protein recovery percentage at 24 hours on NUNC® 96-well round bottom plates greater than 20%, optionally greater than 40%, optionally greater than 60%, optionally greater than 80%, optionally up to 84% for FBG, following the protocol in the present specification.

Optionally in the second more detailed embodiment, the treated contact surface has a protein recovery percentage at 24 hours on NUNC® 96-well round bottom plates greater than the protein recovery percentage of the unconditioned and unconverted surface for Transferrin having an atomic mass of 80,000 Daltons (TFN), following the protocol in the present specification.

Optionally in the second more detailed embodiment, the treated contact surface has a protein recovery percentage at 24 hours on NUNC® 96-well round bottom plates greater than 60%, optionally greater than 65%, optionally greater than 69%, optionally up to 70% for TFN, following the protocol in the present specification.

Optionally in the second more detailed embodiment, the treated contact surface has a protein recovery percentage at 24 hours on NUNC® 96-well round bottom plates greater than the protein recovery percentage of the unconditioned and unconverted surface for Protein A having an atomic mass of 45,000 Daltons (PrA), following the protocol in the present specification.

Optionally in the second more detailed embodiment, the treated contact surface has a protein recovery percentage at 24 hours on NUNC® 96-well round bottom plates greater than 9%, optionally greater than 20%, optionally greater than 40%, optionally greater than 60%, optionally up to 67% for PrA, following the protocol in the present specification.

Optionally in the second more detailed embodiment, the treated contact surface has a protein recovery percentage at 24 hours on NUNC® 96-well round bottom plates greater than the protein recovery percentage of the unconditioned and unconverted surface for Protein G having an atomic mass of 20,000 Daltons (PrG), following the protocol in the present specification.

Optionally in the second more detailed embodiment, the treated contact surface has a protein recovery percentage at 24 hours on NUNC® 96-well round bottom plates greater than 12%, optionally greater than 20%, optionally greater than 40%, optionally greater than 60%, optionally greater than 80%, optionally up to 90% for PrG, following the protocol in the present specification.

Optionally in the second more detailed embodiment, the treated contact surface has a protein recovery percentage at 24 hours greater than the protein recovery percentage of the unconditioned and unconverted surface for Bovine Serum Albumin having an atomic mass of 66,000 Daltons (BSA)

on Eppendorf LoBind© 96-well round bottom plates, following the protocol in the present specification. Eppendorf LoBind© plates are sold by Eppendorf LoBind AG, Hamburg, Germany.

Optionally in the second more detailed embodiment, the treated contact surface has a protein recovery percentage at 24 hours on Eppendorf LoBind© 96-well round bottom plates greater than 95% for BSA, following the protocol in the present specification.

Optionally in the second more detailed embodiment, the treated contact surface has a protein recovery percentage at 24 hours greater than the protein recovery percentage of the unconditioned and unconverted surface for Fibrinogen having an atomic mass of 340,000 Daltons (FBG) on Eppendorf LoBind© 96-well round bottom plates, following the protocol in the present specification.

Optionally in the second more detailed embodiment, the treated contact surface has a protein recovery percentage at 24 hours on Eppendorf LoBind© 96-well round bottom plates greater than 72% for FBG, following the protocol in the present specification.

Optionally in the second more detailed embodiment, the treated contact surface has a protein recovery percentage at 24 hours on Eppendorf LoBind© 96-well round bottom plates greater than the protein recovery percentage of the unconditioned and unconverted surface for Transferrin having an atomic mass of 80,000 Daltons (TFN), following the protocol in the present specification.

Optionally in the second more detailed embodiment, the treated contact surface has a protein recovery percentage at 24 hours on Eppendorf LoBind© 96-well round bottom plates greater than 69% for TFN, following the protocol in the present specification.

Optionally in the second more detailed embodiment, the treated contact surface has a protein recovery percentage at 24 hours on Eppendorf LoBind© 96-well round bottom plates greater than the protein recovery percentage of the unconditioned and unconverted surface for Protein A having an atomic mass of 45,000 Daltons (PrA), following the protocol in the present specification.

Optionally in the second more detailed embodiment, the treated contact surface has a protein recovery percentage at 24 hours on Eppendorf LoBind© 96-well round bottom plates greater than the protein recovery percentage of the unconditioned and unconverted surface for Protein G having an atomic mass of 20,000 Daltons (PrG), following the protocol in the present specification.

Optionally in the second more detailed embodiment, the treated contact surface has a protein recovery percentage at 24 hours on Eppendorf LoBind© 96-well round bottom plates greater than 96% for PrG, following the protocol in the present specification.

Optionally in the second more detailed embodiment, the treated contact surface has a protein recovery percentage at 24 hours greater than the protein recovery percentage of the unconditioned and unconverted surface for Bovine Serum Albumin having an atomic mass of 66,000 Daltons (BSA) on GRIENER® 96-well round bottom plates, following the protocol in the present specification. GRIENER® plates are sold by Greiner Holding AG of Austria.

Optionally in the second more detailed embodiment, the treated contact surface has a protein recovery percentage at 24 hours on GRIENER® 96-well round bottom plates greater than 60%, optionally up to 86%, for BSA, following the protocol in the present specification.

Optionally in the second more detailed embodiment, the treated contact surface has a protein recovery percentage at 24 hours greater than the protein recovery percentage of the unconditioned and unconverted surface for Fibrinogen having an atomic mass of 340,000 Daltons (FBG) on GRIENER® 96-well round bottom plates, following the protocol in the present specification.

Optionally in the second more detailed embodiment, the treated contact surface has a protein recovery percentage at 24 hours on GRIENER® 96-well round bottom plates greater than 50%, optionally up to 65%, for FBG, following the protocol in the present specification.

Optionally in the second more detailed embodiment, the treated contact surface has a protein recovery percentage at 24 hours on GRIENER® 96-well round bottom plates greater than the protein recovery percentage of the unconditioned and unconverted surface for Transferrin having an atomic mass of 80,000 Daltons (TFN), following the protocol in the present specification.

Optionally in the second more detailed embodiment, the treated contact surface has a protein recovery percentage at 24 hours on GRIENER® 96-well round bottom plates greater than 50%, optionally up to 60%, for TFN, following the protocol in the present specification.

Optionally in the second more detailed embodiment, the treated contact surface has a protein recovery percentage at 24 hours on GRIENER® 96-well round bottom plates greater than the protein recovery percentage of the unconditioned and unconverted surface for Protein A having an atomic mass of 45,000 Daltons (PrA), following the protocol in the present specification.

Optionally in the second more detailed embodiment, the treated contact surface has a protein recovery percentage at 24 hours on GRIENER® 96-well round bottom plates greater than 25%, optionally up to 56%, for PrA, following the protocol in the present specification.

Optionally in the second more detailed embodiment, the treated contact surface has a protein recovery percentage at 24 hours on GRIENER® 96-well round bottom plates greater than the protein recovery percentage of the unconditioned and unconverted surface for Protein G having an atomic mass of 20,000 Daltons (PrG), following the protocol in the present specification.

Optionally in the second more detailed embodiment, the treated contact surface has a protein recovery percentage at 24 hours on GRIENER® 96-well round bottom plates greater than 60%, optionally up to 75%, for PrG, following the protocol in the present specification.

Working Example 21

The following is a description and working example of the process of the second more detailed embodiment:

The process of the second more detailed embodiment was applied to 96-well polypropylene microplates manufactured by NUNC®.

The following steps of the second more detailed embodiment were applied to the parts:

As received plates were contacted according to the second more detailed embodiment by being sprayed with tap water (de-ionized or other waters could be used, as could any polar solvent), referred to here as a polar liquid treatment agent, and allowed to stand for 1 second to 30 minutes, providing a polar-treated contact surface.

The parts were then blown off with ionized air according to the second more detailed embodiment, which is referred to here as contacting the polar-treated contact surface with ionized gas at a pressure of 50 psi. Optionally, a gas (nitrogen, argon or any other compressed gas) could be used in place or in addition to the air. The water content of the gas (being used to blow off the parts) can be 0-100%. The parts were blown off for approximately 10 seconds although a time from 1-300 seconds could be used.

The parts were then loaded onto a carrier for the next step of the second more detailed embodiment. A holding time from 1-300 seconds before loading or once loaded (For a total of 1-600 seconds) can be used.

The parts were then loaded into a plasma chamber for treating the ionized-pressurized-gas-treated contact surface with conditioning plasma according to the second more detailed embodiment. It is theorized, without limiting the invention according to the scope or accuracy of this theory, that the conditioning plasma of the second more detailed embodiment cleans non-polymer additives from the surface of the microplates and/or creates a hydrophilic, nanotextured surface, also known as a nanostructure of peaks and recesses, amenable to surface functionalization. According to this theory, the nanostructure would facilitate hydrophilization of the "peaks" while sterically preventing comparatively large proteins from accessing any hydrophobic recesses. Further according to this theory, plasma conditioning, also known as activation, might be better accomplished utilizing an amine (radical) function during the conditioning step, which can be a "handle" or attachment point further built upon or modified in the treatment step, versus a hydroxyl (radical) function or methyl/methylene radicals, when considering the relative stability of the radicals generated (an amine radical is more stable, for example, than a hydroxyl radical, and easier to form than a methyl radical).

Figure 10:
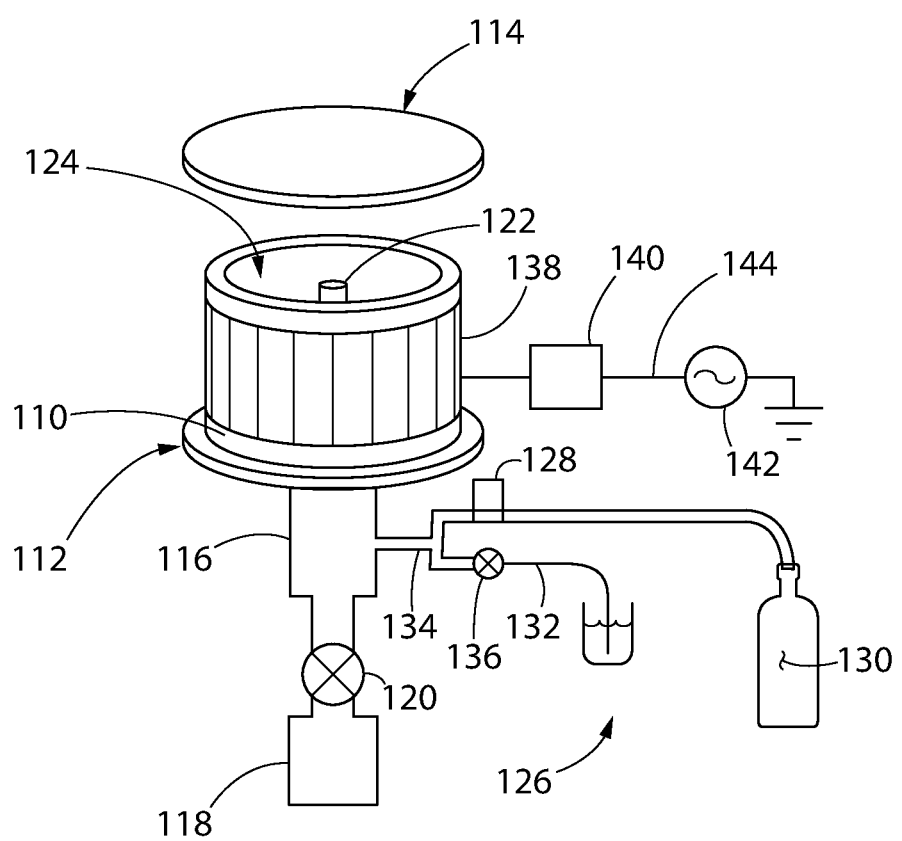
FIG. 10 shows an exemplary reactor configuration for carrying out either the first embodiment or the second embodiment of the present process. Another suitable reactor configuration is that of FIG. 2 as shown and described in U.S. Pat. No. 7,985,188, incorporated here by reference.

An exemplary plasma treatment chamber of the second more detailed embodiment, used in the present example, had the configuration shown in FIG. 10. (optional chambers can be used as well—see below):

Referring to FIG. 10 of the second more detailed embodiment, a cylindrical ceramic chamber 110 is shown, with an aluminum bottom 112 and an aluminum lid 114 (which was closed during use, but shown open in FIG. 10, as it would be when loading or unloading). The chamber 110 was approximately 12 inches (30 cm) in diameter and 8 inches (20 cm) deep. The pumping port of the chamber feeding the vacuum conduit 116 to the vacuum pump 118, controlled by a valve 20, was at the bottom (in the aluminum bottom 112) and was approximately 4 inches (10 cm) in diameter, with the ½-inch (12 mm) diameter gas inlet 122 concentrically protruding through the pumping port into the processing area 124. A plasma screen (not shown) was installed in over the pumping port and was constructed from copper screen and steel wool. Gas was fed to the gas inlet 122 via a gas system 126 under the chamber 10. Mass flow controllers such as 128 were used for the compressed gas (e.g. from the source 130) and a capillary 132 (0.006 inches (0.15 mm) internal ID), that was 36 inches (90 cm) long, controlled the feed rate of water into the manifold 134, via a shut-off valve 136. The ceramic chamber 110 had a copper electrode 138 that was concentrically wrapped around the outside and was approximately 7 inches (18 cm) tall. The electrode 138 was connected to a COMDEL® matching network 140 that allowed the 50-ohm output of the COMDEL® 1000-watt RF (13.56 MHz) power supply 42 to be matched for optimal power coupling (low reflected power). COMDEL® equipment is sold by Comdel, Inc., Gloucester, Massachusetts, USA. The power supply 142 was attached to the COMDEL® matching network 40 via a standard coaxial cable 144. Two capacitance manometers (0-1 Torr and 0-100 Torr) (not shown) were attached to the vacuum conduit 116 (also referred to as a pump line) to measure the process pressures.

The process of the second more detailed embodiment can occur in a wide range of plasma processing chambers including through the use of atmospheric plasma(s) or jets. The parts can be processed in batch (as described above) of 1-1000 parts or processed in a semi-continuous operation with load-locks. In the case of atmospheric processing, no chamber would be required. Optionally, single parts can be processed as described in FIG. 2 and the accompanying description in U.S. Pat. No. 7,985,188.

Once loaded for treating the ionized-pressurized-gas-treated contact surface with conditioning plasma of the second more detailed embodiment, the pressure inside of the chamber was reduced to 50 mTorr. Base pressures to $10^{-6}$ Torr or as high as 100 Torr are also acceptable. Once the base pressure was reached, nitrogen gas (99.9% pure, although purities as high as 99.999% or as low as 95% can also be used) at 30 sccm (standard cubic centimeters per minute) was admitted to the chamber, achieving a processing pressure of 40 mTorr (pressures as low as 1 mTorr or as high as 10 Torr can also be used). Plasma was then ignited using 600 watts at a frequency of 13.56 MHz for 90-180 seconds, although processing times from 1-300 seconds will work. Frequencies from 1 Hz to 10 GHz are also possible. After the processing time was complete the plasma was turned off and the gas evacuated (although this is not a requirement) back to the base pressure. This conditioning plasma treatment of the second more detailed embodiment produced a conditioned contact surface on the microplates.

Next, the conditioned contact surface was treated with conversion plasma of the second more detailed embodiment, in the same apparatus, although other apparatus may instead be used.

It is theorized as one mechanism of action of the second more detailed embodiment, without limiting the invention according to the scope or accuracy of this theory, that the conversion plasma provides further functionalization (hydrophilic "extenders") of the hydrophilized sites or "handles" resulting from the conditioning plasma treatment. According to this theory, this extension function may be accomplished by established (1) polyethylene oxide condensation (PEGylation) methods or (2) betaine/zwitterion (internal ion pair) methods via plasma activation of the surface "handle" (functional group from the conditioning plasma treatment) and/or the hydrophilic extender species. According to this theory, the "extenders" referred to here are the components of the conversion plasma. According to this theory, the recombination of the surface "handle" and "extender" species to form larger hydrophilic species on the treated contact surface provides a hydrophilic sterically stabilized surface, providing inhibiting protein surface binding via hydrosteric repulsion. According to this theory, cyclic esters (lactones) or cyclic sulfoesters (sultones) could be utilized to generate betaine or sulfobetaine species on the treated contact surface.

The conversion plasma was applied as follows according to the second more detailed embodiment. The chamber was evacuated (or remained evacuated), and water vapor was flowed into the chamber through a 0.006 inch (0.15 mm) diameter capillary (36 inches (91 cm) long) at an approximate flow of 30 sccm resulting in a processing pressure between 26 and 70 mTorr (milliTorr). The flow of water vapor can range from 1-100 sccm and pressures from 1 mTorr to 100 Torr are also possible. Plasma was then ignited at 600 watts and sustained for 90-180 seconds although processing times from 1-300 seconds will work. The plasma was then turned off, the vacuum pump valves closed and then the chamber vented back to atmosphere. A treated contact surface was formed as a result. Room air was used to vent the chamber although nitrogen could be used. Optionally, water vapor or other polar solvent containing material could be used.

Once the chamber of the second more detailed embodiment was vented, the lid was removed and the carrier removed. The parts were then unloaded. The parts are ready to use at that point, or they can be packaged in plastic bags, aluminum foil or other packaging for storage and shipment.

The resulting surface (from the above treatment of the second more detailed embodiment) provided a significant reduction in protein adhesion. The results are shown in Tables 21-24.

Similar processing of the second more detailed embodiment can be used to process a wide variety of other articles. These include: labware, for example a contact surface of a microplate, a centrifuge tube, a pipette tip, a well plate, a microwell plate, an ELISA plate, a microtiter plate, the illustrated 96-well plate, a 384-well plate; vessels, for example a vial, a bottle, a jar, a syringe, a cartridge, a blister package, an ampoule, an evacuated blood collection tube, a specimen tube, a centrifuge tube, or a chromatography vial; or medical devices having surfaces that come in contact with blood and other body fluids or pharmaceutical preparations containing proteins, such as catheters, stents, heart valve, electrical leads, pacemakers, insulin pumps, surgical supplies, heart-lung machines, contact lenses, etc.

Optional Processes of the Second More Detailed Embodiment

Water can be applied to the part (via a mist or high humidity cabinet of the second more detailed embodiment) as described above then:

Blowing part/product off with ionized air as described above of the second more detailed embodiment then:

A pre-treatment of the second more detailed embodiment at reduced pressure utilizing a plasma (ionized gas) comprising Nitrogen, then a final treatment of one of the following:

i. Methane and air ii. Methane and nitrogen iii. Methane and water iv. Any combination of the above v. Any other hydrocarbon gas vi. Silane and nitrogen vii. Silane and water viii. Any organosilicon in place of the silane

TABLE 21 of the second more detailed embodiment:
Results
(See notes at the end of this section for definitions of each column)
RECOVERY @ 24 hrs in %

| Treatment | Plate | BSA | FBG | TFN | PrA | PrG |
|---|---|---|---|---|---|---|
| U/C | Nunc | 0 | 6 | 55 | 3 | 4 |
| N | Nunc | 73 | 31 | 51 | 9 | 12 |
| H | Nunc | 78 | 21 | 54 | 22 | 25 |
| I/+/H | Nunc | 82 | 42 | 60 | 78 | 89 |
| U/C | Epp | 93 | 62 | 68 | 85 | 96 |
| N | Epp | 107 | 72 | 67 | 82 | 103 |
| Lipidure | Nunc | 71 | 76 | 65 | 80 | 88 |
| ns3 12/14 | Nunc | 101 | 84 | 70 | 64 | 85 |

TABLE 22 of the second more detailed embodiment:

NUNC 96 well round bottom plates

| Condition | Spray | W/D | Ionize | N time | H time | Power | BSA | FBG | PrA | PrG | TFN |
|---|---|---|---|---|---|---|---|---|---|---|---|
| 5 | Y | W | Y | 90 | 180 | Std | 99 | 84 | 67 | 90 | 65 |
| 2 | N |  | Y | 180 | 180 | Std | 101 | 84 | 64 | 85 | 70 |
| 4 | Y | D | Y | 90 | 180 | Std | 103 | 77 | 65 | 79 | 68 |
| 3 | Y | D | Y | 180 | 180 | Std | 91 | 74 | 61 | 76 | 65 |
| 7 | Y | D | Y | 90 | 180 | 50% | 90 | 69 | 57 | 73 | 62 |
| 6 | N |  | Y | 90 | 180 | 50% | 89 | 65 | 56 | 73 | 65 |
| 1 | Y | W | Y | 180 | 180 | Std | 95 | 58 | 54 | 72 | 65 |

TABLE 23 of the second more detailed embodiment

Griener 96 well round bottom plates

| Condition | Spray | W/D | Ionize | N time | H time | Power | BSA | FBG | PrA | PrG | TFN |
|---|---|---|---|---|---|---|---|---|---|---|---|
| 4 | Y | D | Y | 90 | 180 | Std | 86 | 54 | 56 | 69 | 57 |
| 6 | N |  | Y | 90 | 180 | 50% | 81 | 56 | 48 | 75 | 60 |
| 3 | Y | D | Y | 180 | 180 | Std | 76 | 64 | 38 | 73 | 57 |
| 5 | Y | W | Y | 90 | 180 | Std | 86 | 65 | 34 | 61 | 58 |
| 7 | Y | D | Y | 90 | 180 | 50% | 83 | 54 | 35 | 64 | 56 |

TABLE 23-continued of the second more detailed embodiment

Griener 96 well round bottom plates

| Condition | Spray | W/D | Ionize | N time | H time | Power | BSA | FBG | PrA | PrG | TFN |
|---|---|---|---|---|---|---|---|---|---|---|---|
| 1 | Y | W | Y | 180 | 180 | Std | 77 | 65 | 27 | 63 | 54 |
| 2 | N |   | Y | 180 | 180 | Std | 71 | 57 | 34 | 68 | 55 |

TABLE 24 of the second more detailed embodiment vs. Sample 1, same base material

| SAMPLE | Base Material | $SiO_x$? | $SiO_xC_yH_2$? | conversion plasma Treatment? | XPS: —OH content | SIMS: —OH content | Contact Angle |
|---|---|---|---|---|---|---|---|
| 1 | COC | no | no | no | = | = | = |
| 1 | COP | no | no | no | = | = | = |
| 2 | COC | yes | yes | no | na | na | > |
| 2 | COP | yes | yes | no | na | na | > |
| 3 | COC | yes | yes | yes | > | > | < |
| 3 | COP | yes | yes | yes | > | > | < |
| 4 | COC | no | no | yes | > | > | < |
| 4 | COP | no | no | yes | > | > | < |

NOTES to Tables of the Second More Detailed Embodiment

Treatment—This indicates if the plates were treated with the process of the second more detailed embodiment described herein (ns3, N—nitrogen plasma only (treating the ionized-pressurized-gas-treated contact surface with conditioning plasma), H—water plasma only (treating the conditioned contact surface with conversion plasma comprising: water, a volatile, polar, organic compound, a $C_1$-$C_{12}$ hydrocarbon and oxygen, a hydrocarbon and nitrogen, a silicon-containing gas, or a combination of two or more of these, forming a treated contact surface), 1/+/H—ionize, nitrogen plasma and water plasma, i.e. contacting the polar-treated contact surface with ionized gas; treating the ionized-pressurized-gas-treated contact surface with conditioning plasma, forming a conditioned contact surface; and treating the conditioned contact surface with conversion plasma), U/C—uncoated or treated, these were the as-received plates, Lipidure—this is a commercially available liquid applied and cured chemistry Plate—NUNC®—Epp is short for Eppendorf LoBind® a plastic manufacturer Spray—indicates plates were "misted" or sprayed with water before coating of the second more detailed embodiment. This was an example of contacting the surface with a polar liquid treatment agent comprising: water, a volatile, polar, organic compound, or a combination of any two or more of these, forming a polar-treated contact surface.

W/D indicates if the plates were sprayed and then immediately blown off with ionized air (W) or if they were left for 1-20 minutes and then blown off with ionized air (D) (contacting the polar-treated contact surface with ionized gas), in either event of the second more detailed embodiment.

N—time=nitrogen gas treatment time in seconds.
H—time=water gas treatment time in seconds
Power—Standard was 600 watts applied RF power, 50% was 300 watts.

BSA, FBG, PrA, PrG, TFN were all the proteins used in the study.

Testing for Hydroxyl Content of the Second More Detailed Embodiment

The treated contact surface made by each described process, for example a 96-well microplate well surface, is analyzed by XPS, SIMS, and contact angle with water, compared to the unconditioned and unconverted surface, to determine differences resulting from the present treatments. The following results are contemplated.

XPS Analysis of the Second More Detailed Embodiment

X-ray photoelectron spectroscopy (XPS) is used to characterize the atomic composition of the treated contact surface of the second more detailed embodiment, before any or all of the presently contemplated polar liquid, ionized gas, conditioning plasma, or conversion plasma treatments, versus after the conversion plasma treatment of the second more detailed embodiment.

XPS data of the second more detailed embodiment is quantified using relative sensitivity factors and a model that assumes a surface having a different composition than the bulk material just below the surface, since the present treatments are believed to modify underlying structure at the surface rather than coating it or modifying the bulk material. The analysis volume is the product of the analysis area (spot size or aperture size) and the depth of information. Photoelectrons are generated within the X-ray penetration depth (typically many microns), but only the photoelectrons within the top escape depth or depths are detected.

The XPS instrument of the first more detailed embodiment and the second more detailed embodiment is a PHI™ Quantum 2000 XPS system, sold by Physical Electronics, Inc., Eden Prairie, Minnesota, USA. The PHI™ XPS uses as the X-ray source Monochromated Alkα 1486.6 eV x-ray energy. Values given were normalized to 100 percent using the elements detected. Detection limits were approximately 0.05 to 0.1 atomic percent.

XPS does not measure or detect hydrogen, but does detect and measure oxygen, silicon, nitrogen, and carbon. Consequently, when using XPS in search of an increase in surface hydroxyl concentration, the artifact searched for is an increase in oxygen at the surface of the article, compared to the oxygen level of the unconditioned and unconverted surface and/or the oxygen level beneath the treated contact surface.

XPS analysis is used of the second more detailed embodiment to determine whether treatments using any of the present polar liquid treatment agents, ionized gas, conditioning plasma, and/or conversion plasma treatment steps, or the cumulative result of these treatments, causes an increase in oxygen concentration at the treated contact surface. It is contemplated that, at the conclusion of the conversion plasma treatment, the level of oxygen detected at the treated contact surface is greater than the level of oxygen beneath the treated contact surface, and also greater than the level of oxygen detected at a corresponding surface before any treatment with a polar liquid, ionized gas, conditioning plasma, or conversion plasma.

SIMS Analysis

Secondary-ion mass spectrometry (SIMS) of the present treated and unconditioned and unconverted samples is contemplated of the second more detailed embodiment. SIMS is used to analyze the composition of solid surfaces and thin films. In SIMS, the treated and unconditioned and unconverted surfaces are addressed by directing a focused ion beam, which may have various compositions, against each surface, which ejects secondary ions from the surface materials. The mass/charge ratios of the secondary ions are measured with a mass spectrometer to determine the chemical composition of the surface to a depth of 1 to 2 nm (nanometers). Since oxygen and hydroxyl groups are being sought, it is contemplated that the ion beam will not be an oxygen beam, which would interfere with detection. The ion beam can, for example, be a cesium ion beam which is readily distinguishable from all constituents of the unconditioned and unconverted and treated contact surface and the bulk sample. It is contemplated that the result of SIMS analysis of the second more detailed embodiment will be an increase in the total of oxygen, hydroxyl, and oxygen-containing moieties detected from the treated contact surface, versus the unconditioned and unconverted surface.

Contact Angle Analysis

A contact angle analysis can be done on the treated contact surface versus an unconditioned and unconverted surface of the second more detailed embodiment, to determine the effect of the present treatments.

The analysis instrument for the contact angle tests of the second more detailed embodiment is the Contact Angle Meter model DM-701, made by Kyowa Interface Science Co., Ltd. (Tokyo, Japan). To obtain the contact angle, five water droplets are deposited on the inside surface of small pieces obtained from each specimen. The testing conditions and parameters are summarized below. The best representative pieces for each specimen are selected for testing. A drop size of 1 µL (one microliter) is used for all samples. Due to the curvature of the specimens, a curvature correction routine is used to accurately measure the contact angle.

Contact Angle Testing Conditions and Parameters of the Second More Detailed Embodiment Test instrument—DM-701 Contact Angle Meter
Liquid Dispenser—22 gauge stainless steel needle
Drop Size—µL (one microliter)
Test liquid—Distilled water
Environment—Ambient air, room temperature (about 25° C.)

Results of the Second More Detailed Embodiment

The specimen made from COP plus $SiO_xC_yH_z$ pH protective coating of the second more detailed embodiment as described in this specification has the highest average contact angle of all tested specimens. The average contact angle for specimens made from COP plus pH protective coating is 99.1° (degrees). The average contact angle for the uncoated COP specimen is 90.5°. The glass specimen has a significantly lower average contact angle at 10.6°. This data shows that the pH protective coating raises the contact angle of the uncoated COP vessel. It is expected that an SiOx coated vessel without the passivation layer or pH protective coating would exhibit a result similar to glass, which shows a hydrophilic coating relative to the relative to the passivation layer or pH protective coating.

The present conversion plasma treatment of the second more detailed embodiment is expected to lower the contact angle of the substrate substantially, whether applied directly to the COP substrate or to an $SiO_xC_yH_z$ (pH protective coating or layer) surface. Contact angles of 0° to 90°, optionally from 20° to 80°, optionally from 40° to 80°, optionally from 50° to 70°, optionally from 55° to 65° optionally from 5° to 90°, optionally from 10° to 70°, optionally from 10° to 400 are contemplated to be achievable using the present conversion plasma treatment, optionally with other treatments, on a surface.

Example 22—Vials with pH Protective Coating or Layer of the Second More Detailed Embodiment A cyclic olefin copolymer (COC) resin is injection molded to form a batch of 5 ml COC vials. A cyclic olefin polymer (COP) resin is injection molded to form a batch of 5 ml COP vials. XPS, SIMS, and contact angle tests are performed on the COC and COP vials, as made. These vials are referred to below as Sample 1 vials.

Samples of the respective COC and COP vials are coated by identical processes, of the second more detailed embodiment as described in this example. The COP and COC vials are coated with a two layer coating by plasma enhanced chemical vapor deposition (PECVD). The first layer is composed of SiOx with oxygen and solute barrier properties, and the second layer is an $SiO_xC_yH_z$ pH protective coating or layer. (Optionally, other deposition processes than PECVD (plasma-enhanced chemical vapor deposition), such as non-plasma CVD (chemical vapor deposition), physical vapor deposition (in which a vapor is condensed on a surface without changing its chemical constitution), sputtering, atmospheric pressure deposition, and the like can be used, without limitation).

To form the $SiO_xC_yH_z$ pH protective coating or layer of the second more detailed embodiment, a precursor gas mixture comprising OMCTS, argon, and oxygen is introduced inside each vial. The gas inside the vial is excited between capacitively coupled electrodes by a radio-frequency (13.56 MHz) power source. The preparation of these COC vials and the corresponding preparation of these COP vials, is further described in Example DD and related disclosure of US Publ. Appl. 2015-0021339 A1. XPS, SIMS, and contact angle tests are performed on the resulting $SiO_xC_yH_z$ pH protective coating or layer surfaces of the COC and COP vials. These vials are referred to below as Sample 2 vials.

The interiors of the COC and COP vials are then further treated with conditioning plasma of the second more detailed embodiment, using nitrogen gas as the sole feed, followed by conversion plasma of the second more detailed embodiment, using water vapor as the sole feed, both as described in this specification, to provide vials having treated interior surfaces. XPS, SIMS, and contact angle tests are performed on the resulting treated interior surfaces of the COC and COP vials. These vials are referred to below as Sample 3 vials.

Vials identical to the Sample 1 vials, without SiOx or SiO$_x$C$_y$H$_z$ coatings, are also directly treated with conditioning plasma of the second more detailed embodiment, using nitrogen gas as the sole feed, followed by a conversion plasma of the second more detailed embodiment, using water vapor as the sole feed, both as described in this specification, to provide vials having treated interior surfaces. These vials are referred to below as Sample 4 vials.

The respective vials and expected test results of the second more detailed embodiment are summarized in Table 23 of the second more detailed embodiment. In Table 16 of the second more detailed embodiment, "=" means equal to Sample 1 on the same substrate (COC or COP), "<" means less than Sample 1 on the same substrate, and ">" means greater than Sample 1 on the same substrate.

Example 23 of the First More Detailed Embodiment

In this experiment, six types of 96-well microplates were plasma treated, then subjected to X-ray photoelectron spectroscopy (XPS) analysis to determine the properties of the treated surfaces, in particular to demonstrate qualitatively and quantitatively the introduction of grafted moieties to the polymer.

The six types of 96-well microplates are: the untreated polypropylene Porvair microplates and microplates treated with one of the methods of plasma treatments 1-5 below according to the first more detailed embodiment. The detailed plasma treating procedures are shown below and the variables are shown in Table 25.

Plasma Treatment 1 (i.e. O2 and Water Two Step Treatment):

After the microplates were loaded into a fixture located inside a vacuum chamber, the vacuum chamber lid was closed. The vacuum was activated, and the chamber was sealed while atmospheric gases were removed from within the chamber. Plasma activation was delayed for 30 seconds to allow for the evacuation of atmospheric gases and the infiltration of oxygen gas to occur. The chamber pressure was stabilized during this 30 second time period. An oxygen plasma was activated within the vacuum chamber. The oxygen plasma was deactivated after a duration of 300 seconds. The chamber was released from vacuum and the lid was opened. The microplates were removed from the fixture located inside the chamber.

After a 30 second duration, oxygen was evacuated from the chamber, and water vapor was introduced into the chamber at a flow rate of 10 sccm. A water plasma was activated within the chamber. The water plasma was deactivated after a duration of 180 seconds. The chamber was released from vacuum. The chamber lid was opened. The microplates were removed from the fixture located inside the chamber.

Plasma Treatment 2 (i.e. O2/Water Mixture Treating in One Step):

After the microplates were loaded into a fixture located inside a vacuum chamber, the vacuum chamber lid was closed. Then the vacuum was activated after the chamber was sealed while atmospheric gases were removed from within the chamber. Plasma activation was delayed for 30 seconds to allow for the evacuation of atmospheric gases and the infiltration of oxygen gas and water vapor to occur. The oxygen was flowed at a rate of 95 sccm. The water vapor was flowed at a rate of 10 sccm. The chamber pressure was stabilized during this 30 second time period. Then an oxygen-water plasma was activated within the vacuum chamber. The oxygen-water plasma was deactivated after a duration of 300 seconds. After the completion of the treatment, the chamber was released from vacuum and the chamber lid was opened. The microplates are removed from the fixture located inside the chamber.

Plasma Treatment 3 (i.e. O2 Treatment Only):

After the microplates were loaded into a fixture located inside a vacuum chamber, the vacuum chamber lid was closed. The vacuum was activated after the chamber was sealed and atmospheric gases were removed from within the chamber. Plasma activation was delayed for 30 seconds to allow for the evacuation of atmospheric gases and the infiltration of oxygen gas to occur. The oxygen was flowed at a rate of 95 sccm. The chamber pressure was stabilized during this 30 second time period. Oxygen plasma was activated within the vacuum chamber. The oxygen plasma was deactivated after a duration of 300 seconds. After the completion of the treatment, the chamber was released from vacuum and the chamber lid was opened. The microplates were removed from the fixture located inside the chamber.

Plasma Treatment 4 (i.e. Water Treatment Only):

After the microplates were loaded into a fixture located inside a vacuum chamber, the vacuum chamber lid was closed. The vacuum was activated after the chamber was sealed while the atmospheric gases were removed from within the chamber. Plasma activation was delayed for 30 seconds to allow for the evacuation of atmospheric gases and the infiltration of water vapor to occur. The water vapor was flowed at a rate of 10 sccm. The chamber pressure was stabilized during this 30 second time period. A water plasma was activated within the vacuum chamber. The water plasma was deactivated after a duration of 180 seconds. After the completion of the treatment, the chamber was released from vacuum and the chamber lid was opened. The microplates are removed from the fixture located inside the chamber.

Plasma Treatment 5 (i.e. Air Treatment Only):

After the microplates were loaded into a fixture located inside a vacuum chamber, the vacuum chamber lid was closed. The vacuum was activated after the chamber was sealed while the atmospheric gases were removed from within the chamber. Plasma activation was delayed for 30 seconds to allow for the evacuation of unregulated atmospheric gases and the infiltration of regulated atmospheric gases. The atmospheric gases were flowed at a rate of 100 sccm. The chamber pressure was stabilized during this 30 second time period. Atmospheric plasma was activated within the vacuum chamber. The atmospheric plasma was deactivated after a duration of 300 seconds. After the completion of the treatment, the chamber was released from vacuum and the chamber lid was opened. The microplates were removed from the fixture located inside the chamber.

TABLE 25

| Microplate | Air Flowrate (sccm) | O2 Flowrate (sccm) | Water vapor Flowrate (sccm) | Power (W) | Plasma Time (sec) |
|---|---|---|---|---|---|
| Untreated | N/A | N/A | N/A | N/A | N/A |
| Plasma Treatment 1 | 0 | 95 | 10 | 225 | 300/180 |
| Plasma Treatment 2 | 0 | 95/10 | | 225 | 300 |
| Plasma Treatment 3 | 0 | 95 | 0 | 225 | 300 |

TABLE 25-continued

| Microplate | Air Flowrate (sccm) | O2 Flowrate (sccm) | Water vapor Flowrate (sccm) | Power (W) | Plasma Time (sec) |
|---|---|---|---|---|---|
| Plasma Treatment 4 | 0 | 0 | 10 | 225 | 300 |
| Plasma Treatment 5 | 100 | 0 | 0 | 225 | 300 |

XPS was carried out in the same way as described in Example 18. The XPS results for the six types of microplates are shown in Table 26 and Table 27. Table 26 shows the atomic parentage of grafted atoms such as O, N etc. Table 27 shows the atomic parentage of grafted carbon as reported in Table 26 assigned to specific carbon-containing species such as C—O, C═O and O—C═O which are all hydrogen bond acceptor groups, as well as the atomic parentage of carbon as reported in Table 26 involved in carbon-carbon or hydrogen-carbon bonding ("C—(C,H)"), consisting essentially of carbon remaining in the form of polypropylene. The sum of all carbon-containing species in Table 27 varies slightly from the atomic parentage of carbon reported in Table 26 in at least some instances due to normal experimental error.

TABLE 26

| Microplate | C | N | O | Si |
|---|---|---|---|---|
| Untreated | 99.9 | 0 | 0.1 | 0 |
| Plasma Treatment 1 | 91.1 | 0 | 8.9 | 0 |
| Plasma Treatment 2 | 94.2 | 0 | 5.8 | 0 |
| Plasma Treatment 3 | 93.6 | 0 | 6.4 | 0 |
| Plasma Treatment 4 | 95.4 | 0 | 4.6 | 0 |
| Plasma Treatment 5 | 96.2 | 0 | 3.8 | 0 |

TABLE 27

| Microplate | C—(C, H) | C—O | C═O | O—C═O |
|---|---|---|---|---|
| Untreated | 100 | 0 | 0 | 0 |
| Plasma Treatment 1 | 78.3 | 8.8 | 2.8 | 1.6 |
| Plasma Treatment 2 | 83.5 | 8.8 | 1.5 | 0.5 |
| Plasma Treatment 3 | 82.9 | 8.4 | 1.7 | 0.9 |
| Plasma Treatment 4 | 87.0 | 7.1 | 1.4 | 0.1 |
| Plasma Treatment 5 | 90.3 | 5.4 | 0.7 | 0 |

The six types of microplates were also tested for protein recovery to determine the relation of protein binding properties and the surface features. The testing procedures are described in "Testing of all embodiments". Recovery percentage of the six types of microplates for five proteins (i.e. BSA, FBG, PrA, PrG and TFN) at 1.5 nM after 24 hours contacting with the surfaces are shown in Table 28. The results show that introduction of grafted O atom and "C—O", "C═O" and "O—C═O" species which are hydrogen bond receptor groups lower protein binding (i.e. increase protein recovery). For example, Plasma treatment 1 introduces the highest amount of grafted O atoms and the surface treated with it has the highest protein recovery percentage.

TABLE 28

| Microplate | BSA | FBG | PrA | PrG | TFN |
|---|---|---|---|---|---|
| Untreated | 6 | 9 | 1 | 1 | 1 |
| Plasma Treatment 1 | 89 | 18 | 88 | 93 | 50 |
| Plasma Treatment 2 | 81 | 12 | 68 | 83 | 49 |
| Plasma Treatment 3 | 82 | 12 | 68 | 83 | 49 |
| Plasma Treatment 4 | Not reported | 7 | 5 | Not reported | Not reported |
| Plasma Treatment 5 | 10 | 7 | 6 | Not reported | Not reported |

Example 24—Barrier and pH Protective Coating

In this experiment, three types of 96-well microplates were subjected to X-ray photoelectron spectroscopy (XPS) analysis to determine the properties of the treated surface. The three types of microplates are the untreated polypropylene (UTPP) Porvair microplates, microplates with barrier coating as the liquid contacting surface, microplates with pH protective coating as the liquid contacting surface. The process of applying barrier coating and pH protective coating is described in the specification. XPS was carried out in the same way as described in Example 14. The XPS results for the three types of microplates are shown in Table 29. Table 29 shows the atomic percentage of C, N, O and Si for the surface.

TABLE 29

| Microplates | C | N | O | Si |
|---|---|---|---|---|
| UTPP | 99.9 | 0 | 0.1 | 0 |
| Barrier | 0 | 0 | 40 | 20 |
| pH Protective | 38.6 | 0 | 34.7 | 26.7 |

The three types of microplates are also tested for protein recovery. The testing procedures are described in "Testing of all embodiments". Recovery percentage of the three types of microplates for five proteins (i.e. BSA, FBG, PrA, PrG and TFN) at 1.5 nM after 24 hours contacting with the surfaces are shown in Table 30. The results show that the barrier coated surfaces reduce protein binding compared to untreated propylene surface.

TABLE 30

| Microplate | BSA | FBG | PrA | PrG | TFN |
|---|---|---|---|---|---|
| Untreated | 6 | 9 | 1 | 1 | 1 |
| Barrier | 13 | 8 | 3 | 2 | 27 |

Prophetic Example 25

In addition, other contemplated PECVD coated contact surfaces that provide resistance to protein binding use gas precursors include surfaces coated by PECVD of siloxane, organosiloxane or polyethylene glycol (PEG) precursors, so that the coating defines a contact surface. An example of such a PECVD coated surface is a barrier coating or layer as described in this specification.

Prophetic Example 26

An alternative method contemplated for forming the present contact surfaces comprising:
- from 1 to 30 atomic %, optionally from 5 to 20 atomic %, optionally from 5 to 10 atomic %, grafted oxygen atoms,
- from 0 to 30 atomic %, optionally from 0 to 20 atomic %, optionally from 0 to 10 atomic %, grafted nitrogen atoms, and
- from 80 to 95 atomic %, optionally from 90 to 95 atomic %, carbon atoms which provide resistance to protein binding is application of an amorphous carbon coating by PECVD, using as the monomer gas a precursor such as acetylene, ethylene, methane, propane, butane, ethane, or a combination of two or more of these; further employing with the precursor, either in combination or as a subsequent PECVD process step, a co-monomer gas such air, oxygen, water vapor, or a combination of any two or more of these to provide the required oxygen and optionally nitrogen heteroatoms.

Prophetic Example 27, Embodiment (i)

(Step 1) A commercial molded polypropylene 96-well microplate is placed into a vacuum plasma (Rf or Microwave) reactor. The reactor is evacuated to about 1 torr, then an oxygen/argon gas mixture (10/10 sccm each) is initiated with Rf power of about 50 watts for 5 seconds. An increase in surface C—OH can be monitored by FTIR-ATR, monitoring an increase in 3300 cm-1 (CO—H str) and 1600 cm-1 (C—OH str).

(Step 2) The hydroxy-modified microplate is then removed from the plasma reactor and immersed in an 2 percent w/v ethanolic solution of a copolymer of 2-(meth)acryloyloxyethyl-2'-(trimethylammonio)ethyl phosphate (MPC) and trimethoxysilylethylmethacrylate, prepared in a manner similar as described for copolymers in U.S. Pat. No. 6,828,028.

The solution is removed and the microplate is heated and dried under vacuum at 60-80° C. for 2 hours.

The microplate well performance toward protein, whole blood, and blood serum inhibition can be evaluated via standard protein recovery methods including UV, fluorescent-labeled proteins, radiolabeled proteins established in the art. Applicant expects recoveries should average better than 60 percent.

Prophetic Example 28, Embodiment (ii)

(Step 1) A commercial molded polypropylene 96-well microplate is placed into a vacuum plasma (Rf or Microwave) reactor. The reactor is evacuated to about 1 torr, then an oxygen/argon gas mixture (10/10 sccm each) is initiated with Rf power of about 50 watts for 5 seconds. An increase in surface C—OH can be monitored by FTIR-ATR, monitoring an increase in 3300 cm-1 (CO—H str) and 1600 cm-1 (C—OH str).

(Step 2) The power is stopped, the oxygen/argon gas flow is stopped, and the freshly treated microplate is exposed to a vapor of N-(aminoethyl)-2,2,3-trimethyl-2-aza-1-silacyclopentane) [Gelest], from a prevacuated reservoir containing said aza reagent for 1 minute. An increase in surface alkyl-NH2 can be monitored by FTIR-ATR, monitoring a decrease in 3300 cm-1 (O—H str) and increase in ca. 1140 cm-1 (C—N str).

(Step 3) The amine surface-modified microplate is then removed from the plasma reactor and immersed in an 2 percent w/v ethanolic solution of a copolymer of 2-(meth)acryloyloxyethyl-2'-(trimethylammonio)ethyl phosphate (MPC) and glycidylmethacrylate (GMA), prepared as described in Example 1 of U.S. Pat. No. 6,828,028B1 which is incorporated by reference.

The solution is removed and the microplate is heated and dried under vacuum at 60-80° C. for 2 hours.

The microplate well performance toward protein, whole blood, and blood serum inhibition can be evaluated via standard protein recovery methods including UV, fluorescent-labeled proteins, radiolabeled proteins established in the art. Applicant expects recoveries should average better than 60 percent.

Prophetic Example 29, Embodiment (i) and (ii)

The same procedure is utilized as in Example 27 for embodiment (i), and Example 2, for Embodiment (ii), only the initial substrate is an SiOx plasma-coated polypropylene microplate. SiOx plasma coating is described in other art. The SiOx coating should be at least 5 nanometers in thickness throughout the well to provide solute barrier performance from potential extractable and leachable compositions from the molded plastic article.

An increase in surface Si—OH can be monitored by FTIR-ATR, monitoring an increase in 3300 cm-1 (SiO—H str).

Example 30 (Embodiment (i) and (ii))

Protein Binding Assessment Procedure (General for all coated microplates of Embodiments (i) and (ii))

Purpose: The purpose of this experiment is to determine the amount of protein binding over time to a surface coated microtiter plate.

Materials: BioTek Synergy H1 Microplate Reader and Gen5 Software, Millipore Milli-Q Water System, Millipore Direct Detect Spectromter, Alexa Fluor 488 Labeled Proteins (Bovine Serum Albumin, Fibrinogen, Transferrin, Protein A and Protein G), 10× Phosphate Buffered Saline (PBS), Nunc Black 96-well Optical Bottom Plates, 1 L Plastic Bottle, 25-100 mL Glass Beakers, Aluminum Foil, 1-10 mL Pipette, 100-1000 μL Pipette, 0.1-5 μL Pipette, 50-300 μL Multichannel Pipette Experimental:
- 5 proteins are tested on a single surface coated microplate: Bovine Serum Albumin (BSA), Fibrinogen (FBG), Transferrin (TFN), Protein A (PrA) and Protein G (PrG)
- Each protein is received as a fluorescently labeled powder, labeled with Alexa Fluor 488
  - 5 mg of BSA: 66,000 Da
  - 5 mg of FBG: 340,000 Da
  - 5 mg of TFN: 80,000 Da
  - 1 mg of PrA: 45,000 Da
  - 1 mg of PrG: 20,000 Da
- Once received, each vial of protein is wrapped in aluminum foil for extra protection from light and labeled accordingly, then placed into the freezer for storage
- A solution of 1×PBS is made from a stock solution of 10×PBS
  - 100 mL of 10×PBS is added to a plastic 1 L bottle, followed by 900 mL of distilled water from the Millipore Q-pod Using a 100-1000 µL pipette, 1000 µL of 1×PBS is pipetted into each vial of protein separately, to create protein solutions Each vial is then inverted and vortexed to thoroughly mix the solution Each protein is then tested on the Millipore Direct Detect to get an accurate protein concentration Using a 0.1-5 µL pipette, a 2 µL sample of PBS is placed on the first spot of the Direct Detect reading card and marked as a blank in the software A 2 µL sample of the first protein is then placed onto the remaining 3 spots and marked as samples After the card has been read, an average of the 3 protein concentrations is recorded in mg/mL This is repeated for the remaining 4 proteins The protein solutions are then placed into the refrigerator for storage Protein Binding Assay A standard curve is prepared with 1×PBS for each protein The standard curve starts at 25 nM and a serial dilution is performed to obtain the remaining 4 concentrations: 12.5 nM, 6.25 nM, 3.125 nM and 1.5625 nM The 12.5 nM solution prepared from the standard curve will be used for testing The amount of 25 nM standard needed is as follows:

On the microplate, 4 time points are tested and 4 wells are tested at each time point, for a total of 16 wells to be filled for each protein 250 µL of 12.5 nM solution is placed into each well 16 wells*250 µL of 12.5 nM soln=4000 µL=4 mL of 12.5 nM standard soln 2 mL is added to that volume to account for solution used to generate the standard curve and solution used for initial sample reads Therefore a total of 6 mL of 12.5 nM standard soln is needed Since a serial dilution is being performed, that number is doubled to get the volume of 25 nM solution needed 6 mL*2=12 mL of 25 nM solution needed To assure that there is a buffer in case any mistakes are made, 20 mL of 25 nM standard solution will be prepared If more than one microplate is being tested, this calculation can be adjusted For example, if 2 microplates are being tested:

(4 tp)(4 wells)=16 wells (16 wells)(2 plates)=32 wells (32 wells)(250 µL solution)=8000 µL=8 mL of 12.5 nM solution needed 8 mL+2 mL=10 mL of 12.5 standard solution needed (10 mL solution)*2=20 mL of 25 nM standard solution needed =30 mL 25 nM standard solution The amount of each protein needed to make the 25 nM solution is calculated using the protein concentrations obtained from the Millipore Direct Detect 1 mg/mL=1 g/L Da=g/mol 1 nM=1.0E-9 M

1 L=1.0E6 µL

1 µL=0.001 L $Pr(M) = Pr(g/L) \div Pr\ MW(g/mol)$ $M_1 V_1 = M_2 V_2$ $(Pr(M))V_1 = (2.5E-8M)(V_2 L)$ $V_1 = (2.5E-8\ M)(V_2\ L) \div [Pr\ (M)]$ $V_1 = x\ L\ of\ Pr$ $V_1 = (x\ L\ of\ Pr)(1.0E6\ \mu L)$ $V_1 = x\ \mu L\ of\ Pr$ x mL Pr soln=(x µL)(0.001 mL)

x mL of soln−x mL of Pr=x mL of 1×PBS needed 25 nM Pr soln=x µL of Pr+x mL of 1×PBS Ex) 20 mL of 25 nM BSA solution is needed and the concentration of BSA is 5.165 mg/mL 5.165 g/L BSA÷66000 g/mol BSA=7.826$E$-5 M BSA $M_1 V_1 = M_2 V_2$ (7.826$E$-5 M BSA)$V_1$=(2.5$E$-8 M STD)(0.02 L)

$V_1$=5.0$E$-10÷7.826$E$-5

$V_1$=6.389$E$-6 L $V_1$=(6.389$E$-6 L)(1.0$E$6 µL)

$V_1$=6.389 µL BSA needed (6.389 µL)(0.001 mL)=0.006389 mL 25 nM soln 20 mL total soln−0.006389 mL 25 nM BSA=19.994 mL 1×PBS 25 nM BSA soln=6.389 µL BSA+19.994 mL PBS Once the calculations for all 5 proteins are done, the standards curve for each protein is prepared and tested 25, 100 mL glass beakers are set into rows of 5

Each beaker is wrapped in aluminum foil and labeled with the name of the protein the curve corresponds to and the concentration of the solution in the beaker Row 1 is the standard curve for BSA; row 2, FBG; row 3, TFN; row 4, PrA, row 5, PrG Therefore the first row will be labeled as follows: BSA 25 nM, BSA 12.5 nM, BSA 6.25 nM, BSA 3.125 nM, BSA 1.56 nM The first curve is prepared by adding x mL of 1×PBS and x µL of Protein to the first beaker labeled 25 nM Half of the 25 nM solution is pipetted into the 12.5 nM beaker, then 1×PBS is pipetted into the 12.5 mL beaker to make up the final solution needed For example: if 20 mL of 25 nM solution is prepared, 10 mL of the 25 nM solution and 10 mL of 1×PBS are added to the 12.5 nM beaker, yielding 20 mL of 12.5 nM solution The same is then done to prepare the other 3 concentrations After a standard curve is made, it is tested using the microplate reader, then the next standard curve is made and tested, and so on The BioTek Synergy H1 microplate reader and Gen5 software are used for analysis The synergy H1 is hooked up to the computer containing the software and the software is opened and the reader is turned on In the software, a protocol is set up by clicking "Protocols 4 Create New"

"Multi-plate Assay Protocol" is selected and the number of plates entered is 5

Once the protocol is created, "Procedure 4 Read" is selected

In the "read window, "Fluorescence intensity" and "Endpoint/Kinetic" is selected and "OK" is pressed In the "Read Step" window, the "Excitation" wavelength is set to 485 and the "Emission" wavelength is set to 528

"Top read" is selected

"Options→Automatic Gain Adjustment" is selected and "OK" is pressed in the "Filter Set 1 Options" window, the "Read Step" window and the "Procedure" window The "Plate Layout" link is then selected Within the "Plate Layout" window, "Blanks", "Standard Curves" and "Samples" are selected, followed by the "Next" button In the "Blank" tab, the number of replicates is set to 4 and "Next" is pressed In the "Standard Curve" tab, the number of replicates is set to 4, nM is placed in the "Unit" box and 0.5 is placed in the "Factor" box. In the "STD1" box, 25 is entered and the boxes for "STD2, STD3, STD4 AND STD5" are clicked to fill in the remaining standard curve values. The "next" button is then clicked In the "Sample" tab, the number of replicates is set to 4 and the "Finish" button is clicked The "Plate Layout" window appears and on the "Plate 1" Tab: "BLK" is clicked on and placed into spots A1-A4, 25 nM is placed into B1-B4, 12.5 nM is placed into C1-C4, 6.25 nM is placed into D1-D4, 3.125 nM is placed into E1-E4, 1.5625 is placed into F1-F4 and SPL1 is placed into G1-G4

For the "Plate 2", "Plate 3", "Plate 4" and "Plate 5" tabs, SPL2 is placed in spots A1, B1, $C_1$ and D1

If more than one microplate is being tested, then SPL3 will be placed in spots A2, B2, $C_2$ and D2, and so on depending on the number of microplates being tested The "OK" button is then selected The "Data Reduction" link is then selected and within the "Data Reduction" window, the "Standard Curve" link is selected and in the dropdown menu for the "Y Axis Data", "485,528" is selected. "OK" is then selected in both the "Standard Curve" and "Data Reduction" windows Then, the "Report/Export Builders" link is selected and "New Export to Excel" is selected The "Content" link is selected and the "General Format" dropdown box is changed from "Matrix" to "Row-wise Table"

"OK" is then selected in both the "New Export to Excel" and "Report/Export Builders" windows The Protocol is then saved by clicking "File→Save As Protocoll"

After the first standard curve is prepared, it is ready to be tested on the Syngery H1

Using a 50-300 μL multichannel pipette, 200 μL of 1×PBS is pipetted into wells A1-A4 of a black optical bottom microplate Then, 200 μL of the 25 nM soln is pipetted into wells B1-B4

200 μL of 12.5 nM soln is pipetted into wells C1-C4

200 μL of 6.25 nM soln is pipetted into wells D1-D4

200 μL of 3.125 nM soln is pipetted into wells E1-E4

200 μL of 1.5625 nM soln is pipetted into wells F1-F4

200 μL of 12.5 nM soln is pipetted into wells G1-G4

The Gen5 Software is opened and "Experiments→Create Using an Existing Protocol→Protocoll" is selected Plates 1-5 can be labeled by clicking on the plate name (Ex. Plate 1), right clicking on "Information" and entering the name of the plate into the text box and clicking "OK"

Plate 1: Standards

Plate 2: 1.5 hr

Plate 3: 2.5 hr

Plate 4: 4.5 hr

Plate 5: 24 hr

The black, optical bottom microplate containing the standard curve is then placed on the tray of the Synergy H1

Then "Plate 1 (Standards)" is right-clicked and the option "Read Plate 1" is selected The Experiment can then be saved by clicking "File→Save As"

Each protein will require its own Experiment, so the first Experiment will be saved as BSA, the second as FBG, and so on Repeat the above steps after preparing each standard curve After the standard curves are prepared and tested, all but the 12.5 nM solutions can be discarded The microplate being tested is sectioned off into 6 sections Using a Shaprie, a line is drawn between rows D& E, and columns 4 & 5 and 8 & 9

The first section in the upper left hand corner is labeled BSA, the top middle section is FBG, the Top right section is TFN, the bottom left section is PrA, the bottom right section is PrG, and the bottom middle section is left empty For the BSA section: column 1 is marked 1.5 hr, column 2 is 2.5 hr, column 3 is 4.5 hr and column 4 is 24 hr For FBG: column 5 is 1.5 hr, column 6 is 2.5 hr, column 7 is 4.5 hr and column 8 is 24 hr TFN: column 9 is 1.5 hr, column 10 is 2.5 hr, column 11 is 4.5 hr and column 12 is 24 hr PrA: Column 1 is 1.5 hr, column 2 is 2.5 hr, column 3 is 4.5 hr and column 4 is 24 hr PrG: column 9 is 1.5 hr, column 10 is 2.5 hr, column 11 is 4.5 hr and column 12 is 24 hr After the microplate is labeled, it is ready to be filled Using a 50-300 μL multichannel pipette, 250 μL of 12.5 nM BSA is pipetted into the wells in the BSA section This is done for each protein Once the microplate is filled with solution, it is wrapped in aluminum foil and the sections and time points are labeled After 1.5 hours, using a 50-300 μL multichannel pipette and poking through the aluminum foil, 200 μL of BSA solution is pipetted from the 4 wells in the 1.5 hr column (column 1) and placed into a black optical bottom microplate The Gen5 software is opened and "Experiments 4 BSA" is selected The black microplate is placed into the microplate tray "Plate 2 (1.5 hr)" is then right-clicked and the "Read Plate 2" option is selected "File→Save" is then selected The other 4 proteins are then read the same way by opening their corresponding experiments The same thing is done after 2.5 hours, 4.5 hours and 24 hours After the 24 hr read, "Plate→Export" is then selected from the menu bar An excel spreadsheet will appear and can then be saved in the desired location with the desired name Data:
Using the data produced by the Gen5 software, the 12.5 nM solution concentrations from both the standard curve and SPL1 are averaged The concentrations in the 4 wells at 1.5 hr are averaged This is then done for 2.5 hr, 4.5 hr and 24 hr also The average concentration at each time point is then divided by the average concentration of The 12.5 nM soln from the beginning and multiplied by 100 to get a percent recovery at each time point % Recovery @1.5 hr=[AVG. BSA 1.5 hr]/[AVG. 12.5 nM soln]*100

A graph is then prepared in excel, graphing the percent recovery of each protein over time.

While the technology has been described in detail and with reference to specific examples and embodiments thereof, it will be apparent to one skilled in the art that various changes and modifications can be made therein without departing from the spirit and scope thereof. Additional disclosure is provided in the claims, which are considered to be a part of the present description, each claim defining an optional and optional embodiment.

What is claimed is:

1. A method for treating a surface comprising:
employing a first conditioning treatment of the surface with a conditioning plasma of one or more non-polymerizing compounds at a remote point, where the ratio of the radiant energy density at the remote point to the radiant energy density at the brightest point of the conditioning plasma is less than 0.5; and
employing a second conversion treatment of the surface with a conversion plasma of water vapor at a remote point to form a converted surface, where the ratio of the radiant energy density at the remote point of conversion treatment to the radiant energy density at the brightest point of the conversion plasma is less than 0.5;
wherein the converted surface has a biomolecule recovery percentage greater than the biomolecule recovery percentage of the surface prior to treatment according to the method.

2. The method of claim 1, wherein the converted surface has a biomolecule recovery percentage after 24 hours of at least 40%.

3. The method of claim 1, wherein the biomolecule recovery percentage of the converted surface after 24 hours is at least 80%.

4. The method of claim 1, wherein the biomolecule recovery percentage of the converted surface after 24 hours is from 82% to 90%.

5. The method of claim 1, wherein the surface is a vessel lumen surface.

6. The method of claim 1, wherein the converted surface has a biomolecule recovery percentage greater than the biomolecule recovery percentage of the untreated surface for at least one of: mammal serum albumin; Bovine Serum Albumin (BSA); Fibrinogen (FBG); Transferrin (TFN); egg white ovotransferrin (conalbumin); membrane-associated melanotransferrin; Protein A (PrA); Protein G (PrG); Protein A/G; Protein L; Insulin; Pharmaceutical protein; blood or blood component proteins; and any recombinant form, modification, full length precursor, signal peptide, propeptide, or mature variant of these proteins.

7. The method of claim 1, wherein the surface comprises a thermoplastic material.

8. The method of claim 1, wherein the thermoplastic material comprises olefin polymer, polypropylene (PP), polyethylene (PE), cyclic olefin copolymer (COC), cyclic olefin polymer (COP), polymethylpentene, polyester, polyethylene terephthalate, polyethylene naphthalate, polybutylene terephthalate (PBT), polyvinylidene chloride (PVdC), polyvinyl chloride (PVC), polycarbonate, polylactic acid, polystyrene, hydrogenated polystyrene, polycyclohexylethylene (PCHE), epoxy resin, nylon, polyurethane polyacrylonitrile, polyacrylonitrile (PAN), an ionomeric resin, or any combination, composite or blend of any two or more of the above materials.

9. The method of claim 1 wherein the first treatment step and/or second treatment step are carried out using plasma excited by extremely low frequency (ELF) of 3 to 30 Hz, super low frequency (SLF) of 30 to 300 Hz, voice or ultra-low frequency (VF or ULF) of 300 Hz to 3 kHz, very low frequency (VLF) of 3 to 30 kHz, low frequency (LF) of 30 to 300 kHz, medium frequency (MF) of 300 kHz to 3 MHz, high frequency (HF) of 3 to 30 MHz, very high frequency (VHF) of 30 to 300 MHZ, ultra-high frequency (UHF) of 300 MHz to 3 GHZ, or any combination of two or more of these.

10. The method of claim 1, in which the surface is a coating or layer of PECVD deposited $SiO_xC_yH_z$ or $SiN_xC_yH_z$, in which x is from about 0.5 to about 2.4 as measured by X-ray photoelectron spectroscopy (XPS), y is from about 0.6 to about 3 as measured by XPS, and z is from about 2 to about 9 as measured by Rutherford backscattering spectrometry (RBS); or a barrier coating or layer of SiOx, in which x is from about 1.5 to about 2.9 as measured by XPS.

11. The method of claim 1, wherein the surface is a fluid contact surface of an article of labware.

12. The method of claim 1, wherein the surface is a fluid contact surface of a microplate, a centrifuge tube, a pipette tip, a well plate, a microwell plate, an ELISA plate, a microtiter plate, a 96-well plate, a 384-well plate, a vial, a bottle, a jar, a syringe, a cartridge, a blister package, an ampoule, an evacuated blood collection tube, a specimen tube, a centrifuge tube, or a chromatography vial.

13. The method of claim 1, wherein the method is carried out in a plasma chamber having a treatment volume of 100 mL to 50 liters a tubular fluid inlet projects into the treatment volume, through which one or more feed gases are fed into the plasma chamber; and the plasma chamber further comprises a vacuum source for at least partially evacuating the treatment volume.

14. The method of claim 1, further comprising the steps, prior to treating the surface with the conditioning plasma, of:
applying a solvent, also known as a polar liquid treatment agent, to the surface, and
applying ionized gas to the surface.

15. The method of claim 14 where the ionized gas is air.

16. The method of claim 14 wherein the conditioning plasma; is comprised of nitrogen.

17. The method of claim 1, further comprising the steps of:
applying a solvent, also known as a polar liquid treatment agent, to the surface prior to treating the surface with the conditioning plasma.

18. The method of claim 17 where the solvent, also known as a polar liquid treatment agent, is water.

19. The method of claim 17 where the conditioning plasma, is comprised of nitrogen.

20. An article treated according to a method as described in claim 1.

* * * * *